(12) United States Patent
Okamoto et al.

(10) Patent No.: US 11,423,975 B2
(45) Date of Patent: Aug. 23, 2022

(54) MEMORY DEVICE AND METHOD OF OPERATING THE SAME

(71) Applicant: SEMICONDUCTOR ENERGY LABORATORY CO., LTD., Atsugi (JP)

(72) Inventors: Yuki Okamoto, Kanagawa (JP); Tatsuya Onuki, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/968,922

(22) PCT Filed: Feb. 13, 2019

(86) PCT No.: PCT/IB2019/051135
§ 371 (c)(1),
(2) Date: Aug. 11, 2020

(87) PCT Pub. No.: WO2019/162802
PCT Pub. Date: Aug. 29, 2019

(65) Prior Publication Data
US 2021/0050052 A1      Feb. 18, 2021

(30) Foreign Application Priority Data

Feb. 23, 2018 (JP) .............................. JP2018-030810
Mar. 23, 2018 (JP) .............................. JP2018-056653
Apr. 13, 2018 (JP) .............................. JP2018-077326

(51) Int. Cl.
*G11C 11/4097* (2006.01)
*G11C 11/4091* (2006.01)
(Continued)

(52) U.S. Cl.
CPC ...... *G11C 11/4097* (2013.01); *G11C 11/4091* (2013.01); *H01L 27/1052* (2013.01);
(Continued)

(58) Field of Classification Search
CPC ... G11C 11/409; G11C 11/4097; H01L 29/24; H01L 27/1255; H01L 27/124; H01L 27/1225; H01L 27/1207; H01L 27/1052
See application file for complete search history.

(56) References Cited

U.S. PATENT DOCUMENTS

| 5,276,649 A | 1/1994 | Hoshita et al. |
| 5,511,030 A * | 4/1996 | Tanaka .................. G11C 11/409 |
| | | 365/203 |

(Continued)

FOREIGN PATENT DOCUMENTS

| JP | 02-244485 A | 9/1990 |
| JP | 2013-145875 A | 7/2013 |

(Continued)

OTHER PUBLICATIONS

International Search Report (Application No. PCT/IB2019/051135) dated May 28, 2019.

(Continued)

*Primary Examiner* — Connie C Yoha
(74) *Attorney, Agent, or Firm* — Fish & Richardson P.C.

(57) ABSTRACT

A novel memory device is provided. A first cell array including a plurality of memory cells and a second cell array including a plurality of memory cells are provided to overlap with each other. Two bit lines included in the first bit line pair are electrically connected to part of the memory cells included in the first cell array and to part of the memory cells included in the second cell array. Two bit lines included in the second bit line pair are electrically connected to part of the memory cells included in the first cell array and to part of the memory cells included in the second cell array. In the first cell array, one of the bit lines included in the second bit line pair includes a region overlapping with part of the first bit line pair. In the second cell array, the other of the bit lines (Continued)

included in the second bit line pair includes a region overlapping with part of the first bit line pair.

22 Claims, 54 Drawing Sheets

(51) Int. Cl.
*H01L 27/105* (2006.01)
*H01L 27/12* (2006.01)
*H01L 29/24* (2006.01)
*H01L 29/786* (2006.01)

(52) U.S. Cl.
CPC ........ *H01L 27/124* (2013.01); *H01L 27/1207* (2013.01); *H01L 27/1225* (2013.01); *H01L 27/1255* (2013.01); *H01L 29/24* (2013.01); *H01L 29/7869* (2013.01); *H01L 29/78648* (2013.01)

(56) References Cited

U.S. PATENT DOCUMENTS

| | | | | |
|---|---|---|---|---|
| 5,771,199 | A * | 6/1998 | Lee | G11C 8/12 365/230.03 |
| 9,076,505 | B2 | 7/2015 | Atsumi et al. | |
| 9,478,276 | B2 | 10/2016 | Onuki | |
| 9,865,325 | B2 | 1/2018 | Onuki | |
| 9,990,965 | B2 | 6/2018 | Atsumi | |
| 10,984,840 | B2 * | 4/2021 | Onuki | G11C 11/4091 |
| 2002/0018359 | A1 | 2/2002 | Mizuno et al. | |
| 2003/0151943 | A1 * | 8/2003 | Sadakata | G11C 11/405 365/149 |
| 2005/0174866 | A1 * | 8/2005 | Wada | G11C 7/18 365/205 |
| 2005/0226025 | A1 * | 10/2005 | Kang | G11C 7/18 365/63 |
| 2007/0058468 | A1 * | 3/2007 | Butler | G11C 7/02 365/210.1 |
| 2007/0253267 | A1 * | 11/2007 | Nobutoki | G11C 7/02 365/207 |
| 2013/0148411 | A1 | 6/2013 | Atsumi et al. | |
| 2013/0155790 | A1 | 6/2013 | Atsumi | |
| 2015/0294710 | A1 | 10/2015 | Onuki | |
| 2017/0358334 | A1 * | 12/2017 | Onuki | G11C 11/24 |
| 2020/0342935 | A1 * | 10/2020 | Onuki | H01L 27/1207 |
| 2020/0343244 | A1 * | 10/2020 | Onuki | H01L 29/7869 |

FOREIGN PATENT DOCUMENTS

| | | |
|---|---|---|
| JP | 2013-168631 A | 8/2013 |
| JP | 2016-054282 A | 4/2016 |
| KR | 2016-0145069 A | 12/2016 |
| TW | 201541454 | 11/2015 |
| WO | WO-2015/155635 | 10/2015 |

OTHER PUBLICATIONS

Written Opinion (Application No. PCT/IB2019/051135) dated May 28, 2019.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.

Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.

Yamazaki.S et al., "In—Ga—Zn-Oxide Semiconductor and Its Transistor Characteristics", ECS Journal of Solid State Science and Technology, July 1, 2014, vol. 3, No. 9, pp. Q3012-Q3022.

Yamazaki.S, "Crystalline Oxide Semiconductor Using CAAC-IGZO and its Application", ECS Transactions, Oct. 1, 2014, vol. 64, No. 10, pp. 155-164, The Electrochemical Society.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7.

Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

Taiwanese Office Action (Application No. 108106119) dated Apr. 29, 2022.

* cited by examiner

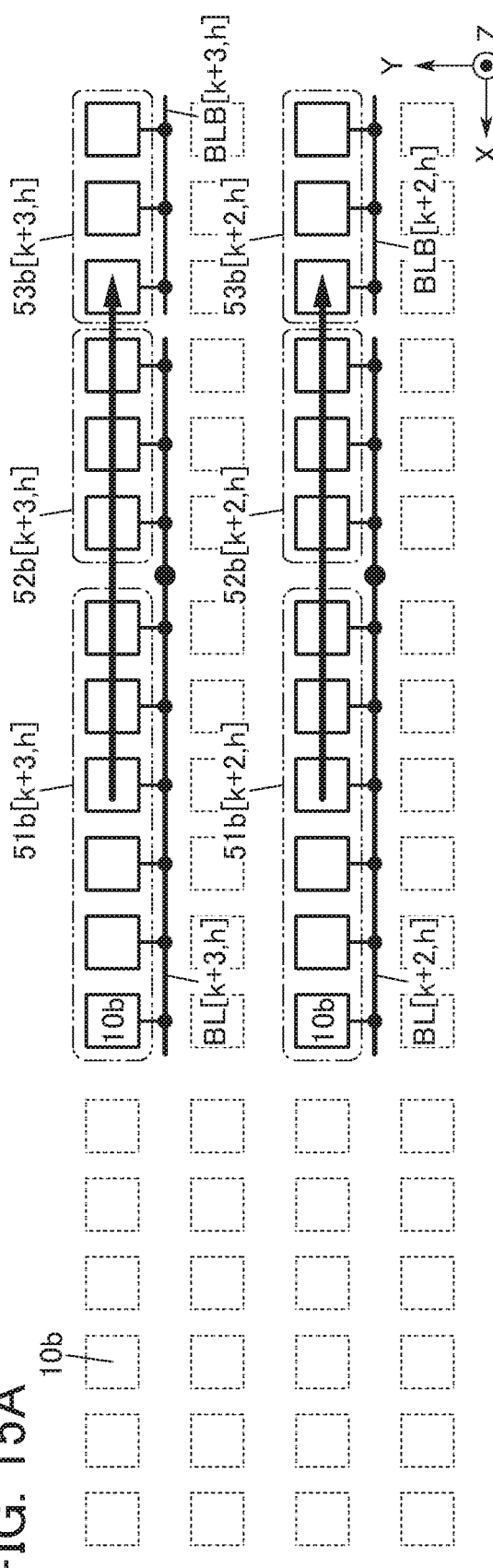
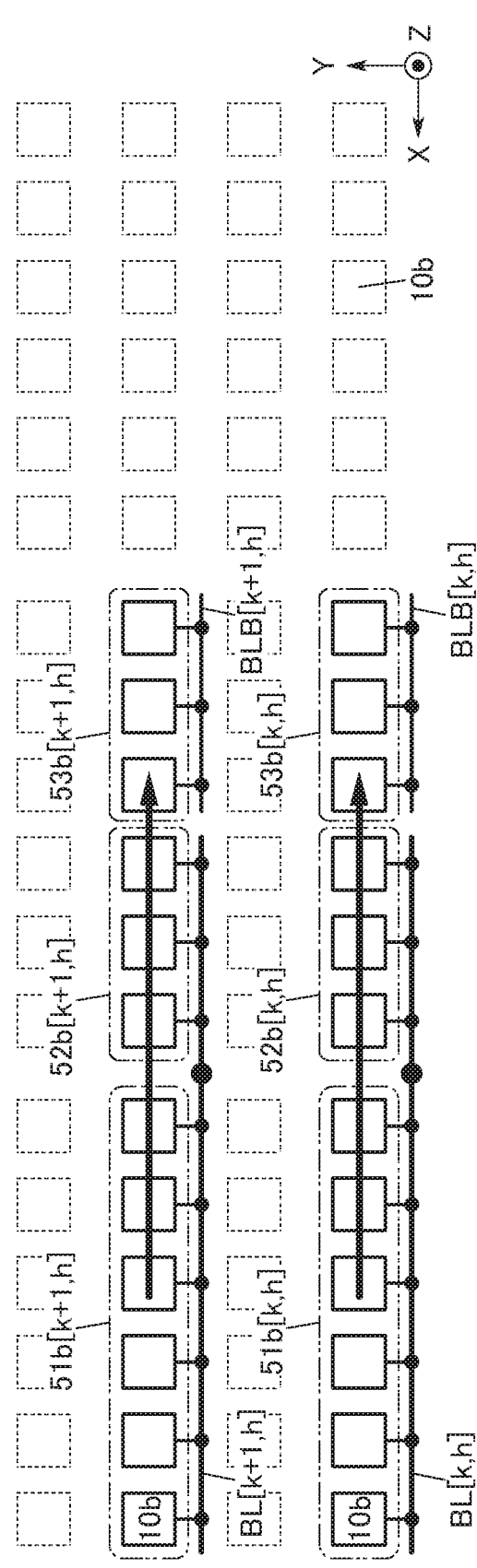

FIG. 27A1
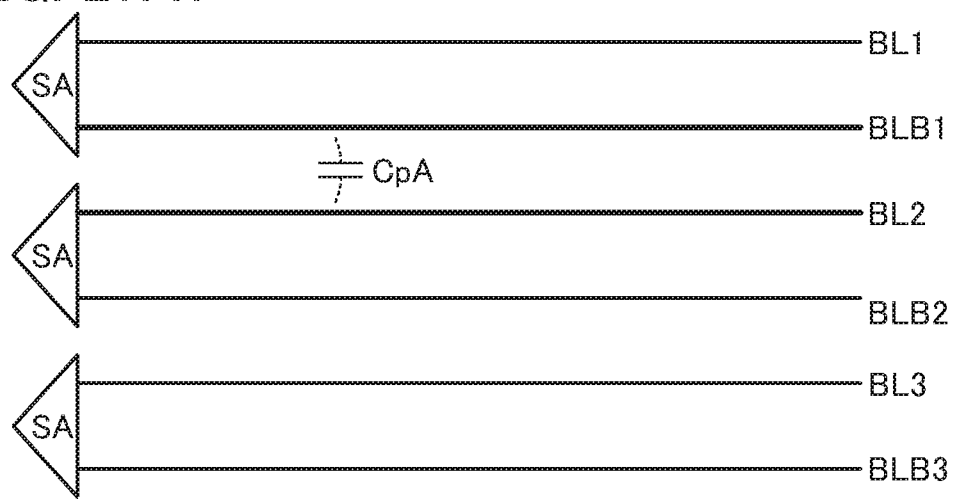
FIG. 27B1
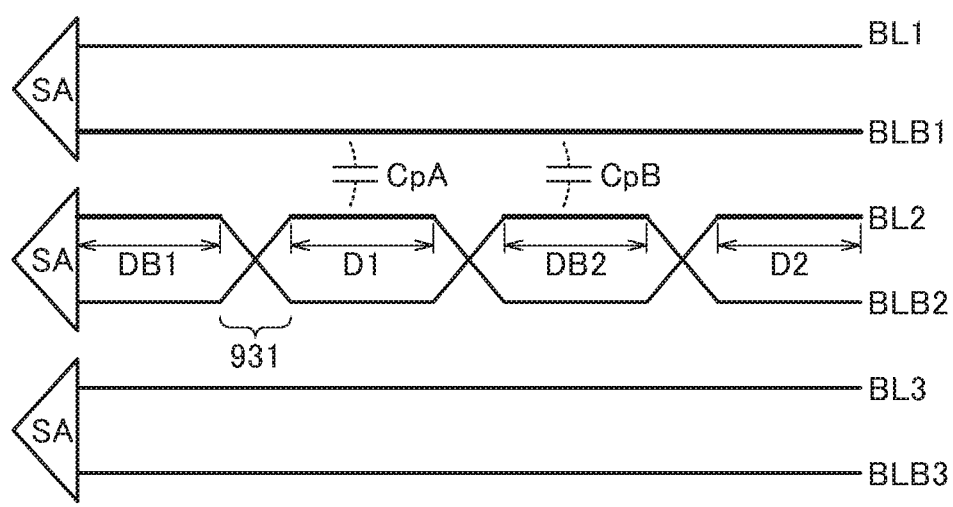
FIG. 27A2
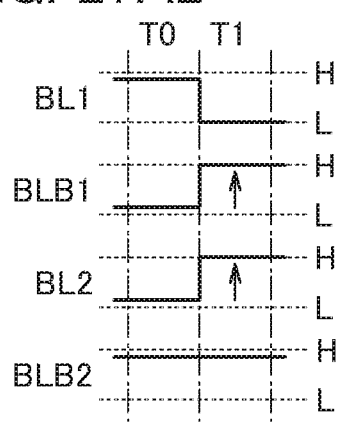
FIG. 27B2
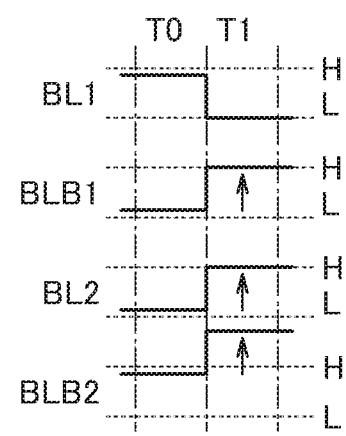

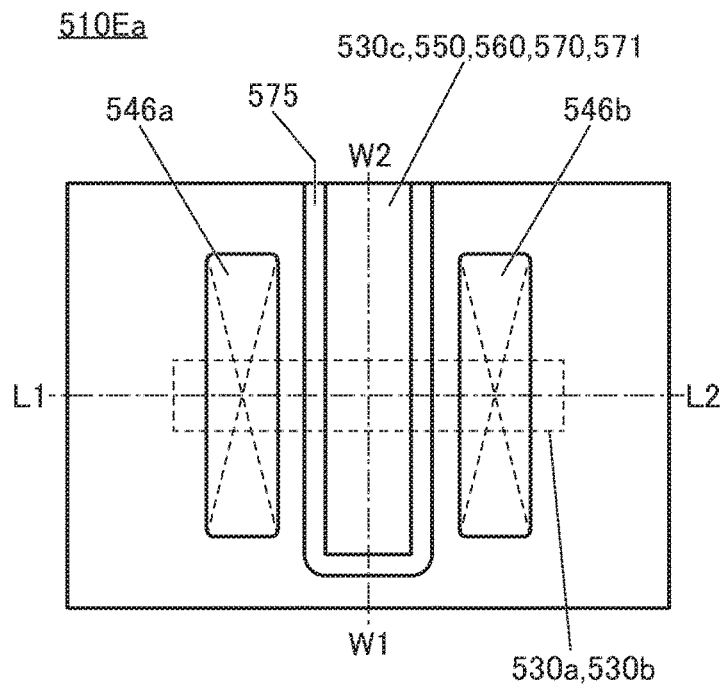
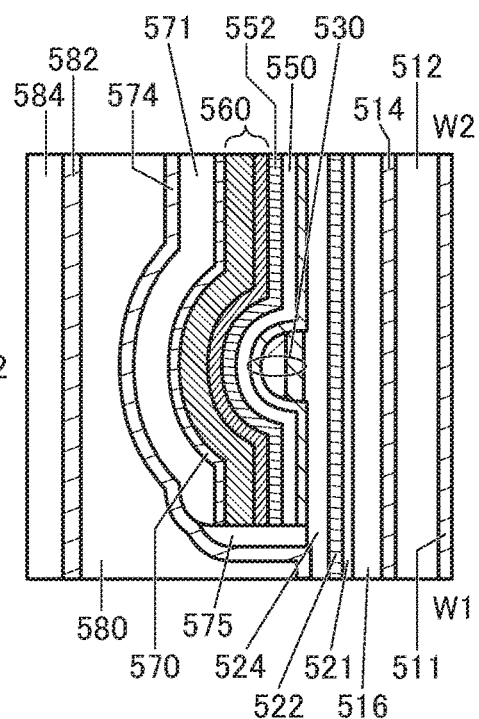
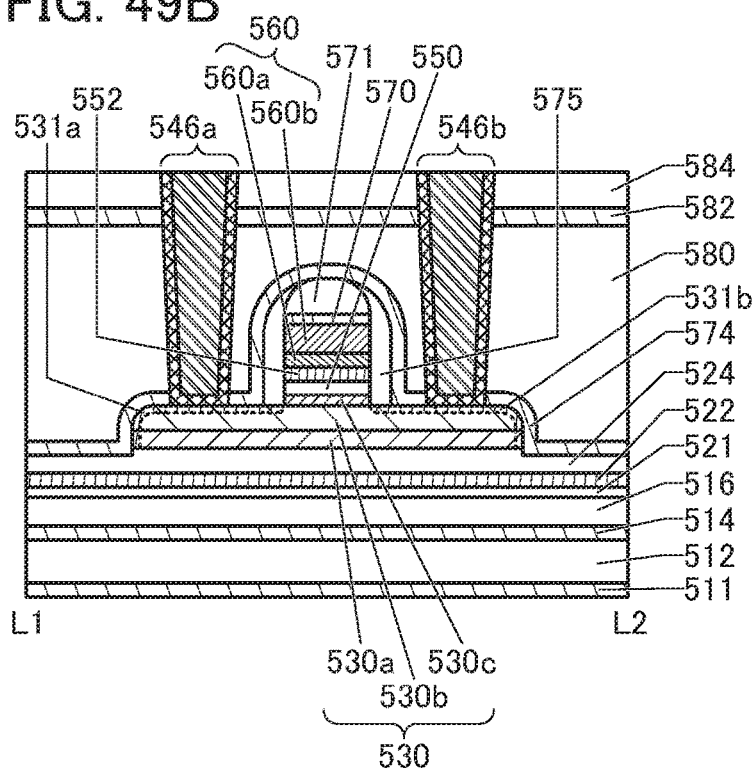

MEMORY DEVICE AND METHOD OF OPERATING THE SAME

CROSS REFERENCE TO RELATED APPLICATIONS

This application is a U.S. National Phase Application under 35 U.S.C. § 371 of International Application PCT/IB2019/051135, filed on Feb. 13, 2019, which is incorporated by reference and claims the benefit of foreign priority applications filed in Japan on Feb. 23, 2018, as Application No. 2018-038010, on Mar. 23, 2018, as Application No. 2018-056653, and on Apr. 13, 2018, as Application No. 2018-077236.

TECHNICAL FIELD

One embodiment of the present invention relates to a memory device, a semiconductor device, or electronic devices using these devices.

Note that one embodiment of the present invention is not limited to the above technical field. One embodiment of the invention disclosed in this specification and the like relates to an object, a method, or a manufacturing method. One embodiment of the invention disclosed in this specification and the like also relates to a process, a machine, manufacture, or a composition of matter.

In this specification and the like, a semiconductor device generally means a device that can function by utilizing semiconductor characteristics. A transistor and a semiconductor circuit are embodiments of semiconductor devices. A display device (e.g., a liquid crystal display device and a light-emitting display device), a projection device, a lighting device, an electro-optical device, a power storage device, a memory device, a semiconductor circuit, an imaging device, an electronic device, and the like may be referred to as a semiconductor device. Alternatively, they may include a semiconductor device.

BACKGROUND ART

A silicon-based semiconductor material is widely known as a semiconductor thin film that can be used in a transistor, and as another material, an oxide semiconductor has attracted attention. As the oxide semiconductor, not only single-component metal oxides, such as indium oxide and zinc oxide, but also multi-component metal oxides are known. Among the multi-component metal oxides, in particular, an In—Ga—Zn oxide (hereinafter also referred to as IGZO) has been actively researched.

From the researches on IGZO, a CAAC (c-axis aligned crystalline) structure and an nc (nanocrystalline) structure, which are not single crystal nor amorphous, have been found in an oxide semiconductor (see Non-Patent Document 1 to Non-Patent Document 3). Non-Patent Document 1 and Non-Patent Document 2 also disclose a technique for fabricating a transistor using an oxide semiconductor having a CAAC structure. Moreover, Non-Patent Document 4 and Non-Patent Document 5 show that a fine crystal is included even in an oxide semiconductor which has lower crystallinity than the CAAC structure or the nc structure.

A transistor using IGZO for an active layer has an extremely low off-state current (see Non-Patent Document 6), and LSI and a display that utilize the feature have been reported (see Non-Patent Document 7 and Non-Patent Document 8).

In addition, a DRAM (Dynamic Random Access Memory) is known as one of memory devices. A DRAM includes a cell array in which a plurality of memory cells are arranged in a matrix, a plurality of bit lines, and a plurality of word lines. A memory cell is electrically connected to any one of the plurality of bit lines and any one of the plurality of word lines. A selection signal for selecting a memory cell on which writing and reading of information are performed is supplied to a word line. The information is written to and read from a memory cell through a bit line.

Therefore, when data is written to a memory cell X through a bit line A, for example, noise due to a potential change of the bit line A may be transmitted to a bit line B adjacent to the bit line A. In this case, data retained in a memory cell Y electrically connected to the bit line B is changed unintentionally in some cases. As a method for reducing the influence of such noise, a twisted bit-line method has been suggested (see Patent Document 1).

Furthermore, DRAMs are classified into folded bit-line DRAMs and open bit-line DRAMs.

REFERENCES

Patent Document

[Patent Document 1] Japanese Published Patent Application No. H2-244485

Non-Patent Documents

[Non-Patent Document 1] S. Yamazaki et al., "SID Symposium Digest of Technical Papers", 2012, volume 43, issue 1, pp. 183-186.
[Non-Patent Document 2] S. Yamazaki et al., "Japanese Journal of Applied Physics", 2014, volume 53, Number 4S, pp. 04ED18-1-04ED18-10.
[Non-Patent Document 3] S. Ito et al., "The Proceedings of AM-FPD '13 Digest of Technical Papers", 2013, pp. 151-154.
[Non-Patent Document 4] S. Yamazaki et al., "ECS Journal of Solid State Science and Technology", 2014, volume 3, issue 9, pp. Q3012-Q3022.
[Non-Patent Document 5] S. Yamazaki, "ECS Transactions", 2014, volume 64, issue 10, pp. 155-164.
[Non-Patent Document 6] K. Kato et al., "Japanese Journal of Applied Physics", 2012, volume 51, pp. 021201-1-021201-7.
[Non-Patent Document 7] S. Matsuda et al., "2015 Symposium on VLSI Technology Digest of Technical Papers", 2015, pp. T216-T217.
[Non-Patent Document 8] S. Amano et al., "SID Symposium Digest of Technical Papers", 2010, volume 41, issue 1, pp. 626-629.

SUMMARY OF THE INVENTION

Problems to be Solved by the Invention

The twisted bit-line pair method can be applied to a memory device employing a folded bit-line method but cannot be applied to a memory device employing an open bit-line method in which the integration degree of memory cells is high. Thus, a highly integrated cell array has been difficult to achieve.

In the twisted bit-line pair method, an intersection portion needs to be provided in at least part of a pair of bit lines, and a memory cell cannot be placed in the intersection portion.

An object of one embodiment of the present invention is to provide a memory device having a high degree of integration. Alternatively, an object is to provide a memory device that is less likely to be affected by noise. Alternatively, an object is to provide a highly reliable memory device. Alternatively, an object is to provide a memory device with low power consumption. Alternatively, an object is to provide a novel memory device. Alternatively, an object is to provide a novel semiconductor device.

Note that the descriptions of these objects do not preclude the existence of other objects. In one embodiment of the present invention, there is no need to achieve all the objects. Other objects will be apparent from and can be derived from the description of the specification, the drawings, the claims, and the like.

Means for Solving the Problems

A first cell array including a plurality of memory cells and a second cell array including a plurality of memory cells are provided to overlap with each other. Two bit lines included in the first bit line pair are electrically connected to part of the memory cells included in the first cell array and to part of the memory cells included in the second cell array. Two bit lines included in the second bit line pair are electrically connected to part of the memory cells included in the first cell array and to part of the memory cells included in the second cell array. In the first cell array, one of the bit lines included in the second bit line pair includes a region overlapping with part of the first bit line pair. In the second cell array, the other of the bit lines included in the second bit line pair includes a region overlapping with part of the first bit line pair.

One embodiment of the present invention is a memory device including a first cell array, a second cell array, a first bit line pair, and a second bit line pair. The first cell array and the second cell array include a region where they overlap with each other. The first cell array includes Aa (Aa is an integer greater than or equal to 1) first memory cell(s), Ba (Ba is an integer greater than or equal to 1) first memory cell(s), Ca (Ca is an integer greater than or equal to 1) first memory cell(s), Da (Da is an integer greater than or equal to 1) first memory cell(s), Ea (Ea is an integer greater than or equal to 1) first memory cell(s); and Fa (Fa is an integer greater than or equal to 1) first memory cell(s). The second cell array includes Ab (Ab is an integer greater than or equal to 1) second memory cell(s), Bb (Bb is an integer greater than or equal to 1) second memory cell(s), Cb (Cb is an integer greater than or equal to 1) second memory cell(s), Db (Db is an integer greater than or equal to 1) second memory cell(s), Eb (Eb is an integer greater than or equal to 1) second memory cell(s), and Fb (Fb is an integer greater than or equal to 1) second memory cell(s). One bit line of the first bit line pair is electrically connected to the Aa first memory cell(s), the Ca first memory cell(s), and the Cb second memory cell(s). The other of the first bit line pair is electrically connected to the Ba first memory cell(s), the Ab second memory cell(s), and the Bb second memory cell(s). One bit line of the second bit line pair is electrically connected to the Da first memory cell(s), the Fa first memory cell(s), and the Fb second memory cell(s). The other of the second bit line pair is electrically connected to the Ea first memory cell(s), the Db second memory cell(s), and the Eb second memory cell(s). Part of the Da first memory cell(s) are adjacent to the Ba first memory cell(s). Another part of the Da first memory cell(s) are adjacent to the Ca first memory cell(s). Part of the Db first memory cell(s) are adjacent to the Bb first memory cell(s). Another part of the Db first memory cell(s) are adjacent to the Cb first memory cell(s).

A plurality of the first bit line pairs and a plurality of the second bit line pairs may be included. The first memory cell may include a first transistor and a first capacitor, and the second memory cell may include a second transistor and a second capacitor. The first transistor and the second transistor may include an oxide semiconductor in a semiconductor layer in which a channel is formed.

Another embodiment of the present invention is a memory device including a first cell array, a second cell array, first to fourth BLf bit lines, first to fourth BLs bit lines, first to fourth BLBf bit lines, and first to fourth BLBs bit lines. The first cell array and the second cell array include a region where they overlap with each other. The first cell array includes Aa (Aa is an integer greater than or equal to 1) first memory cell(s), Ba (Ba is an integer greater than or equal to 1) first memory cell(s), Ca (Ca is an integer greater than or equal to 1) first memory cell(s), Da (Da is an integer greater than or equal to 1) first memory cell(s), Ea (Ea is an integer greater than or equal to 1) first memory cell(s), Fa (Fa is an integer greater than or equal to 1) first memory cell(s), Ga (Ga is an integer greater than or equal to 1) first memory cell(s), Ha (Ha is an integer greater than or equal to 1) first memory cell(s), Ia (Ia is an integer greater than or equal to 1) first memory cell(s), Ja (Ja is an integer greater than or equal to 1) first memory cell(s), Ka (Ka is an integer greater than or equal to 1) first memory cell(s), and La (La is an integer greater than or equal to 1) first memory cell(s). The second cell array includes Ab (Ab is an integer greater than or equal to 1) second memory cell(s), Bb (Bb is an integer greater than or equal to 1) second memory cell(s), Cb (Cb is an integer greater than or equal to 1) second memory cell(s), Db (Db is an integer greater than or equal to 1) second memory cell(s), Eb (Eb is an integer greater than or equal to 1) second memory cell(s), Fb (Fb is an integer greater than or equal to 1) second memory cell(s), Gb (Gb is an integer greater than or equal to 1) second memory cell(s), Hb (Hb is an integer greater than or equal to 1) second memory cell(s), Ib (Ib is an integer greater than or equal to 1) second memory cell(s), Jb (Jb is an integer greater than or equal to 1) second memory cell(s), Kb (Kb is an integer greater than or equal to 1) second memory cell(s), and Lb (Lb is an integer greater than or equal to 1) second memory cell(s). The first BLf bit line is electrically connected to the Ba first memory cell(s) and the Bb second memory cell(s). The first BLs bit line is electrically connected to the Ab second memory cell(s). The first BLBf bit line is electrically connected to the Ca first memory cell(s) and the Cb second memory cell(s). The first BLBs bit line is electrically connected to the Aa first memory cell(s). The second BLf bit line is electrically connected to the Fa first memory cell(s) and the Fb second memory cell(s). The second BLs bit line is electrically connected to the Db second memory cell(s). The second BLBf bit line is electrically connected to the Ea first memory cell(s) and the Eb second memory cell(s). The second BLBs bit line is electrically connected to the Da first memory cell(s). The third BLf bit line is electrically connected to the Ia first memory cell(s) and the Ib second memory cell(s). The third BLs bit line is electrically connected to the Gb second memory cell(s). The third BLBf bit line is electrically connected to the Ha first memory cell(s) and the Hb second memory cell(s). The third BLBs bit line is electrically connected to the Ga first memory cell(s). The fourth BLf bit line is electrically connected to the Ka first memory cell(s) and the Kb second memory cell(s). The fourth BLs bit line is electrically connected to the Jb second memory cell(s). The fourth BLBf bit line is electrically connected to the La first memory cell(s) and the Lb second memory cell(s). The fourth BLBs bit line is electrically connected to the Ja first memory cell(s). The Ba first memory cell(s) and the Ia first memory cell(s) are adjacent to part of the Da first memory cell(s). The Ca first memory cell(s) and the Ha first memory cell(s) are adjacent to another part of the Da first memory cell(s). Part of the Ja first memory cell(s) are adjacent to the Ia first memory cell(s). Another part of the Ja first memory cell(s) are adjacent to the Ha first memory cell(s). The Bb second memory cell(s) and the Ib second memory cell(s) are adjacent to part of the Db second memory cell(s). The Cb second memory cell(s) and the Hb second memory cell(s) are adjacent to another part of the Db second memory cell(s). Part of the Jb second memory cell(s) are adjacent to the Ib second memory cell(s). Another part of the Jb second memory cell(s) are adjacent to the Hb second memory cell(s).

In the above memory device, a first sense amplifier and 11th to 14th switches may be included. The first BLf bit line may be electrically connected to the first sense amplifier through the 11th switch. The first BLs bit line may be electrically connected to the first sense amplifier through the 12th switch. The first BLBf bit line may be electrically connected to the first sense amplifier through the 13th switch. The first BLBs bit line may be electrically connected to the first sense amplifier through the 14th switch.

In the above memory device, a second sense amplifier and 21th to 24th switches may be included. The second BLf bit line may be electrically connected to the second sense amplifier through the 21th switch. The second BLs bit line may be electrically connected to the second sense amplifier through the 22th switch. The second BLBf bit line may be electrically connected to the second sense amplifier through the 23th switch. The second BLBs bit line may be electrically connected to the second sense amplifier through the 24th switch.

In the above memory device, a third sense amplifier and 31th to 34th switches may be included. The third BLf bit line may be electrically connected to the third sense amplifier through the 31th switch. The third BLs bit line may be electrically connected to the third sense amplifier through the 32th switch. The third BLBf bit line may be electrically connected to the third sense amplifier through the 33th switch. The third BLBs bit line may be electrically connected to the third sense amplifier through the 34th switch.

In the above memory device, a fourth sense amplifier and 41th to 44th switches may be included. The fourth BLf bit line may be electrically connected to the fourth sense amplifier through the 41th switch. The fourth BLs bit line may be electrically connected to the fourth sense amplifier through the 42th switch. The fourth BLBf bit line may be electrically connected to the fourth sense amplifier through the 43th switch. The fourth BLBs bit line may be electrically connected to the fourth sense amplifier through the 44th switch.

Ca is preferably greater than or equal to 0.8 times and less than or equal to 1.2 times Ba, and Ca is more preferably equal in number to Ba. Ab is preferably greater than or equal to 0.8 times and less than or equal to 1.2 times Aa, and Ab is more preferably equal in number to Aa. A sum of Ba and Ca is greater than or equal to 0.8 times and less than or equal to 1.2 times the Aa, and the sum of Ba and Ca is more preferably equal in number to Aa. Ia is preferably greater than or equal to 0.8 times and less than or equal to 1.2 times Ba, and Ia is more preferably equal in number to Ba.

Another embodiment of the present invention is a method of operating a memory device including a first memory cell, a second memory cell, a first bit line, a second bit line, and a sense amplifier. The first memory cell includes a first transistor and a first capacitor. The second memory cell includes a second transistor and a second capacitor. The first transistor and the second transistor each include an oxide semiconductors in a semiconductor layer. The first memory cell may be electrically connected to the sense amplifier through the first bit line and the second memory cell is electrically connected to the sense amplifier through the second bit line. The method of operating a memory device includes a first operation of supplying a first potential to a gate of the first transistor and supplying a charge stored in the first capacitor to the first bit line. During a period of the first operation, a second potential is supplied to a gate of the second transistor.

A third potential may be supplied to the gate of the first transistor after the first operation is finished. In addition, a second operation of supplying the first potential to the gate of the first transistor and supplying the charge of the first bit line to the first capacitor may be included. During a period of the second operation, the second potential is supplied to the gate of the second transistor. A third potential may be supplied to the gate of the first transistor after the second operation is finished.

The first potential may be a potential higher than a source potential and a drain potential of the first transistor. The second potential may be a potential higher than a source potential and a drain potential of the second transistor. The third potential may be a potential lower than the source potential and the drain potential of the first transistor.

Effect of the Invention

According to one embodiment of the present invention, a memory device that is less likely to be affected by noise can be provided. Alternatively, a memory device having a high degree of integration can be provided. Alternatively, a memory device with high reliability can be provided. Alternatively, a memory device with low power consumption can be provided. Alternatively, a novel memory device can be provided. Alternatively, a novel semiconductor device can be provided.

Note that the descriptions of the effects do not preclude the existence of other effects. One embodiment of the present invention does not necessarily have all of these effects. Effects other than these will be apparent from the description of the specification, the drawings, the claims, and the like and effects other than these can be derived from the description of the specification, the drawings, the claims, and the like.

BRIEF DESCRIPTION OF THE DRAWINGS

FIGS. 15A and 15B Diagrams illustrating arrangement of memory cell groups.

FIGS. 27A1, 27A2, 27B1, and 27B2 Diagrams illustrating bit lines and sense amplifiers, and diagrams illustrating changes in the potentials of bit lines.

FIGS. 49A to 49C Diagrams illustrating a structure example of a transistor.

MODE FOR CARRYING OUT THE INVENTION

Figure 1:
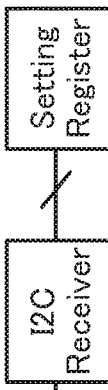
FIG. 1 A diagram illustrating a configuration example of a memory device.

Embodiments are described in detail with reference to the drawings. Note that the present invention is not limited to the following description, and it is easily understood by those skilled in the art that various changes and modifications can be made without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated in some cases.

The position, size, range, and the like of each component illustrated in the drawings and the like are not accurately represented in some cases to facilitate understanding of the invention. Therefore, the disclosed invention is not necessarily limited to the position, size, range, and the like disclosed in the drawings and the like. For example, in the actual manufacturing process, a layer, a resist mask, or the like might be unintentionally reduced in size by treatment such as etching, which is not illustrated in some cases for easy understanding.

Especially in a top view (also referred to as a "plan view"), a perspective view, or the like, some components might not be illustrated for easy understanding of the invention. In addition, some hidden lines and the like might not be shown.

Ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. A term with an ordinal number in this specification and the like might be provided with a different ordinal number in a claim. A term with an ordinal number in this specification and the like might not be provided with an ordinal number in a claim and the like.

In addition, in this specification and the like, a term such as an "electrode" or a "wiring" does not limit the function of a component. For example, an "electrode" is used as part of a "wiring" in some cases, and vice versa. Furthermore, the term "electrode" or "wiring" can also mean a combination of a plurality of "electrodes" and "wirings" provided in an integrated manner.

Note that the term "over" or "under" in this specification and the like does not necessarily mean that a component is placed "directly above and in contact with" or "directly below and in contact with" another component. For example, the expression "electrode B over insulating layer A" does not necessarily mean that the electrode B is on and in direct contact with the insulating layer A and can mean the case where another component is provided between the insulating layer A and the electrode B.

Furthermore, functions of a source and a drain are interchanged with each other depending on operation conditions, for example, when a transistor of different polarity is employed or when the direction of current flow is changed in circuit operation; therefore, it is difficult to define which is the source or the drain. Thus, the terms "source" and "drain" can be interchanged with each other in this specification.

In this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or text, another connection relation is disclosed in the drawings or the text.

In this specification and the like, the term "electrically connected" includes the case where components are connected through an "object having any electric function". There is no particular limitation on an "object having any electric function" as long as electric signals can be transmitted and received between components that are connected through the object. Thus, even when the expression "electrically connected" is used, there is a case where no physical connection is made and a wiring just extends in an actual circuit.

Note that the channel length refers to, for example, a distance between a source (source region or source electrode) and a drain (drain region or drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other or a region where a channel is formed. In one transistor, channel widths in all regions are not necessarily the same. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter also referred to as an "effective channel width") is sometimes different from a channel width shown in a top view of a transistor (hereinafter also referred to as an "apparent channel width"). For example, in a transistor having a gate electrode covering side surfaces of a semiconductor layer, an effective channel width is greater than an apparent channel width, and its influence cannot be ignored in some cases. For example, in a miniaturized transistor having a gate electrode covering side surfaces of a semiconductor, the proportion of channels formed in the side surfaces of the semiconductor may be increased. In that case, an effective channel width is greater than an apparent channel width.

In such a case, an effective channel width is difficult to estimate by measuring in some cases. For example, to estimate an effective channel width from a design value, it is necessary to assume that the shape of a semiconductor is known. Therefore, in the case where the shape of a semiconductor is not known accurately, estimating an effective channel width accurately is difficult.

Thus, in this specification, an apparent channel width is referred to as a surrounded channel width (SCW) in some cases. Furthermore, in this specification, the simple term "channel width" may denote a surrounded channel width, an apparent channel width, or an effective channel width. Note that the values of a channel length, a channel width, an effective channel width, an apparent channel width, a surrounded channel width, and the like can be determined by analyzing a cross-sectional TEM image and the like.

Note that in the case where field-effect mobility, a current value per channel width, and the like of a transistor are obtained by calculation, the calculation is performed using a surrounded channel width in some cases. In that case, a value different from one calculated using an effective channel width is obtained in some cases.

Note that impurities in a semiconductor refer to, for example, elements other than the main components of the semiconductor. For example, an element with a concentration of lower than 0.1 atomic % can be regarded as an impurity. When an impurity is contained, for example, DOS (Density of States) in a semiconductor may be increased, the carrier mobility may be decreased, or the crystallinity may be decreased. In the case where the semiconductor is an oxide semiconductor, examples of an impurity that changes the characteristics of the semiconductor include Group 1 elements, Group 2 elements, Group 13 elements, Group 14 elements, Group 15 elements, and transition metals other than the main components of the oxide semiconductor; specific examples are hydrogen, lithium, sodium, silicon, boron, phosphorus, carbon, and nitrogen. In the case of an oxide semiconductor, water also serves as an impurity in some cases. Furthermore, in the case of an oxide semiconductor, oxygen vacancies may be formed by entry of impurities. In the case where the semiconductor is silicon, examples of an impurity that changes the characteristics of the semiconductor include oxygen, Group 1 elements except hydrogen, Group 2 elements, Group 13 elements, and Group 15 elements.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" or "orthogonal" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification and the like, the terms "identical", "the same", "equal", "uniform", and the like (including synonyms thereof) used in describing calculation values and actual measurement values allow for a margin of error of ±20%, unless otherwise specified.

In this specification and the like, in the case where an etching step is performed after a resist mask is formed by a photolithography method, the resist mask is removed after the etching step, unless otherwise specified.

In this specification and the like, a high power supply potential VDD (also referred to as "VDD" or "H potential") is a power supply potential higher than a low power supply potential VSS. The low power supply potential VSS (also referred to as "VSS" or "L potential") is a power supply potential lower than the high power supply potential VDD. In addition, a ground potential (also referred to as "GND" or "GND potential") can be used as VDD or VSS. For example, in the case where a ground potential is used as VDD, VSS is lower than the ground potential, and in the case where a ground potential is used as VSS, VDD is higher than the ground potential.

Note that the terms "film" and "layer" can be used interchangeably depending on the case or the circumstances. For example, the term "conductive layer" can be changed into the term "conductive film" in some cases. Also, for example, the term "insulating film" can be changed into the term "insulating layer" in some cases.

Furthermore, unless otherwise specified, transistors described in this specification and the like are enhancement-type (normally-off-type) field effect transistors. Unless otherwise specified, transistors described in this specification and the like are n-channel transistors. Thus, unless otherwise specified, the threshold voltage (also referred to as "Vth") is larger than 0 V.

Embodiment 1

A memory device of one embodiment of the present invention is described with reference to drawings.

First, a folded bit-line memory device and an open bit-line memory device are described.

Figure 26A:
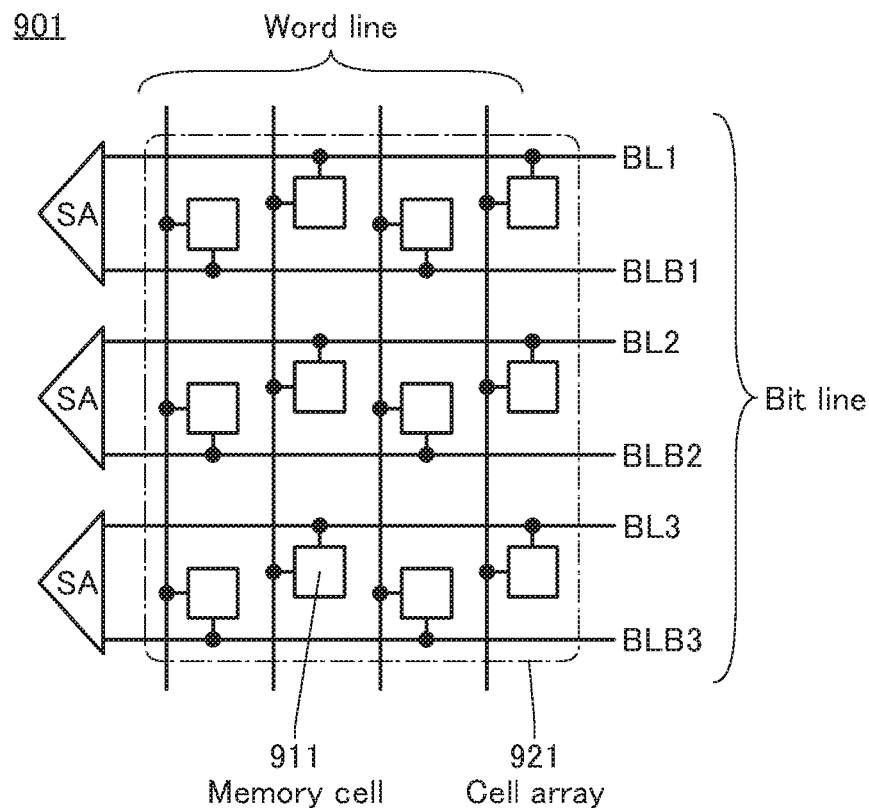
FIGS. 26A and 26B Diagrams illustrating a folded bit-line memory device and an open bit-line memory device.

FIG. 26(A) is a block diagram illustrating a folded bit-line memory device 901. The memory device 901 includes a cell array 921 including memory cells 911 arranged in a matrix, a plurality of word lines, a plurality of bit lines, and a plurality of sense amplifiers SA. In the memory device 901, the plurality of bit lines extend in the row direction (or in the column direction), and the plurality of word lines extend in the column direction (or in the row direction).

The plurality of word lines each intersect with a plurality of bit line pairs. The plurality of bit lines include a plurality of bit lines BL and a plurality of bit lines BLB. FIG. 26(A) illustrates three bit lines BL (a bit line BL1 to a bit line BL3) and three bit lines BLB (a bit line BLB1 to a bit line BLB3).

In the folded bit-line memory device 901, the bit lines BL and the bit lines BLB are alternately provided. One bit line BL and one bit line BLB form one bit line pair. The memory device 901 includes a bit line pair formed by the bit line BL1 and the bit line BLB1, a bit line pair formed by the bit line BL2 and the bit line BLB2, and a bit line pair formed by the bit line BL3 and the bit line BLB3. One sense amplifier SA is electrically connected to one bit line pair.

The memory cell 911 is provided in the vicinity of an intersection point of the word line and the bit line. Note that the memory cell 911 electrically connected to the bit line BL of one bit line pair and the memory cell 911 electrically connected to the bit line BLB of the same bit line pair cannot be electrically connected to the same word line. For this reason, memory cells cannot be provided in the vicinity of all the intersection points in the folded bit-line memory device, which makes it difficult to achieve highly integrated memory cells.

Figure 26B:
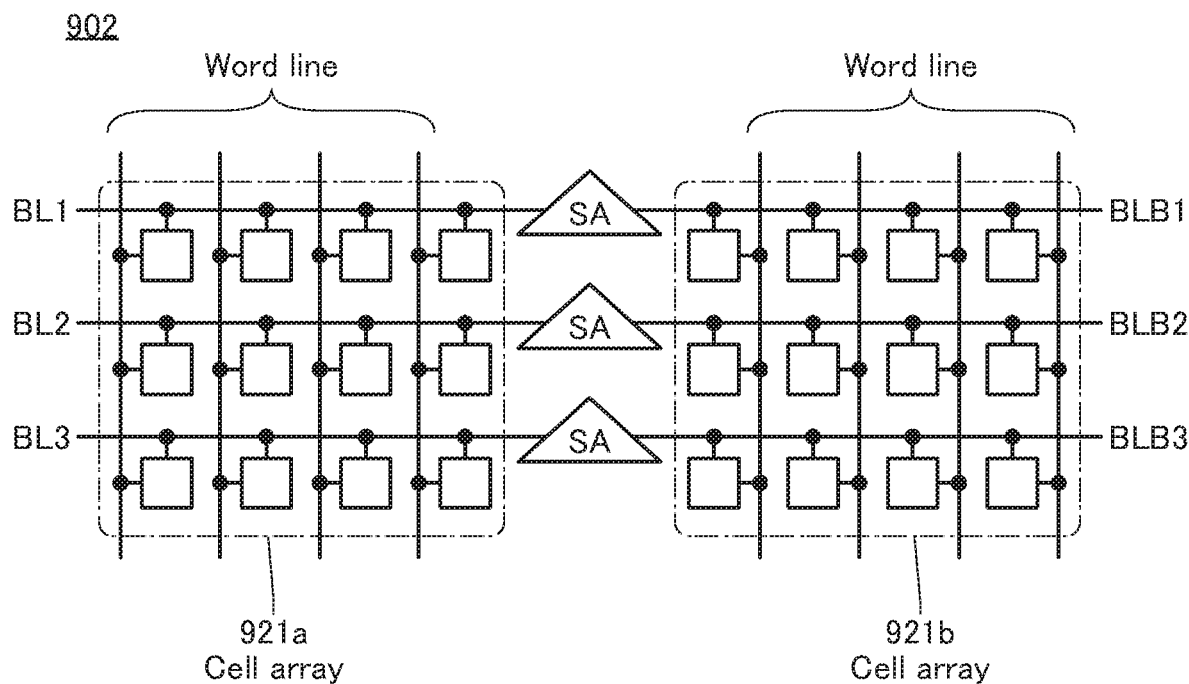

FIG. 26(B) is a block diagram illustrating an open bit-line memory device 902. In the open bit-line memory device 902, the bit lines BL are provided in a cell array 921a and the bit lines BLB are provided in a cell array 921b. A plurality of word lines are provided in each of the cell array 921a and the cell array 921b.

In the open bit-line memory device 902, memory cells can be provided in the vicinity of all the intersection points because the bit line BL and the bit line BLB are provided in different cell arrays and the word lines are provided in each cell array. This facilitates high integration of cell arrays.

Data retained in the memory cell 911 is read by the sense amplifier SA. When a specific memory cell 911 is selected by the word line, the data of the selected memory cell 911 is supplied to the bit line (bit line BL or bit line BLB), whereby the potential of the bit line changes. The sense amplifier SA amplifies and outputs a potential difference between the bit line BL and the bit line BLB.

FIG. 27(A1) illustrates the bit lines and the sense amplifiers SA of the memory device 901. FIG. 27(A2) is a timing chart showing the potential change of the bit lines.

The bit lines are capacitively coupled with each other through a parasitic capacitance. For example, a parasitic capacitance CpA exists between the bit line BLB1 and the bit line BL2. Thus, when the potential of the bit line BLB1 is inverted by data writing, the potential of the bit line BL2 adjacent to the bit line BLB1 may be also inverted.

The malfunction of the memory device 901 is described with reference to FIG. 27(A2). In a period T0, the potential of each of the bit line BL1 and the bit line BLB2 is slightly lower than H potential and the potential of each of the bit line BLB1 and the bit line BL2 is slightly higher than L potential. When the bit line BLB1 is supplied with the H potential in a period T1, the potential of the bit line BL2 that is capacitively coupled with the bit line BLB1 through the parasitic capacitance CpA also increases and may become higher than the potential of the bit line BLB2. Since the sense amplifier SA amplifies a slight potential difference, wrong data is read from a bit line pair including the bit line BL2. That is, the potential change of the bit line BLB1 affects the bit line BL2 as noise.

The influence of the noise can be reduced by making the bit line BL2 and the bit line BLB2 intersect with each other. In this specification and the like, a bit line pair including an intersection point of the bit line BL and the bit line BLB is referred to as a "twisted bit line pair". FIG. 27(B1) illustrates the bit lines and the sense amplifiers SA of the memory device 901 including a twisted bit line pair. FIG. 27(B2) is a timing chart showing the potential change of the twisted bit line pair.

In FIG. 27(B1), a bit line pair including the bit line BL2 and the bit line BLB2 is a twisted bit line pair. The twisted bit line pair illustrated in FIG. 27(B1) includes three intersection points 931 and part of the bit line BL2 and part of the bit line BLB2 are adjacent to the bit line BLB1. Specifically, a region D1 and a region D2 of the bit line BL2 and a region DB1 and a region DB2 of the bit line BLB2 are adjacent to the bit line BLB1.

As described above, the parasitic capacitance CpA exists between the bit line BLB1 and the bit line BL2. A parasitic capacitance between the bit line BLB1 and the bit line BLB2 is denoted as a parasitic capacitance CpB. The capacitance value of the parasitic capacitance CpA is proportional to the total length of the region D1 and the region D2, for example. Similarly, the capacitance value of the parasitic capacitance CpB is proportional to the total length of the region DB1 and the region DB2. The capacitance value of the parasitic capacitance CpA is preferably equal to the capacitance value of the parasitic capacitance CpB. Thus, the total length of the regions of the bit line BL2 that are adjacent to the bit line BLB1 (the total length of the region D1 and the region D2) is preferably the same as the total length of the regions of the bit line BLB2 that are adjacent to the bit line BLB1 (the total length of the region DB1 and the region DB2).

Note that, the capacitance value of the parasitic capacitance CpA is also proportional to the total number of memory cells connected to the region D1 and memory cells connected to the region D2. Similarly, the capacitance value of the parasitic capacitance CpB is also proportional to the total number of memory cells connected to the region DB1 and memory cells connected to the region DB2. Thus, the total number of the memory cells connected to the region D1 and the memory cells connected to the region D2 is preferably the same as the total number of the memory cells connected to the region DB1 and the memory cells connected to the region DB2.

The potential change of the twisted bit line pair is described with reference to FIG. 27(B2). In a period T0, the potential of each of the bit line BL1 and the bit line BLB2 is slightly lower than H potential and the potential of each of the bit line BLB1 and the bit line BL2 is slightly higher than L potential. When the bit line BLB1 is supplied with the H potential in a period T1, the potential of the bit line BL2 that is capacitively coupled with the bit line BLB1 through the parasitic capacitance CpA increases. Moreover, the potential of the bit line BLB2 that is capacitively coupled with the bit line BLB1 through the parasitic capacitance CpB also increases. As described above, both of the potential of the bit line BL2 and the potential of the bit line BLB2 increase in the twisted bit line pair; therefore, a potential difference between those bit lines hardly changes even when affected by noise.

A folded bit-line memory device in which twisted bit line pairs and non-twisted bit line pairs are alternately provided is prevented from malfunctioning due to noise, and thus can have high reliability. On the contrary, an open-bit line memory device cannot include a twisted bit line pair because the bit line BL and the bit line BLB that form one bit line pair exist in different cell arrays on the same plane.

<<Memory Device 100>>

FIG. 1 is a block diagram showing a configuration example of a memory device 100 which is one embodiment of the present invention.

The memory device 100 includes an input/output circuit 111 (IO Circuit), a control circuit 112 (Controller), an I2C receiver 113 (I2C Receiver), a setting resister 114 (Setting Resister), an LVDS circuit 115, an LVDS circuit 116, a decoder 117 (Decoder), and a memory block array 210 (Memory Block Array).

In addition, the control circuit 112 includes a register 118 (Reg_r) and a register 119 (Reg_w). In addition, the memory block array 210 includes n (n is an integer greater than or equal to 1) memory blocks 211. In this specification and the like, a first memory block 211 is referred to as a memory block 211_1, and an i-th (i is an integer greater than or equal to 1 and less than or equal to n) memory block 211 is referred to as a memory block 211_i.

The input/output circuit 111 has a function of delivering a signal from/to an external device. Operation conditions and the like of the memory device 100 are determined by a setting parameter stored in the setting resister 114. The setting parameter is written into the setting resister 114 through the input/output circuit 111 and the I2C receiver 113. Note that the I2C receiver 113 may be omitted depending on the purpose, the use, or the like.

Examples of the setting parameter are designation information about execution intervals of refresh operations or operation timings of circuit operations, and the like. The control circuit 112 has a function of processing the setting parameter and a command signal from the outside to determine an operation mode of the memory device 100. The control circuit 112 has a function of generating a variety of control signals to control the operation of the whole memory device 100.

In addition, the control circuit 112 is supplied with a reset signal res, an address signal ADDR[16:0], a row address identifying signal RAS (Row Address Strobe), a column address identifying signal CAS (Column Address Strobe), a writing control signal WE (Write Enable), a clock signal clk_t for data writing, writing data WDATA[7:0], and the like from the outside through the input/output circuit 111. The clock signal clk_t for data writing is supplied to the control circuit 112 through a transfer circuit LVDS_rx.

Moreover, a clock signal clk_w for data reading and reading data RDATA[7:0] are supplied from the control circuit 112 to the input/output circuit 111. The clock signal clk_w for data reading is supplied to the input/output circuit 111 through a transfer circuit LVDS_tx. The transfer circuit LVDS_rx and the transfer circuit LVDS_tx are transfer circuits that operate in accordance with the LVDS (Low voltage differential signaling) standard. Note that one or both of the transfer circuit LVDS_rx and the transfer circuit LVDS_tx may be omitted depending on the purpose, the use, or the like.

The writing data WDATA[7:0] is transferred in synchronization with the clock signal clk_t for data writing and retained in the register 119 in the control circuit 112. The control circuit 112 has a function of supplying data retained in the register 119 to the memory block array 210.

Data read from the memory block array 210 is retained as the reading data RDATA[7:0] in the register 118 in the control circuit 112. The control circuit 112 has a function of transferring the reading data RDATA[7:0] to the input/output circuit 111 in synchronization with the clock signal clk_w for data reading.

The control circuit 112 has a function of outputting a column address signal C_ADDR, a column selection enable signal CSEL_EN, a data latch signal DLAT, a global writing enable signal GW_EN, a global reading enable signal GR_EN, a global sense amplifier enable signal GSA_EN, a global equalization enable signal GEQ_ENB, a local sense amplifier enable signal LSA_EN, a local equalization enable signal LEQ_ENB, a word line address selection signal WL_ADDR[7:0], and the like.

The column address signal C_ADDR and the column selection enable signal CSEL_EN are supplied to the decoder 117.

<Memory Block>

Figure 2A:
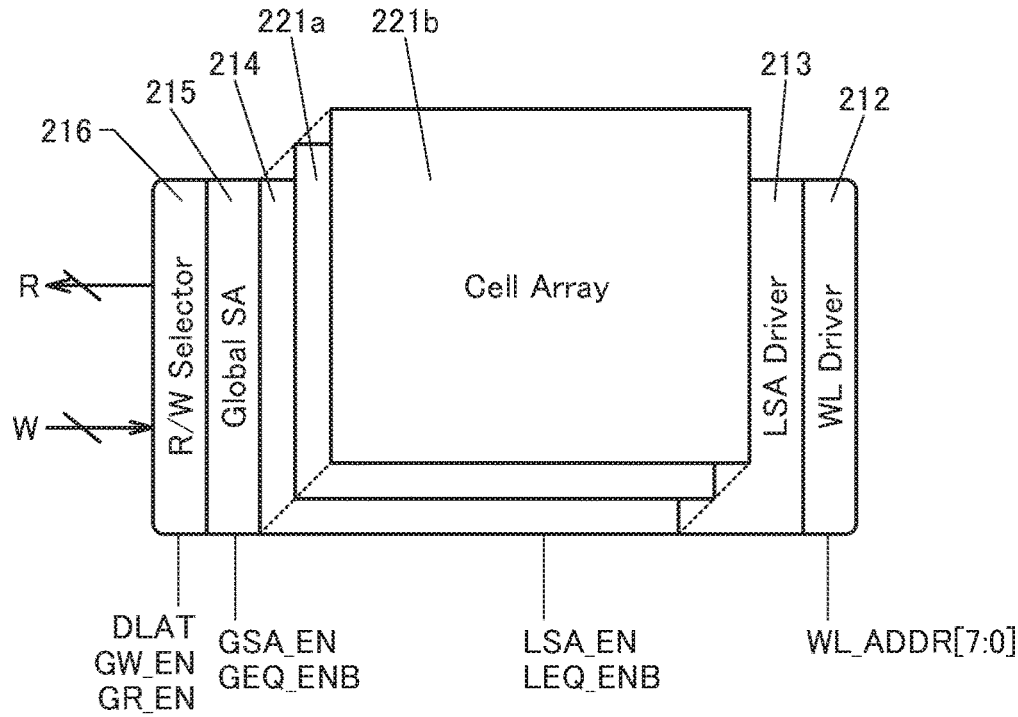
FIGS. 2A and 2B Diagrams illustrating configuration examples of a memory block.
Figure 2B:
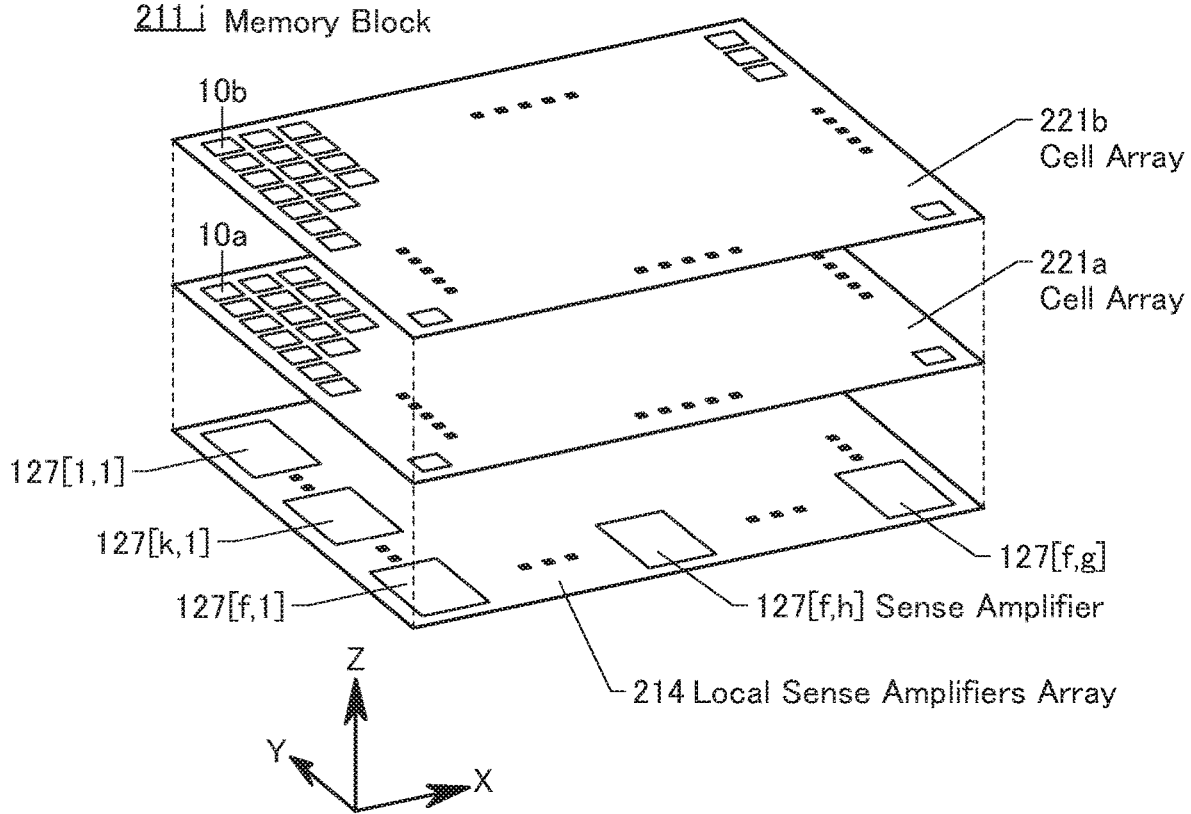

FIG. 2(A) is a block diagram illustrating a configuration example of the memory block 211_*i* (Memory Block). FIG. 2(B) is a perspective block diagram illustrating a configuration example of a local sense amplifier array 214, a cell array 221*a*, and a cell array 221*b* included in the memory block 211_*i*. In FIG. 2(B) and the like, arrows indicating the X direction, the Y direction, and the Z direction are illustrated. The X direction, the Y direction, and the Z direction are orthogonal to each other.

The memory block 211_*i* includes a word line driver 212 (WL Driver), a local sense amplifier driver 213 (LSA Driver), the local sense amplifier array 214, a global sense amplifier 215 (Global SA), a read/write selector 216 (R/W Selector), a cell array 221*a* (Cell Array), and a cell array 221*b* (Cell Array).

The data latch signal DLAT, the global writing enable signal GW_EN, and the global reading enable signal GR_EN are supplied to the read/write data selector 216. The global sense amplifier enable signal GSA_EN and the global equalization enable signal GEQ_ENB are supplied to the global sense amplifier 215. The local sense amplifier enable signal LSA_EN and the local equalization enable signal LEQ_ENB are supplied to the local sense amplifier array 214. The word line address selection signal WL_ADDR[7:0] is supplied to the word line driver 212.

The local sense amplifier array 214 (Local Sense Amplifiers Array) includes a plurality of sense amplifiers 127 (Sense Amplifier) arranged in a matrix of f rows and g columns (f and g are each an integer greater than or equal to 1). In this specification and the like, the sense amplifier 127 in a first row and a first column is denoted by a sense amplifier 127[1, 1]. In addition, the sense amplifier 127 in a k-th row and an h-th column (k is an integer greater than or equal to 1 and less than or equal to f, h is an integer greater than or equal to 1 and less than or equal to g) is denoted by a sense amplifier 127[k,h].

The cell array 221*a* is provided to overlap the local sense amplifier array 214, and the cell array 221*b* is provided to overlap the cell array 221*a*. When the cell array 221*a* and the cell array 221*b* are provided to overlap the local sense amplifier array 214, the wiring length of the bit line can be reduced. In addition, when the cell array 221*a* and the cell array 221*b* are provided to overlap with each other, the packing density of the memory cells can be increased.

The cell array 221*a* includes a plurality of memory cells 10*a* arranged in a matrix of p rows and q columns (p and q are each an integer greater than or equal to 1). The cell array 221*b* includes a plurality of memory cells 10*b* arranged in a matrix of p rows and q columns. The cell array 221*a* also includes p word lines WLa extending in the X-direction (row direction) (not illustrated in FIG. 2(B)). The cell array 221*b* also includes p word lines WLb extending in the X-direction (row direction) (not illustrated in FIG. 2(B)). Note that in this specification and the like, a j-th (j is an integer greater than or equal to 1 and less than or equal to p) word line WLa is denoted by a word line WLa[j] and a j-th word line WLb is denoted by a word line WLb[j].

One memory cell 10*a* is electrically connected to one of the word lines WLa. In addition, one memory cell 10*b* is electrically connected to one of the word lines WLb.

Figure 3:
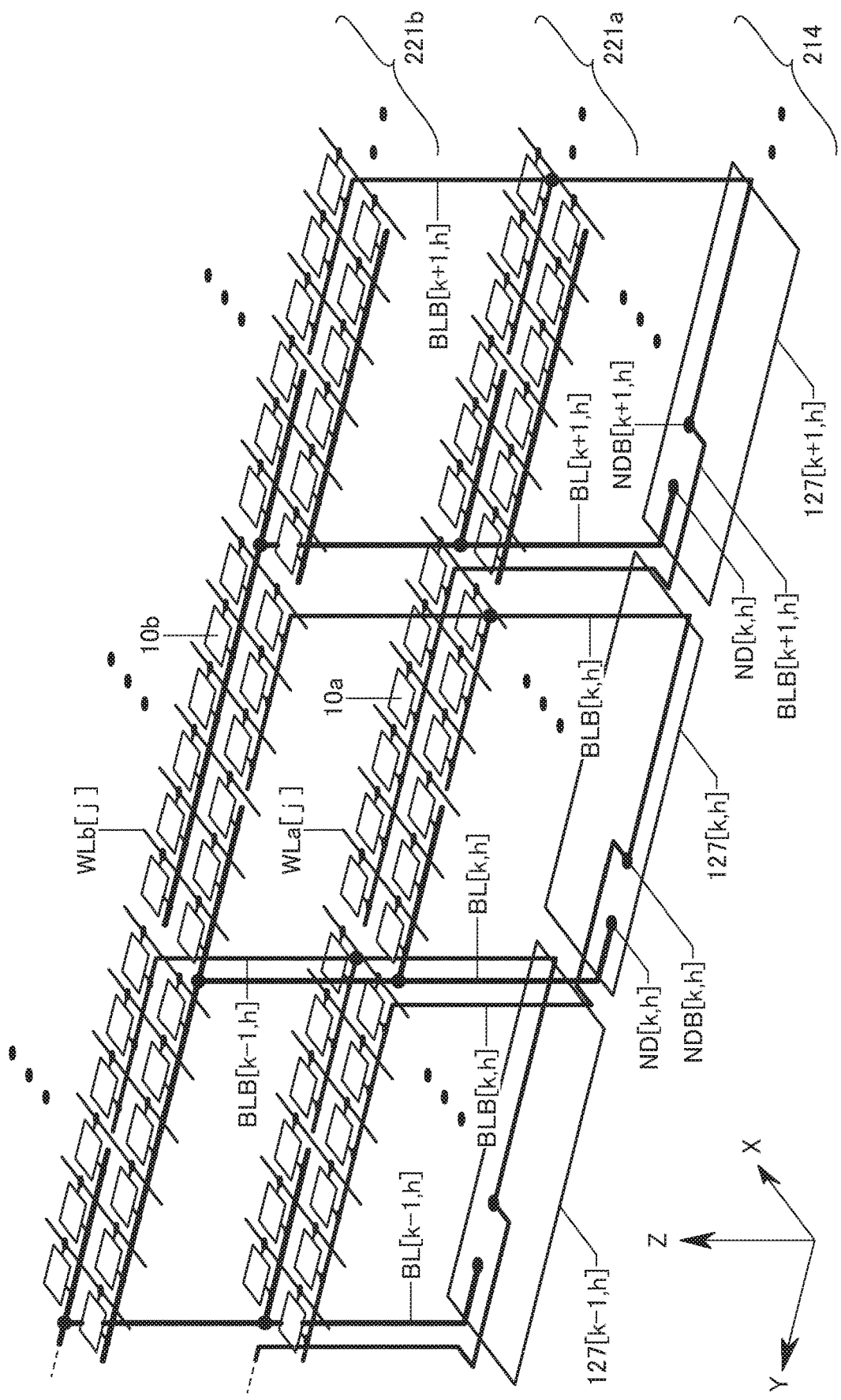
FIG. 3 A diagram illustrating a connection relationship between sense amplifiers and memory cells.
Figure 4:
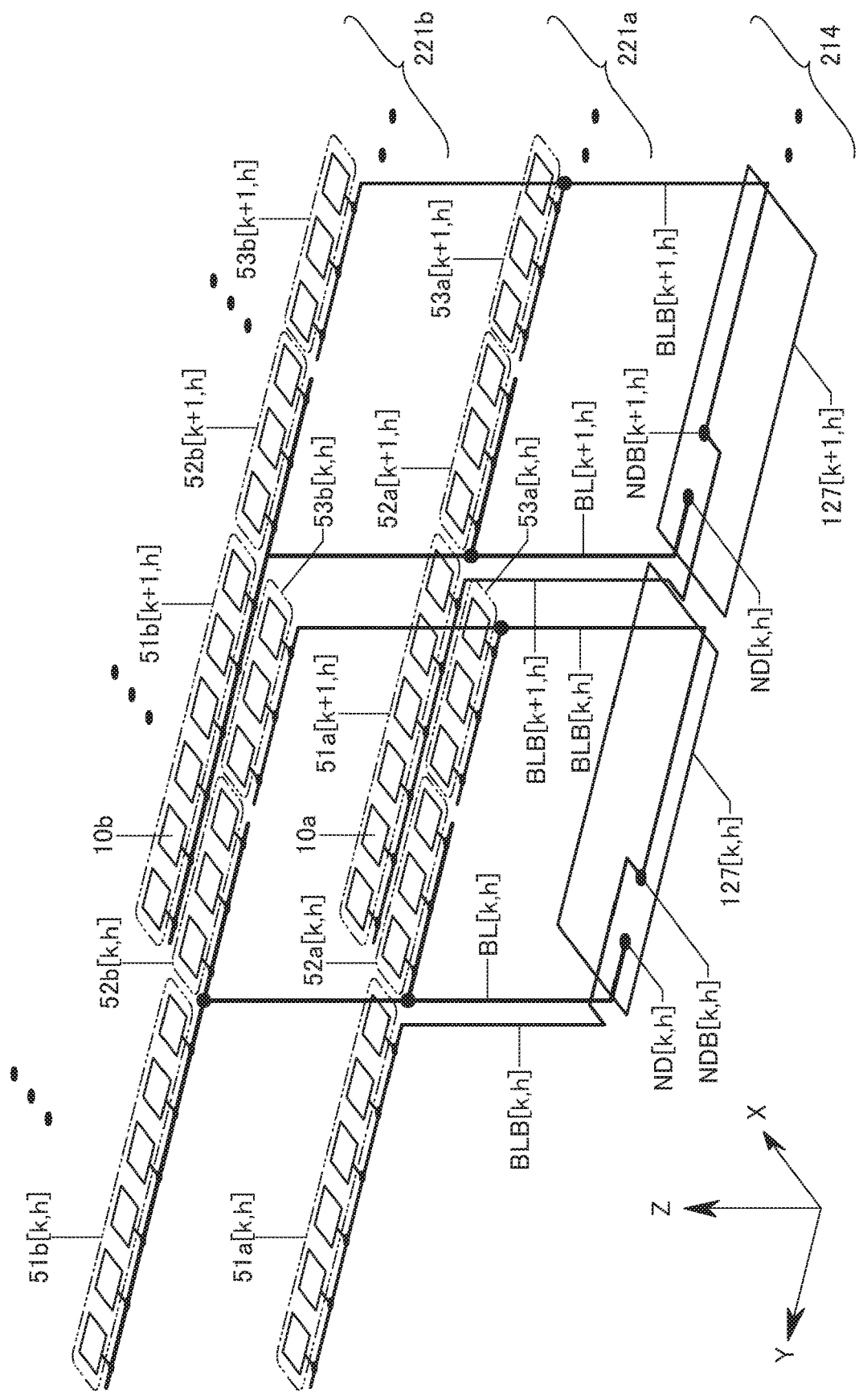
FIG. 4 A diagram illustrating a connection relationship between sense amplifiers and memory cells.

FIG. 3 and FIG. 4 are perspective block diagrams illustrating the connection relationship between the sense amplifiers 127, the memory cells 10*a*, and the memory cells 10*b*. FIG. 3 and FIG. 4 illustrate part of the local sense amplifier array 214, part of the cell array 221*a*, and part of the cell array 221*b* included in the memory block 211. The sense amplifier 127 illustrated in FIG. 3 and FIG. 4 is a two-cell width type sense amplifier. In this specification and the like, the "two-cell width type sense amplifier" refers to a sense amplifier whose length in the X-direction is roughly equivalent to two memory cells.

FIG. 3 illustrates a sense amplifier 127[k,h], a sense amplifier 127[k−1,h], a sense amplifier 127[k+1,h], and the memory cells 10*a* and memory cells 10*b* which are electrically connected to these sense amplifiers 127. Note that FIG. 3 illustrates the case where twelve memory cells 10*a* and twelve memory cells 10*b* are electrically connected to one sense amplifier 127, as an example. However, the number of the memory cells 10*a* and the memory cells 10*b* which are electrically connected to one sense amplifier 127 is not limited this example.

Figure 5:
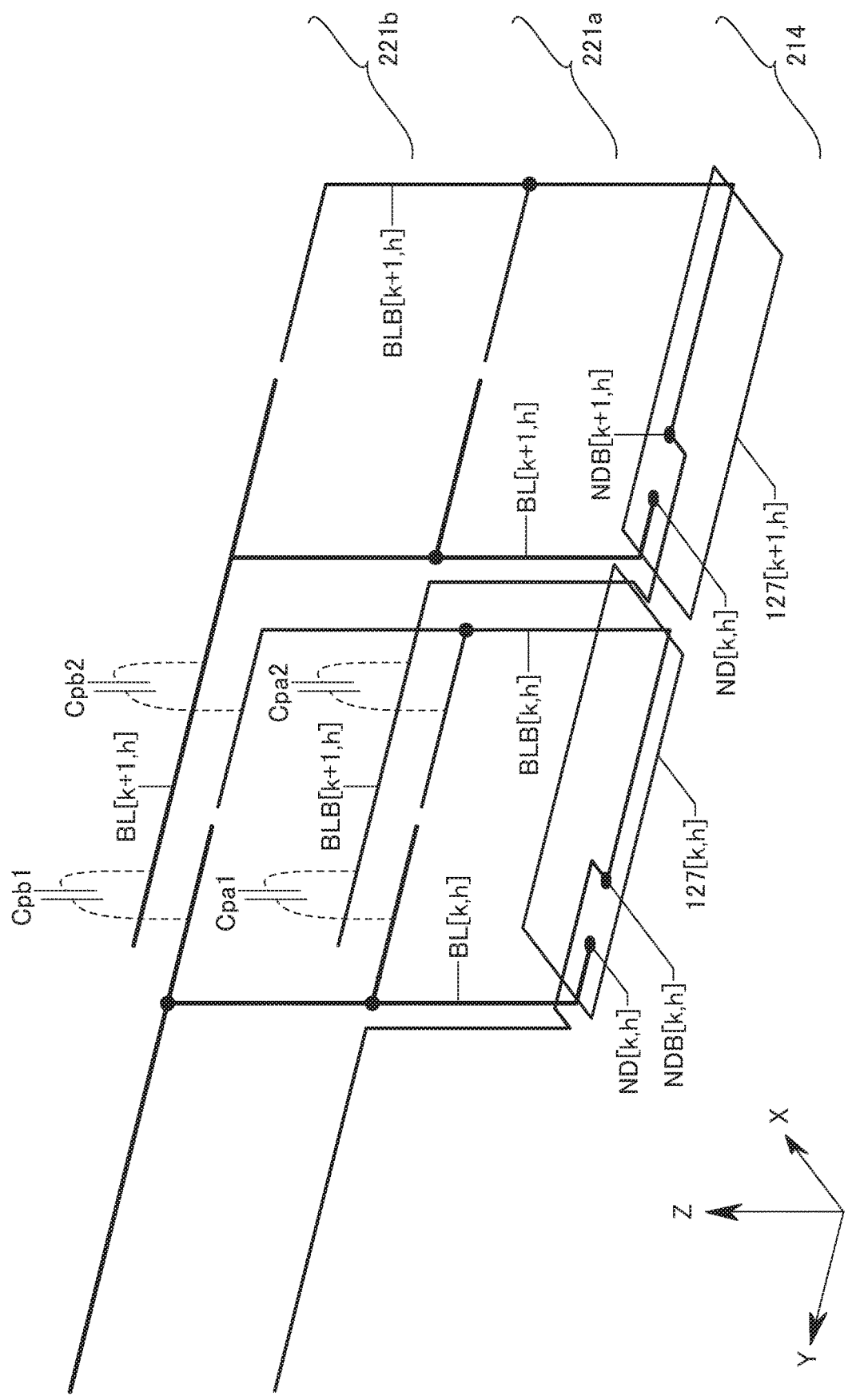
FIG. 5 A diagram illustrating an arrangement example of bit line pair.

FIG. 4 is a perspective block diagram illustrating the connection relationship between the sense amplifiers 127, the memory cells 10*a*, and the memory cells 10*b*. FIG. 4 illustrates the memory cells electrically connected to the sense amplifier 127[k,h] and the memory cells electrically connected to the sense amplifier 127[k+1,h]. Note that in FIG. 4, description of the word line WLa and the word line WLb is omitted. Moreover, FIG. 5 is a diagram illustrating the sense amplifier 127[k,h], the sense amplifier 127[k+1,h], and the bit lines BL and bit lines BLB that correspond to the respective sense amplifiers.

One sense amplifier 127 is electrically connected to one bit line pair. Among the bit line BL and bit line BLB included in the bit line pair, the bit line BL is electrically connected to a node ND of the sense amplifier 127 and the bit line BLB is electrically connected to a node NDB of the sense amplifier 127. The sense amplifier 127 has a function of amplifying a potential difference between the bit line BL and the bit line BLB.

In this specification and the like, the bit line BL electrically connected to the sense amplifier 127[k,h] is denoted by a bit line BL[k,h]. In addition, the bit line BLB electrically connected to the sense amplifier 127[k,h] is denoted by a bit line BLB[k,h]. The node ND of the sense amplifier 127[k,h] is denoted by a node ND[k,h]. In addition, the node NDB of the sense amplifier 127[k,h] is denoted by a node NDB[k,h].

One memory cell 10*a* is electrically connected to any one of the bit lines BL or any one of the bit lines BLB. In addition, one memory cell 10*b* is electrically connected to any one of the bit lines BL or any one of the bit lines BLB.

The cell array 221*a* includes a memory cell group 51*a* including A (A is an integer greater than or equal to 1) memory cells 10*a*, a memory cell group 52*a* including B (B is an integer greater than or equal to 1) memory cells 10*a*, and a memory cell group 53*a* including C (C is an integer greater than or equal to 1) memory cells 10*a*.

The cell array 221*b* includes a memory cell group 51*b* including D (D is an integer greater than or equal to 1) memory cells 10*b*, a memory cell group 52*b* including E (E is an integer greater than or equal to 1) memory cells 10*b*, and a memory cell group 53*b* including F (F is an integer greater than or equal to 1) memory cells 10*b*.

The memory cells 10a included in the memory cell group 51a and the memory cell group 53a and the memory cells 10b included in the memory cell group 53b are each electrically connected to the bit line BLB.

The memory cells 10b included in the memory cell group 51b and the memory cell group 52b and the memory cells 10a included in the memory cell group 52a are each electrically connected to the bit line BL.

Thus, the bit line BL includes a region where it is electrically connected to the memory cells 10a in the cell array 221a and a region where it is electrically connected to the memory cells 10b in the cell array 221b. Similarly, the bit line BLB includes a region where it is electrically connected to the memory cells 10a in the cell array 221a and a region where it is electrically connected to the memory cells 10b in the cell array 221b.

In this specification and the like, the memory cell group 51a electrically connected to the sense amplifier 127[k,h] through the bit line BL[k,h] or the bit line BLB[k,h] is denoted by a memory cell group 51a[k,h]. In addition, the memory cell group 52a, the memory cell group 53a, the memory cell group 51b, the memory cell group 52b, and the memory cell group 53b are denoted in a similar manner.

In addition, when the memory cell array 221a is seen from the X-direction (row direction), a memory cell group 51a[k+1,h] includes a region overlapping with a memory cell group 52a[k,h] and a region overlapping with a memory cell group 53a[k,h]. In other words, when the memory cell array 221a is seen from the X-direction (row direction), a bit line BLB[k+1,h] includes a region overlapping with the bit line BL[k,h] and a region overlapping with the bit line BLB[k,h].

In addition, when the memory cell array 221a is seen from the Z-direction, the memory cell group 51a[k+1,h] includes a region adjacent to the memory cell group 52a[k,h] and a region adjacent to the memory cell group 53a[k,h]. In other words, when the memory cell array 221a is seen from the Z-direction, the bit line BLB[k+1,h] includes a region adjacent to the bit line BL[k,h] and a region adjacent to the bit line BLB[k,h].

In addition, when the memory cell array 221b is seen from the X-direction (row direction), a memory cell group 51b[k+1,h] includes a region overlapping with a memory cell group 52b[k,h] and a region overlapping with a memory cell group 53b[k,h]. In other words, when the memory cell array 221b is seen from the X-direction (row direction), a bit line BL[k+1,h] includes a region overlapping with the bit line BL[k,h] and a region overlapping with the bit line BLB[k,h].

In addition, when the memory cell array 221b is seen from the Z-direction, the memory cell group 51b[k+1,h] includes a region adjacent to the memory cell group 52b[k,h] and a region adjacent to the memory cell group 53b[k,h]. In other words, when the memory cell array 221b is seen from the Z-direction, the bit line BL[k+1,h] includes a region overlapping with the bit line BL[k,h] and a region overlapping with the bit line BLB[k,h].

The parasitic capacitance of the bit line BL and the parasitic capacitance of the bit line BLB change depending on the number of memory cells electrically connected to the bit lines.

Moreover, in the cell array 221a, the capacitance values of a parasitic capacitance Cpa1 generated between the bit line BL[k,h] and the bit line BLB[k+1,h] and a parasitic capacitance Cpa2 generated between the bit line BLB[k,h] and the bit line BL[k+1,h] are preferably equal (see FIG. 5). Specifically, the capacitance value of the parasitic capacitance Cpa1 is preferably greater than or equal to 0.8 times and less than or equal to 1.2 times, further preferably greater than or equal to 0.9 times and less than or equal to 1.1 times, still further preferably greater than or equal to 0.95 times and less than or equal to 1.05 times that of the parasitic capacitance Cpa2. When the parasitic capacitance Cpa1 and the parasitic capacitance Cpa2 are made equal or close to each other, the influence of noise can be further reduced.

Therefore, B, which is the number of the memory cells 10a included in the memory cell group 52a[k,h], is preferably equal to C, which is the number of the memory cells 10a included in the memory cell group 53a[k,h]. Specifically, C is preferably greater than or equal to 0.8 times and less than or equal to 1.2 times, further preferably greater than or equal to 0.9 times and less than or equal to 1.1 times, still further preferably greater than or equal to 0.95 times and less than or equal to 1.05 times B.

In this case, the parasitic capacitance Cpa1 corresponds to one of a parasitic capacitance CpA and a parasitic capacitance CpB illustrated in FIG. 27(B1), and the parasitic capacitance Cpa2 corresponds to the other.

Moreover, in the cell array 221b, the capacitance values of a parasitic capacitance Cpb1 generated between the bit line BL[k,h] and the bit line BL[k+1,h] and a parasitic capacitance Cpb2 generated between the bit line BLB[k,h] and the bit line BLB[k+1,h] are preferably equal. Specifically, the capacitance value of the parasitic capacitance Cpb1 is preferably greater than or equal to 0.8 times and less than or equal to 1.2 times, further preferably greater than or equal to 0.9 times and less than or equal to 1.1 times, still further preferably greater than or equal to 0.95 times and less than or equal to 1.05 times that of the parasitic capacitance Cpb2. When the parasitic capacitance Cpb1 and the parasitic capacitance Cpb2 are made equal or close to each other, the influence of noise can be further reduced.

Therefore, E, which is the number of the memory cells 10b included in the memory cell group 52b[k,h], is preferably equal to F, which is the number of the memory cells 10a included in the memory cell group 53b[k,h]. Specifically, F is preferably greater than or equal to 0.8 times and less than or equal to 1.2 times, further preferably greater than or equal to 0.9 times and less than or equal to 1.1 times, still further preferably greater than or equal to 0.95 times and less than or equal to 1.05 times E.

In this case, the parasitic capacitance Cpb1 corresponds to one of a parasitic capacitance CpA and a parasitic capacitance CpB illustrated in FIG. 27(B1), and the parasitic capacitance Cpb2 corresponds to the other.

In addition, the bit line BL[k,h] may be affected by noise from the bit line BL[k+1,h] and the bit line BLB[k+1,h]. In this case, the capacitance values of the parasitic capacitance Cpa1 and the parasitic capacitance Cpb1 are preferably equal to each other. Specifically, the capacitance value of the parasitic capacitance Cpa1 is preferably greater than or equal to 0.8 times and less than or equal to 1.2 times, further preferably greater than or equal to 0.9 times and less than or equal to 1.1 times, still further preferably greater than or equal to 0.95 times and less than or equal to 1.05 times that of the parasitic capacitance Cpb1. When the parasitic capacitance Cpa1 and the parasitic capacitance Cpb1 are made equal or close to each other, the influence of noise can be further reduced.

Therefore, B, which is the number of the memory cells 10a included in the memory cell group 52a[k,h], is preferably equal to E, which is the number of the memory cells 10b included in the memory cell group 52b[k,h]. Specifically, E is preferably greater than or equal to 0.8 times and less than or equal to 1.2 times, further preferably greater than or equal to 0.9 times and less than or equal to 1.1 times, still further preferably greater than or equal to 0.95 times and less than or equal to 1.05 times B.

In this case, the parasitic capacitance Cpa1 corresponds to one of a parasitic capacitance CpA and a parasitic capacitance CpB illustrated in FIG. 27(B1), and the parasitic capacitance Cpb1 corresponds to the other.

In addition, the bit line BLB[k,h] may be affected by noise from the bit line BL[k+1,h] and the bit line BLB[k+1,h]. In this case, the capacitance values of the parasitic capacitance Cpa2 and the parasitic capacitance Cpb2 are preferably equal to each other. Specifically, the capacitance value of the parasitic capacitance Cpa2 is preferably greater than or equal to 0.8 times and less than or equal to 1.2 times, further preferably greater than or equal to 0.9 times and less than or equal to 1.1 times, still further preferably greater than or equal to 0.95 times and less than or equal to 1.05 times that of the parasitic capacitance Cpb2. When the parasitic capacitance Cpa2 and the parasitic capacitance Cpb2 are made equal or close to each other, the influence of noise can be further reduced.

Therefore, C, which is the number of the memory cells 10a included in the memory cell group 53a[k,h], is preferably equal to F, which is the number of the memory cells 10b included in the memory cell group 53b[k,h]. Specifically, F is preferably greater than or equal to 0.8 times and less than or equal to 1.2 times, further preferably greater than or equal to 0.9 times and less than or equal to 1.1 times, still further preferably greater than or equal to 0.95 times and less than or equal to 1.05 times C.

In this case, the parasitic capacitance Cpa2 corresponds to one of a parasitic capacitance CpA and a parasitic capacitance CpB illustrated in FIG. 27(B1), and the parasitic capacitance Cpb2 corresponds to the other.

It is preferable that A, which is the number of the memory cells 10a included in the memory cell group 51a[k+1,h], be equal to the sum of B, which is the number of the memory cells 10a included in the memory cell group 52a[k,h], and C, which is the number of the memory cells 10a included in the memory cell group 53a[k,h]. Specifically, the sum of B and C is preferably greater than or equal to 0.8 times and less than or equal to 1.2 times, further preferably greater than or equal to 0.9 times and less than or equal to 1.1 times, still further preferably greater than or equal to 0.95 times and less than or equal to 1.05 times A.

Moreover, B, which is the number of the memory cells 10a included in the memory cell group 52a[k,h], is preferably equal or substantially equal to C, which is the number of the memory cells 10a included in the memory cell group 53a[k,h]. Specifically, B is preferably greater than or equal to 0.8 times and less than or equal to 1.2 times, further preferably greater than or equal to 0.9 times and less than or equal to 1.1 times, still further preferably greater than or equal to 0.95 times and less than or equal to 1.05 times C.

Moreover, E, which is the number of the memory cells 10b included in the memory cell group 52b[k,h], is preferably equal or substantially equal to F, which is the number of the memory cells 10b included in the memory cell group 53b[k,h]. Specifically, E is preferably greater than or equal to 0.8 times and less than or equal to 1.2 times, further preferably greater than or equal to 0.9 times and less than or equal to 1.1 times, still further preferably greater than or equal to 0.95 times and less than or equal to 1.05 times F.

It is preferable that D, which is the number of the memory cells 10b included in the memory cell group 51b[k+1,h], be equal to the sum of E, which is the number of the memory cells 10b included in the memory cell group 52b[k,h], and F, which is the number of the memory cells 10b included in the memory cell group 53b[k,h]. Specifically, the sum of E and F is preferably greater than or equal to 0.8 times and less than or equal to 1.2 times, further preferably greater than or equal to 0.9 times and less than or equal to 1.1 times, still further preferably greater than or equal to 0.95 times and less than or equal to 1.05 times D.

According to one embodiment of the present invention, the effect of reducing noise can be obtained as in a twisted bit-line pair method without providing an intersection portion generated in the twisted bit-line pair method. Thus, both the reliability and memory cell packing density of the memory device 100 can be increased.

[Memory Cell]

Figure 6A:
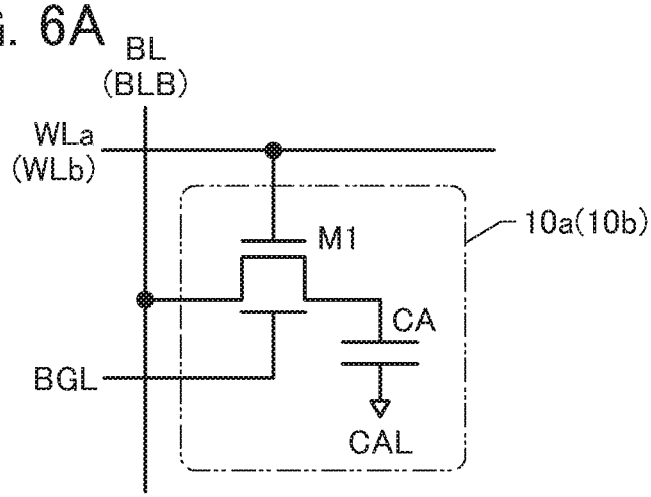
FIGS. 6A to 6C Diagrams illustrating circuit configuration examples of a memory cell.

FIG. 6(A) shows an example of a circuit configuration that can be used for the memory cell 10a and the memory cell 10b. The memory cell 10a and the memory cell 10b each include a transistor M1 and a capacitor CA. The transistor M1 includes a front gate (also simply referred to as a gate in some cases) and a back gate. The back gate is positioned so that a channel formation region of a semiconductor layer is sandwiched between the gate and the back gate. By changing the potential of the back gate, the threshold voltage of the transistor can be changed. The potential of the back gate may be equal to that of the gate or may be a given fixed potential such as a ground potential GND.

One of a source and a drain of the transistor M1 is electrically connected to one electrode of the capacitor CA, the other of the source and the drain of the transistor M1 is electrically connected to one of the bit line BL and the bit line BLB, the gate of the transistor M1 is electrically connected to one of the word line WLa and the word line WLb, and the back gate of the transistor M1 is electrically connected to a wiring BGL. The other electrode of the capacitor CA is electrically connected to a wiring CAL.

The wiring CAL functions as a wiring for applying a predetermined potential to the other electrode of the capacitor CA. At the time of data writing and reading, a low-level potential (also referred to as a reference potential in some cases) is preferably applied to the wiring CAL.

The wiring BGL functions as a wiring for applying a potential to the back gate of the transistor M1. By applying a given potential to the wiring BGL, the threshold voltage of the transistor M1 can be changed.

Data writing and reading are performed in such a manner that a potential that brings the transistor M1 into a conductive state (an on state) is supplied to the word line WLa and/or the word line WLb to bring the transistor M1 into a conductive state and the bit line BL or the bit line BLB and the one electrode of the capacitor CA are electrically connected to each other.

Figure 6B:
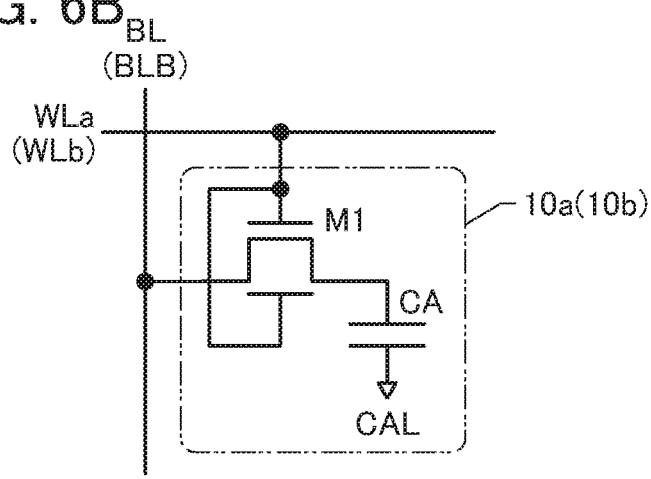

Alternatively, a circuit configuration shown as an example in FIG. 6(B) may be used for the memory cell 10a and the memory cell 10b. In the circuit configuration example shown in FIG. 6(B), the back gate of the transistor M1 is electrically connected not to the wiring BGL, but the word line WLa or the word line WLb. Such a configuration enables the same voltage to be applied to the gate of the transistor M1 and the back gate of the transistor M1, and thus increases a current (on-state current) flowing through the source and the drain of the transistor M1 when the transistor M1 is in an on state.

Figure 6C:
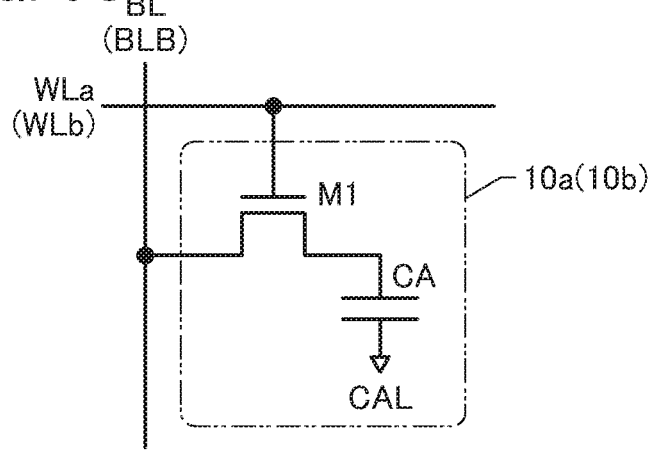

Alternatively, the transistor M1 may be a single-gate transistor, that is, a transistor that does not include a back gate. FIG. 6C shows a circuit configuration example in which the transistor M1 is a single-gate transistor. Since the transistor M1 shown in FIG. 6C does not include a back gate, the manufacturing process of the memory cell can be shortened.

A transistor in which an oxide semiconductor is used for a semiconductor layer where a channel is formed (also referred to as an "OS transistor") is preferably used as the transistor M1. For the semiconductor layer where a channel is formed, for example, an oxide semiconductor containing one of indium, an element M (aluminum, gallium, yttrium, or tin), and zinc can be used. In particular, an oxide semiconductor containing indium, gallium, and zinc is preferably used for the semiconductor layer of the OS transistor.

The OS transistor using the oxide semiconductor containing indium, gallium, and zinc has a characteristic of an extremely low off-state current. The use of the OS transistor as the transistor M1 enables the transistor M1 to have an extremely low leakage current. That is, written data can be retained by the transistor M1 for a long time, and thus the frequency of the refresh operation for the memory cell can be decreased. Moreover, the refresh operation for the memory cell can be omitted. Owing to an extremely low leakage current, the memory cell can retain multilevel data or analog data.

Figure 7A:
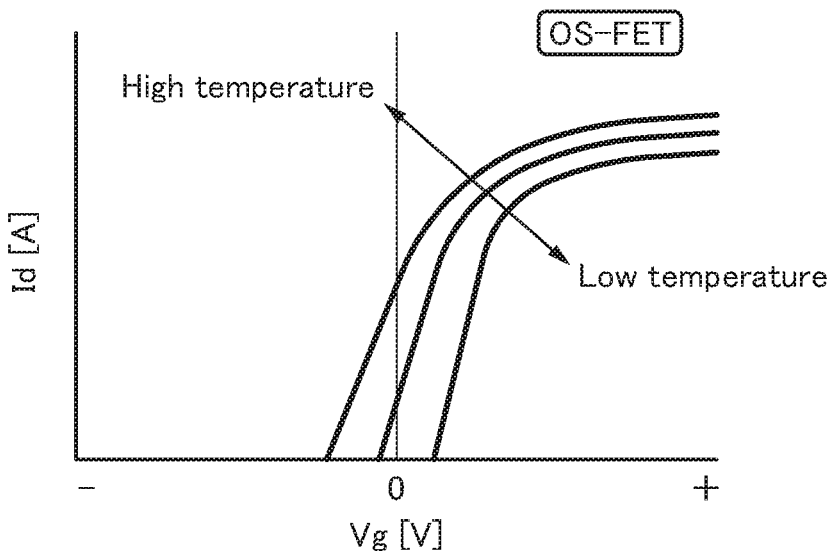
FIGS. 7A and 7B Diagrams showing electrical characteristics of transistors.
Figure 7B:
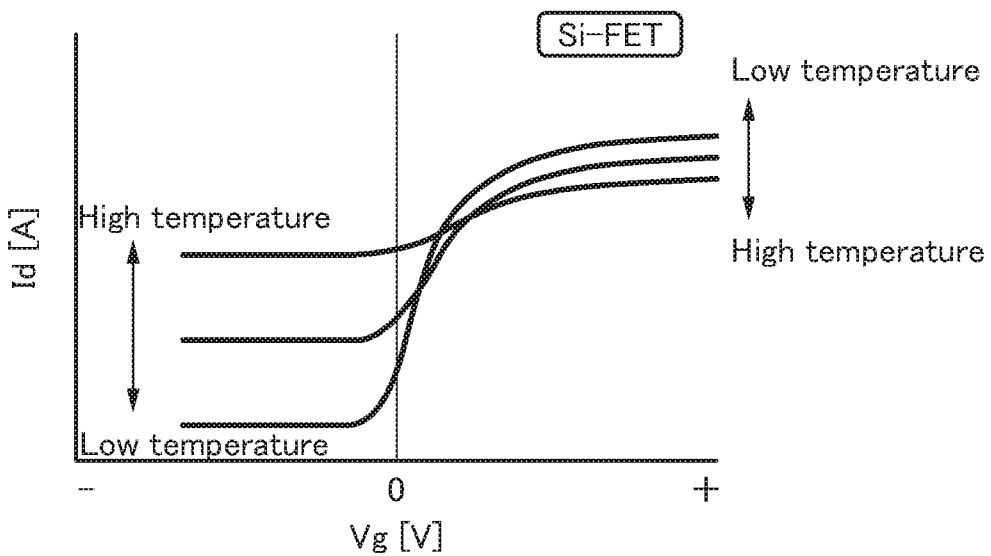

Here, temperature dependence of Id-Vg characteristics, which is one of the electrical characteristics of a transistor, is described. FIG. 7(A) and FIG. 7(B) show an example of Id-Vg characteristics, which are the electrical characteristics of a transistor. The Id-Vg characteristics show a change in drain current (Id) with respect to a change in gate voltage (Vg). The horizontal axis in FIG. 7(A) and FIG. 7(B) represents Vg on a linear scale. The vertical axis in FIG. 7(A) and FIG. 7(B) represents Id on a log scale.

FIG. 7(A) shows the Id-Vg characteristics of an OS transistor. FIG. 7(B) shows the Id-Vg characteristics of a transistor using silicon in a semiconductor layer in which a channel is formed (also referred to as a "Si transistor"). Note that both FIG. 7(A) and FIG. 7(B) show the Id-Vg characteristics of an n-channel transistor.

Both an OS transistor and a Si transistor have properties that the Vth shifts in the negative direction with increasing temperature and the subthreshold swing increases with increasing temperature. As a result, Id (also referred to as a "cut-off current") when Vg is 0 V increases with increasing temperature.

The off-state current of an OS transistor is unlikely to increase even when it operates at high temperature (see FIG. 7(A)). In addition, with increasing operating temperature, the on-state current of an OS transistor increases. By contrast, the off-state current of a Si transistor increases and the on-state current decreases with increasing temperature (see FIG. 7(B)).

The off-state current of an OS transistor can be decreased even at high temperature when the Vg is set to a negative voltage, as shown in FIG. 7(A). Thus, when an OS transistor is used as the transistor M1, the power consumption of the whole semiconductor device including the transistor M1 can be reduced even in the operation at high temperatures.

In this specification and the like, a DRAM using an OS transistor is referred to as a dynamic oxide semiconductor random access memory (DOSRAM). A DOSRAM can be formed by using the OS transistor as the transistor M1.

This embodiment can be implemented in an appropriate combination with any of the structures described in the other embodiments and the like.

Embodiment 2

In this embodiment, a modification example of the memory block 211 described in the above embodiment is described. The above embodiment can be referred to for the portions that are not described in this embodiment.

When the cell array 221a and the cell array 221b are stacked, the memory cell packing density can be doubled as described above. Note that the total number of the memory cells electrically connected to the sense amplifiers 127 is also doubled, and the parasitic capacitance generated between the bit line BL and the bit line BLB also increases accordingly. Since the parasitic capacitance is a load for the sense amplifier 127, the increase in parasitic capacitance might cause unstable operation of the sense amplifier 127 or a reduction in the operation speed of the memory device 100.

Configuration Example

Figure 8:
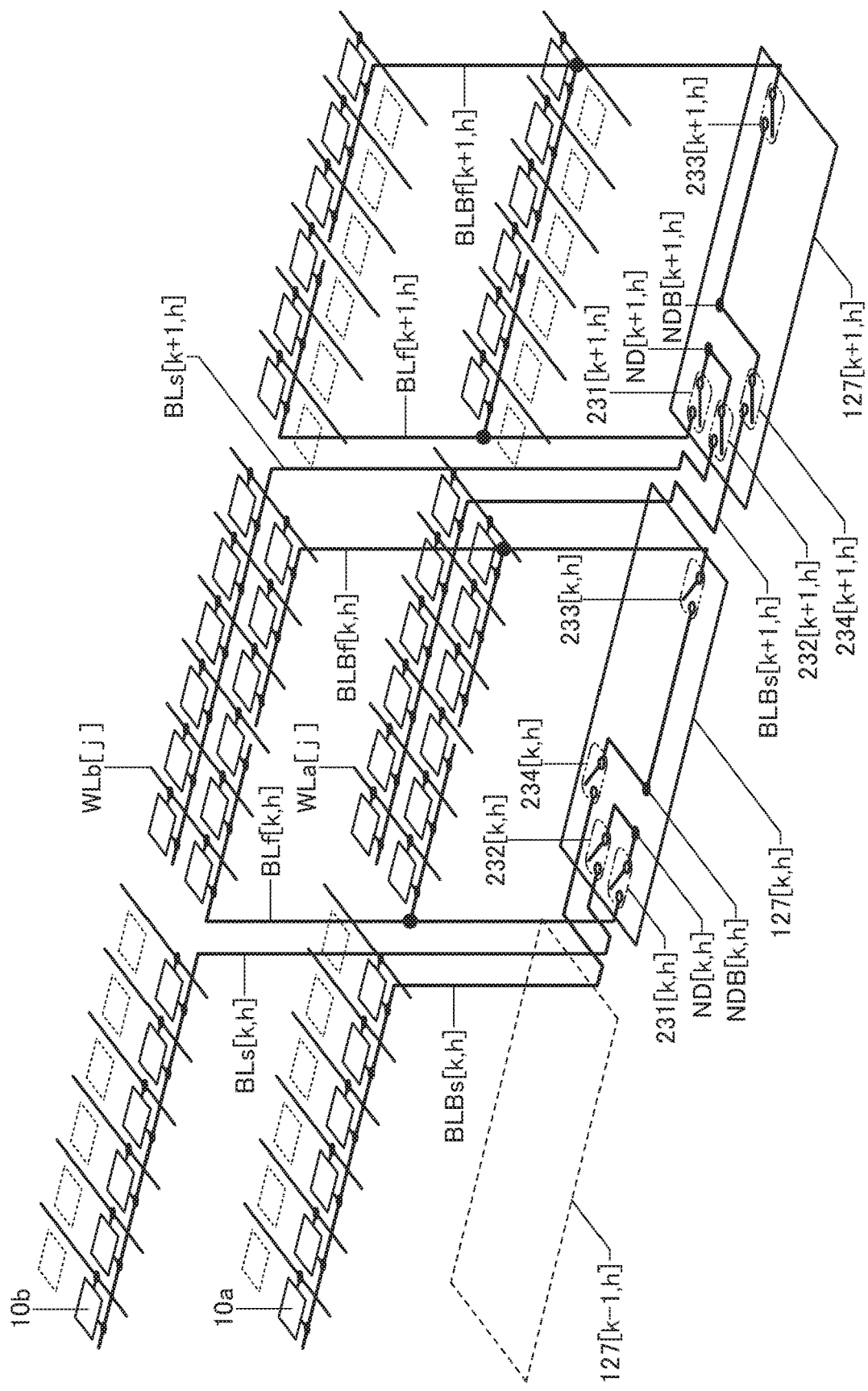
FIG. 8 A diagram illustrating a connection relationship between sense amplifiers and memory cells.

In this embodiment, a configuration in which the parasitic capacitance generated between the bit line BL and the bit line BLB is reduced is described with reference to FIG. 8. In FIG. 8, part of the local sense amplifier array 214, part of the cell array 221a, and part of the cell array 221b are extracted and illustrated.

In the configuration illustrated in FIG. 8, a first bit line BLf and a second bit line BLs are provided instead of the bit line BL, and a first bit line BLBf and a second bit line BLBs are provided instead of the bit line BLB. In other words, the bit line BL is divided into the first bit line BLf and the second bit line BLs, and the bit line BLB is divided into the first bit line BLBf and the second bit line BLBs.

In this embodiment and the like, the first bit line BLf electrically connected to the sense amplifier 127[k,h] is denoted by a first bit line BLf[k,h]. The second bit line BLs, the first bit line BLBf, and the second bit line BLBs are denoted in a similar manner.

In addition, a switch 231 to a switch 234 are provided in the sense amplifier 127. In this embodiment and the like, the switch 231 included in the sense amplifier 127[k,h] is denoted by a switch 231 [k,h]. The switch 232 to the switch 234 are denoted in a similar manner.

The first bit line BLf[k,h] is electrically connected to the memory cells 10a included in the memory cell group 52a[k,h] and the memory cells 10b included in the memory cell group 52b[k,h]. The first bit line BLf[k,h] is also electrically connected to the node ND[k,h] through the switch 231[k,h]. Note that although the memory cell groups are not clearly illustrated in FIG. 8, FIG. 4 may be referred to for the memory cell groups.

The second bit line BLs[k,h] is electrically connected to the memory cells 10b included in the memory cell group 51b[k,h]. The second bit line BLs[k,h] is electrically connected to the node ND[k,h] through the switch 232[k,h].

The first bit line BLBf[k,h] is electrically connected to the memory cells 10a included in the memory cell group 53a[k,h] and the memory cells 10b included in the memory cell group 53b[k,h]. The first bit line BLBf[k,h] is also electrically connected to the node NDB[k,h] through the switch 233 [k,h].

The second bit line BLBs[k,h] is electrically connected to the memory cells 10a included in the memory cell group 51a[k,h]. The second bit line BLBs[k,h] is electrically connected to the node NDB[k,h] through the switch 234[k,h].

As a switch such as the switch 231 to the switch 234, electrical switches, mechanical switches, or the like can be used, for example. For example, a transistor, a MEMS, or the like can be used as the switch such as the switch 231 to the switch 234. Note that when a transistor is used as the switch, there is no particular limitation on the conductivity type of the transistor.

For the switch such as the switch 231 to the switch 234, a logic circuit in which a plurality of transistors are combined may be used. For example, a complementary logic circuit (a logic circuit using an N-channel transistor and a P-channel transistor) may be used as the logic circuit.

Operation Example

Figure 9:
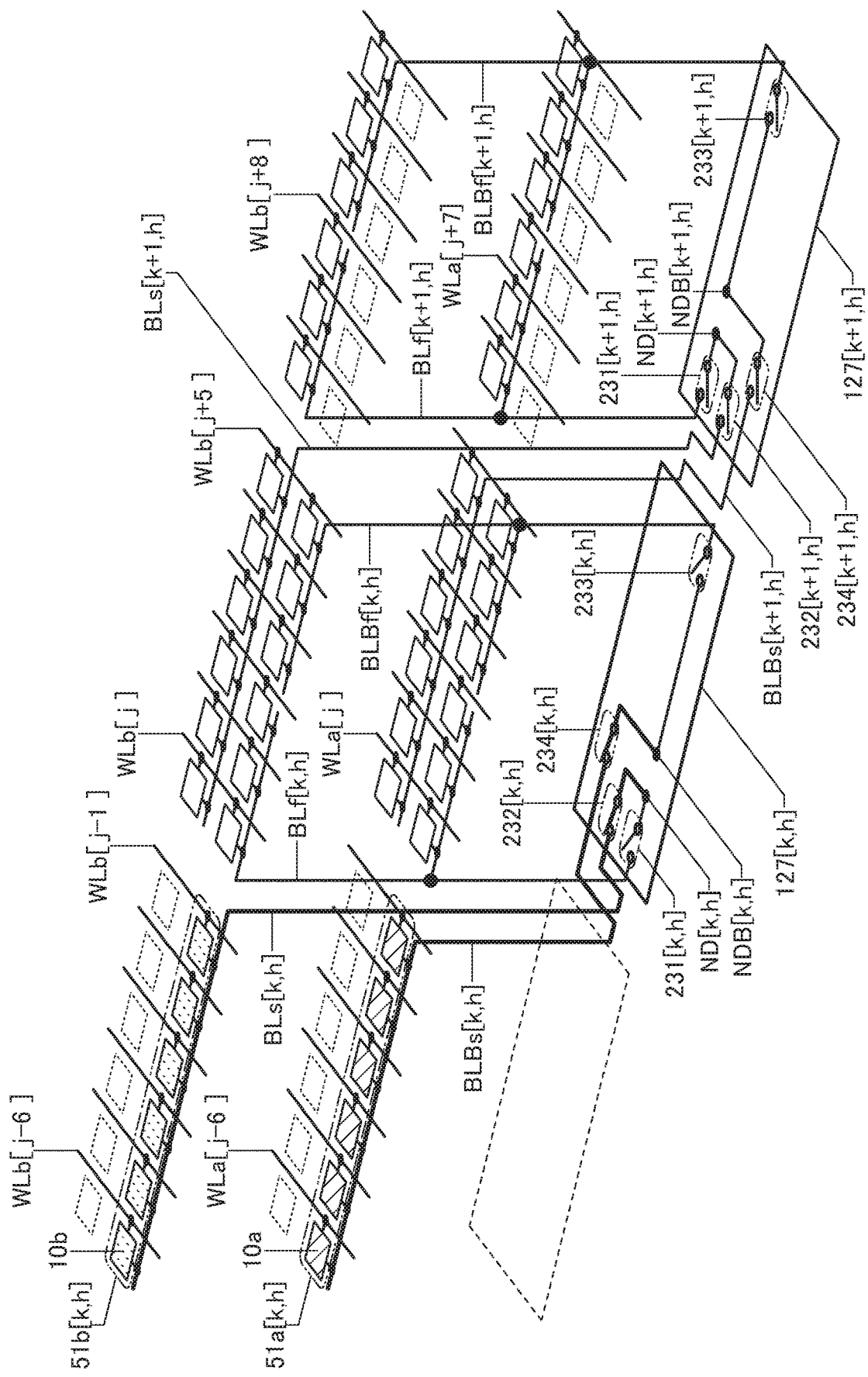
FIG. 9 A diagram illustrating a connection relationship between sense amplifiers and memory cells.

For example, in the case where data is written or read to/from any of the memory cells 10a included in the memory cell group 51a[k,h] and the memory cells 10b included in the memory cell group 51b[k,h], the switch 231[k,h] and the switch 233[k,h] are brought into an off state (a non-conduction state) and the switch 232[k,h] and the switch 234[k,h] are brought into an on state (a conduction state) (see FIG. 9).

In other words, when any of a word line WLa[j−6] to a word line WLa[j−1] and a word line WLb[j−6] to a word line WLb[j−1] is selected, the switch 231[k,h] and the switch 233[k,h] are brought into an off state and the switch 232[k,h] and the switch 234[k,h] are brought into an on state.

Figure 10:
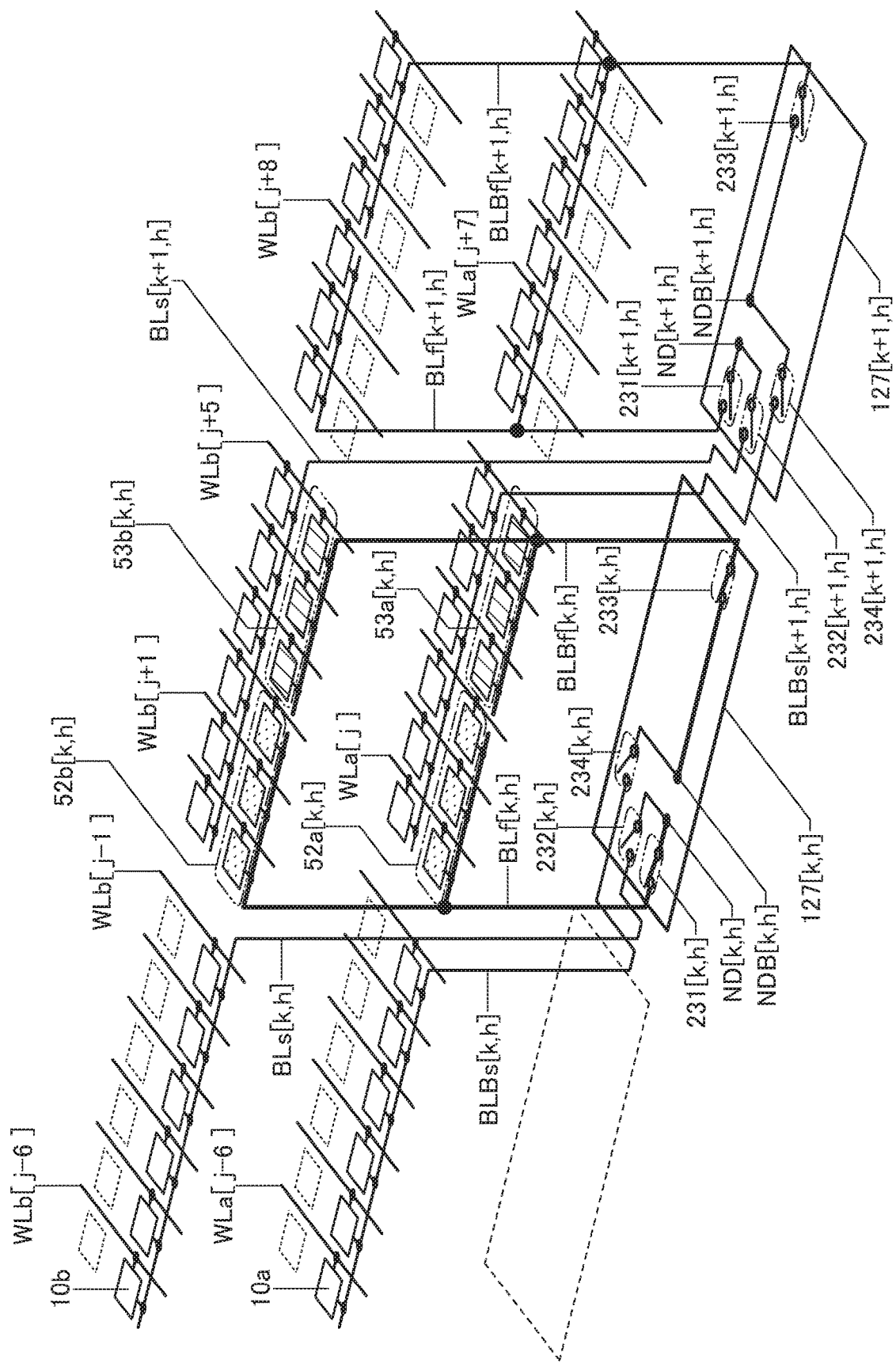
FIG. 10 A diagram illustrating a connection relationship between sense amplifiers and memory cells.

For example, in the case where data is written or read to/from any of the memory cells 10a included in the memory cell group 52a[k,h], the memory cells 10b included in the memory cell group 52b[k,h], the memory cells 10a included in the memory cell group 53a[k,h], and the memory cells 10b included in the memory cell group 53b[k,h], the switch 232[k,h] and the switch 234[k,h] are brought into an off state and the switch 231 [k,h] and the switch 233 [k,h] are brought into an on state (see FIG. 10).

In other words, when any of the word line WLa[j] to a word line WLa[j+5] and the word line WLb[j] to a word line WLb[j+5] is selected, the switch 232[k,h] and the switch 234[k,h] are brought into an off state and the switch 231[k,h] and the switch 233 [k,h] are brought into an on state.

Note that actually, to store the data in all the memory cells electrically connected to the selected word line WL (any one of the word line WLa and the word line WLb), all the sense amplifiers 127 electrically connected to these memory cells need to be operated. In this embodiment, when any of the word line WLa[j] to the word line WLa[j+5] and the word line WLb[j] to the word line WLb[j+5] is selected, all the sense amplifiers 127 placed in the k-th row and all the sense amplifiers 127 placed in the k+1-th row need to be operated.

Figure 11:
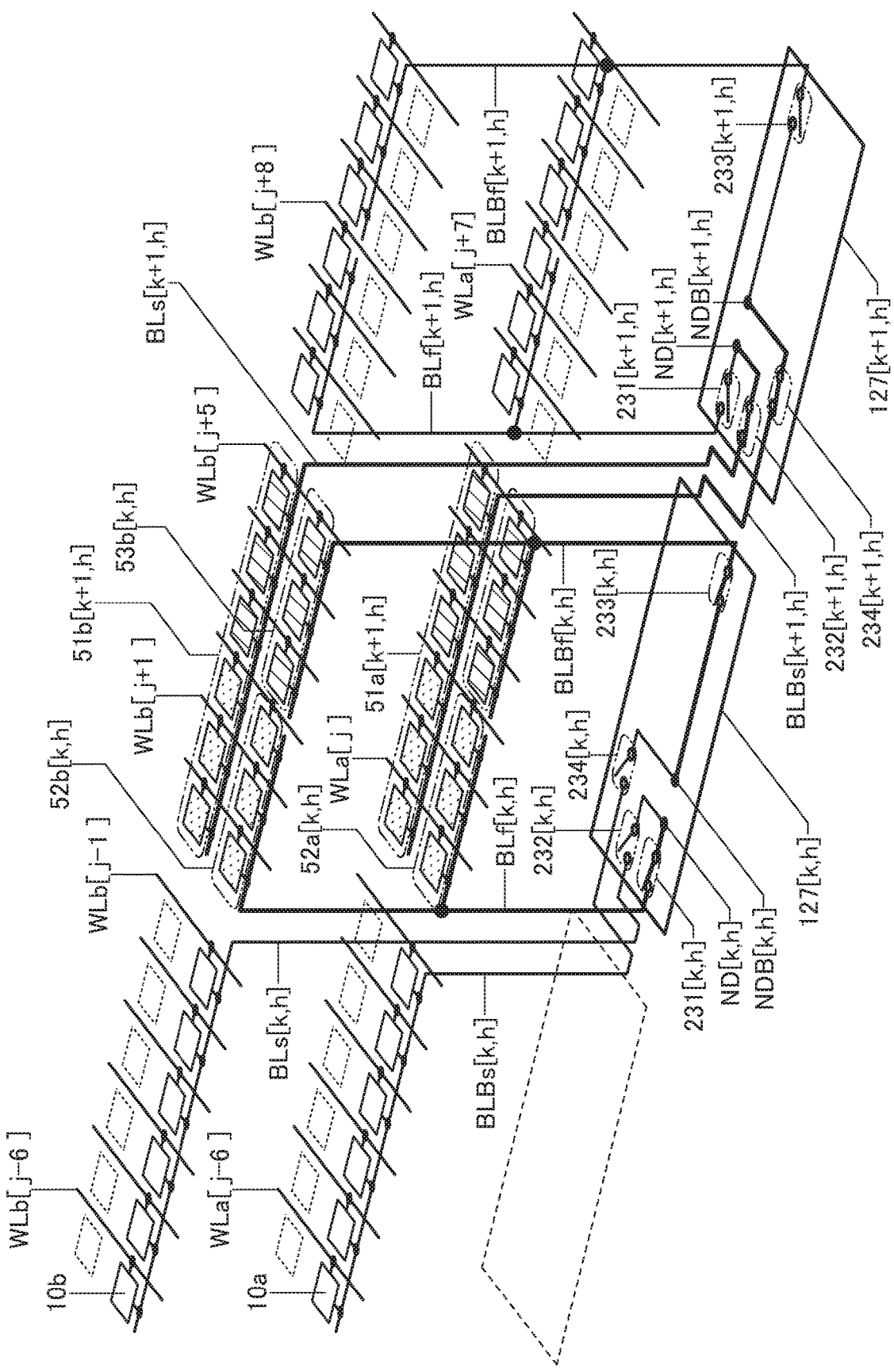
FIG. 11 A diagram illustrating a connection relationship between sense amplifiers and memory cells.

FIG. 11 illustrates a state in which the sense amplifier 127[k+1,h] is operated at the same time as the sense amplifier 127[k,h] when any of the word line WLa[j] to the word line WLa[j+5] and the word line WLb[j] to the word line WLb[j+5] is selected. Specifically, the switch 232[k,h] and the switch 234[k,h] included in the sense amplifier 127[k,h] are brought into an off state, and the switch 231 [k,h] and the switch 233[k,h] included in the sense amplifier 127[k,h] are brought into an on state; the switch 231[k+1,h] and the switch 233[k+1,h] included in the sense amplifier 127[k+1, h] are brought into an off state, and the switch 232[k+1,h] and the switch 234[k+1,h] included in the sense amplifier 127[k+1,h] are brought into an on state.

The divided bit lines BL and bit lines BLB are provided and the on state and off state of the switch 231 to the switch 234 are changed in accordance with the address of the selected word lines WL (the word line WLa and the word line WLb), whereby the parasitic capacitance which is a load for the sense amplifier 127 can be reduced. In this embodiment, the parasitic capacitance which is a load for the sense amplifier 127 can be halved.

Note that operation of the switch 231 to the switch 234 is controlled by the local sense amplifier driver 213.

According to one embodiment of the present invention, operation of the sense amplifier can be highly stable. Consequently, the memory device 100 can be highly reliable. Alternatively, according to one embodiment of the present invention, the operation speed of the sense amplifier 127 can be increased. Consequently, the operation speed of the memory device 100 can be increased.

This embodiment can be implemented in an appropriate combination with the structures described in the other embodiments and the like.

Embodiment 3

In this embodiment, a connection example of a sense amplifier 127A which is a four-cell width type sense amplifier 127, the memory cell 10a, and the memory cell 10b is described as a modification example of the memory block 211. In this specification and the like, "four-cell width type sense amplifier" refers to a sense amplifier whose length in the X-direction is roughly equivalent to four memory cells.

In addition, points different from those in the above embodiments are mainly described so that repetition of the description can be reduced. The above embodiments can be referred to for the portions that are not described in this embodiment.

Configuration Example

Figure 12:
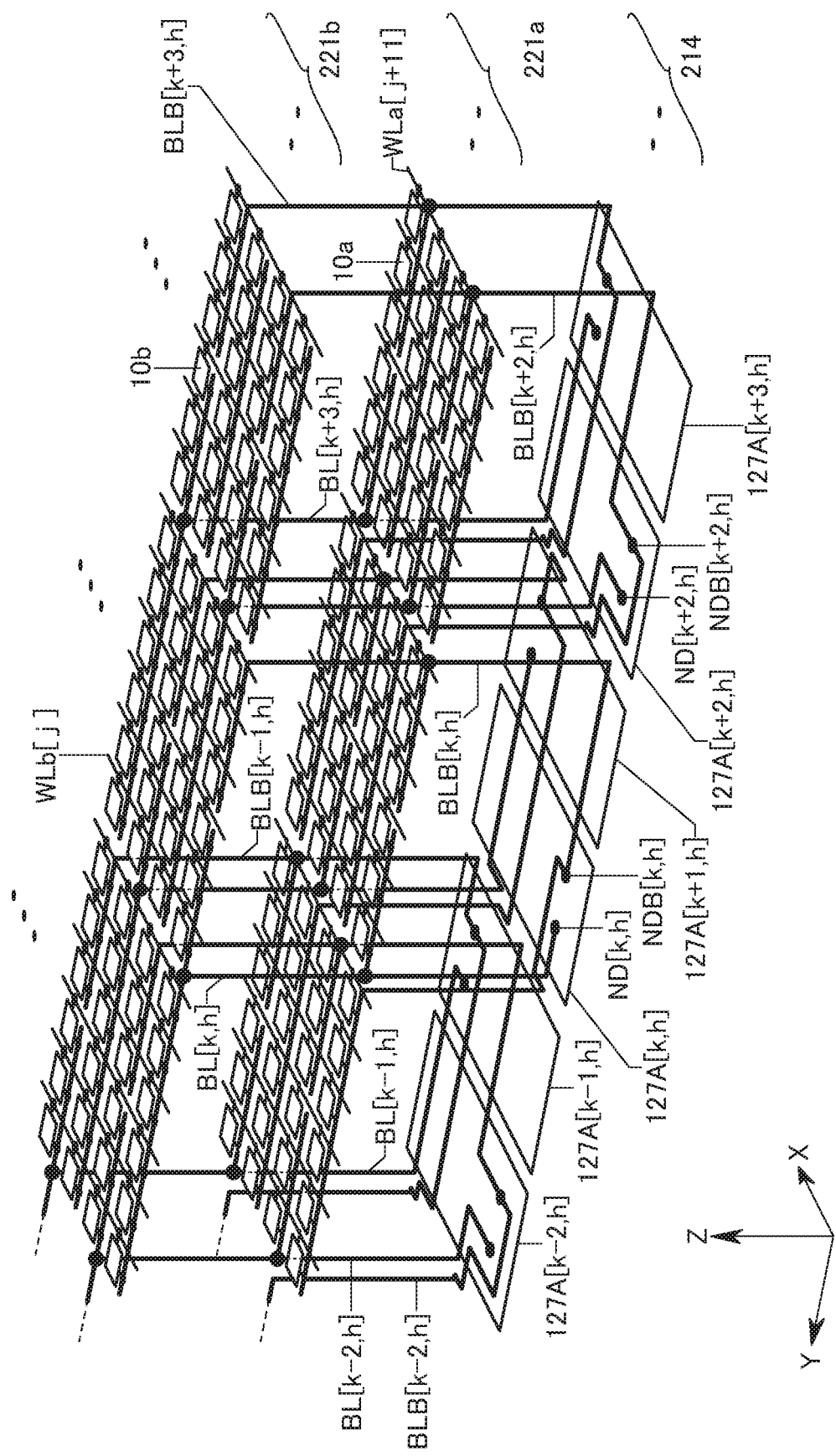
FIG. 12 A diagram illustrating a connection relationship between sense amplifiers and memory cells.
Figure 13:
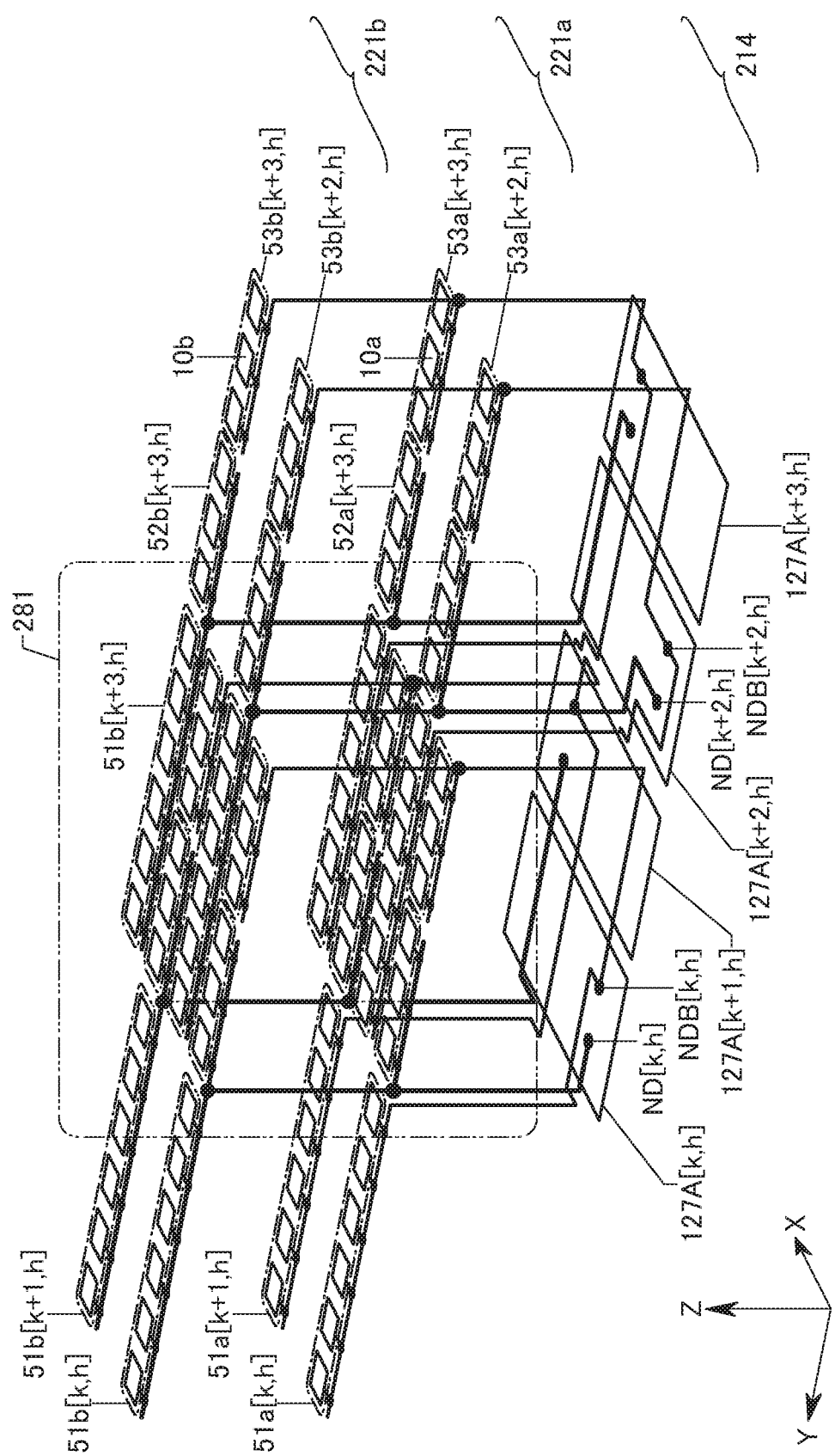
FIG. 13 A diagram illustrating a connection relationship between sense amplifiers and memory cells.

FIG. 12 and FIG. 13 are perspective block diagrams illustrating the connection relationship between the sense amplifiers 127A, the memory cells 10a, and the memory cells 10b. Note that like the sense amplifier 127, the sense amplifier 127A in the k-th row and the h-th column is denoted by a sense amplifier 127A[k,h].

FIG. 12 is a diagram illustrating a sense amplifier 127A [k−2,h], a sense amplifier 127A[k−1,h], a sense amplifier 127A[k,h], a sense amplifier 127A[k+1,h], a sense amplifier 127A[k+2,h], a sense amplifier 127A[k+3,h], and memory cells electrically connected to any of these sense amplifiers 127A.

Note that FIG. 12 illustrates the case where twelve memory cells 10a and twelve memory cells 10b are electrically connected to one sense amplifier 127A, as an example. However, the number of the memory cells 10a and the memory cells 10b which are electrically connected to one sense amplifier 127A is not limited this example.

Figure 14:
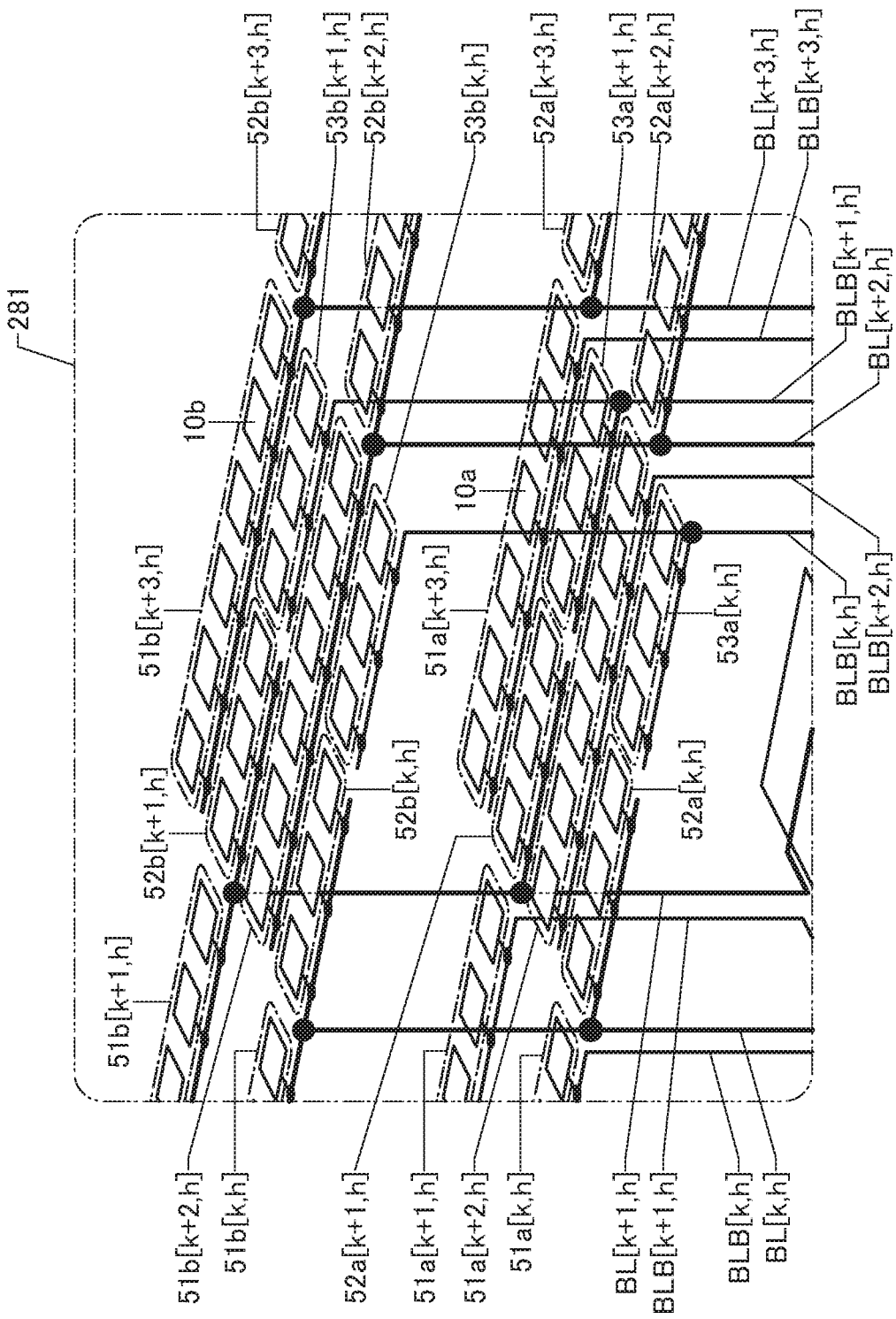
FIG. 14 A diagram illustrating a connection relationship between sense amplifiers and memory cells.
Figure 16:
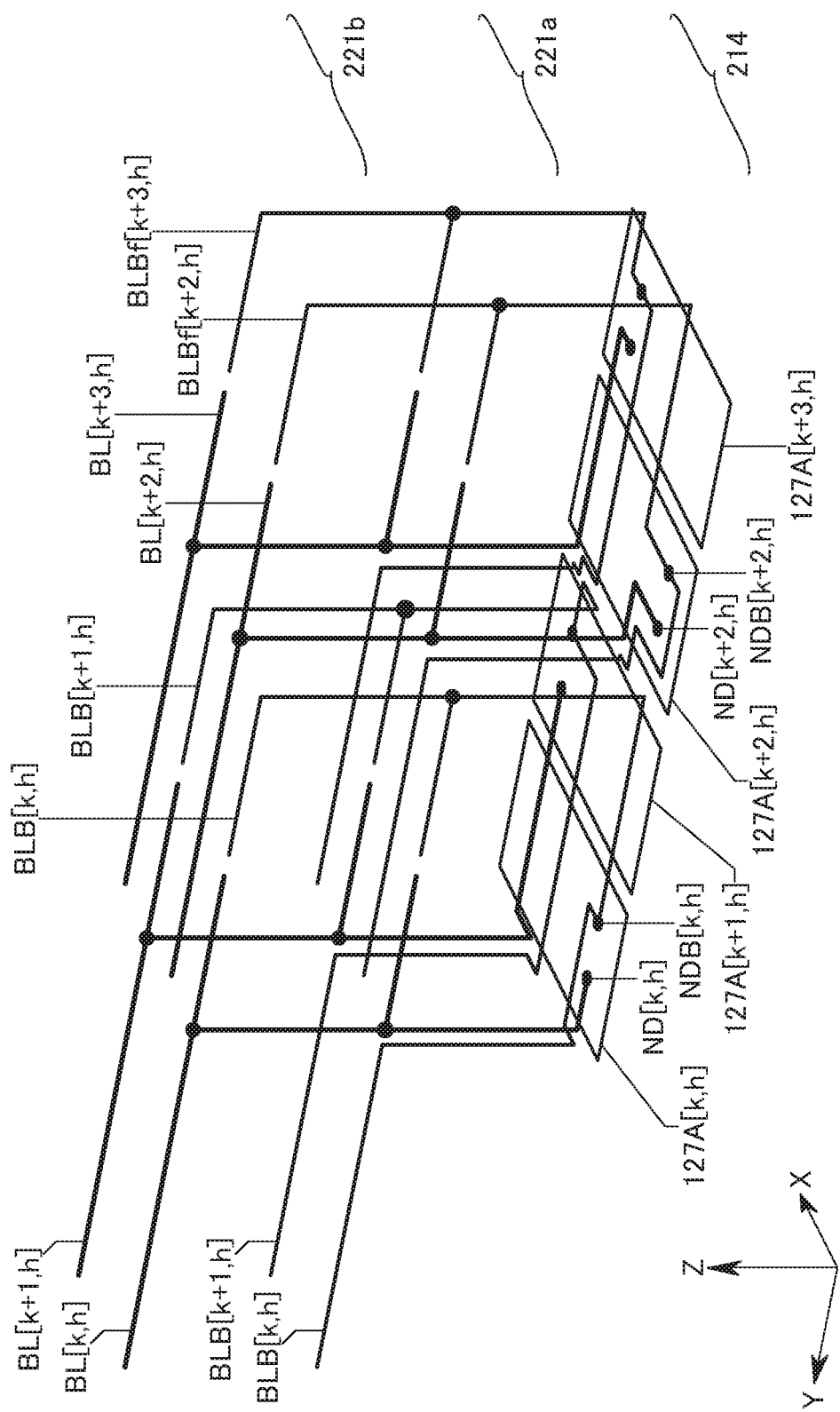
FIG. 16 A diagram illustrating an arrangement example of bit line pair.

FIG. 13 is a perspective block diagram illustrating the connection relationship between the sense amplifiers 127A, the memory cells 10a, and the memory cells 10b. FIG. 13 is a diagram illustrating memory cells electrically connected to any of the sense amplifier 127A[k,h] to the sense amplifier 127A[k+3,h]. Note that in FIG. 13, description of the word line WLa and the word line WLb is omitted. FIG. 14 is an enlarged view of a portion 281 illustrated in FIG. 13. FIG. 15 is a diagram of part of the cell array 221b seen from the Z-direction. Moreover, FIG. 16 is a diagram illustrating the sense amplifier 127A[k,h] to the sense amplifier 127A[k+ 3,h], and the bit lines BL and bit lines BLB that correspond to the respective sense amplifiers.

One sense amplifier 127A is electrically connected to one bit line pair. Among the bit line BL and bit line BLB included in the bit line pair, the bit line BL is electrically connected to a node ND of the sense amplifier 127A and the bit line BLB is electrically connected to a node NDB of the sense amplifier 127A. The sense amplifier 127A has a function of amplifying a potential difference between the bit line BL and the bit line BLB.

Note that as in the above embodiment, the memory cell group 51a electrically connected to the sense amplifier 127A[k,h] through the bit line BL[k,h] or the bit line BLB[k,h] is denoted by a memory cell group 51a[k,h] also in this this embodiment. In addition, the memory cell group 52a, the memory cell group 53a, the memory cell group 51b, the memory cell group 52b, and the memory cell group 53b are denoted in a similar manner.

In FIG. 13 and FIG. 14, when the memory cell array 221a is seen from the X-direction (row direction), a memory cell group 51a[k+2,h] includes a region overlapping with a memory cell group 52a[k,h] and a region overlapping with a memory cell group 53a[k,h]. In other words, when the memory cell array 221a is seen from the X-direction (row direction), a bit line BLB[k+2,h] includes a region overlapping with the bit line BL[k,h] and a region overlapping with the bit line BLB[k,h].

In addition, when the memory cell array 221a is seen from the X-direction (row direction), a memory cell group 51a[k+3,h] includes a region overlapping with a memory cell group 52a[k+1,h] and a region overlapping with a memory cell group 53a[k+1,h]. In other words, when the memory cell array 221a is seen from the X-direction (row direction), a bit line BLB[k+3,h] includes a region overlapping with the bit line BL[k+1,h] and a region overlapping with the bit line BLB[k+1,h].

In addition, when the memory cell array 221a is seen from the X-direction (row direction), a memory cell group 51a[k+2,h] includes a region overlapping with the memory cell group 52a[k,h] and the memory cell group 52a[k+1,h] and a region overlapping with the memory cell group 53a[k,h] and the memory cell group 53a[k+1,h].

In addition, when the memory cell array 221a is seen from the X-direction (row direction), a memory cell group 51a[k+3,h] includes a region overlapping with the memory cell group 52a[k,h] and the memory cell group 52a[k+1,h] and a region overlapping with the memory cell group 53a[k,h] and the memory cell group 53a[k+1,h].

In addition, when the memory cell array 221a is seen from the Z-direction, the memory cell group 51a[k+2,h] includes a region adjacent to the memory cell group 52a[k,h] and a region adjacent to the memory cell group 53a[k,h]. In other words, when the memory cell array 221a is seen from the Z-direction, the bit line BLB[k+2,h] includes a region adjacent to the bit line BL[k,h] and a region adjacent to the bit line BLB[k,h].

In addition, when the memory cell array 221a is seen from the Z-direction, the memory cell group 51a[k+3,h] includes a region adjacent to the memory cell group 52a[k+1,h] and a region adjacent to the memory cell group 53a[k+1,h]. In other words, when the memory cell array 221a is seen from the Z-direction, the bit line BLB[k+3,h] includes a region adjacent to the bit line BL[k+1,h] and a region adjacent to the bit line BLB[k+1,h].

When the memory cell array 221a is seen from the Z-direction, the memory cell group 52a[k+1,h] and the memory cell group 52a[k,h] are adjacent to each other through the memory cell group 51a[k+2,h]. In addition, the memory cell group 53a[k+1,h] and the memory cell group 53a[k,h] are adjacent to each other through the memory cell group 51a[k+2,h].

In FIG. 13 and FIG. 14, when the memory cell array 221b is seen from the X-direction (row direction), a memory cell group 51b[k+2,h] includes a region overlapping with a memory cell group 52b[k,h] and a region overlapping with a memory cell group 53b[k,h]. In other words, when the memory cell array 221b is seen from the X-direction (row direction), a bit line BLB[k+2,h] includes a region overlapping with the bit line BL[k,h] and a region overlapping with the bit line BLB[k,h].

In addition, when the memory cell array 221b is seen from the X-direction (row direction), a memory cell group 51b[k+3,h] includes a region overlapping with a memory cell group 52b[k+1,h] and a region overlapping with a memory cell group 53b[k+1,h]. In other words, when the memory cell array 221b is seen from the X-direction (row direction), a bit line BL[k+3,h] includes a region overlapping with the bit line BL[k+1,h] and a region overlapping with the bit line BLB[k+1,h].

In addition, when the memory cell array 221b is seen from the X-direction (row direction), a memory cell group 51b[k+2,h] includes a region overlapping with the memory cell group 52b[k,h] and the memory cell group 52b[k+1,h] and a region overlapping with the memory cell group 53b[k,h] and the memory cell group 53b[k+1,h].

In addition, when the memory cell array 221b is seen from the X-direction (row direction), a memory cell group 51b[k+3,h] includes a region overlapping with the memory cell group 52b[k,h] and the memory cell group 52b[k+1,h] and a region overlapping with the memory cell group 53b[k,h] and the memory cell group 53b[k+1,h].

In addition, when the memory cell array 221b is seen from the Z-direction, the memory cell group 51b[k+2,h] includes a region adjacent to the memory cell group 52b[k,h] and a region adjacent to the memory cell group 53b[k,h]. In other words, when the memory cell array 221b is seen from the Z-direction, the bit line BL[k+2,h] includes a region adjacent to the bit line BL[k,h] and a region adjacent to the bit line BLB[k,h].

In addition, when the memory cell array 221b is seen from the Z-direction, the memory cell group 51b[k+3,h] includes a region adjacent to the memory cell group 52b[k+1,h] and a region adjacent to the memory cell group 53b[k+1,h]. In other words, when the memory cell array 221b is seen from the Z-direction, the bit line BL[k+3,h] includes a region adjacent to the bit line BL[k+1,h] and a region adjacent to the bit line BLB[k+1,h].

When the memory cell array 221b is seen from the Z-direction, the memory cell group 52b[k+1,h] and the memory cell group 52b[k,h] are adjacent to each other through the memory cell group 51b[k+2,h]. In addition, the memory cell group 53b[k+1,h] and the memory cell group 53b[k,h] are adjacent to each other through the memory cell group 51b[k+2,h].

FIGS. 15(A) and 15(B) are diagrams of part of the cell array 221b seen from the Z-direction. FIG. 15(A) illustrates the memory cell group 51b[k+2,h], the memory cell group 52b[k+2,h], the memory cell group 53b[k+2,h], the memory cell group 51b[k+3,h], the memory cell group 52b[k+3,h], and the memory cell group 53b[k+3,h]. FIG. 15(B) illustrates the memory cell group 51b[k,h], the memory cell group 52b[k,h], the memory cell group 53b[k,h], the memory cell group 51b[k+1,h], the memory cell group 52b[k+1,h], and the memory cell group 53b[k+1,h]. In addition, the other memory cells 10b are indicated by dashed lines.

In this embodiment, the memory cell group 51b, the memory cell group 52b, and the memory cell group 53b are arranged in the same direction along the X-direction. Specifically, in FIGS. 15(A) and 15(B), the X-direction is viewed as the horizontal axis, and the memory cell group 51b, the memory cell group 52b, and the memory cell group 53b are arranged in this order from the left of the diagrams. Note that although not illustrated, the memory cell group 51a, the memory cell group 52a, and the memory cell group 53a are arranged in a similar manner.

The parasitic capacitance of the bit line BL and the parasitic capacitance of the bit line BLB change depending on the number of memory cells electrically connected to the bit lines. As described in the above embodiment, the parasitic capacitance of the bit line BL and the parasitic capacitance of the bit line BLB are preferably equal. When the capacitance values of the both are made equal or close to each other, the influence of noise can be further reduced. Note that the description in the above embodiments is referred to for details.

This embodiment can be implemented in an appropriate combination with the structures described in the other embodiments and the like.

Embodiment 4

In this embodiment, a modification example of the memory block 211 described in Embodiment 3 is described. The above embodiment can be referred to for the portions that are not described in this embodiment.

As described in the above embodiment, when the cell array 221a and the cell array 221b are stacked, the memory cell packing density can be doubled as described above. Note that the total number of the memory cells electrically connected to the sense amplifiers 127A is also doubled, and the parasitic capacitance generated between the bit line BL and the bit line BLB also increases accordingly. Since the parasitic capacitance is a load for the sense amplifier 127A, the increase in parasitic capacitance might cause unstable operation of the sense amplifier 127A or a reduction in the operation speed of the memory device 100.

Configuration Example

Figure 17:
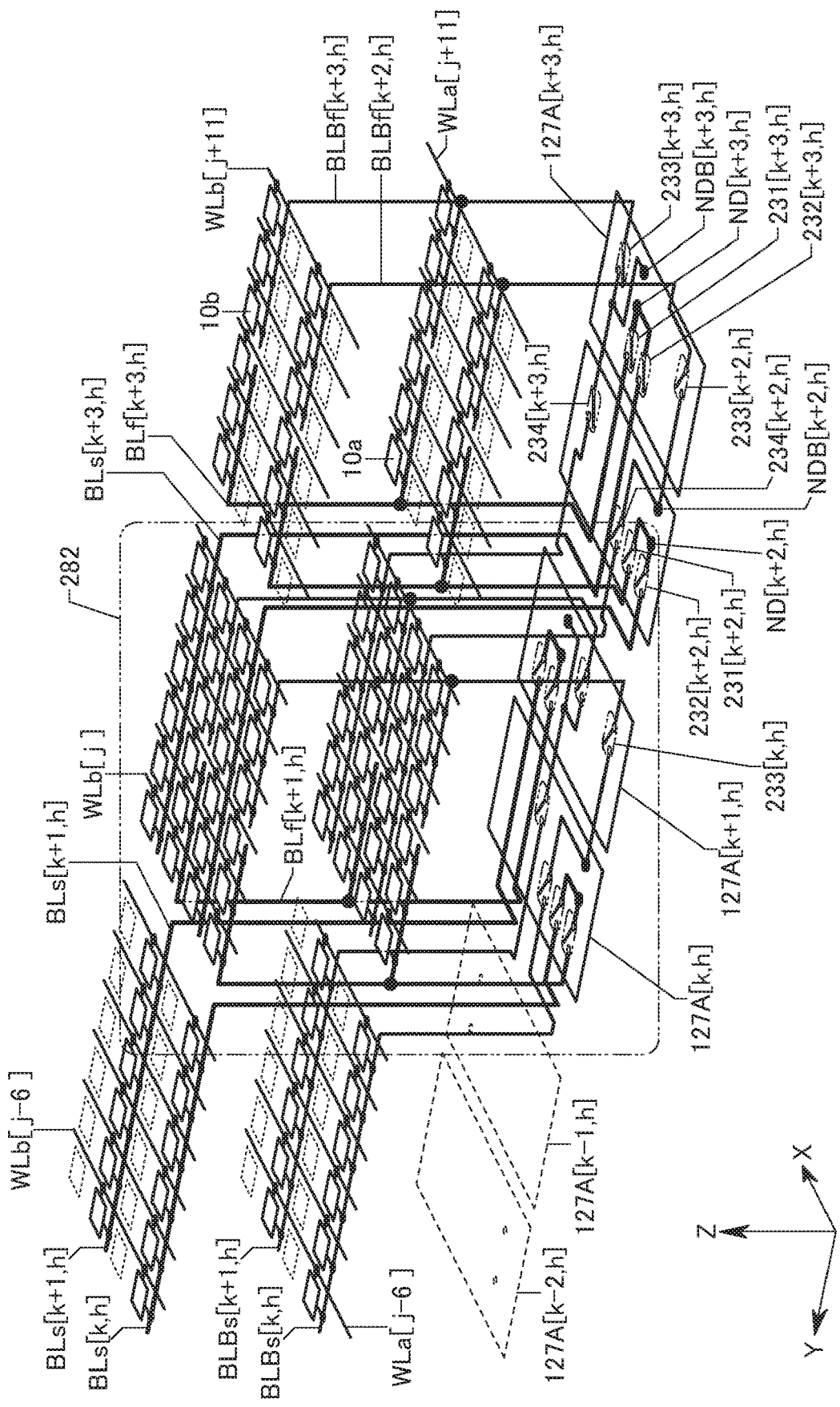
FIG. 17 A diagram illustrating a connection relationship between sense amplifiers and memory cells.
Figure 18:
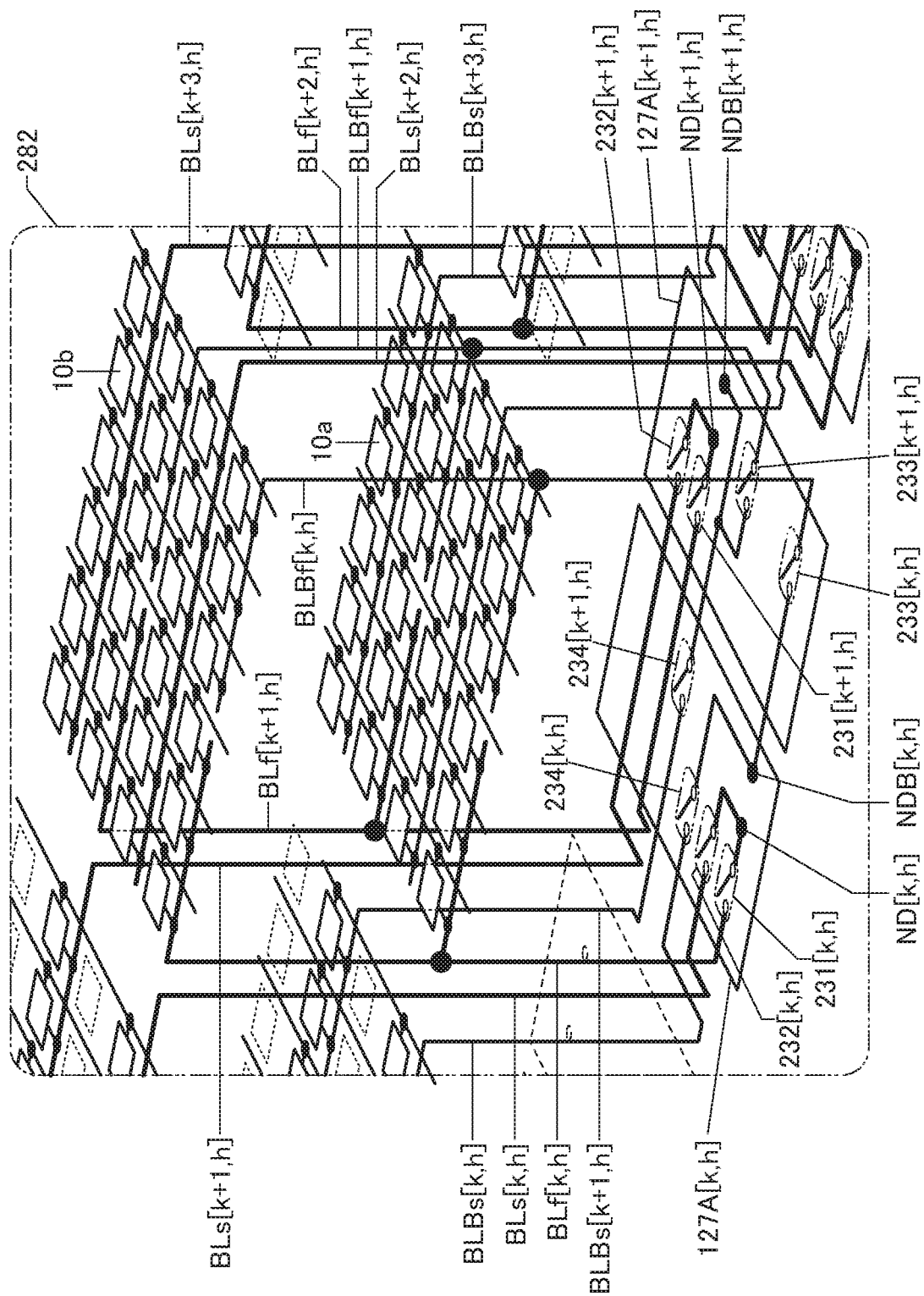
FIG. 18 A diagram illustrating a connection relationship between sense amplifiers and memory cells.

In this embodiment, a configuration in which the parasitic capacitance generated between the bit line BL and the bit line BLB is reduced is described with reference to FIG. 17 and FIG. 18. In FIG. 17, part of the local sense amplifier array 214, part of the cell array 221a, and part of the cell array 221b are extracted and illustrated. FIG. 18 is an enlarged view of a portion 282 illustrated in FIG. 17.

As illustrated in FIG. 17, a first bit line BLf and a second bit line BLs are provided instead of the bit line BL, and a first bit line BLBf and a second bit line BLBs are provided instead of the bit line BLB. In other words, the bit line BL is divided into the first bit line BLf and the second bit line BLs, and the bit line BLB is divided into the first bit line BLBf and the second bit line BLBs.

Note that as in the above embodiment, the first bit line BLf electrically connected to the sense amplifier 127A[k,h] is denoted by a first bit line BLf[k,h] also in this embodiment. The second bit line BLs, the first bit line BLBf, and the second bit line BLBs are denoted in a similar manner.

In addition, a switch 231 to a switch 234 are provided in the sense amplifier 127A. As in the above embodiment, the switch 231 included in the sense amplifier 127A[k,h] is denoted by a switch 231 [k,h]. The switch 232 to the switch 234 are denoted in a similar manner.

The first bit line BLf[k,h] is electrically connected to the memory cells 10a included in the memory cell group 52a[k,h] and the memory cells 10b included in the memory cell group 52b[k,h]. The first bit line BLf[k,h] is also electrically connected to the node ND[k,h] through the switch 231[k,h]. Note that although the memory cell groups are not clearly illustrated in FIG. 17 and FIG. 18, FIG. 13 and FIG. 14 may be referred to for the memory cell groups.

The second bit line BLs[k,h] is electrically connected to the memory cells 10b included in the memory cell group 51b[k,h]. The second bit line BLs[k,h] is electrically connected to the node ND[k,h] through the switch 232[k,h].

The first bit line BLBf[k,h] is electrically connected to the memory cells 10a included in the memory cell group 53a[k,h] and the memory cells 10b included in the memory cell group 53b[k,h]. The first bit line BLBf[k,h] is also electrically connected to the node NDB[k,h] through the switch 233 [k,h]. Note that the switch 233[k,h] may be provided in the sense amplifier 127A[k,h] though provided in the sense amplifier 127A[k+1,h] in FIG. 17 and FIG. 18.

The second bit line BLBs[k,h] is electrically connected to the memory cells 10a included in the memory cell group 51a[k,h]. The second bit line BLBs[k,h] is electrically connected to the node NDB[k,h] through the switch 234[k, h].

The first bit line BLf[k+1,h] is electrically connected to the memory cells 10a included in the memory cell group 52a[k+1,h] and the memory cells 10b included in the memory cell group 52b[k+1,h]. The first bit line BLf[k+1,h] is also electrically connected to the node ND[k+1,h] through the switch 231[k+1,h].

The second bit line BLs[k+1,h] is electrically connected to the memory cells 10b included in the memory cell group 51b[k+1,h]. The second bit line BLs[k+1,h] is also electrically connected to the node ND[k+1,h] through the switch 232[k+1,h].

The first bit line BLBf[k+1,h] is electrically connected to the memory cells 10a included in the memory cell group 53a[k+1,h] and the memory cells 10b included in the memory cell group 53b[k+1,h]. The first bit line BLBf[k+1,h] is also electrically connected to the node NDB[k+1,h] through the switch 233[k+1,h].

The second bit line BLBs[k+1,h] is electrically connected to the memory cells 10a included in the memory cell group 51a[k+1,h]. The second bit line BLBs[k+1,h] is also electrically connected to the node NDB[k+1,h] through the switch 234[k+1,h].

The first bit line BLf[k+2,h] is electrically connected to the memory cells 10a included in the memory cell group 52a[k+2,h] and the memory cells 10b included in the memory cell group 52b[k+2,h]. The first bit line BLf[k+2,h] is also electrically connected to the node ND[k+2,h] through the switch 231[k+2,h].

The second bit line BLs[k+2,h] is electrically connected to the memory cells 10b included in the memory cell group 52b[k+2,h]. The second bit line BLs[k+2,h] is also electrically connected to the node ND[k+2,h] through the switch 232[k+2,h].

The first bit line BLBf[k+2,h] is electrically connected to the memory cells 10a included in the memory cell group 53a[k+2,h] and the memory cells 10b included in the memory cell group 53b[k+2,h]. The first bit line BLBf[k+2,h] is also electrically connected to the node NDB[k+2,h] through the switch 233[k+2,h]. Note that the switch 233[k+2,h] may be provided in the sense amplifier 127A[k+2,h] though provided in the sense amplifier 127A[k+3,h] in FIG. 17 and FIG. 18.

The first bit line BLf[k+3,h] is electrically connected to the memory cells 10a included in the memory cell group 52a[k+3,h] and the memory cells 10b included in the memory cell group 52b[k+3,h]. The first bit line BLf[k+3,h] is also electrically connected to the node ND[k+3,h] through the switch 231[k+3,h].

The second bit line BLs[k+3,h] is electrically connected to the memory cells 10b included in the memory cell group 52b[k+3,h]. The second bit line BLs[k+3,h] is also electrically connected to the node ND[k+3,h] through the switch 232[k+3,h].

The first bit line BLBf[k+3,h] is electrically connected to the memory cells 10a included in the memory cell group 53a[k+3,h] and the memory cells 10b included in the memory cell group 53b[k+3,h]. The first bit line BLBf[k+3,h] is also electrically connected to the node NDB[k+3,h] through the switch 233[k+3,h].

The second bit line BLBs[k+3,h] is electrically connected to the memory cells 10a included in the memory cell group 51a[k+3,h]. The second bit line BLBs[k+3,h] is also electrically connected to the node NDB[k+3,h] through the switch 234[k+3,h]. Note that the switch 234[k+3,h] may be provided in the sense amplifier 127A[k+3,h] though provided in the sense amplifier 127A[k+2,h] in FIG. 17.

As a switch such as the switch 231 to the switch 234, electrical switches, mechanical switches, or the like can be used, for example. For example, a transistor, a MEMS, or the like can be used as the switch such as the switch 231 to the switch 234. Note that when a transistor is used as the switch, there is no particular limitation on the conductivity type of the transistor.

For the switch such as the switch 231 to the switch 234, a logic circuit in which a plurality of transistors are combined may be used. For example, a complementary logic circuit (a logic circuit using an N-channel transistor and a P-channel transistor) may be used as the logic circuit.

The memory cell selection operation performed for writing or reading of data can be understood with reference to Embodiment 2. Thus, detailed description is omitted in this embodiment.

The divided bit lines BL and bit lines BLB are provided and the on state and off state of the switch 231 to the switch 234 are changed in accordance with the address of the selected word lines WL (the word line WLa and the word line WLb), whereby the parasitic capacitance which is a load for the sense amplifier 127 can be reduced. In this embodiment, the parasitic capacitance which is a load for the sense amplifier 127 can be halved.

According to one embodiment of the present invention, operation of the sense amplifier can be highly stable. Consequently, the memory device 100 can be highly reliable. Alternatively, according to one embodiment of the present invention, the operation speed of the sense amplifier 127 can be increased. Consequently, the operation speed of the memory device 100 can be increased.

This embodiment can be implemented in an appropriate combination with the structures described in the other embodiments and the like.

Embodiment 5

In this embodiment, a modification example of the memory block 211 described in Embodiment 4 is described. Note that the above embodiment can be referred to for the portions that are not described in this embodiment.

Configuration Example

Figure 19:
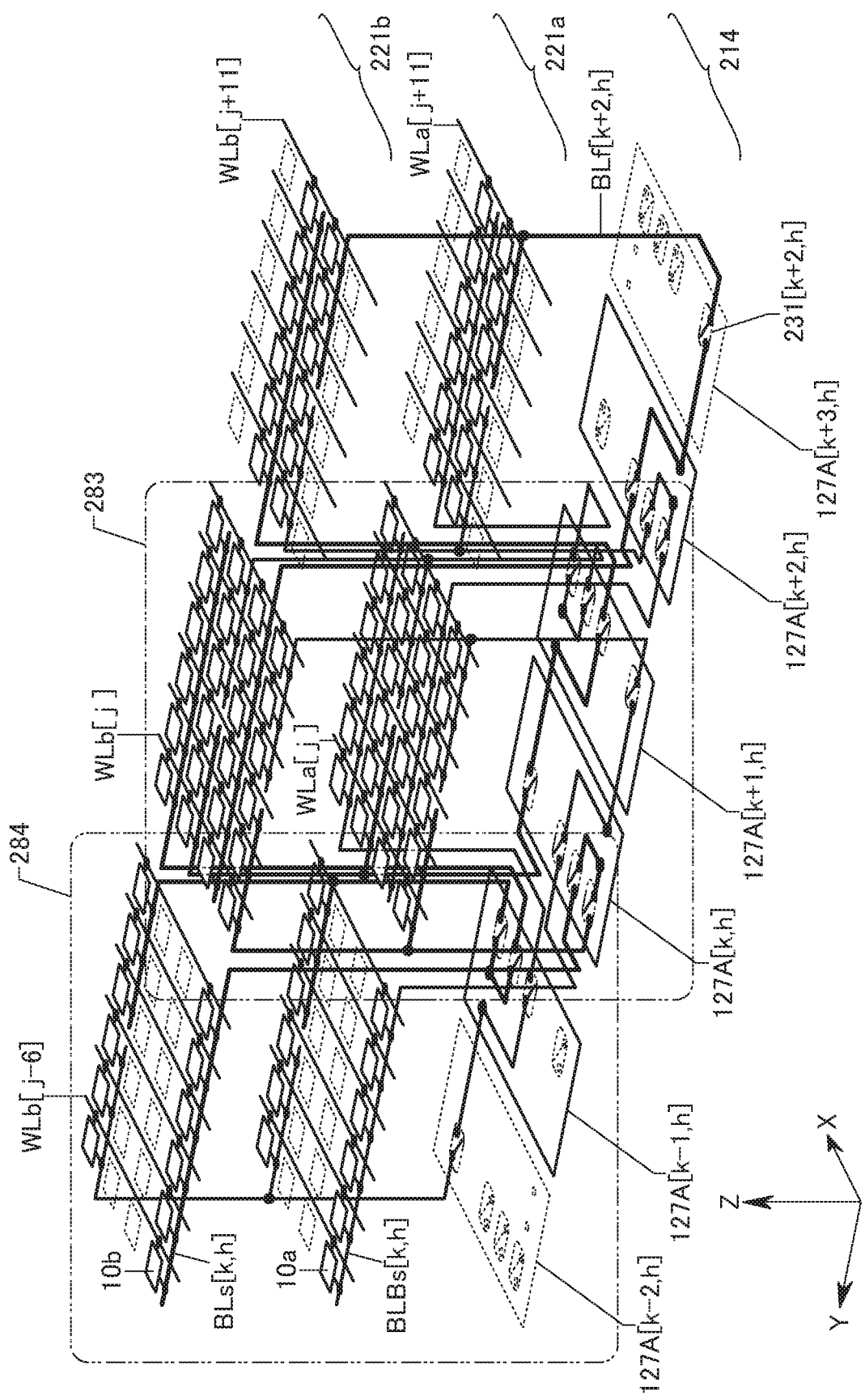
FIG. 19 A diagram illustrating a connection relationship between sense amplifiers and memory cells.
Figure 20:
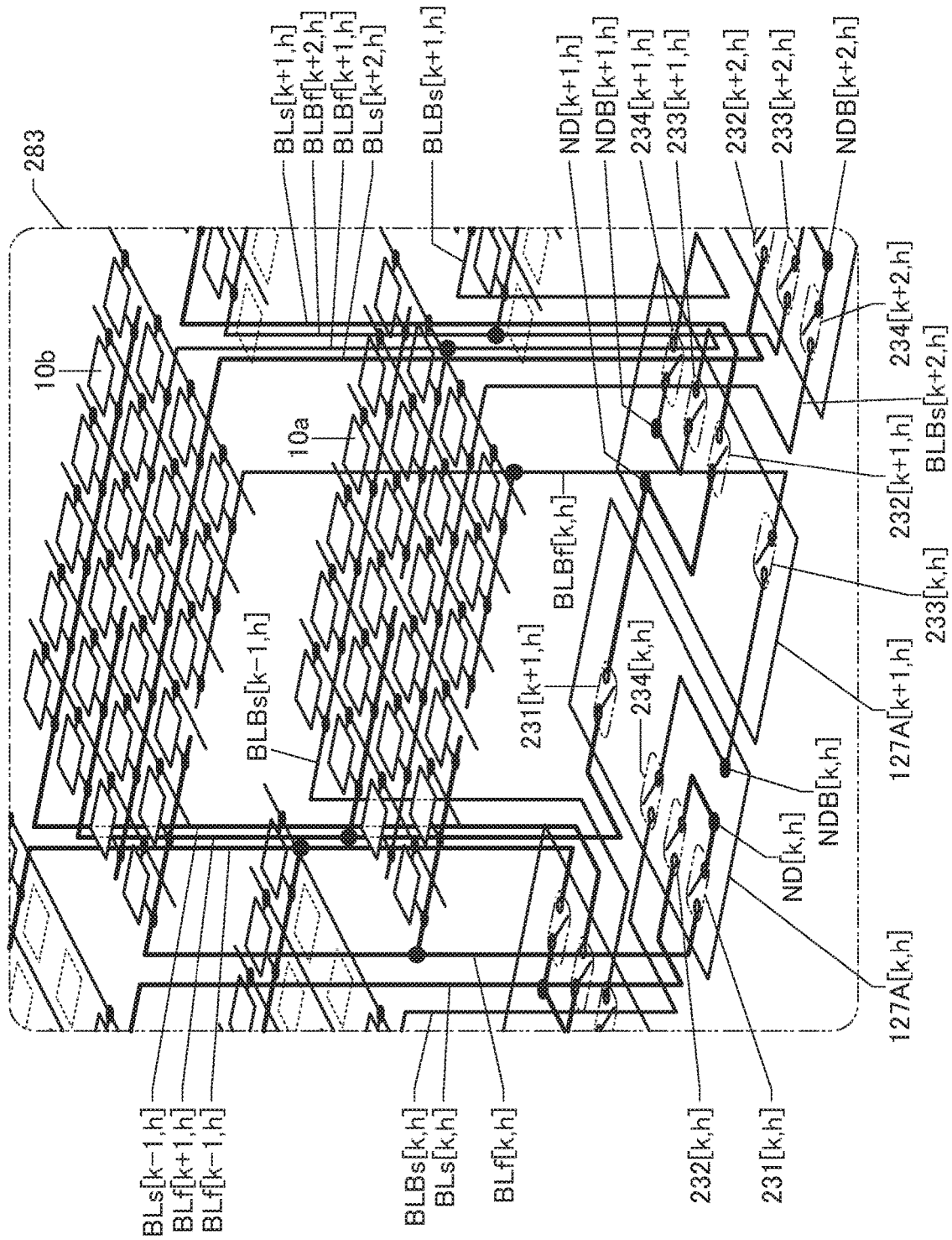
FIG. 20 A diagram illustrating a connection relationship between sense amplifiers and memory cells.
Figure 21:
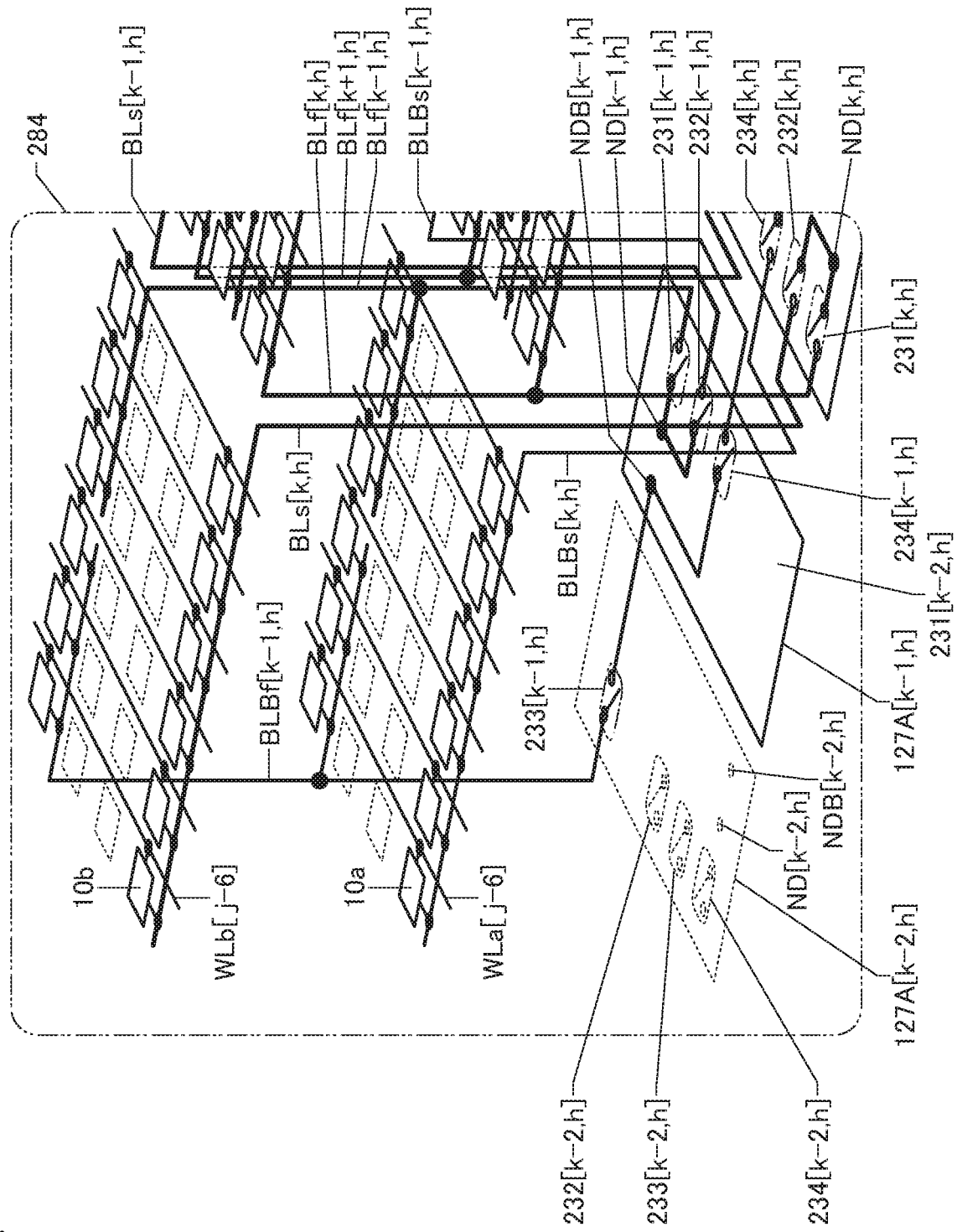
FIG. 21 A diagram illustrating a connection relationship between sense amplifiers and memory cells.

In FIG. 19, part of the local sense amplifier array 214, part of the cell array 221a, and part of the cell array 221b are extracted and illustrated. FIG. 20 is an enlarged view of a portion 283 illustrated in FIG. 19. In addition, FIG. 21 is an enlarged view of a portion 284 illustrated in FIG. 19.

Figure 22:
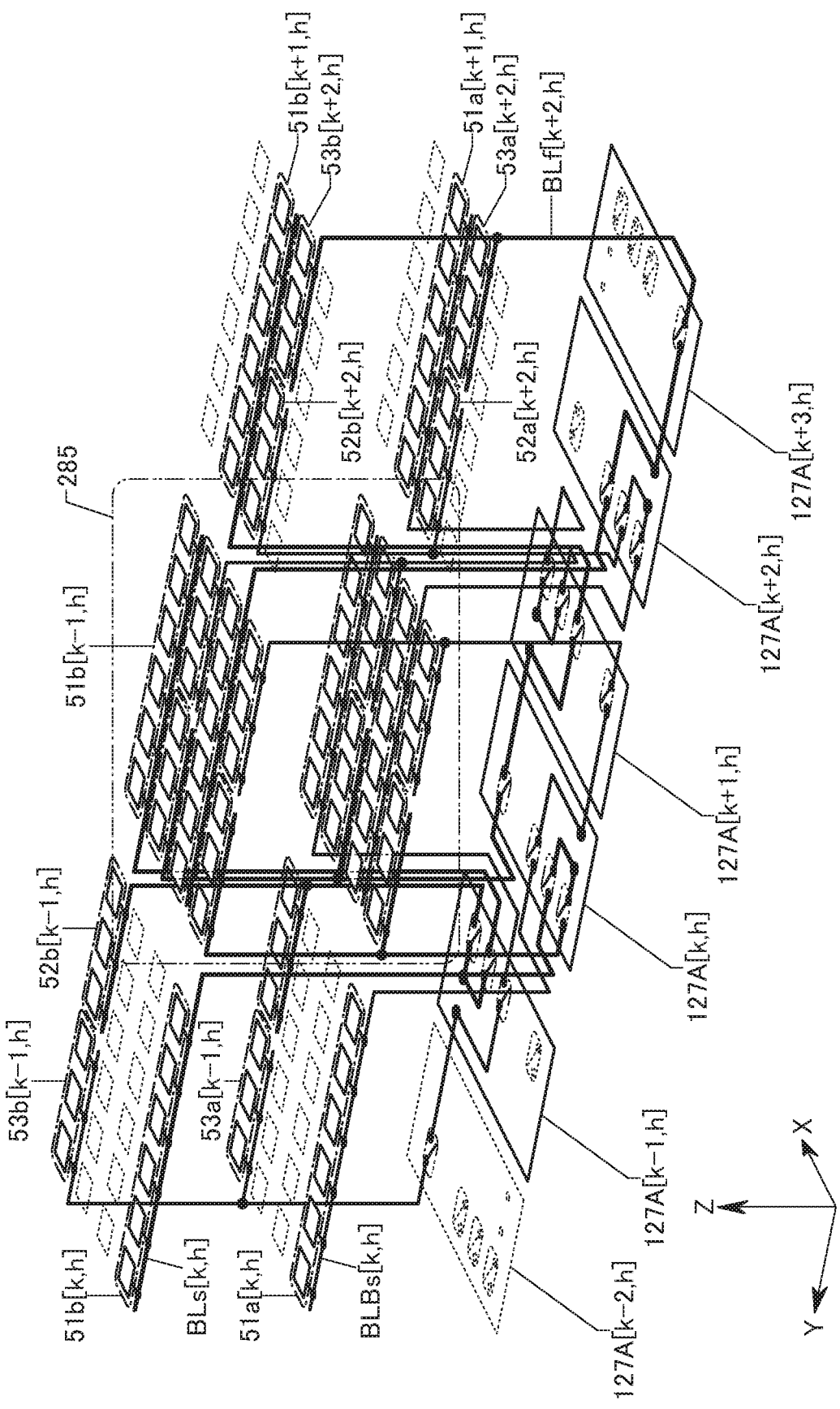
FIG. 22 A diagram illustrating a connection relationship between sense amplifiers and memory cells.
Figure 23:
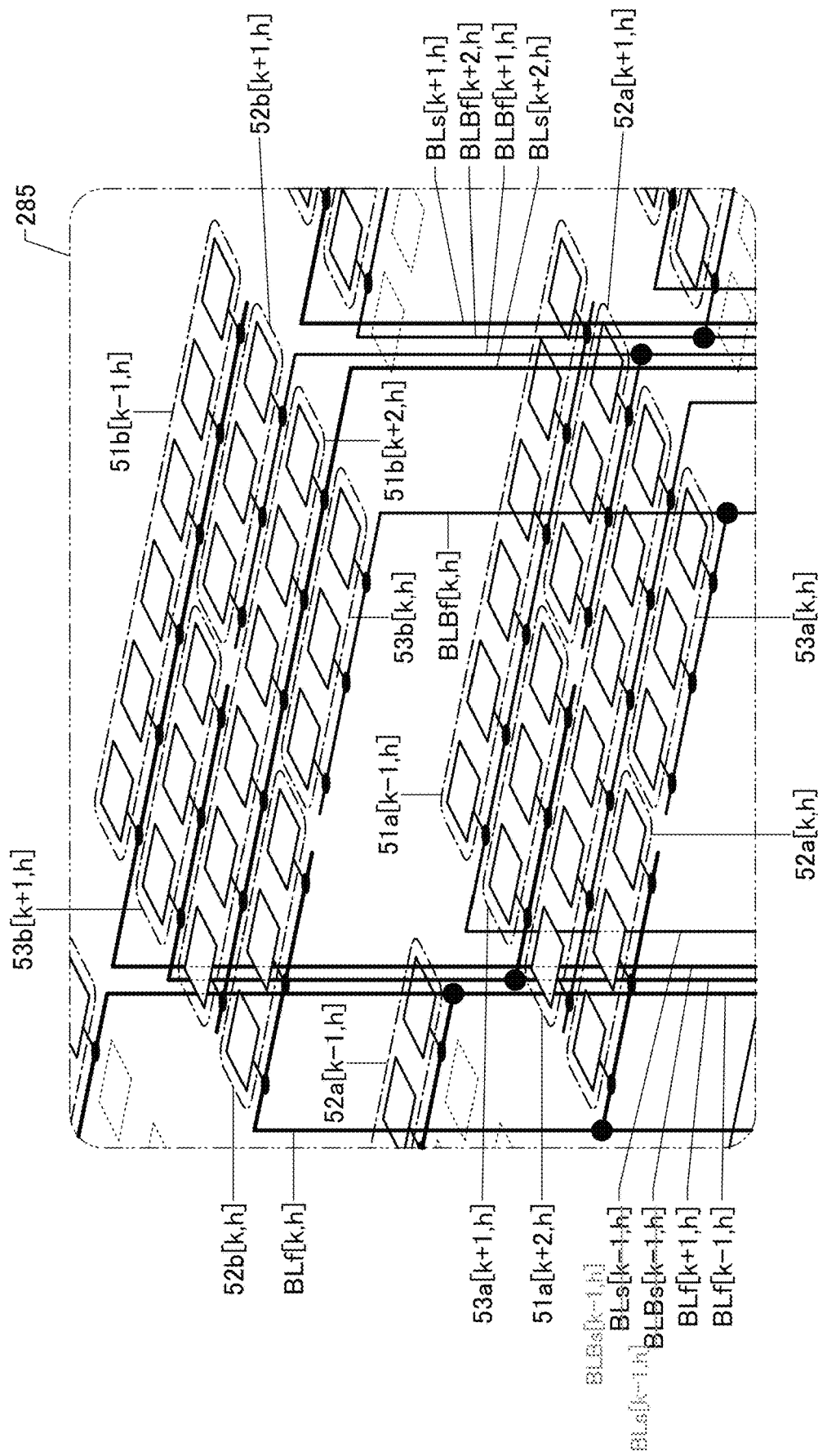
FIG. 23 A diagram illustrating a connection relationship between sense amplifiers and memory cells.

FIG. 22 is a perspective block diagram illustrating the connection relationship between the sense amplifiers 127A, the memory cells 10a, and the memory cells 10b. FIG. 22 is a diagram in which the illustration of the word line WLa and the word line WLb is eliminated from FIG. 19. FIG. 23 is an enlarged view of a portion 285 illustrated in FIG. 22. In addition, FIG. 24 is a diagram of part of the cell array 221b seen from the Z-direction. Moreover, FIG. 25 is a diagram illustrating the sense amplifier 127A[k−1,h] to the sense amplifier 127A[k+3,h], and the bit lines BL and bit lines BLB that correspond to the respective sense amplifiers.

The first bit line BLf[k,h] is electrically connected to the memory cells 10a included in the memory cell group 52a[k,h] and the memory cells 10b included in the memory cell group 52b[k,h]. The first bit line BLf[k,h] is also electrically connected to the node ND[k,h] through the switch 231[k,h]. Note that although the memory cell groups are not clearly illustrated in FIG. 19, FIG. 20, and FIG. 21, FIG. 22, and FIG. 23 may be referred to for the memory cell groups.

The second bit line BLs[k,h] is electrically connected to the memory cells 10b included in the memory cell group 51b[k,h]. The second bit line BLs[k,h] is electrically connected to the node ND[k,h] through the switch 232[k,h].

The first bit line BLBf[k,h] is electrically connected to the memory cells 10a included in the memory cell group 53a[k,h] and the memory cells 10b included in the memory cell group 53b[k,h]. The first bit line BLBf[k,h] is also electrically connected to the node NDB[k,h] through the switch 233 [k,h]. Note that the switch 233[k,h] may be provided in the sense amplifier 127A[k,h] though provided in the sense amplifier 127A[k+1,h] in FIG. 19 and FIG. 20.

The second bit line BLBs[k,h] is electrically connected to the memory cells 10a included in the memory cell group 51a[k,h]. The second bit line BLBs[k,h] is electrically connected to the node NDB[k,h] through the switch 234[k, h].

The first bit line BLf[k+1,h] is electrically connected to the memory cells 10a included in the memory cell group 52a[k+1,h] and the memory cells 10b included in the memory cell group 52b[k+1,h]. The first bit line BLf[k+1,h] is also electrically connected to the node ND[k+1,h] through the switch 231[k+1,h]. Note that the switch 231[k+1,h] may be provided in the sense amplifier 127A[k+1,h] though provided in the sense amplifier 127A[k,h] in FIG. 19 and FIG. 20.

The second bit line BLs[k+1,h] is electrically connected to the memory cells 10b included in the memory cell group 51b[k+1,h]. The second bit line BLs[k+1,h] is also electrically connected to the node ND[k+1,h] through the switch 232[k+1,h].

The first bit line BLBf[k+1,h] is electrically connected to the memory cells 10a included in the memory cell group 52a[k+1,h] and the memory cells 10b included in the memory cell group 52b[k+1,h]. The first bit line BLBf[k+1,h] is also electrically connected to the node NDB[k+1,h] through the switch 233[k+1,h].

The second bit line BLBs[k+1,h] is electrically connected to the memory cells 10a included in the memory cell group 51a[k+1,h]. The second bit line BLBs[k+1,h] is also electrically connected to the node NDB[k+1,h] through the switch 234[k+1,h].

The first bit line BLf[k−1,h] is electrically connected to the memory cells 10a included in the memory cell group 52a[k−1,h] and the memory cells 10b included in the memory cell group 52b[k−1,h]. The first bit line BLf[k−1,h] is also electrically connected to the node ND[k,h] through the switch 231[k−1,h].

The second bit line BLs[k−1,h] is electrically connected to the memory cells 10b included in the memory cell group 51b[k−1,h]. The second bit line BLs[k−1,h] is also electrically connected to the node ND[k−1,h] through the switch 232[k−1,h].

The first bit line BLBf[k−1,h] is electrically connected to the memory cells 10a included in the memory cell group 53a[k−1,h] and the memory cells 10b included in the memory cell group 53b[k−1,h]. The first bit line BLBf[k−1,h] is also electrically connected to the node NDB[k−1,h] through the switch 233[k−1,h]. Note that the switch 233[k−1,h] may be provided in the sense amplifier 127A[k−1,h] though provided in the sense amplifier 127A[k−2,h] in FIG. 19 and FIG. 21.

The second bit line BLBs[k−1,h] is electrically connected to the memory cells 10a included in the memory cell group 51a[k−1,h]. The second bit line BLBs[k−1,h] is also electrically connected to the node NDB[k−1,h] through the switch 234[k−1,h].

The first bit line BLf[k+2,h] is electrically connected to the memory cells 10a included in the memory cell group 52a[k+2,h] and the memory cells 10b included in the memory cell group 52b[k+2,h]. The first bit line BLf[k+2,h] is also electrically connected to the node ND[k+2,h] through the switch 231[k+2,h]. Note that the switch 231[k+2,h] may be provided in the sense amplifier 127A[k+2,h] though provided in the sense amplifier 127A[k+3,h] in FIG. 19.

The second bit line BLs[k+2,h] is electrically connected to the memory cells 10b included in the memory cell group 51b[k+2,h]. The second bit line BLs[k+2,h] is also electrically connected to the node ND[k+2,h] through the switch 232[k+2,h].

The first bit line BLBf[k+2,h] is electrically connected to the memory cells 10a included in the memory cell group 52a[k+2,h] and the memory cells 10b included in the memory cell group 52b[k+2,h]. The first bit line BLBf[k+2,h] is also electrically connected to the node NDB[k+1,h] through the switch 233[k+2,h].

The second bit line BLBs[k+2,h] is electrically connected to the memory cells 10a included in the memory cell group 51a[k+2,h]. The second bit line BLBs[k+2,h] is also electrically connected to the node NDB[k+2,h] through the switch 234[k+2,h].

In FIG. 22 and FIG. 23, when the memory cell array 221a is seen from the X-direction (row direction), a memory cell group 51a[k+2,h] includes a region overlapping with a memory cell group 52a[k,h] and a region overlapping with a memory cell group 53a[k,h]. In other words, when the memory cell array 221a is seen from the X-direction (row direction), a bit line BLBs[k+2,h] includes a region overlapping with the bit line BLf[k,h] and a region overlapping with the bit line BLBf[k,h].

In addition, when the memory cell array 221a is seen from the X-direction (row direction), a memory cell group 51a[k−1,h] includes a region overlapping with a memory cell group 52a[k+1,h] and a region overlapping with a memory cell group 53a[k+1,h]. In other words, when the memory cell array 221a is seen from the X-direction (row direction), a bit line BLBs[k−1,h] includes a region overlapping with the bit line BL[k+1,h] and a region overlapping with the bit line BLf[k+1,h].

In addition, when the memory cell array 221a is seen from the X-direction (row direction), a memory cell group 51a [k+2,h] includes a region overlapping with the memory cell group 52a[k,h] and the memory cell group 53a[k+1,h] and a region overlapping with the memory cell group 53a[k,h] and the memory cell group 52a[k+1,h].

In addition, when the memory cell array 221a is seen from the X-direction (row direction), a memory cell group 51a [k−1,h] includes a region overlapping with the memory cell group 52a[k,h] and the memory cell group 53a[k+1,h] and a region overlapping with the memory cell group 53a[k,h] and the memory cell group 52a[k+1,h].

In addition, when the memory cell array 221a is seen from the Z-direction, the memory cell group 51a[k+2,h] includes a region adjacent to the memory cell group 52a[k,h] and a region adjacent to the memory cell group 53a[k,h]. In other words, when the memory cell array 221a is seen from the Z-direction, the bit line BLs[k+2,h] includes a region adjacent to the bit line BLf[k,h] and a region adjacent to the bit line BLBf[k,h].

In addition, when the memory cell array 221a is seen from the Z-direction, the memory cell group 51a[k−1,h] includes a region adjacent to the memory cell group 53a[k+1,h] and a region adjacent to the memory cell group 52a[k+1,h]. In other words, when the memory cell array 221a is seen from the Z-direction, the bit line BLBs[k−1,h] includes a region adjacent to the bit line BLf[k+1,h] and a region adjacent to the bit line BLBf[k+1,h].

When the memory cell array 221a is seen from the Z-direction, the memory cell group 53a[k+1,h] and the memory cell group 52a[k,h] are adjacent to each other through the memory cell group 51a[k+2,h]. The memory cell group 52a[k+1,h] and the memory cell group 53a[k,h] are adjacent to each other through the memory cell group 51a[k+2,h].

In FIG. 22 and FIG. 23, when the memory cell array 221b is seen from the X-direction (row direction), a memory cell group 51b[k+2,h] includes a region overlapping with a memory cell group 52b[k,h] and a region overlapping with a memory cell group 53b[k,h]. In other words, when the memory cell array 221b is seen from the X-direction (row direction), a bit line BLs[k+2,h] includes a region overlapping with the bit line BLf[k,h] and a region overlapping with the bit line BLBf[k,h].

In addition, when the memory cell array 221b is seen from the X-direction (row direction), a memory cell group 51b [k−1,h] includes a region overlapping with a memory cell group 52b[k+1,h] and a region overlapping with a memory cell group 53b[k+1,h]. In other words, when the memory cell array 221b is seen from the X-direction (row direction), a bit line BLs[k−1,h] includes a region overlapping with the bit line BLf[k+1,h] and a region overlapping with the bit line BLBf[k+1,h].

In addition, when the memory cell array 221b is seen from the X-direction (row direction), a memory cell group 51b [k+2,h] includes a region overlapping with the memory cell group 52b[k,h] and the memory cell group 53b[k+1,h] and a region overlapping with the memory cell group 53b[k,h] and the memory cell group 52b[k+1,h].

In addition, when the memory cell array 221b is seen from the X-direction (row direction), a memory cell group 51b [k−1,h] includes a region overlapping with the memory cell group 52b[k,h] and the memory cell group 53b[k+1,h] and a region overlapping with the memory cell group 53b[k,h] and the memory cell group 52b[k+1,h].

In addition, when the memory cell array 221b is seen from the Z-direction, the memory cell group 51b[k+2,h] includes a region overlapping with the memory cell group 52b[k,h] and a region adjacent to the memory cell group 53b[k,h]. In other words, when the memory cell array 221b is seen from the Z-direction, the bit line BLs[k+2,h] includes a region adjacent to the bit line BLf[k,h] and a region adjacent to the bit line BLBf[k,h].

In addition, when the memory cell array 221b is seen from the Z-direction, the memory cell group 51b[k−1,h] includes a region adjacent to the memory cell group 53b[k+1,h] and a region adjacent to the memory cell group 52b[k+1,h]. In other words, when the memory cell array 221b is seen from the Z-direction, the bit line BLs[k−1,h] includes a region adjacent to the bit line BLf[k+1,h] and a region adjacent to the bit line BLBf[k+1,h].

When the memory cell array 221b is seen from the Z-direction, the memory cell group 53b[k+1,h] and the memory cell group 52b[k,h] are adjacent to each other through the memory cell group 51b[k+2,h]. The memory cell group 52b[k+1,h] and the memory cell group 53b[k,h] are adjacent to each other through the memory cell group 51b[k+2,h].

Figure 24A:
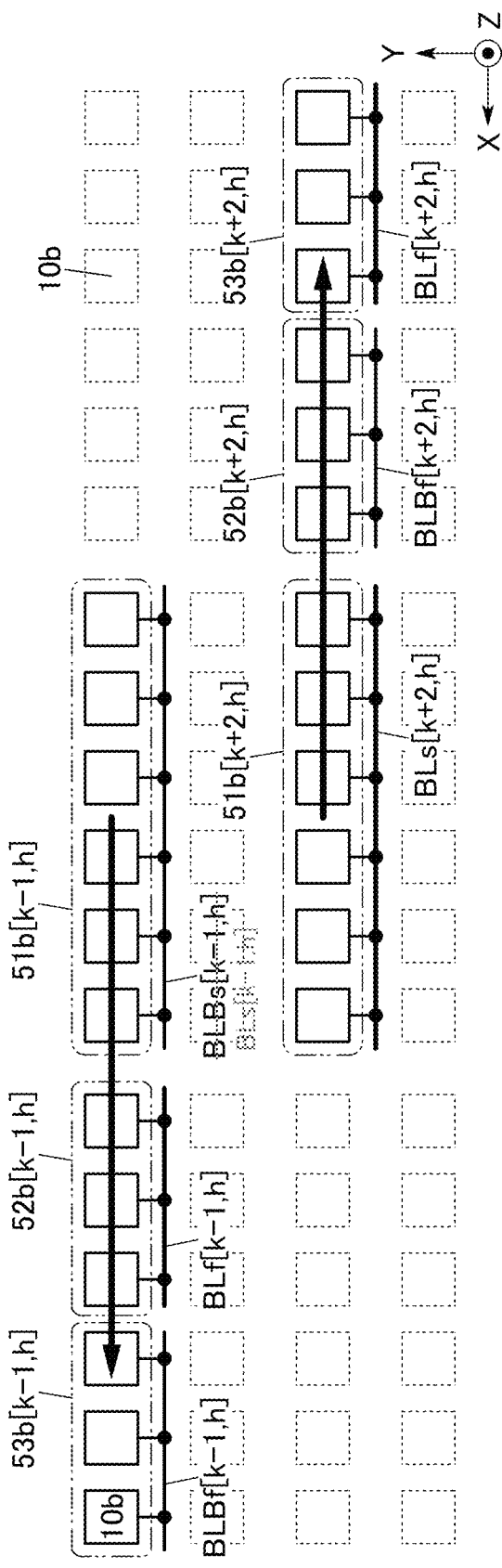
FIGS. 24A and 24B Diagrams illustrating arrangement of memory cell groups.
Figure 24B:
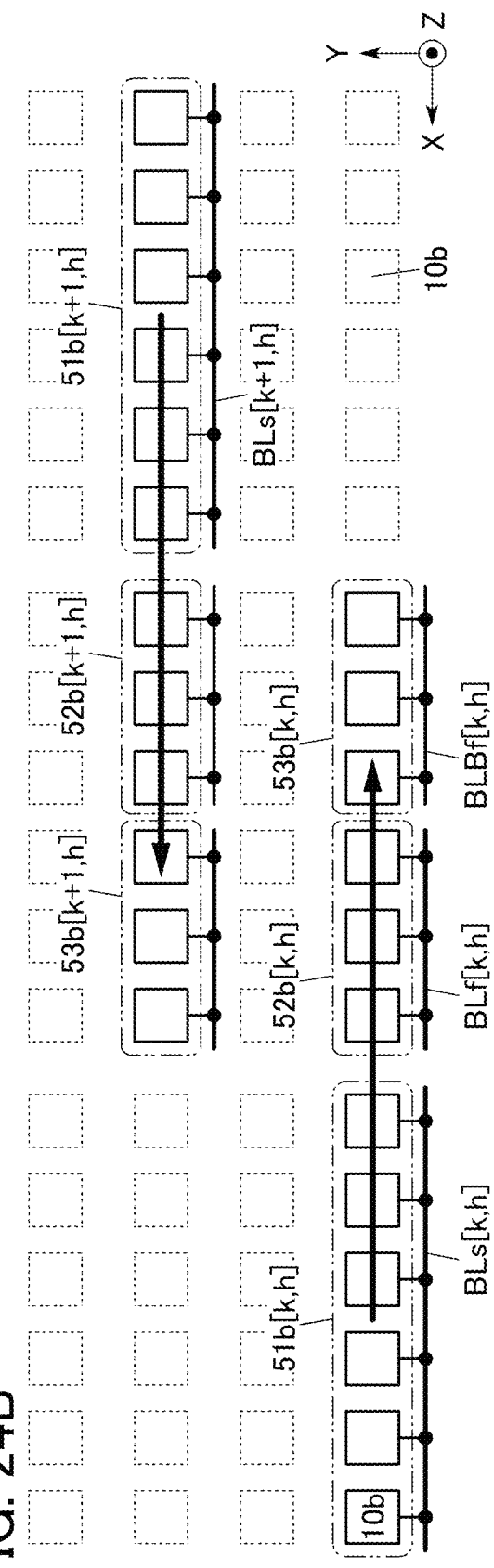
Figure 25:
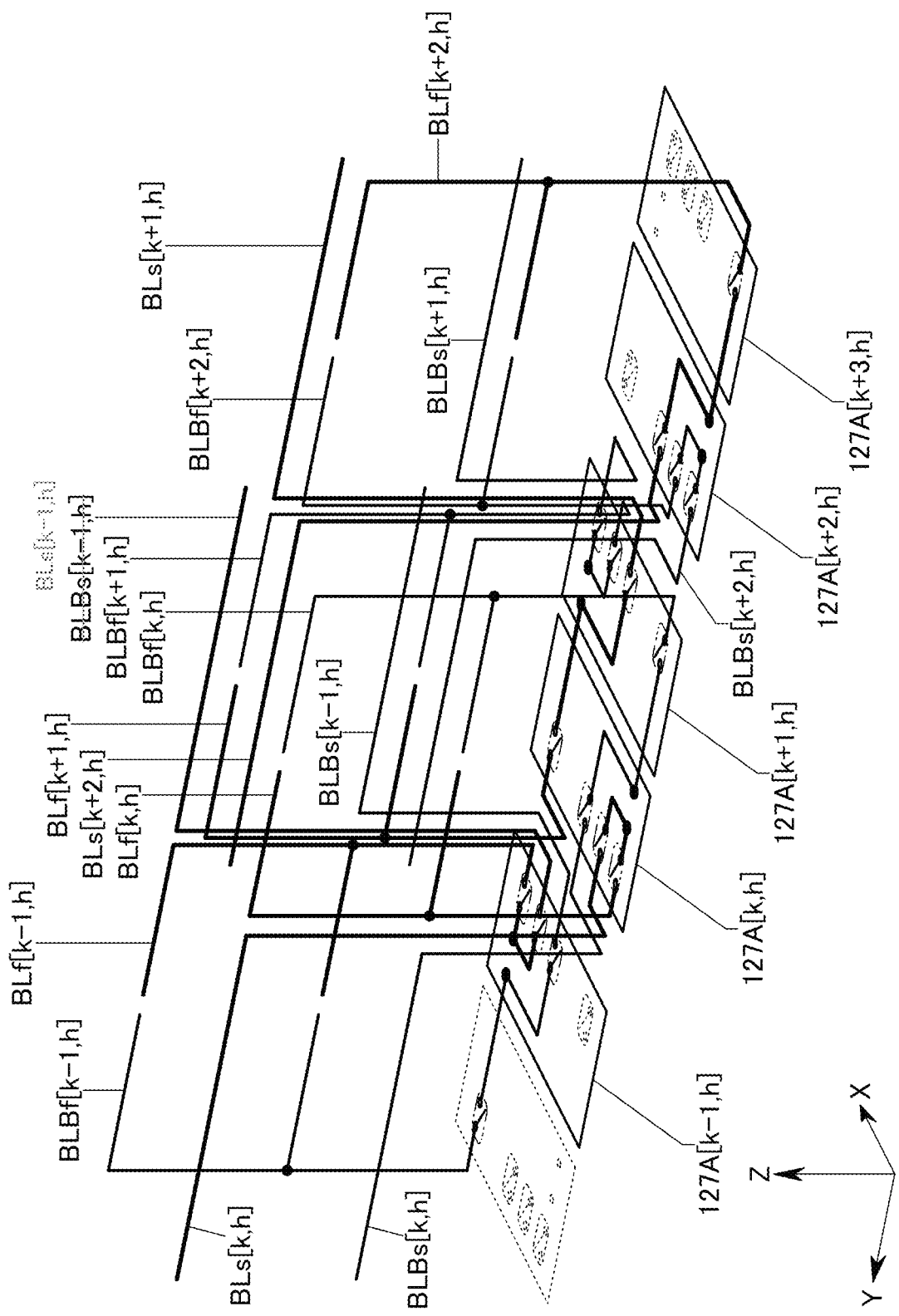
FIG. 25 A diagram illustrating an arrangement example of bit line pair.

FIGS. 24(A) and 24(B) are diagrams of part of the cell array 221b seen from the Z-direction. FIG. 24(A) illustrates the memory cell group 51b[k+2,h], the memory cell group 52b[k+2,h], the memory cell group 53b[k+2,h], the memory cell group 51b[k−1h,], the memory cell group 52b[k−1,h], and the memory cell group 53b[k−1,h]. FIG. 24(B) illustrates the memory cell group 51b[k,h], the memory cell group 52b[k,h], the memory cell group 53b[k,h], the memory cell group 51b[k+1,h], the memory cell group 52b[k+1,h], and the memory cell group 53b[k+1,h]. In addition, the other memory cells 10b are indicated by dashed lines.

In this embodiment, the memory cell groups electrically connected to the sense amplifier 127A[k,h] (the memory cell group 51b[k,h], the memory cell group 52b[k,h], and the memory cell group 53b[k,h]) and the memory cell groups electrically connected to the sense amplifier 127A[k+2,h] (the memory cell group 51b[k+2,h], the memory cell group 52b[k+2,h], and the memory cell group 53b[k+2,h]) are arranged in the same direction.

Specifically, in FIGS. 24(A) and 24(B), the X-direction is viewed as the horizontal axis, and the memory cell group 51b[k,h], the memory cell group 52b[k,h], and the memory cell group 53b[k,h] are arranged in this order from the left of the diagrams. In a similar manner, the memory cell group 51b[k+2,h], the memory cell group 52b[k+2,h], and the memory cell group 53b[k+2,h] are arranged in this order from the left of the diagrams.

In addition, the memory cell groups electrically connected to the sense amplifier 127A[k+1,h] (the memory cell group 51b[k+1,h], the memory cell group 52b[k+1,h], and the memory cell group 53b[k+1,h]) and the memory cell groups electrically connected to the sense amplifier 127A[k−1,h] (the memory cell group 51b[k−1,h], the memory cell group 52b[k−1,h], and the memory cell group 53b[k−1,h]) are arranged in the same direction.

Specifically, in FIGS. 24(A) and 24(B), the X-direction is viewed as the horizontal axis, and the memory cell group 51b[k+1,h], the memory cell group 52b[k+1,h], and the memory cell group 53b[k+1,h] are arranged in this order from the right of the diagrams. In a similar manner, the memory cell group 51b[k−1,h], the memory cell group 52b[k−1,h], and the memory cell group 53b[k−1,h] are arranged in this order from the right of the diagrams.

Thus, the memory cell group electrically connected to the sense amplifier 127A[k,h] and the memory cell group electrically connected to the sense amplifier 127A[k+2,h] differ in the arrangement directions of the memory cell groups from the memory cell group electrically connected to the sense amplifier 127A[k+1,h] and the memory cell group electrically connected to the sense amplifier 127A[k−1,h]. Note that although not illustrated, the memory cell group 51a, the memory cell group 52a, and the memory cell group 53a are arranged in a similar manner.

This embodiment can be implemented in an appropriate combination with the structures described in the other embodiments and the like.

Embodiment 6

In this embodiment, a circuit configuration example of the sense amplifier 127 included in the local sense amplifier array 214 and an operation example of the memory device 100 are described using diagrams.

Circuit Configuration Example

Figure 28:
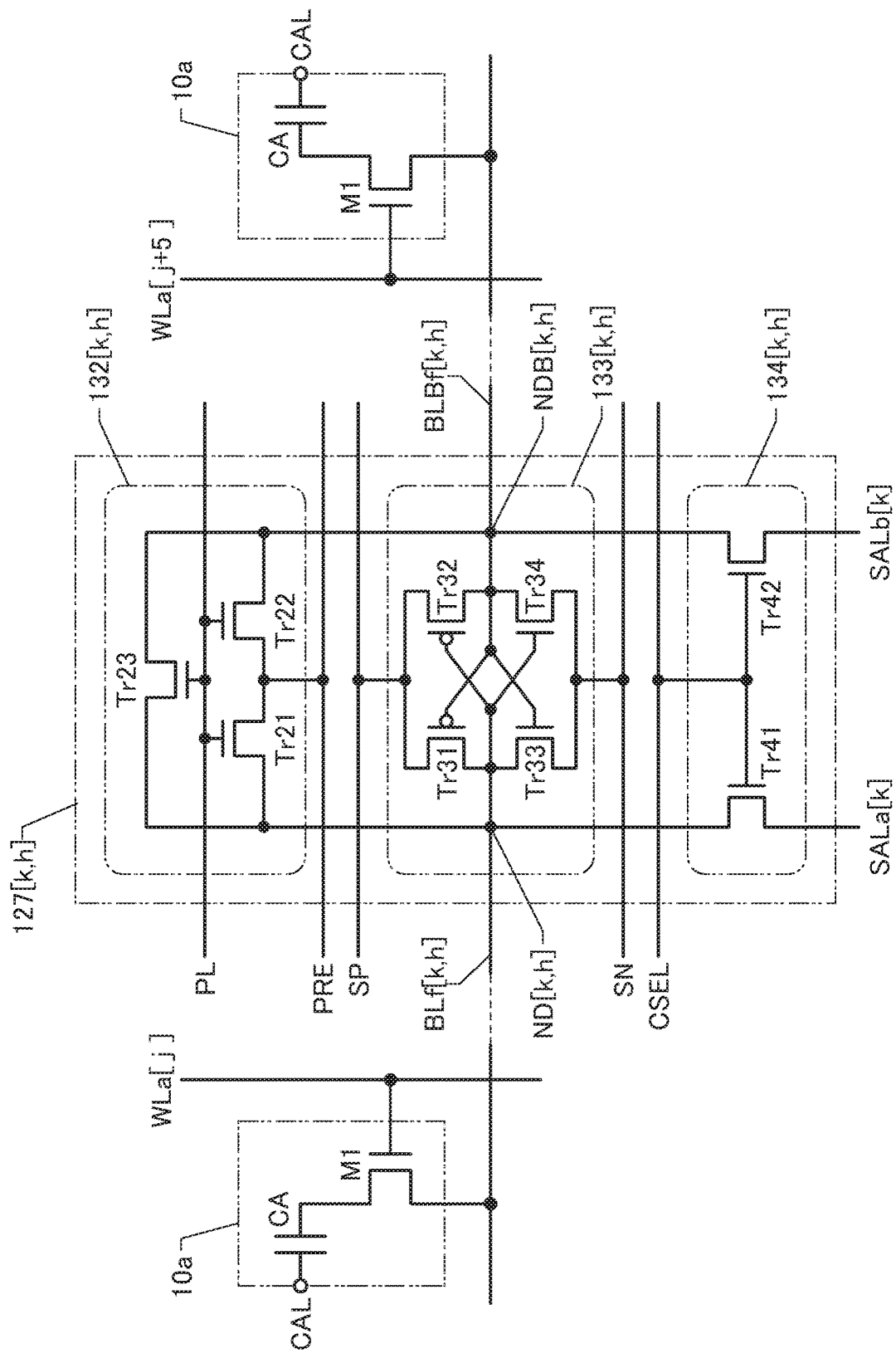
FIG. 28 A diagram illustrating a circuit configuration example of a sense amplifier.

FIG. 28 shows a circuit configuration example of the sense amplifier 127[k,h]. The sense amplifier 127[k,h] illustrated in FIG. 28 includes a precharge circuit 132, an amplifier circuit 133, and an input/output circuit 134. Note that in this embodiment and the like, the precharge circuit 132, the amplifier circuit 133, and the input/output circuit 134 included in the sense amplifier 127[k,h] are denoted by a precharge circuit 132[k,h], an amplifier circuit 133[k,h], and an input/output circuit 134[k,h], respectively.

FIG. 28 illustrates the memory cell 10a electrically connected to the sense amplifier 127[k,h] through a wiring BLf[k,h] and the memory cell 10a electrically connected to the sense amplifier 127[k,h] through a wiring BLBf[k,h]. An example in which the memory cell illustrated in FIG. 6(C) is used as the memory cell 10a is shown in FIG. 28.

[Precharge Circuit 132]

The precharge circuit 132[k,h] includes an n-channel transistor Tr21 to an n-channel transistor Tr23. Note that the transistor Tr21 to the transistor Tr23 may be p-channel transistors.

One of a source and a drain of the transistor Tr21 is electrically connected to the wiring BLf[k,h], and the other of the source and the drain is electrically connected to the wiring PRE. A connection between one of the source and the drain of the transistor Tr21 and the wiring BLf[k,h] is a node ND[k,h].

One of a source and a drain of the transistor Tr22 is electrically connected to the wiring BLBf[k,h], and the other of the source and the drain is electrically connected to the wiring PRE. A connection between one of the source and the drain of the transistor Tr22 and the wiring BLBf[k,h] is a node NDB[k,h].

One of a source and a drain of the transistor Tr23 is electrically connected to the wiring BLf[k,h] through the node ND[k,h], and the other of the source and the drain is electrically connected to the wiring BLBf[k,h] through the node NDB[k,h]. A gate of the transistor Tr21, a gate of the transistor Tr22, and a gate of the transistor Tr23 are electrically connected to a wiring PL.

The precharge circuit 132[k,h] has a function of initializing the potentials of the wiring BLf[k,h] and the wiring BLBf[k,h].

[Amplifier Circuit 133]

The amplifier circuit 133[k,h] includes a p-channel transistor Tr31, a p-channel transistor Tr32, an n-channel transistor Tr33, and an n-channel transistor Tr34.

One of a source and a drain of the transistor Tr31 is electrically connected to a wiring SP, and the other of the source and the drain is electrically connected to a gate of the transistor Tr32, a gate of the transistor Tr34, the node ND[k,h], and the wiring BLf[k,h].

One of a source and a drain of the transistor Tr33 is electrically connected to the gate of the transistor Tr32, the gate of the transistor Tr34, the node NDB[k,h], and the wiring BLf[k,h], and the other of the source and the drain is electrically connected to a wiring SN.

One of a source and a drain of the transistor Tr32 is electrically connected to the wiring SP, and the other of the source and the drain is electrically connected to a gate of the transistor Tr31, a gate of the transistor Tr33, the node NDB[k,h], and the wiring BLBf[k,h].

One of a source and a drain of the transistor Tr34 is electrically connected to the gate of the transistor Tr31, the gate of the transistor Tr33, the node NDB[k,h], and the wiring BLBf[k,h], and the other of the source and the drain is electrically connected to the wiring SN.

The amplifier circuit 133[k,h] has a function of amplifying the potentials of the wiring BLf[k,h] and the wiring BLBf[k,h]. Note that the amplifier circuit 133[k,h] functions as a latch sense amplifier.

[Input/Output Circuit 134]

The input/output circuit 134[k,h] includes an n-channel transistor Tr41 and an n-channel transistor Tr42. Note that the transistor Tr41 and the transistor Tr42 may be p-channel transistors.

One of a source and a drain of the transistor Tr41 is electrically connected to the node ND[k,h] and the wiring BLf[k,h], and the other of the source and the drain is electrically connected to a wiring SALa[k]. One of a source and a drain of the transistor Tr42 is electrically connected to the node NDB[k,h] and the wiring BLBf[k,h], and the other of the source and the drain is electrically connected to a wiring SALb[k]. A gate of the transistor Tr41 and a gate of the transistor Tr42 are electrically connected to a wiring CSEL.

The input/output circuit 134[k,h] has a function of controlling the electrical continuity between the wiring BLf[k,h] and the wiring SALa[k] and the electrical continuity between the wiring BLBf[k,h] and the wiring SALb[k] on the basis of a potential supplied to the wiring CSEL. That is, whether a potential is output to the wiring SALa[k] and the wiring SALb[k] can be selected by the input/output circuit 134[k,h].

The wiring SP, the wiring SN, the wiring CSEL, the wiring PRE, and the wiring PL have a function of transmitting a signal for controlling the operation of the precharge circuit 132, the amplifier circuit 133, and the input/output circuit 134. The wiring SP, the wiring SN, the wiring CSEL, the wiring PRE, and the wiring PL are connected to the control circuit 112 illustrated in FIG. 1. The control circuit 112 has a function of supplying a control signal to the wiring SP, the wiring SN, the wiring CSEL, the wiring PRE, and the wiring PL.

Operation Example

Next, an operation example of the memory device 100 is described. In this embodiment, an operation example of the sense amplifier 127 and the memory cell 10a illustrated in FIG. 28 is described. In this embodiment, four operation modes (a reading mode, a writing mode, a refresh mode, and a retention mode) are described. In addition, the memory cell 10a and the memory cell 10b are each a memory element capable of storing 1-bit information.

[Reading Mode]

The reading mode is an operation mode performed when information stored in the memory cell 10a or the memory cell 10b is read. An operation example of the reading mode is described using a timing chart illustrated in FIG. 29. As an example, an operation of reading information stored in the memory cell 10a electrically connected to the wiring BLf[k,h] and the word line WLa[j] is described.

[Period T11]

In Period T11, the precharge circuit 132[k,h] is operated, and the potentials of the wiring BLf[k,h] and the wiring BLBf[k,h] are initialized. Specifically, the potential of the wiring PL is set to VDD, whereby the transistor Tr21 to the transistor Tr23 are brought into an on state. Thus, a potential Vpre (also referred to as a "Vpre") of the wiring PRE is supplied to the wiring BLf[k,h] and the wiring BLBf[k,h]. Note that the potential Vpre is a potential higher than VSS and lower than VDD. In this embodiment, the potential Vpre is set to (VDD+VSS)/2. In this embodiment, VDD is set to 1.5 V, VSS is set to 0 V, and Vpre is set to 0.75 V.

Note that in Period T11, the potential of the wiring CSEL is VSS, and the transistor Tr41 and the transistor Tr42 in the input/output circuit 134[k,h] are in an off state. Moreover, in Period T11, the potential of the wiring CSEL may be set to a potential VNN described later.

In addition, the potential of the word line WLa[j] is the potential VNN, and the transistor M1 included in the memory cell 10a is in an off state. In this embodiment, since the memory cell 10a is a one-bit memory element, VDD or VSS is retained in the memory cell 10a. The potential VNN (also referred to as "VNN") is a potential at which the transistor M1 is brought into an off state. Therefore, VNN is preferably a potential lower than or equal to VSS. In addition, VNN is further preferably a potential lower than VSS.

When VSS is the reference potential (0 V), a potential lower than VSS is referred to as a "negative potential," a "negative voltage," or a "negative bias" in some cases. As described above, VNN is preferably a negative potential. In other words, VNN is preferably a potential lower than the source potential and the drain potential of the transistor M1. In this embodiment, VNN is set to −0.5 V.

When VNN supplied to the word line WLa[j] is a negative potential, the transistor M1 can be brought into an off state more reliably. A memory device whose data retention time is long even when operated at high temperature, in particular, can be provided.

As in the case of the word line WLa[j], the potential of the word line WLa[j+5] is VNN and the transistor M1 included in the memory cell 10a electrically connected to the word line WLa[j+5] is in an off state.

In addition, the potentials of the wiring SP and the wiring SN are the potential Vpre, and the amplifier circuit 133[k,h] remains in a halting state.

[Period T12]

In Period T12, the potential of the wiring PL is set to VSS or VNN, and the transistor Tr21 to the transistor Tr23 are brought into an off state. In this case, VNN is preferably a potential lower than the source potentials and drain potentials of the transistor Tr21 to the transistor Tr23. That is, VNN is preferably a negative potential.

In addition, in Period T12, the word line WLa[j] is set in a selected state. Specifically, the potential of the word line WLa[j] is set to a potential VPP, whereby the transistor M1 included in the memory cell 10a is brought into an on state.

Since the potential VPP (also referred to as "VPP") is a potential at which the transistor M1 is brought into an on state, VPP is preferably a potential higher than or equal to VDD. In addition, VPP is more preferably a potential higher than VDD. In particular, VPP is further preferably a potential higher than VDD by the Vth of the transistor M1 or more. In this embodiment, VPP is set to 3.0 V.

This establishes electrical continuity between the wiring BLf[k,h] and the capacitor CA through the transistor M1 in the memory cell 10a electrically connected to the word line WLa[j], and the potential of the wiring BLf[k,h] changes in accordance with the amount of charge retained in the capacitor CA.

Figure 29:
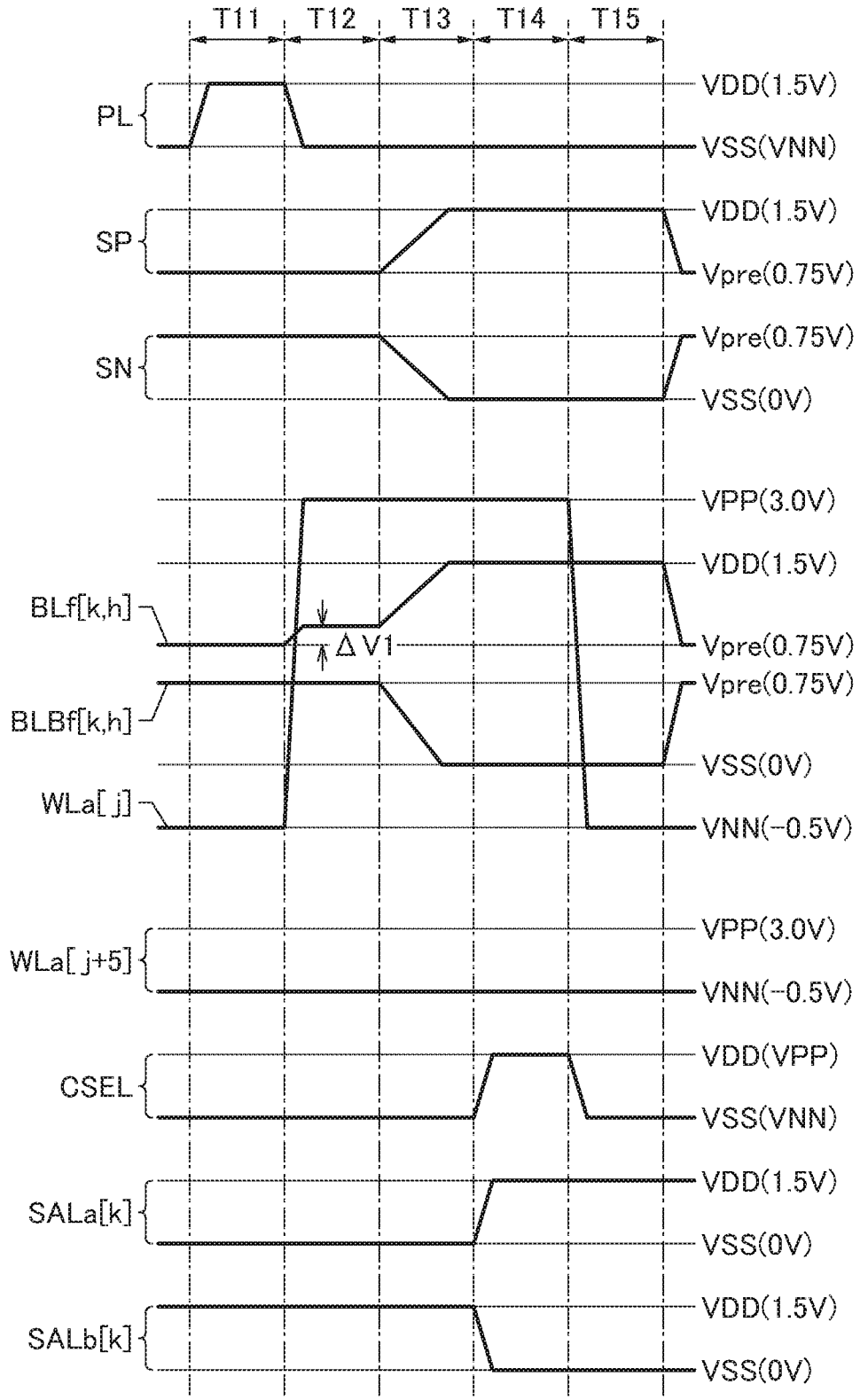
FIG. 29 A diagram showing an operation example of a sense amplifier.

FIG. 29 shows the case where data "1" is stored in the memory cell 10a and the amount of charge accumulated in the capacitor CA is large, as an example. In the case where the amount of charge accumulated in the capacitor CA is large, the release of charge from the capacitor CA to the wiring BLf[k,h] increases the potential of the wiring BLf [k,h] from the potential Vpre by ΔV1. By contrast, in the case where data "0" is stored in the memory cell 10a and the amount of charge accumulated in the capacitor CA is small, charge flows from the wiring BLf[k,h] to the capacitor CA, decreasing the potential of the wiring BLf[k,h] by ΔV2 (not illustrated).

Note that in Period T12, the potential of the wiring CSEL is VSS or VNN, and the transistor Tr41 and the transistor Tr42 in the input/output circuit 134[k,h] are in an off state. In this case, VNN is preferably a potential lower than the source potentials and drain potentials of the transistor Tr41 and the transistor Tr42. That is, VNN is preferably a negative potential.

In addition, the potentials of the wiring SP and the wiring SN are the potential Vpre. The amplifier circuit 133[k,h] remains in a halting state.

[Period T13]

In Period T13, the potential of the wiring SP is changed to VDD and the potential of the wiring SN is changed to VSS. Thus, the amplifier circuit 133[k,h] is brought into an operating state. The amplifier circuit 133[k,h] has a function of amplifying the potential difference between the wiring BLf[k,h] and the wiring BLBf[k,h] (ΔV1 in FIG. 29).

When the amplifier circuit 133[k,h] is brought into an operating state, the potential of the wiring BLf[k,h] changes to VDD from Vpre+ΔV1. In addition, the potential of the wiring BLBf[k,h] changes to VSS from Vpre.

Note that in the case where the potential of the wiring BLf[k,h] is Vpre−ΔV2 in the initial stage of Period T13, bringing the amplifier circuit 133[k,h] into an operating state changes the potential of the wiring BLf[k,h] to VSS from Vpre−ΔV2. In addition, the potential of the wiring BLBf[k, h] changes to VDD from Vpre.

In Period T13, the potential of the wiring PL is VSS or VNN, and the transistor Tr21 to the transistor Tr23 in the precharge circuit 132[k,h] are in an off state.

The potential of the wiring CSEL is VSS or VNN, and the transistor Tr41 and the transistor Tr42 in the input/output circuit 134[k,h] are in an off state. In addition, the potential of the word line WLa[j] is VPP and the transistor M1 included in the memory cell 10a electrically connected to the word line WLa[j] is in an on state. Consequently, in the memory cell 10a, the amount of charge corresponding to the potential (VDD) of the wiring BLf[k,h] is accumulated in the capacitor CA.

[Period T14]

In Period T14, the potential of the wiring CSEL is changed to bring the input/output circuit 134[k,h] into an on state. Specifically, the potential of the wiring CSEL is set to VDD or VPP, whereby the transistor Tr41 and the transistor Tr42 are brought into an on state. Accordingly, the potential of the wiring BLf[k,h] is supplied to the wiring SALa[k], and the potential of the wiring BLBf[k,h] is supplied to the wiring SALb[k].

In Period T14, the potential of the wiring PL is VSS or VNN, and the transistor Tr21 to the transistor Tr23 in the precharge circuit 132[k,h] are in an off state. In addition, the potential of the word line WLa[j] is VPP, and the transistor M1 included in the memory cell 10a is in an on state. The potential of the wiring SP is VDD, the potential of the wiring SN is VSS, and the amplifier circuit 133[k,h] is in an operating state. Consequently, in the memory cell 10a electrically connected to the word line WLa[j], charge corresponding to the potential (VDD) of the wiring BLf[k,h] is supplied to the capacitor CA through the wiring BLf[k,h] and accumulated.

[Period T15]

In Period T15, the potential of the wiring CSEL is changed to bring the input/output circuit 134[k,h] into an off state. Specifically, the potential of the wiring CSEL is set to VSS or VNN, whereby the transistor Tr41 and the transistor Tr42 are brought into an off state.

In addition, the word line WLa[j] is set in an unselected state in Period T15. Specifically, the potential of the word line WLa[j] is set to VNN. Consequently, the transistor included in the memory cell 10a electrically connected to the word line WLa[j] is brought into an off state. Thus, the amount of charge corresponding to VDD is retained in the capacitor CA included in the memory cell 10a. Accordingly, data is retained in the memory cell 10a even after the data is read.

When VNN supplied to the word line WLa[j] is a negative potential, the transistor M1 can be brought into an off state more reliably. A memory device whose data retention time is long even when operated at high temperature, in particular, can be provided.

Note that in Period T15, even when the input/output circuit 134[k,h] is brought into an off state, the potentials of the wiring BLf[k,h] and the wiring BLBf[k,h] are retained by an amplifier circuit AC as long as the amplifier circuit 133[k,h] is in an operating state. Therefore, the sense amplifier 127[k,h] has a function of temporarily retaining information that has been read from the memory cell 10a.

Through the operations described above, information can be read from the memory cell 10a. The read data is supplied to the control circuit 112 (see FIG. 1) through the wiring SALa[k] and/or the wiring SALb[k]. Note that reading of data from other memory cells can be performed in a manner similar to that of the memory cell 10a.

[Writing Mode]

The writing mode is an operation mode performed when information to be stored is written to the memory cell 10a or the memory cell 10b. An operation example of the writing mode is described with reference to a timing chart shown in FIG. 30. As an example, an operation of writing information to the memory cell 10a electrically connected to the wiring BLf[k,h] and the word line WLa[j] is described.

[Period T21]

In Period T21, an operation similar to that in Period T11 is performed, and the potentials of the wiring BLf[k,h] and the wiring BLBf[k,h] are initialized. Specifically, the potential of the wiring PL is set to VDD and the potentials of the wiring BLf[k,h] and the wiring BLBf[k,h] are set to Vpre.

[Period T22]

In Period T22, the potential of the wiring PL is set to VSS or VNN, and the transistor Tr21 to the transistor Tr23 are brought into an off state. Furthermore, the word line WLa[j] electrically connected to the memory cell 10a to which data is written is selected. Specifically, the potential of the word line WLa[j] is set to VPP, whereby the transistor M1 included in the memory cell 10a is brought into an on state. This establishes electrical continuity between the wiring BLf[k,h] and the capacitor CA through the transistor M1 in the memory cell 10a.

At this time, in the case where data "1" is already stored in the memory cell 10a, the release of charge from the capacitor CA to the wiring BLf[k,h] increases the potential of the wiring BLf[k,h] from the potential Vpre by $\Delta V1$.

[Period T23]

In Period T23, the potential of the wiring SP is set to VDD and the potential of the wiring SN is set to VSS to bring the amplifier circuit 133[k,h] into an operating state.

[Period T24]

In Period T24, the potential of the wiring CSEL is changed to bring the input/output circuit 134[k,h] into an operating state. This establishes electrical continuity between the wiring BLf[k,h] and the wiring SALa[k] and also electrical continuity between the wiring BLBf[k,h] and the wiring SALb[k].

A data signal WDATA is supplied to the input/output circuit 134[k,h] through the wiring SALa[k] and the wiring SALb[k]. By supplying a writing potential corresponding to the data signal WDATA to the wiring SALa[k] and the wiring SALb[k], the writing potential is supplied to the wiring BLf[k,h] and the wiring BLBf[k,h] through the input/output circuit 134[k,h]. For example, in the case where data "0" is stored in the memory cell 10a, VSS is supplied to the wiring SALa[k] and VDD is supplied to the wiring SALb[k].

Thus, the on/off state of the transistor Tr31 to the transistor Tr34 included in the amplifier circuit 133[k,h] is inverted, the potential (VSS) of the wiring SN is supplied to the wiring BLf[k,h], and the potential (VDD) of the wiring SP is supplied to the wiring BLBf[k,h]. Accordingly, the amount of charge corresponding to the potential (VSS) representing the data "0" is supplied to the capacitor CA through the wiring BLf[k,h] and accumulated. Through the operations described above, data can be written to the memory cell 10a.

[Period T25]

In Period T25, VNN is supplied to the word line WLa[j] and the word line WLa[j] is set in an unselected state. Accordingly, charge written to the memory cell 10a is retained.

In addition, the potential of the wiring CSEL is set to VSS or VNN, whereby the transistor Tr41 and the transistor Tr42 are brought into an off state.

Note that after the potential of the wiring SALa[k] is supplied to the wiring BLf[k,h], the potentials of the wiring BLf[k,h] and the wiring BLBf[k,h] are retained by the amplifier circuit 133[k,h] as long as the sense amplifier circuit 133[k,h] is in an operating state even when the transistor Tr41 and the transistor Tr42 are brought into an off state in the input/output circuit 134[k,h]. Thus, the timing of switching the transistor Tr41 and the transistor Tr42 from an on state to an off state can be either before or after the word line WLa[j] is selected.

Through the operations described above, data can be written to the memory cell 10a. Note that writing of data to other memory cells can be performed in a manner similar to that of the memory cell 10a.

When VNN supplied to the word line WLa[j] is a negative potential, the transistor M1 can be brought into an off state more reliably. A memory device whose data retention time is long even when operated at high temperature, in particular, can be provided.

[Refresh Mode]

The refresh mode mode is an operation mode for performing refresh operation (rewriting operation) at regular intervals to maintain data written to the memory cell 10a. The operation in the refresh mode mode is described with reference to a timing chart shown in FIG. 31. As an example, an operation of rewriting information to the memory cell 10a electrically connected to the wiring BLf[k,h] and the word line WLa[j] is described. Note that the refresh operation can be performed in the same principle as the above operation modes.

[Period T31]

In Period T31, an operation similar to that in Period T11 is performed, and the potentials of the wiring BLf[k,h] and the wiring BLBf[k,h] are initialized. Specifically, the potential of the wiring PL is set to VDD and the potentials of the wiring BLf[k,h] and the wiring BLBf[k,h] are set to Vpre.

[Period T32]

In Period T32, the potential of the wiring PL is set to VSS or VNN, and the transistor Tr21 to the transistor Tr23 are brought into an off state. Furthermore, the word line WLa[j] electrically connected to the memory cell 10a to which data is written is set in a selected state. Specifically, the potential of the word line WLa[j] is set to VPP, whereby the transistor M1 included in the memory cell 10a is brought into an on state. This establishes electrical continuity between the wiring BLf[k,h] and the capacitor CA through the transistor M1 in the memory cell 10a.

At this time, in the case where data "1" is already stored in the memory cell 10a, the release of charge from the capacitor CA to the wiring BLf[k,h] increases the potential of the wiring BLf[k,h] from the potential Vpre by $\Delta V1$.

[Period T33]

In Period T33, the potential of the wiring SP is set to VDD and the potential of the wiring SN is set to VSS to bring the amplifier circuit 133[k,h] into an operating state. When the amplifier circuit 133[k,h] is brought into an operating state, the potential of the wiring BLf[k,h] changes to the potential (VDD) of the wiring SP from Vpre+$\Delta V1$. In addition, the potential of the wiring BLBf[k,h] changes to the potential (VDD) of the wiring SN from Vpre.

[Period T34]

In Period T34, VNN is supplied to the word line WLa[j] and the word line WLa[j] is set in an unselected state. Accordingly, charge corresponding to the potential (VDD) of the wiring BLf[k,h] is supplied to the capacitor CA included in the memory cell 10a through the wiring BLf[k,h] and accumulated.

When VNN supplied to the word line WLa[j] is a negative potential, the transistor M1 can be brought into an off state more reliably. A memory device whose data retention time is long even when operated at high temperature, in particular, can be provided.

Since data reading or writing is not performed in the refresh mode, the input/output circuit 134[k,h] may remain in an off state. Thus, the refresh mode can be performed in a shorter period than the reading mode and the writing mode. Note that the refresh mode of other memory cells can be performed in a manner similar to that of the memory cell 10a.

Moreover, an OS transistor is preferably used as the transistor M1. As described in the above embodiment, an OS transistor has an extremely low off-state current. The use of an OS transistor as the transistor M1 can reduce the number of refresh operations for a certain period. Alternatively, the refresh operation can be eliminated.

<Retention Mode>

The retention mode is an operation mode in which data written to the memory cell 10a is retained. It can be said that a memory cell that is not involved in any operation mode of the reading mode, the writing mode, and the refresh mode operates in the retention mode.

Figure 30:
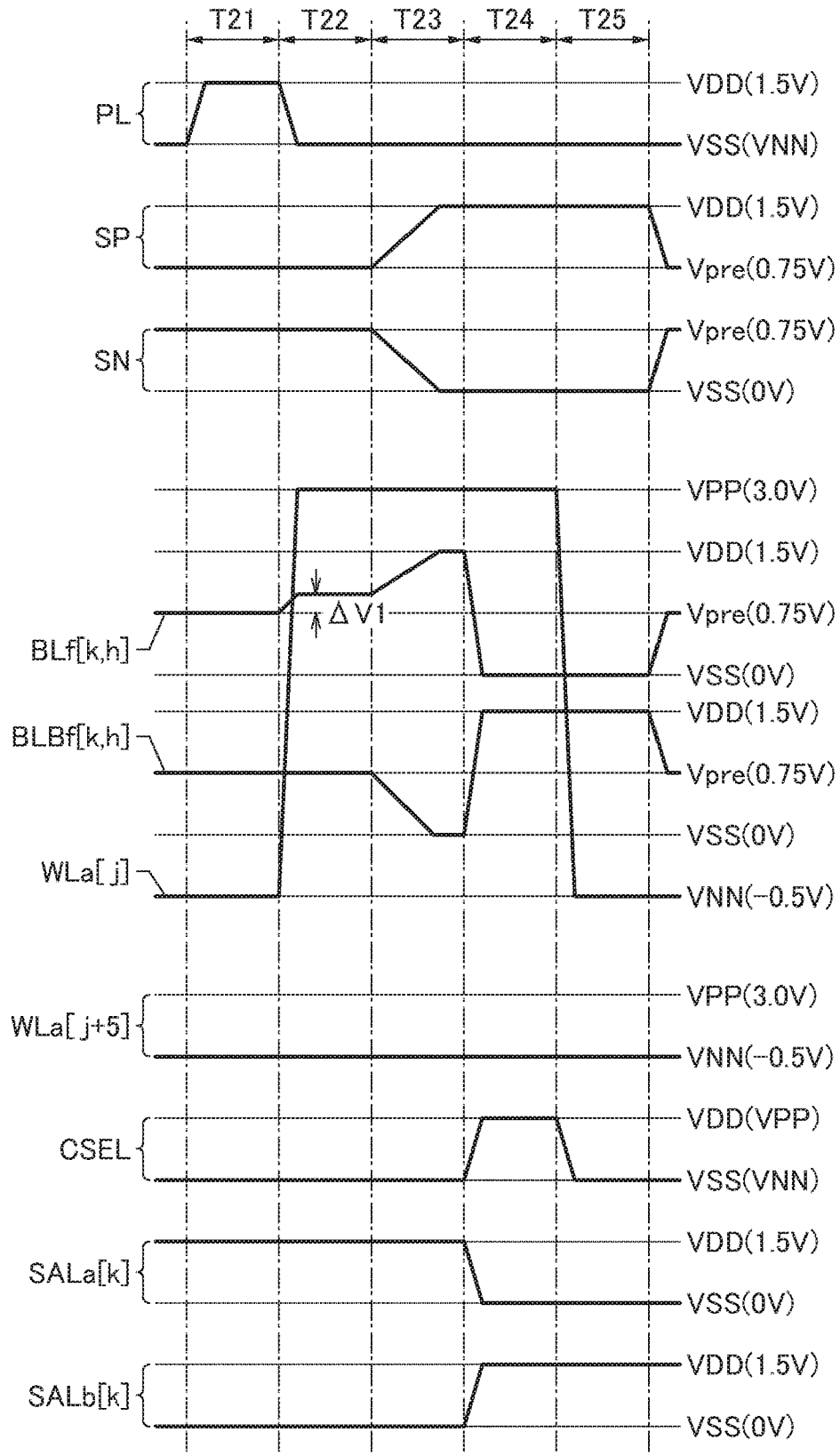
FIG. 30 A diagram showing an operation example of a sense amplifier.
Figure 31:
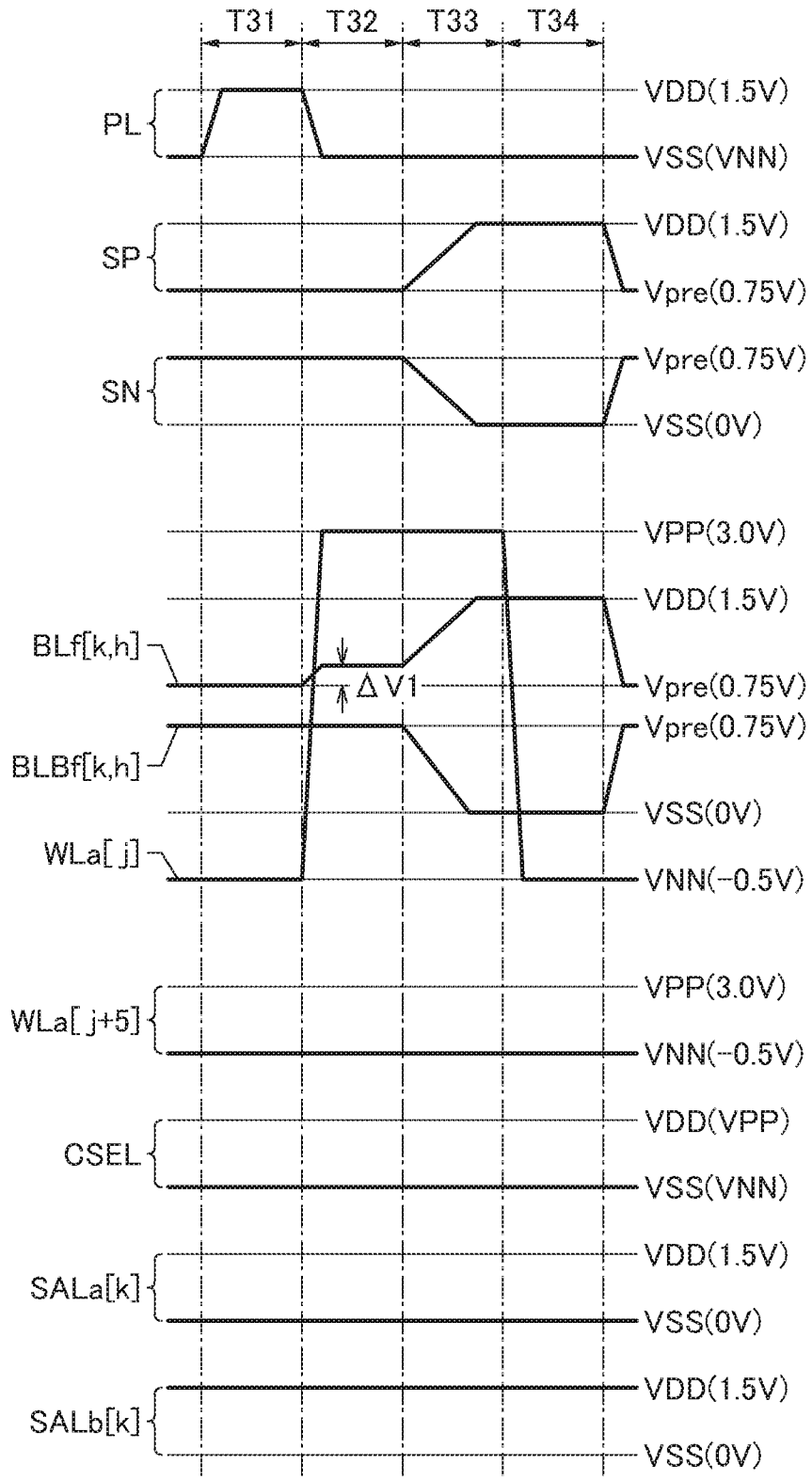
FIG. 31 A diagram showing an operation example of a sense amplifier.

For example, in the above operation description, the memory cell 10a electrically connected to the word line WLa[j+5] operates in the retention mode during the period in which the memory device 100 operates for the memory cell 10a electrically connected to the word line WLa[j] in any of the reading mode, the writing mode, and the refresh mode (see FIG. 29 to FIG. 31).

More specifically, the potential of the word line WLa[j+5] is VNN during the period in which the memory device 100 operates for the memory cell 10a electrically connected to the word line WLa[j] in any of the reading mode, the writing mode, and the refresh mode. Thus, the off state of the transistor M1 included in the memory cell 10a electrically connected to the word line WLa[j+5] is maintained. In other words, information stored in the memory cell 10a is retained during the retention mode operation period.

To bring the transistor M1 into an off state more reliably, VNN is preferably a negative potential. When VNN is set to a negative potential, incorrect writing or incorrect reading can be less likely to occur. When VNN is set to a negative potential, the reliability of the memory device 100 can be increased.

Modification Example

Figure 32:
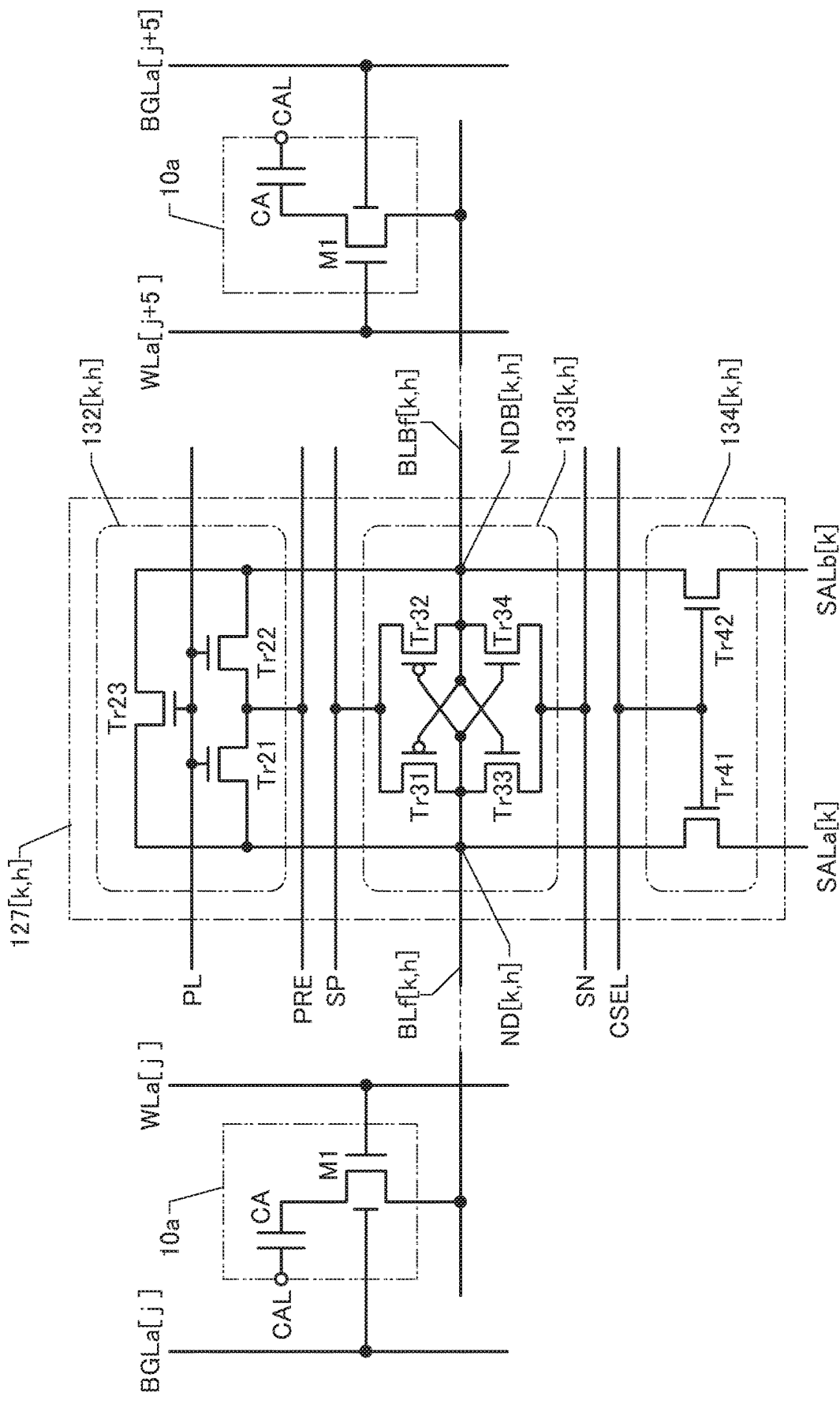
FIG. 32 A diagram illustrating a circuit configuration example of a sense amplifier.

Then, a modification example of the circuit configuration shown in FIG. 28 is illustrated in FIG. 32. FIG. 32 is a circuit configuration example where the memory cell illustrated in FIG. 6(A) is used as the memory cell 10a. Thus, the memory cell 10a illustrated in FIG. 32 includes the transistor M1 having a back gate. The back gate of the transistor M1 is electrically connected to a wiring BGLa.

In the cell array 221a, p wirings BGLa are provided to extend in the X-direction (row direction) (not illustrated). The cell array 221b also includes p wirings BGLb extending in the X-direction (row direction) (not illustrated). Note that in this specification and the like, a j-th (j is an integer greater than or equal to 1 and less than or equal to p) wiring BGLa is denoted by a wiring BGLa[j] and a j-th wiring BGLb is denoted by a wiring BGLb[j]. In addition, the wiring BGLa[j] is provided in parallel with the word line WLa[j], and the wiring BGLb[j] is provided in parallel with the word line WLb[j].

In FIG. 32, the memory cell 10a electrically connected to the word line WLa[j] is electrically connected to the wiring BGLa[j]. The wiring BGLa[j] is electrically connected to the back gate of the transistor M1 included in the memory cell 10a. Note that the circuit configuration except the memory cell 10a is the same as that in FIG. 28.

Next, operation examples of the circuit configuration illustrated in FIG. 32 are described with reference to FIG. 33 to FIG. 35. Also in the circuit configuration, operations in the four operation modes (the reading mode, the writing mode, the refresh mode, and the retention mode) are possible as in the circuit configuration illustrated in FIG. 28. Points different from those in the above operation modes are mainly described so that repetition of the description can be reduced. Note that in FIG. 33 to FIG. 35, the description of changes in the potentials of the wiring CSEL, the wiring SALa[k], and the wiring SALb[k] is omitted.

[Reading Mode]

Figure 33:
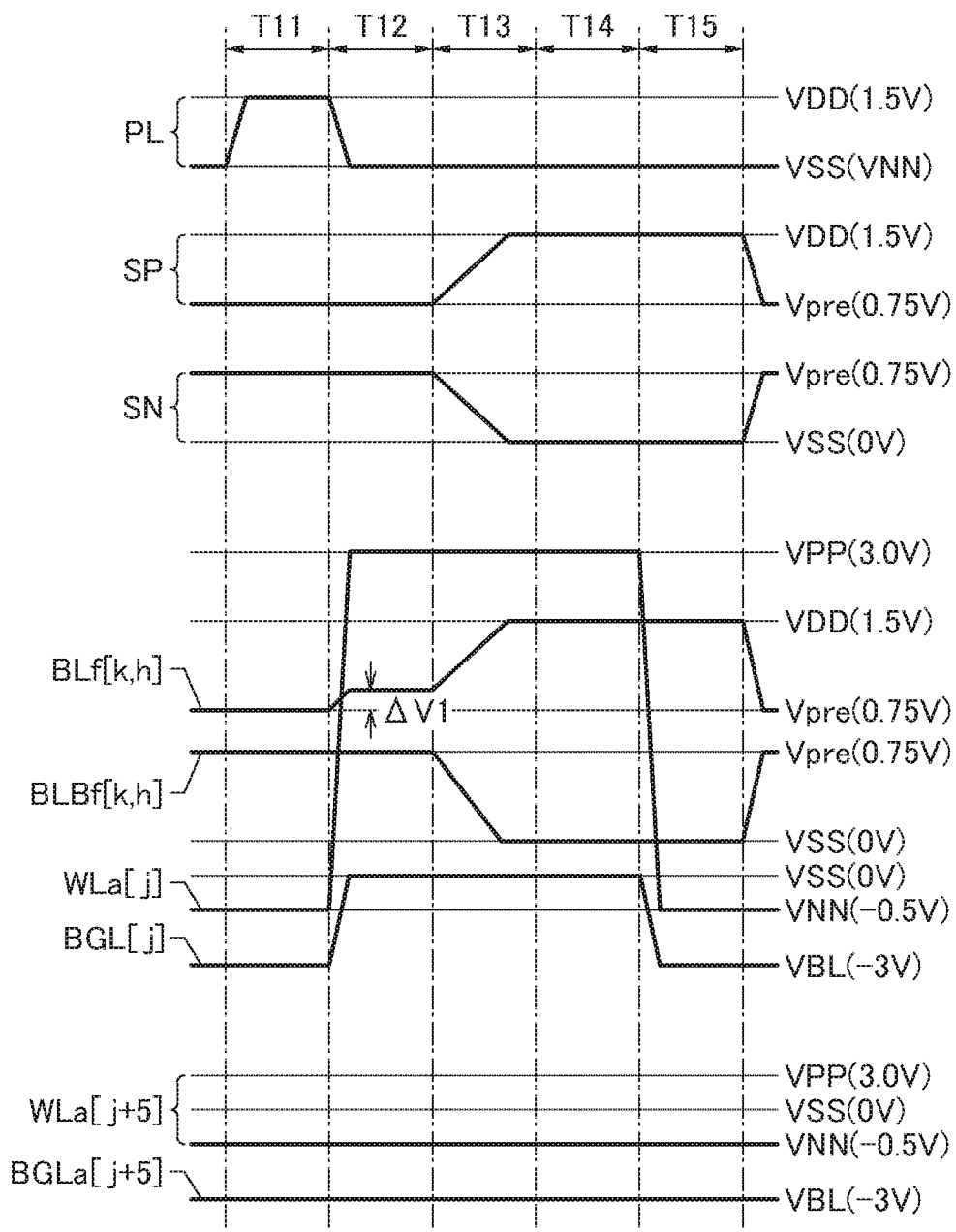
FIG. 33 A diagram showing an operation example of a sense amplifier.

Using a timing chart illustrated in FIG. 33, an operation of reading information stored in the memory cell 10a electrically connected to the wiring BLf[k,h] and the word line WLa[j] is described.

[Period T11]

In Period T11, the precharge circuit 132[k,h] is operated, and the potentials of the wiring BLf[k,h] and the wiring BLBf[k,h] are initialized. The potential of the wiring BGLa[j] is set to a potential VBL (also referred to as a "VBL"). VBL is a potential lower than VSS. Thus, VBL is a negative potential. The magnitude of VBL is also changed by the thickness of the gate insulating layer on the back gate electrode side. When the thickness of the gate insulating layer on the back gate electrode side is larger than that of the gate insulating layer on the front gate electrode side, VBL is higher than VNN in some cases. In this embodiment, VBL is set to −3 V.

The transistor M1 can also be brought into an off state by supply of a negative potential only to the wiring BGLa[j]. However, a negative potential is preferably supplied to both the word line WLa[j] and the wiring BGLa[j]. In particular, with the thickness of the gate insulating layer on the back gate electrode side which is larger than that of the gate insulating layer on the front gate electrode side, VBL with which the same effect can be achieved is lower when a negative potential is supplied to both the word line WLa[j] and the wiring BGLa[j] than when a negative potential is supplied only to the wiring BGLa[j]. Thus, the intensity of an electric field applied to the transistor M1 can be reduced. Accordingly, the reliability of the transistor M1 can be increased. Furthermore, the power consumption of the transistor M1 can be reduced. This can increase the reliability of the memory device 100 and reduce the power consumption.

[Period T12]

In Period T12, the word line WLa[j] is set in a selected state. Specifically, the potential of the word line WLa[j] is set to a potential VPP, whereby the transistor M1 included in the memory cell 10a is brought into an on state. Furthermore, the potential of the wiring BGLa[j] is made higher than or equal to the potential VSS. The potential of the wiring BGLa[j] is set to a potential VSS (0 V) in this embodiment, but may be higher than the potential VSS. For example, the potential of the wiring BGLa[j] may be set to a potential VPP.

[Period T13 and Period T14]

In Period T13 and Period T14, information stored in the memory cell 10a is read.

[Period T15]

In Period T15, the word line WLa[j] is set to an unselected state. Specifically, the potential of the word line WLa[j] is set to VNN. The potential of the word line WLa[j] becomes VNN, and the potential of the wiring BGLa[j] is set to VBL accordingly.

Note that a constant potential may be maintained without any change in the potential of the wiring BGLa[j] during the operation in the reading mode. For example, a negative potential is supplied to the wiring BGLa[j], whereby the Vth of the transistor M1 can be shifted in the positive direction. Consequently, the cut-off current can be lowered.

By contrast, when the potential of the wiring BGLa[j] is increased in accordance with the increase in the potential of the word line WLa[j], the operation speed of the transistor M1 can be increased. This can reduce the time needed for the reading operation. That is, the operation speed of the memory device 100 can be increased.

When both of the potentials of the word line WLa[j] and the wiring BGLa[j] are increased, an equivalent increase in operation speed can be achieved by a smaller voltage increase than when only one of the potentials is increased. Consequently, the intensity of an electric field applied to the transistor M1 can be reduced and the reliability of the transistor M1 can be increased. Furthermore, the power consumption of the transistor M1 can be reduced. This can increase the reliability of the memory device 100 and reduce the power consumption.

[Writing Mode]

Figure 34:
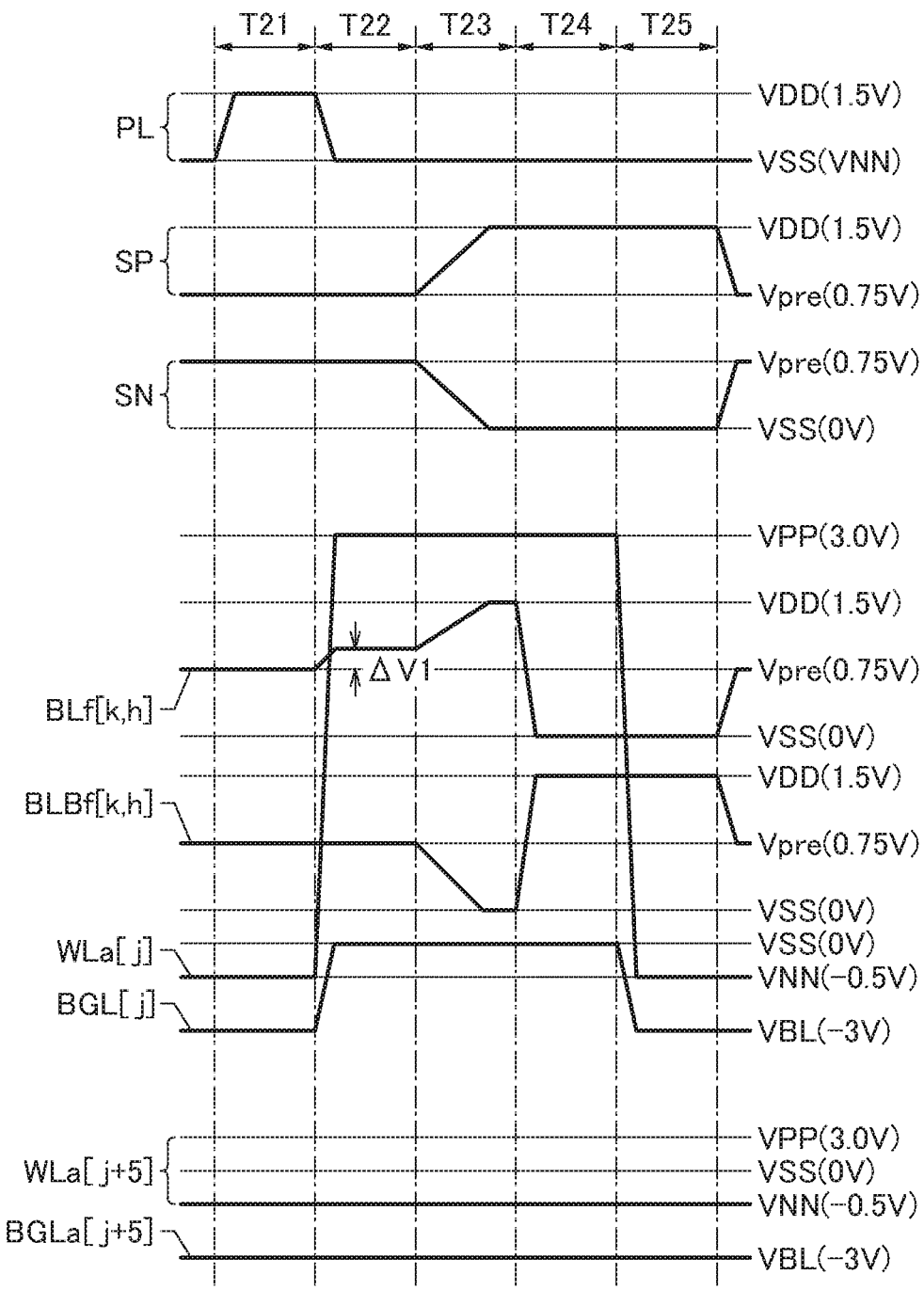
FIG. 34 A diagram showing an operation example of a sense amplifier.

Using a timing chart illustrated in FIG. 34, an operation of writing information to the memory cell 10*a* electrically connected to the wiring BLf[k,h] and the word line WLa[j] is described.

[Period T21]

In Period T21, the precharge circuit 132[k,h] is operated, and the potentials of the wiring BLf[k,h] and the wiring BLBf[k,h] are initialized. Furthermore, the potential of the wiring BGLa[j] is set to the potential VBL.

[Period T22]

In Period T22, the word line WLa[j] is set in a selected state. Specifically, the potential of the word line WLa[j] is set to a potential VPP, whereby the transistor M1 included in the memory cell 10*a* is brought into an on state. Furthermore, the potential of the wiring BGLa[j] is made higher than or equal to the potential VSS.

[Period T23 and Period T24]

In Period T23 and Period T24, information is written to the memory cell 10*a*.

[Period T25]

In Period T25, the word line WLa[j] is set to an unselected state. Specifically, the potential of the word line WLa[j] is set to VNN. Furthermore, the potential of the word line WLa[j] becomes VNN, and the potential of the wiring BGLa[j] is set to VBL accordingly.

Note that a constant potential may be maintained without any change in the potential of the wiring BGLa[j] during the operation in the writing mode. For example, the wiring BGLa[j] is set to a negative potential, whereby the Vth of the transistor M1 can be shifted in the positive direction and the cut-off current can be lowered. By contrast, when the potential of the wiring BGLa[j] is increased in accordance with the increase in the potential of the word line WLa[j], the operation speed of the transistor M1 can be increased. This can reduce the time needed for the writing operation. That is, the operation speed of the memory device 100 can be increased.

[Refresh Mode]

Figure 35:
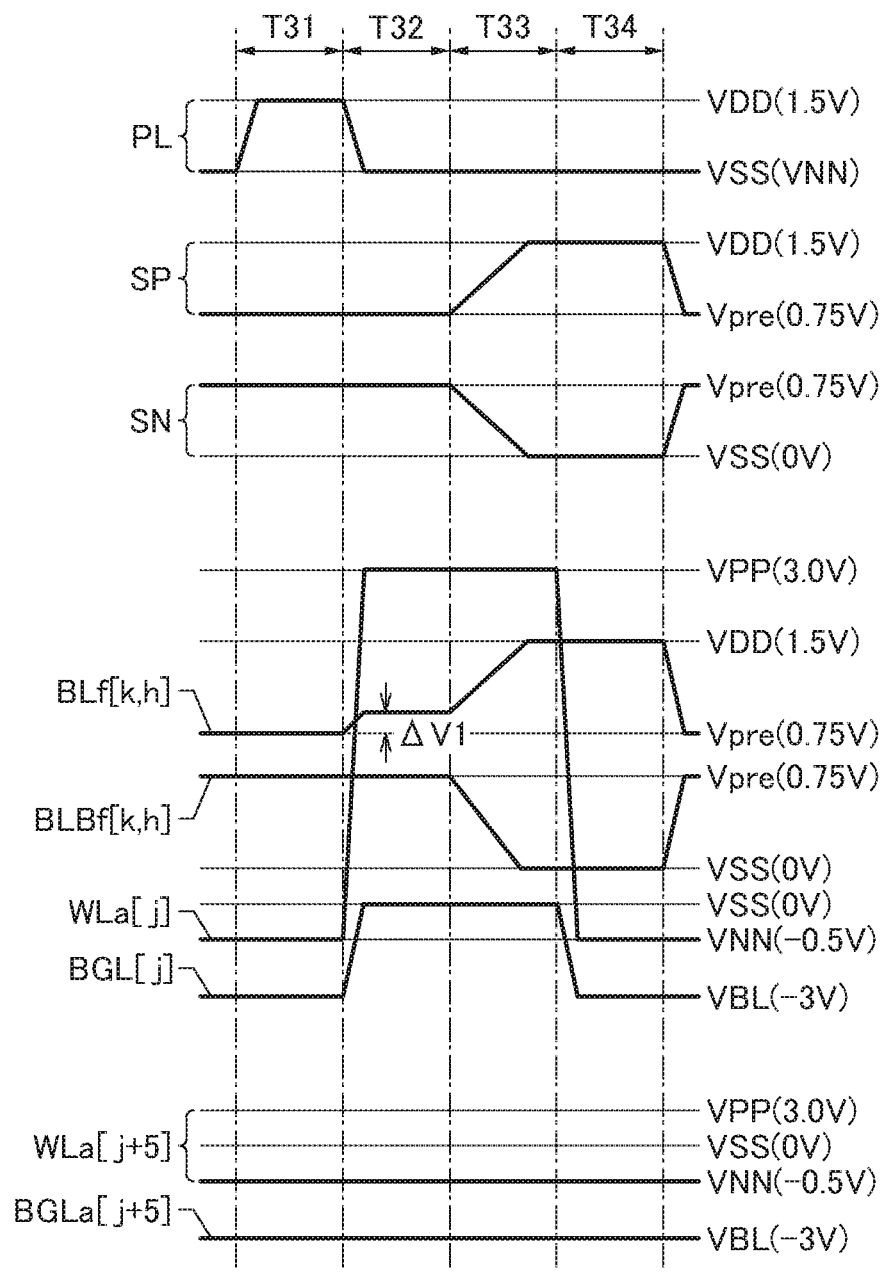
FIG. 35 A diagram showing an operation example of a sense amplifier.

Using a timing chart illustrated in FIG. 35, an operation of rewriting information stored in the memory cell 10*a* electrically connected to the wiring BLf[k,h] and the word line WLa[j] is described.

[Period T31]

In Period T31, the precharge circuit 132[k,h] is operated, and the potentials of the wiring BLf[k,h] and the wiring BLBf[k,h] are initialized. Furthermore, the potential of the wiring BGLa[j] is set to the potential VBL.

[Period T32]

In Period T32, the word line WLa[j] is set in a selected state. Specifically, the potential of the word line WLa[j] is set to a potential VPP, whereby the transistor M1 included in the memory cell 10*a* is brought into an on state. Furthermore, the potential of the wiring BGLa[j] is made higher than or equal to the potential VSS.

[Period T33]

In Period T33, information written to the memory cell 10*a* is rewritten.

[Period T34]

In Period T34, the word line WLa[j] is set to an unselected state. Specifically, the potential of the word line WLa[j] is set to VNN. Furthermore, the potential of the wiring BGLa[j] is set to VBL accordingly.

Note that a constant potential may be maintained without any change in the potential of the wiring BGLa[j] during the operation in the refresh mode. For example, the wiring BGLa[j] is set to a negative potential, whereby the Vth of the transistor M1 can be shifted in the positive direction and the cut-off current can be lowered. By contrast, when the potential of the wiring BGLa[j] is increased in accordance with the increase in the potential of the word line WLa[j], the operation speed of the transistor M1 can be increased. This can reduce the time needed for the refresh operation. That is, the operation speed of the memory device 100 can be increased.

<Retention Mode>

As described above, the retention mode is an operation mode in which data written to the memory cell 10*a* is retained. It can be said that a memory cell that is not involved in any operation mode of the reading mode, the writing mode, and the refresh mode operates in the retention mode.

For example, in the above operation description, the memory cell 10*a* electrically connected to the word line WLa[j+5] operates in the retention mode during the period in which the memory device 100 operates for the memory cell 10*a* electrically connected to the word line WLa[j] in any of the reading mode, the writing mode, and the refresh mode (see FIG. 33 to FIG. 35).

More specifically, the potential of the word line WLa[j+5] is VNN and the potential of the wiring BGLa[j+5] is VBL during the period in which the memory device 100 operates for the memory cell 10*a* electrically connected to the word line WLa[j] in any of the reading mode, the writing mode, and the refresh mode. Thus, the off state of the transistor M1 included in the memory cell 10*a* electrically connected to the word line WLa[j+5] is maintained. In other words, information stored in the memory cell 10*a* is retained during the retention mode operation period.

The transistor M1 can also be brought into an off state by supply of a negative potential only to the wiring BGLa[j+5]. However, a negative potential is preferably supplied to both the word line WLa[j+5] and the wiring BGLa[j+5]. In particular, with the thickness of the gate insulating layer on the back gate electrode side which is larger than that of the gate insulating layer on the front gate electrode side, VBL with which the same effect can be achieved is lower when a negative potential is supplied to both the word line WLa[j+5] and the wiring BGLa[j+5] than when a negative potential is supplied only to the wiring BGLa[j+5]. Thus, the intensity of an electric field applied to the transistor M1 can be reduced. Accordingly, the reliability of the transistor M1 can be increased. Furthermore, the power consumption of the transistor M1 can be reduced. This can increase the reliability of the memory device 100 and reduce the power consumption.

This embodiment can be implemented in an appropriate combination with the structures described in the other embodiments and the like.

Embodiment 7

In this embodiment, a cross-sectional structure example of the memory device 100 will be described with reference to diagrams.

Structure Example of Memory Device

Figure 36:
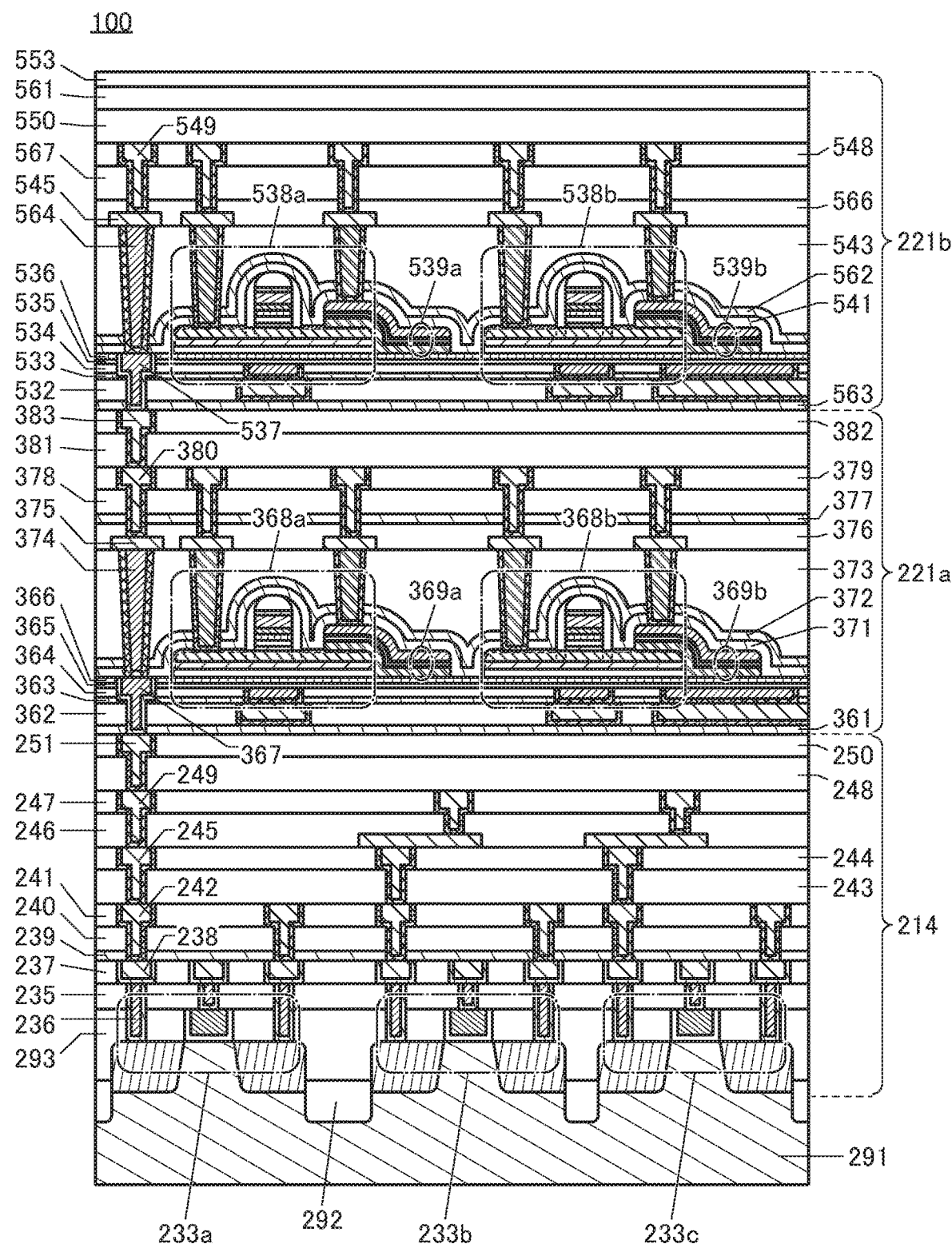
FIG. 36 A diagram illustrating a structure example of a semiconductor device.

FIG. 36 illustrates a cross section of part of the memory device 100. In the memory device 100 illustrated in FIG. 36, the local sense amplifier array 214, the cell array 221a, and the cell array 221b are stacked over a substrate 291. Note that a circuit other than the cell array 221a and the cell array 221b are provided over the substrate 291 like the local sense amplifier array 214. FIG. 36 illustrates the case where a single crystal semiconductor substrate (e.g., a single crystal silicon substrate) is used as the substrate 291. A source, a drain, and a channel of each transistor included in the local sense amplifier array 214 are formed in part of the substrate 291. In addition, the cell array 221a and the cell array 221b include thin film transistors (e.g., OS transistors).

[Local Sense Amplifier Array 214]

In FIG. 36, the local sense amplifier array 214 includes a transistor 233a, a transistor 233b, and a transistor 233c on the substrate 291. FIG. 36 illustrates cross sections of the transistor 233a, the transistor 233b, and the transistor 233c in the channel length direction.

As described above, the channels of the transistor 233a, the transistor 233b, and the transistor 233c are formed in part of the substrate 291. When an integrated circuit is required to operate at high speed, a single crystal semiconductor substrate is preferably used as the substrate 291.

The transistor 233a, the transistor 233b, and the transistor 233c are electrically isolated from each other by an element isolation layer 292. The element isolation layer can be formed by a LOCOS (Local Oxidation of Silicon) method, an STI (Shallow Trench Isolation) method, or the like.

Furthermore, an insulating layer 293, an insulating layer 235, and an insulating layer 237 are provided over the transistor 233a, the transistor 233b, and the transistor 233c, and an electrode 238 is embedded in the insulating layer 237. The electrode 238 is electrically connected to one of a source and a drain of the transistor 233a through a contact plug 236.

An insulating layer 239, an insulating layer 240, and an insulating layer 241 are provided over the electrode 238 and the insulating layer 237, and an electrode 242 is embedded in the insulating layer 239, the insulating layer 240, and the insulating layer 241. The electrode 242 is electrically connected to the electrode 238.

An insulating layer 243 and an insulating layer 244 are provided over the electrode 242 and the insulating layer 241, and an electrode 245 is embedded in the insulating layer 243 and the insulating layer 244. The electrode 245 is electrically connected to the electrode 242.

An insulating layer 246 and an insulating layer 247 are provided over the electrode 245 and the insulating layer 244, and an electrode 249 is embedded in the insulating layer 246 and the insulating layer 247. The electrode 249 is electrically connected to the electrode 245.

An insulating layer 248 and an insulating layer 250 are provided over the electrode 249 and the insulating layer 247, and an electrode 251 is embedded in the insulating layer 248 and the insulating layer 250. The electrode 251 is electrically connected to the electrode 249.

[Cell Array 221a]

The cell array 221a is provided over the local sense amplifier array 214. In FIG. 36, the cell array 221a includes a transistor 368a, a transistor 368b, a capacitor 369a, and a capacitor 369b. FIG. 36 illustrates cross sections of the transistor 368a and the transistor 368b in the channel length direction. The transistor 368a and the transistor 368b are each a transistor including a back gate.

An oxide semiconductor, which is one kind of metal oxide, is preferably used for semiconductor layers of the transistor 368a and the transistor 368b. That is, OS transistors are preferably used as the transistor 368a and the transistor 368b.

The transistor 368a and the transistor 368b are provided over an insulating layer 361 and an insulating layer 362. An insulating layer 363 and an insulating layer 364 are provided over the insulating layer 362. The back gates of the transistor 368a and the transistor 368b are embedded in the insulating layer 363 and the insulating layer 364. An insulating layer 365 and an insulating layer 366 are provided over the insulating layer 364. An electrode 367 is embedded in the insulating layer 361 to the insulating layer 366. The electrode 367 is electrically connected to the electrode 251.

An insulating layer 371, an insulating layer 372, and an insulating layer 373 are formed over the transistor 368a, the transistor 368b, the capacitor 369a, and the capacitor 369b, and an electrode 375 is formed over the insulating layer 373. The electrode 375 is electrically connected to the electrode 367 through a contact plug 374.

An insulating layer 376, an insulating layer 377, an insulating layer 378, and an insulating layer 379 are provided over the electrode 375. An electrode 380 is embedded in the insulating layer 376 to the insulating layer 379. The electrode 380 is electrically connected to the electrode 375.

An insulating layer 381 and an insulating layer 382 are provided over the electrode 380 and the insulating layer 379, and an electrode 383 is embedded in the insulating layer 381 and the insulating layer 382. The electrode 383 is electrically connected to the electrode 380.

[Cell Array 221b]

The cell array 221b is provided over the cell array 221a. In FIG. 36, the cell array 221b includes a transistor 538a, a transistor 538b, a capacitor 539a, and a capacitor 539b. FIG. 36 illustrates cross sections of the transistor 538a and the transistor 538b in the channel length direction. Note that the transistor 538a and the transistor 538b are each a transistor including a back gate.

Therefore, an oxide semiconductor, which is one kind of metal oxide, is preferably used for semiconductor layers of the transistor 538a and the transistor 538b. That is, OS transistors are preferably used as the transistor 538a and the transistor 538b.

The transistor 538a and the transistor 538b are provided over an insulating layer 563 and an insulating layer 532. An insulating layer 533 and an insulating layer 534 are provided over the insulating layer 532. The back gates of the transistor 538a and the transistor 538b are embedded in the insulating layer 533 and the insulating layer 534. An insulating layer 535 and an insulating layer 536 are provided over the insulating layer 534. An electrode 537 is embedded in the insulating layer 563 to the insulating layer 536. The electrode 537 is electrically connected to the electrode 383.

An insulating layer 541, an insulating layer 562, and an insulating layer 543 are formed over the transistor 538a, the transistor 538b, the capacitor 539a, and the capacitor 539b, and an electrode 545 is formed over the insulating layer 543. The electrode 545 is electrically connected to the electrode 537 through a contact plug 564.

An insulating layer 566, an insulating layer 567, and an insulating layer 548 are provided over the electrode 545. An electrode 549 is embedded in the insulating layer 566 to the insulating layer 548. The electrode 549 is electrically connected to the contact plug 564 through the electrode 545.

An insulating layer 550 and an insulating layer 561 are provided over the electrode 549 and the insulating layer 548. An insulating layer 553 is provided over the insulating layer 561.

Modification Example

Figure 37:
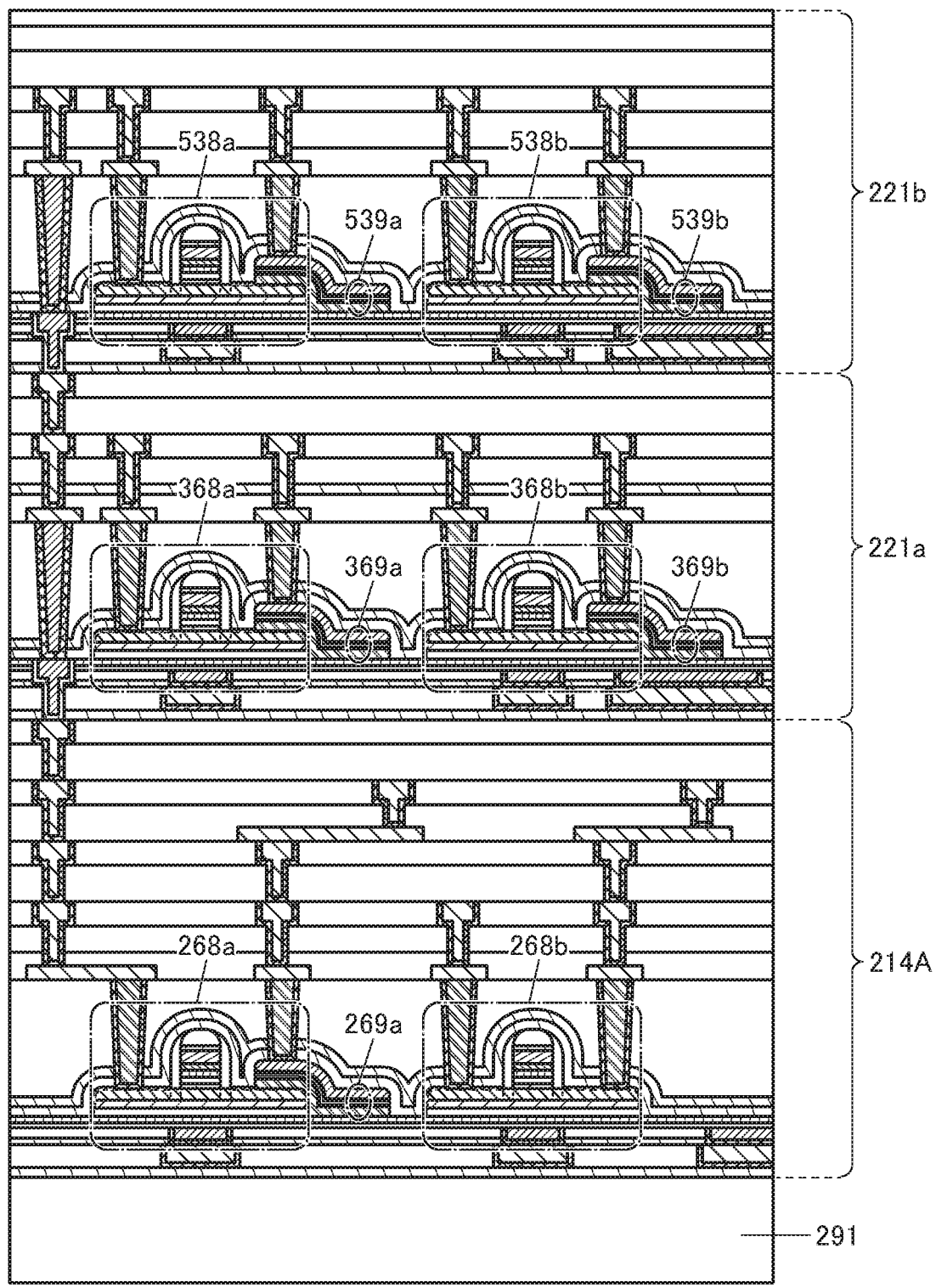
FIG. 37 A diagram illustrating a structure example of a semiconductor device.

FIG. 37 illustrates a cross section of part of the memory device 100A. The memory device 100A is a modification example of the memory device 100. The memory device 100A includes a local sense amplifier array 214A, the cell array 221a, and the cell array 221b. The local sense amplifier array 214A, the cell array 221a, and the cell array 221b are provided in this order over the substrate 291. An insulating substrate (e.g., a glass substrate) is used as the substrate 291 of the memory device 100A.

The local sense amplifier array 214A includes a transistor 268a, a transistor 268b, a capacitor 269a, and a capacitor 269b. Thin film transistors (e.g., OS transistors) are used as the transistors included in the local sense amplifier array 214A. The cell array 221a and the cell array 221b can be manufactured in a manner similar to the above.

When all the transistors included in the local sense amplifier array 214A are OS transistors, the local sense amplifier array 214A can be a single-polarity integrated circuit. When all the transistors included in the memory device 100A are OS transistors, the memory device 100A can be a single-polarity memory device.

<Materials>
[Substrate]

Although there is no particular limitation on a material used for a substrate, it is required to have heat resistance high enough to withstand at least heat treatment performed later. For example, a single crystal semiconductor substrate or a polycrystalline semiconductor substrate using silicon, silicon carbide, or the like as a material or a compound semiconductor substrate using silicon germanium or the like as a material can be used as the substrate. Furthermore, an SOI substrate, a semiconductor substrate on which a semiconductor element such as a strained transistor or a FIN-type transistor is provided, or the like can be used. Alternatively, gallium arsenide, aluminum gallium arsenide, indium gallium arsenide, gallium nitride, indium phosphide, silicon germanium, or the like that can be used for a high electron mobility transistor (HEMT) may be used. That is, the substrate is not limited to a simple supporting substrate and may be a substrate where a device such as another transistor is formed.

Furthermore, a glass substrate of barium borosilicate glass, aluminoborosilicate glass, or the like, a ceramic substrate, a quartz substrate, a sapphire substrate, or the like can be used as the substrate. Note that a flexible substrate may be used as the substrate. In the case where a flexible substrate is used, a transistor, a capacitor, or the like may be directly fabricated over the flexible substrate, or a transistor, a capacitor, or the like may be fabricated over another fabrication substrate and then separated therefrom and transferred onto the flexible substrate. Note that to perform separation from the fabrication substrate and transfer to the flexible substrate, a separation layer is preferably provided between the fabrication substrate and the transistor, the capacitor, or the like.

For the flexible substrate, for example, a metal, an alloy, a resin, glass, or fiber thereof can be used. The flexible substrate used as the substrate preferably has a lower coefficient of linear expansion because deformation due to an environment is inhibited. For the flexible substrate used as the substrate, for example, a material whose coefficient of linear expansion is lower than or equal to $1\times10^{-3}$/K, lower than or equal to $5\times10^{-5}$/K, or lower than or equal to $1\times10^{-5}$/K is used. Examples of the resin include polyester, polyolefin, polyamide (e.g., nylon and aramid), polyimide, polycarbonate, and acrylic. In particular, aramid is suitable for the flexible substrate because of its low coefficient of linear expansion.

[Insulating Layer]

For the insulating layer, a single layer or a stack of a material selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, aluminum silicate, and the like is used. A material in which a plurality of materials selected from an oxide material, a nitride material, an oxynitride material, and a nitride oxide material are mixed may be used.

Note that in this specification and the like, a nitride oxide refers to a compound in which the nitrogen content is higher than the oxygen content. An oxynitride refers to a compound in which the oxygen content is higher than the nitrogen content. The content of each element can be measured by Rutherford backscattering spectrometry (RBS), for example.

When an oxide semiconductor, which is one kind of metal oxide, is used for the semiconductor layer, the hydrogen concentration in the insulating layer is preferably lowered in order to prevent an increase in the hydrogen concentration in the semiconductor layer. Specifically, the hydrogen concentration in the insulating layer is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$ in secondary ion mass spectrometry (SIMS). It is particularly preferable to lower the hydrogen concentration in the insulating layer in contact with the semiconductor layer.

Furthermore, the nitrogen concentration in the insulating layer is preferably lowered in order to prevent an increase in the nitrogen concentration in the semiconductor layer. Specifically, the nitrogen concentration in the insulating layer is lower than or equal to $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$ in SIMS.

It is preferred that at least a region of the insulating layer in contact with the semiconductor layer have few defects and typically have as few signals observed by electron spin resonance (ESR) spectroscopy as possible. An example of the signals is an E' center observed at a g-factor of 2.001. Note that the E' center is due to the dangling bond of silicon. For example, in the case where a silicon oxide layer or a silicon oxynitride layer is used as the insulating layer, a silicon oxide layer or a silicon oxynitride layer whose spin density due to the E' center is lower than or equal to $3\times10^{17}$ spins/cm$^3$, preferably lower than or equal to $5\times10^{16}$ spins/cm$^3$ is used.

In addition to the above-described signal, a signal due to nitrogen dioxide (NO$_2$) may be observed. The signal is divided into the following three signals according to the N nuclear spin: a signal observed at a g-factor of greater than or equal to 2.037 and less than or equal to 2.039 (referred to as a first signal), a signal observed at a g-factor of greater than or equal to 2.001 and less than or equal to 2.003 (referred to as a second signal), and a signal observed at a g-factor of greater than or equal to 1.964 and less than or equal to 1.966 (referred to as a third signal).

For example, as the insulating layer, it is suitable to use an insulating layer whose spin density of a signal due to nitrogen dioxide ($NO_2$) is higher than or equal to $1\times10^{17}$ spins/cm$^3$ and lower than $1\times10^{18}$ spins/cm$^3$.

Note that nitrogen oxide ($NO_x$) including nitrogen dioxide ($NO_2$) forms a state in the insulating layer. The state is positioned in the energy gap of the oxide semiconductor layer. Thus, when nitrogen oxide ($NO_x$) is diffused into the interface between the insulating layer and the oxide semiconductor layer, an electron may be trapped by the state on the insulating layer side. As a result, the trapped electron remains in the vicinity of the interface between the insulating layer and the oxide semiconductor layer; hence, the threshold voltage of the transistor is shifted in the positive direction. Accordingly, the use of a film with a low nitrogen oxide content as the insulating layer can reduce a shift in the threshold voltage of the transistor.

As an insulating layer that releases a small amount of nitrogen oxide ($NO_x$), for example, a silicon oxynitride layer can be used. The silicon oxynitride layer is a film that releases more ammonia than nitrogen oxide ($NO_x$) in thermal desorption spectroscopy (TDS); the typical released amount of ammonia is greater than or equal to $1\times10^{18}$/cm$^3$ and less than or equal to $5\times10^{19}$/cm$^3$. Note that the released amount of ammonia is the total amount in the range of the heat treatment temperature in TDS from 50° C. to 650° C. or from 50° C. to 550° C.

Since nitrogen oxide ($NO_x$) reacts with ammonia and oxygen in heat treatment, the use of an insulating layer that releases a large amount of ammonia reduces nitrogen oxide ($NO_x$).

At least one of the insulating layers in contact with the oxide semiconductor layer is preferably formed using an insulating layer from which oxygen is released by heating. Specifically, it is preferable to use an insulating layer in which the amount of released oxygen converted into oxygen atoms is $1.0\times10^{18}$ atoms/cm$^3$ or more, $1.0\times10^{19}$ atoms/cm$^3$ or more, or $1.0\times10^{20}$ atoms/cm$^3$ or more in TDS performed with heat treatment where the surface temperature of the insulating layer is higher than or equal to 100° C. and lower than or equal to 700° C., preferably higher than or equal to 100° C. and lower than or equal to 500° C. Note that in this specification and the like, oxygen released by heating is also referred to as "excess oxygen".

Furthermore, an insulating layer containing excess oxygen can also be formed by performing treatment for adding oxygen to an insulating layer. The treatment for adding oxygen can be performed by heat treatment, plasma treatment, or the like in an oxidizing atmosphere. Alternatively, oxygen may be added by an ion implantation method, an ion doping method, a plasma immersion ion implantation method, or the like. Examples of a gas used in the treatment for adding oxygen include an oxygen gas such as $^{16}O_2$ or $^{18}O_2$ and a gas containing oxygen, such as a nitrous oxide gas or an ozone gas. Note that in this specification, the treatment for adding oxygen is also referred to as "oxygen doping treatment". The oxygen doping treatment may be performed while the substrate is heated.

For the insulating layer, a heat-resistant organic material such as polyimide, an acrylic-based resin, a benzocyclobutene-based resin, polyamide, or an epoxy-based resin can be used. Other than the above organic materials, it is also possible to use a low-dielectric constant material (a low-k material), a siloxane-based resin, PSG (phosphosilicate glass), BPSG (borophosphosilicate glass), or the like. Note that the insulating layer may be formed by stacking a plurality of insulating layers formed of these materials.

Note that the siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. In addition, the organic group may include a fluoro group.

There is no particular limitation on the method for forming the insulating layer. Note that a baking step is necessary in some cases depending on a material used for the insulating layer. In this case, when the baking step of the insulating layer also serves as another heat treatment step, the transistor can be manufactured efficiently.

[Electrode]

As a conductive material for forming the electrode, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and the like can be used. A semiconductor having high electrical conductivity, typified by polycrystalline silicon containing an impurity element such as phosphorus, or silicide such as nickel silicide may be used.

A conductive material containing the above metal element and oxygen may be used. A conductive material containing the above metal element and nitrogen may be used. For example, a conductive material containing nitrogen, such as titanium nitride or tantalum nitride, may be used. Indium tin oxide (ITO), indium oxide containing tungsten oxide, indium zinc oxide containing tungsten oxide, indium oxide containing titanium oxide, indium tin oxide containing titanium oxide, indium zinc oxide, indium gallium zinc oxide, or indium tin oxide to which silicon is added may be used. Furthermore, indium gallium zinc oxide containing nitrogen may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed. A stacked-layer structure combining a conductive material containing nitrogen and a conductive material containing oxygen may be employed.

Note that in the case where an oxide semiconductor is used for the semiconductor layer and the gate electrode employs a stacked-layer structure combining a material containing the above metal element and a conductive material containing oxygen, the conductive material containing oxygen is preferably provided on the semiconductor layer side. By providing the conductive material containing oxygen on the semiconductor layer side, oxygen released from the conductive material is easily supplied to the semiconductor layer.

For the electrode, a conductive material with high embeddability, such as tungsten or polysilicon, can be used, for example. A conductive material with high embeddability and a barrier layer (a diffusion prevention layer) such as a titanium layer, a titanium nitride layer, or a tantalum nitride layer may be used in combination. Note that the electrode may be referred to as a "contact plug".

In particular, for the electrode in contact with the gate insulating layer, a conductive material through which impurities are less likely to pass is preferably used. An example of the conductive material through which impurities are less likely to pass is tantalum nitride.

When an insulating material through which impurities are less likely to pass is used for the insulating layer and a conductive material through which impurities are less likely to pass is used for the electrode, diffusion of impurities to the transistor can be further inhibited. Thus, the reliability of the transistor can be further increased. That is, the reliability of the memory device can be further increased.

[Semiconductor Layer]

For the semiconductor layer, a single crystal semiconductor, a polycrystalline semiconductor, a microcrystalline semiconductor, an amorphous semiconductor, or the like can be used alone or in combination. As a semiconductor material, silicon, germanium, or the like can be used, for example. Furthermore, a compound semiconductor such as silicon germanium, silicon carbide, gallium arsenide, an oxide semiconductor, or a nitride semiconductor, an organic semiconductor, or the like can be used.

In the case of using an organic semiconductor for the semiconductor layer, a low molecular organic material having an aromatic ring, a π-electron conjugated conductive polymer, or the like can be used. For example, rubrene, tetracene, pentacene, perylenediimide, tetracyanoquinodimethane, polythiophene, polyacetylene, or polyparaphenylene vinylene can be used.

Note that semiconductor layers may be stacked. In the case of stacking semiconductor layers, semiconductors having different crystal states may be used or different semiconductor materials may be used.

The bandgap of an oxide semiconductor is greater than or equal to 2 eV; thus, the use of the oxide semiconductor for the semiconductor layer can achieve a transistor with an extremely low off-state current. Specifically, the off-state current per micrometer of channel width at room temperature (typically 25° C.) at a voltage between a source and a drain of 3.5 V can be lower than $1\times10^{-20}$ A, lower than $1\times10^{-22}$ A, or lower than $1\times10^{-24}$ A. That is, the on/off ratio can be greater than or equal to 20 digits. In addition, a transistor using an oxide semiconductor for the semiconductor layer has high withstand voltage between its source and drain. Thus, a transistor with high reliability can be provided. A transistor with high output voltage and high withstand voltage can be provided. A memory device or the like with high reliability can be provided. A memory device or the like with high output voltage and high withstand voltage can be provided.

In this specification and the like, a transistor in which silicon having crystallinity is used for a semiconductor layer where a channel is formed is also referred to as a "crystalline Si transistor".

The crystalline Si transistor tends to have relatively high mobility compared with the OS transistor. On the other hand, the crystalline Si transistor has difficulty in achieving an extremely low off-state current such as one in the OS transistor. Thus, it is important that the semiconductor material used for the semiconductor layer be properly selected depending on the purpose and the usage. For example, depending on the purpose and the usage, the OS transistor and the crystalline Si transistor and the like may be used in combination.

In the case where an oxide semiconductor layer is used as the semiconductor layer, the oxide semiconductor layer is preferably formed by a sputtering method. The oxide semiconductor layer is preferably formed by a sputtering method, in which case the density of the oxide semiconductor layer can be increased. When the oxide semiconductor layer is formed by a sputtering method, a rare gas (typically argon), oxygen, or a mixed gas of a rare gas and oxygen is used as a sputtering gas. In addition, increasing the purity of a sputtering gas is necessary. For example, as an oxygen gas or a rare gas used as a sputtering gas, a gas that is highly purified to have a dew point of −60° C. or lower, preferably −100° C. or lower is used. When the highly purified sputtering gas is used for the deposition, entry of moisture or the like into the oxide semiconductor layer can be prevented as much as possible.

Furthermore, in the case where the oxide semiconductor layer is formed by a sputtering method, moisture in a deposition chamber of a sputtering apparatus is preferably removed as much as possible. For example, with an adsorption vacuum evacuation pump such as a cryopump, the deposition chamber is preferably evacuated to be a high vacuum state (to a degree of approximately $5\times10^{-7}$ Pa to $1\times10^{-4}$ Pa). In particular, the partial pressure of gas molecules corresponding to $H_2O$ (gas molecules corresponding to m/z=18) in the deposition chamber in the standby mode of the sputtering apparatus is preferably lower than or equal to $1\times10^{-4}$ Pa, further preferably lower than or equal to $5\times10^{-5}$ Pa.

[Metal Oxide]

An oxide semiconductor, which is one kind of metal oxide, preferably contains at least indium or zinc. In particular, indium and zinc are preferably contained. Furthermore, aluminum, gallium, yttrium, tin, or the like is preferably contained in addition to them. Furthermore, one or more kinds selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide semiconductor contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, magnesium, and the like. Note that it is sometimes acceptable to use a plurality of the above-described elements in combination as the element M.

Note that in this specification and the like, a metal oxide containing nitrogen is also collectively referred to as a metal oxide in some cases. A metal oxide containing nitrogen may be referred to as a metal oxynitride.

[Composition of Metal Oxide]

The composition of a CAC (Cloud-Aligned Composite)-OS that can be used in a transistor disclosed in one embodiment of the present invention will be described below.

Note that in this specification and the like, CAAC (c-axis aligned crystal) and CAC (Cloud-Aligned Composite) are sometimes stated. Note that CAAC refers to an example of a crystal structure, and CAC refers to an example of a function or a material composition.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. In some cases, the conductive regions are observed to be coupled in a cloud-like manner with their boundaries blurred.

In the CAC-OS or the CAC-metal oxide, in some cases, the conductive regions and the insulating regions each have a size greater than or equal to 0.5 nm and less than or equal to 10 nm, preferably greater than or equal to 0.5 nm and less than or equal to 3 nm, and are dispersed in the material.

The CAC-OS or the CAC-metal oxide includes components having different bandgaps. For example, the CAC-OS or the CAC-metal oxide includes a component having a wide gap due to the insulating region and a component having a narrow gap due to the conductive region. In this structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, the transistor in the on state can achieve high current driving capability, that is, a high on-state current and high field-effect mobility.

In other words, the CAC-OS or the CAC-metal oxide can also be referred to as a matrix composite or a metal matrix composite.

[Structure of Metal Oxide]

Oxide semiconductors (metal oxides) can be classified into a single crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear grain boundary even in the vicinity of distortion in the CAAC-OS. That is, formation of a grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can also be referred to as an (In,M) layer.

The CAAC-OS is a metal oxide with high crystallinity. On the other hand, in the CAAC-OS, a reduction in electron mobility due to a grain boundary is less likely to occur because it is difficult to observe a clear grain boundary. Furthermore, entry of impurities, formation of defects, or the like might decrease the crystallinity of a metal oxide, which means that the CAAC-OS is a metal oxide having small amounts of impurities and defects (e.g., oxygen vacancies). Thus, a metal oxide including the CAAC-OS is physically stable. Therefore, the metal oxide including the CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

An a-like OS is a metal oxide having a structure between those of the nc-OS and an amorphous oxide semiconductor. The a-like OS contains a void or a low-density region. That is, the a-like OS has low crystallinity compared with the nc-OS and the CAAC-OS.

An oxide semiconductor (a metal oxide) can have various structures with different properties. The oxide semiconductor of one embodiment of the present invention may include two or more of an amorphous oxide semiconductor, a polycrystalline oxide semiconductor, an a-like OS, an nc-OS, and a CAAC-OS.

[Transistor Including Metal Oxide]

Next, the case where the above metal oxide is used in a channel formation region of a transistor will be described.

Note that when the above metal oxide is used in a channel formation region of a transistor, a transistor having high field-effect mobility can be achieved. In addition, a transistor having high reliability can be achieved.

Furthermore, a metal oxide with a low carrier density is preferably used for the transistor. In the case where the carrier density of a metal oxide film is reduced, the impurity concentration in the metal oxide film is reduced to reduce the density of defect states. In this specification and the like, a state with a low impurity concentration and a low density of defect states is referred to as a highly purified intrinsic or substantially highly purified intrinsic state. For example, a metal oxide has a carrier density lower than $8\times10^{11}/cm^3$, preferably lower than $1\times10^{11}/cm^3$, further preferably lower than $1\times10^{10}/cm^3$, and higher than or equal to $1\times10^{-9}/cm^3$.

A highly purified intrinsic or substantially highly purified intrinsic metal oxide film has a low density of defect states and accordingly may have a low density of trap states.

Charges trapped by the trap states in the metal oxide take a long time to disappear and may behave like fixed charges. Thus, a transistor whose channel formation region includes a metal oxide having a high density of trap states has unstable electrical characteristics in some cases.

Accordingly, in order to obtain stable electrical characteristics of the transistor, it is effective to reduce the impurity concentration in the metal oxide. In addition, in order to reduce the impurity concentration in the metal oxide, the impurity concentration in an adjacent film is also preferably reduced. Examples of impurities include hydrogen, nitrogen, an alkali metal, an alkaline earth metal, iron, nickel, and silicon.

[Impurities]

Here, the influence of each impurity in the metal oxide will be described.

When silicon or carbon, which is a Group 14 element, is contained in the metal oxide, defect states are formed in the metal oxide. Thus, the concentration of silicon or carbon in the metal oxide and the concentration of silicon or carbon in the vicinity of an interface with the metal oxide (the concentration measured by secondary ion mass spectrometry (SIMS)) are set lower than or equal to $2 \times 10^{18}$ atoms/cm$^3$, preferably lower than or equal to $2 \times 10^{17}$ atoms/cm$^3$.

When the metal oxide contains an alkali metal or an alkaline earth metal, defect states are formed and carriers are generated in some cases. Thus, a transistor using a metal oxide that contains an alkali metal or an alkaline earth metal for its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by SIMS is set lower than or equal to $1 \times 10^{18}$ atoms/cm$^3$, preferably lower than or equal to $2 \times 10^{16}$ atoms/cm$^3$.

When containing nitrogen, the metal oxide easily becomes n-type by generation of electrons serving as carriers and an increase in carrier density. As a result, a transistor using a metal oxide that contains nitrogen for its channel formation region is likely to have normally-on characteristics. Thus, nitrogen in the channel formation region in the metal oxide is preferably reduced as much as possible. For example, the nitrogen concentration in the metal oxide is set lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$ in SIMS.

Hydrogen contained in a metal oxide reacts with oxygen bonded to a metal atom to be water, and thus forms an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using the metal oxide that contains hydrogen for its channel formation region is likely to have normally-on characteristics. Accordingly, hydrogen in the metal oxide is preferably reduced as much as possible. Specifically, the hydrogen concentration of the metal oxide obtained by SIMS is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$.

When a metal oxide in which the impurity concentration is sufficiently reduced is used in a channel formation region of a transistor, stable electrical characteristics can be given.

<Deposition Method>

An insulating material for forming the insulating layer, a conductive material for forming the electrode, or a semiconductor material for forming the semiconductor layer can be formed by a sputtering method, a spin coating method, a CVD (Chemical Vapor Deposition) method (including a thermal CVD method, an MOCVD (Metal Organic Chemical Vapor Deposition) method, a PECVD (Plasma Enhanced CVD) method, a high density plasma CVD method, an LPCVD (low pressure CVD) method, an APCVD (atmospheric pressure CVD) method, and the like), an ALD (Atomic Layer Deposition) method, or an MBE (Molecular Beam Epitaxy) method, or a PLD (Pulsed Laser Deposition) method, a dipping method, a spray coating method, a droplet discharging method (e.g., an inkjet method), or a printing method (e.g., screen printing or offset printing).

By a plasma CVD method, a high-quality film can be obtained at a relatively low temperature. With the use of a deposition method that does not use plasma at the time of deposition, such as an MOCVD method, an ALD method, or a thermal CVD method, damage is not easily caused on a surface where the film is deposited. For example, a wiring, an electrode, an element (e.g., a transistor or a capacitor), or the like included in a memory device might be charged up by receiving charges from plasma. In that case, accumulated charges might break the wiring, electrode, element, or the like included in the memory device. By contrast, in the case of a deposition method not using plasma, such plasma damage is not caused; thus, the yield of memory devices can be increased. Moreover, since plasma damage during deposition is not caused, a film with few defects can be obtained.

Unlike a deposition method in which particles ejected from a target or the like are deposited, a CVD method and an ALD method are deposition methods in which a film is formed by reaction at a surface of an object. Thus, a CVD method and an ALD method are deposition methods that enable favorable step coverage almost regardless of the shape of an object. In particular, an ALD method enables excellent step coverage and excellent thickness uniformity and can be favorably used to cover a surface of an opening with a high aspect ratio, for example. Note that an ALD method has a relatively low deposition rate, and thus is preferably used in combination with another deposition method with a high deposition rate, such as a CVD method, in some cases.

When a CVD method or an ALD method is used, the composition of a film to be formed can be controlled with a flow rate ratio of source gases. For example, by a CVD method or an ALD method, a film with a certain composition can be deposited depending on the flow rate ratio of the source gases. Moreover, with a CVD method or an ALD method, by changing the flow rate ratio of the source gases while depositing the film, a film whose composition is continuously changed can be deposited. In the case of depositing a film while changing the flow rate ratio of the source gases, as compared with the case of depositing a film with the use of a plurality of deposition chambers, the time taken for the deposition can be shortened because the time taken for transfer and pressure adjustment is omitted. Thus, memory devices can be manufactured with improved productivity in some cases.

Note that in the case of depositing a film by an ALD method, a gas that does not contain chlorine is preferably used as a material gas.

This embodiment can be implemented in an appropriate combination with the structures described in the other embodiments and the like.

Embodiment 8

In this embodiment, a structure example of a transistor that can be used in the memory device and the like described in the above embodiment will be described.

Transistor Structure Example 1

Figure 38A:
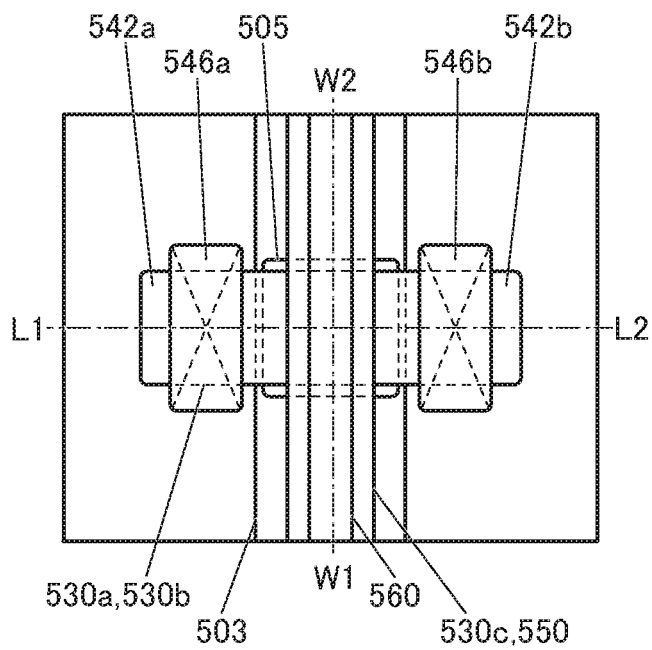
FIGS. 38A to 38C Diagrams illustrating a structure example of a transistor.
Figure 38C:
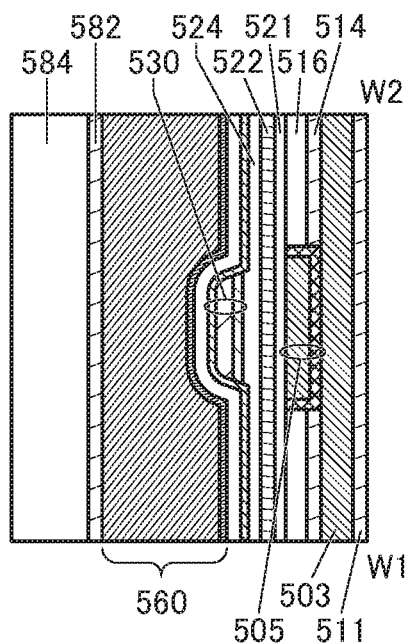
Figure 38B:
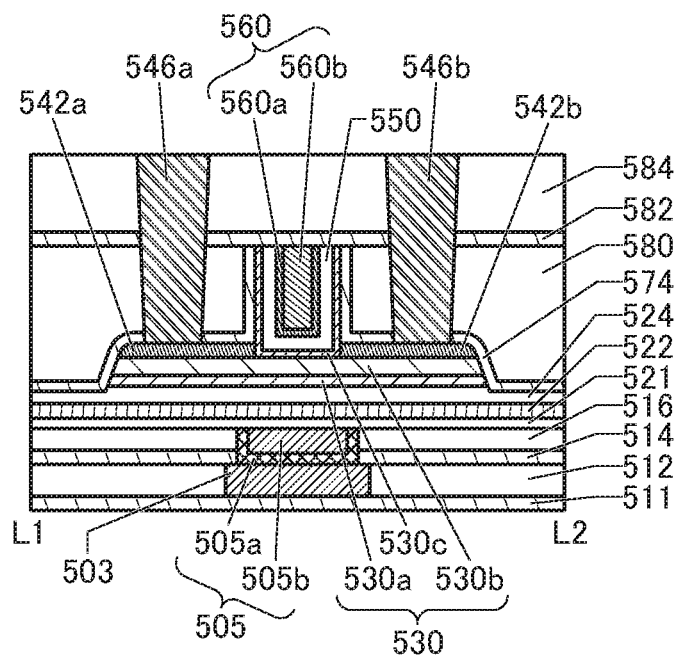

A structure example of a transistor 510A is described with reference to FIGS. 38(A), 38(B), and 38(C). FIG. 38(A) is a top view of the transistor 510A. FIG. 38(B) is a cross-sectional view of a portion indicated by a dashed-dotted line L1-L2 in FIG. 38(A). FIG. 38(C) is a cross-sectional view of a portion indicated by a dashed-dotted line W1-W2 in FIG. 38(A). For clarity of the diagram, some components are not illustrated in the top view of FIG. 38(A).

FIGS. 38(A), 38(B), and 38(C) illustrate the transistor 510A and an insulating layer 511, an insulating layer 512, an insulating layer 514, an insulating layer 516, an insulating layer 580, an insulating layer 582, and an insulating layer 584 that function as interlayer films. In addition, a conductive layer 546 (a conductive layer 546a and a conductive layer 546b) that is electrically connected to the transistor 510A and functions as a contact plug, and a conductive layer 503 functioning as a wiring are illustrated.

The transistor 510A includes a conductive layer 560 (a conductive layer 560a and a conductive layer 560b) functioning as a first gate electrode; a conductive layer 505 (a conductive layer 505a and a conductive layer 505b) functioning as a second gate electrode; an insulating layer 550 functioning as a first gate insulating film; an insulating layer 521, an insulating layer 522, and an insulating layer 524 that function as a second gate insulating layer; an oxide 530 (an oxide 530a, an oxide 530b, and an oxide 530c) including a region where a channel is formed; a conductive layer 542a functioning as one of a source and a drain; a conductive layer 542b functioning as the other of the source and the drain; and an insulating layer 574.

In the transistor 510A illustrated in FIG. 38, the oxide 530c, the insulating layer 550, and the conductive layer 560 are positioned in an opening provided in the insulating layer 580 with the insulating layer 574 positioned therebetween. Moreover, the oxide 530c, the insulating layer 550, and the conductive layer 560 are positioned between the conductive layer 542a and the conductive layer 542b.

The insulating layer 511 and the insulating layer 512 function as interlayer films.

As the interlayer film, a single layer or stacked layers of an insulating layer such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST) can be used. Alternatively, aluminum oxide, bismuth oxide, germanium oxide, niobium oxide, silicon oxide, titanium oxide, tungsten oxide, yttrium oxide, or zirconium oxide may be added to these insulating layers, for example. Alternatively, these insulating layers may be subjected to nitriding treatment. Silicon oxide, silicon oxynitride, or silicon nitride may be stacked over the insulating layer.

For example, the insulating layer 511 preferably functions as a barrier film that inhibits entry of impurities such as water and hydrogen into the transistor 510A from the substrate side. Accordingly, for the insulating layer 511, it is preferable to use an insulating material that has a function of inhibiting diffusion of impurities such as a hydrogen atom, a hydrogen molecule, a water molecule, and a copper atom (through which the above impurities are less likely to pass). Alternatively, it is preferable to use an insulating material that has a function of inhibiting diffusion of oxygen (e.g., at least one of oxygen atoms, oxygen molecules, and the like) (through which the above oxygen is less likely to pass). Moreover, aluminum oxide or silicon nitride, for example, may be used for the insulating layer 511. This structure can inhibit diffusion of impurities such as hydrogen and water to the transistor 510A side from the substrate side of the insulating layer 511.

For example, the dielectric constant of the insulating layer 512 is preferably lower than that of the insulating layer 511. When a material with a low dielectric constant is used for the interlayer film, the parasitic capacitance generated between wirings can be reduced.

The conductive layer 503 is formed to be embedded in the insulating layer 512. Here, the level of the top surface of the conductive layer 503 and the level of the top surface of the insulating layer 512 can be substantially the same. Note that although a structure in which the conductive layer 503 is a single layer is illustrated, the present invention is not limited thereto. For example, the conductive layer 503 may have a multi-layer film structure of two or more layers. Note that for the conductive layer 503, a conductive material that has high conductivity and contains tungsten, copper, or aluminum as its main component is preferably used.

In the transistor 510A, the conductive layer 560 sometimes functions as a first gate (also referred to as a top gate) electrode. The conductive layer 505 sometimes functions as a second gate (also referred to as a bottom gate) electrode. In that case, the threshold voltage of the transistor 510A can be controlled by changing a potential applied to the conductive layer 505 not in synchronization with but independently of a potential applied to the conductive layer 560. In particular, the threshold voltage of the transistor 510A can be higher than 0 V and the off-state current can be reduced by applying a negative potential to the conductive layer 505. Thus, drain current at the time when a potential applied to the conductive layer 560 is 0 V can be lower in the case where a negative potential is applied to the conductive layer 505 than in the case where a negative potential is not applied to the conductive layer 505.

For example, when the conductive layer 505 and the conductive layer 560 overlap with each other, in the case where a potential is applied to the conductive layer 560 and the conductive layer 505, an electric field generated from the conductive layer 560 and an electric field generated from the conductive layer 505 are connected and can cover a channel formation region formed in the oxide 530.

That is, the channel formation region can be electrically surrounded by the electric field of the conductive layer 560 having a function of the first gate electrode and the electric field of the conductive layer 505 having a function of the second gate electrode. In this specification, a transistor structure in which a channel formation region is electrically surrounded by electric fields of a first gate electrode and a second gate electrode is referred to as a surrounded channel (S-channel) structure.

Like the insulating layer 511 or the insulating layer 512, the insulating layer 514 and the insulating layer 516 function as interlayer films. For example, the insulating layer 514 preferably functions as a barrier film that inhibits entry of impurities such as water and hydrogen into the transistor 510A from the substrate side. This structure can inhibit diffusion of impurities such as hydrogen and water to the transistor 510A side from the substrate side of the insulating layer 514. Moreover, for example, the insulating layer 516 preferably has a lower dielectric constant than the insulating layer 514. When a material with a low dielectric constant is used for the interlayer film, the parasitic capacitance generated between wirings can be reduced.

In the conductive layer 505 functioning as the second gate, the conductive layer 505a is formed in contact with an inner wall of an opening in the insulating layer 514 and the insulating layer 516, and the conductive layer 505b is formed further inside. Here, the top surfaces of the conductive layer 505a and the conductive layer 505b and the top surface of the insulating layer 516 can be substantially level with each other. Although the transistor 510A having a structure in which the conductive layer 505a and the conductive layer 505b are stacked is illustrated, the present invention is not limited thereto. For example, the conductive layer 505 may have a single-layer structure or a stacked-layer structure of three or more layers.

Here, for the conductive layer 505a, a conductive material that has a function of inhibiting diffusion of impurities such as a hydrogen atom, a hydrogen molecule, a water molecule, and a copper atom (through which the above impurities are less likely to pass) is preferably used. Alternatively, it is preferable to use a conductive material that has a function of inhibiting diffusion of oxygen (e.g., at least one of oxygen atoms, oxygen molecules, and the like) (through which the above oxygen is less likely to pass). Note that in this specification, a function of inhibiting diffusion of impurities or oxygen means a function of inhibiting diffusion of any one or all of the above impurities and the above oxygen.

For example, when the conductive layer 505a has a function of inhibiting diffusion of oxygen, a reduction in conductivity of the conductive layer 505b due to oxidation can be inhibited.

In the case where the conductive layer 505 doubles as a wiring, for the conductive layer 505b, it is preferable to use a conductive material that has high conductivity and contains tungsten, copper, or aluminum as its main component. In that case, the conductive layer 503 is not necessarily provided. Note that the conductive layer 505b is illustrated as a single layer but may have a stacked-layer structure, for example, a stack of any of the above conductive materials and titanium or titanium nitride.

The insulating layer 521, the insulating layer 522, and the insulating layer 524 function as a second gate insulating layer.

The insulating layer 522 preferably has a barrier property. The insulating layer 522 having a barrier property functions as a layer that inhibits entry of impurities such as hydrogen into the transistor 510A from the surroundings of the transistor 510A.

For the insulating layer 522, a single layer or stacked layers of an insulating layer containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST) are preferably used, for example. As miniaturization and high integration of transistors progress, a problem such as leakage current may arise because of a thinner gate insulating layer. When a high-k material is used for an insulating layer functioning as the gate insulating layer, a gate potential during operation of the transistor can be reduced while the physical thickness is maintained.

For example, it is preferable that the insulating layer 521 be thermally stable. For example, silicon oxide and silicon oxynitride, which have thermal stability, are preferable. In addition, a combination of an insulating layer of a high-k material and silicon oxide or silicon oxynitride allows the insulating layer 521 to have a stacked-layer structure with thermal stability and a high dielectric constant.

Note that the second gate insulating layer is shown to have a three-layer stacked structure in FIG. 38, but may have a single-layer structure or a stacked-layer structure of two or more layers. In that case, without limitation to a stacked-layer structure formed of the same material, a stacked-layer structure formed of different materials may be employed.

The oxide 530 including a region functioning as the channel formation region includes the oxide 530a, the oxide 530b over the oxide 530a, and the oxide 530c over the oxide 530b. Including the oxide 530a under the oxide 530b makes it possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c. As the oxide 530, the oxide semiconductor described in the above embodiment, which is one kind of metal oxide, can be used.

Note that the oxide 530c is preferably provided in the opening provided in the insulating layer 580 with the insulating layer 574 positioned therebetween. When the insulating layer 574 has a barrier property, diffusion of impurities from the insulating layer 580 into the oxide 530 can be inhibited.

One of conductive layers 542 functions as a source electrode and the other functions as a drain electrode.

For the conductive layer 542a and the conductive layer 542b, a metal such as aluminum, titanium, chromium, nickel, copper, yttrium, zirconium, molybdenum, silver, tantalum, or tungsten or an alloy containing any of the metals as its main component can be used. In particular, a metal nitride film of tantalum nitride or the like is preferable because it has a barrier property against hydrogen or oxygen and its oxidation resistance is high.

Although a single-layer structure is shown in FIG. 38, a stacked-layer structure of two or more layers may be employed. For example, a tantalum nitride film and a tungsten film may be stacked. Alternatively, a titanium film and an aluminum film may be stacked. Further alternatively, a two-layer structure in which an aluminum film is stacked over a tungsten film, a two-layer structure in which a copper film is stacked over a copper-magnesium-aluminum alloy film, a two-layer structure in which a copper film is stacked over a titanium film, or a two-layer structure in which a copper film is stacked over a tungsten film may be employed.

A three-layer structure consisting of a titanium film or a titanium nitride film, an aluminum film or a copper film stacked over the titanium film or the titanium nitride film, and a titanium film or a titanium nitride film formed thereover; a three-layer structure consisting of a molybdenum film or a molybdenum nitride film, an aluminum film or a copper film stacked over the molybdenum film or the molybdenum nitride film, and a molybdenum film or a molybdenum nitride film formed thereover; or the like may be employed. Note that a transparent conductive material containing indium oxide, tin oxide, or zinc oxide may be used.

A barrier layer may be provided over the conductive layer 542. For the barrier layer, a material having a barrier property against oxygen or hydrogen is preferably used. This structure can inhibit oxidation of the conductive layer 542 at the time of depositing the insulating layer 574.

A metal oxide can be used for the barrier layer, for example. In particular, an insulating film of aluminum oxide, hafnium oxide, gallium oxide, or the like, which has a barrier property against oxygen and hydrogen, is preferably used. Alternatively, silicon nitride formed by a CVD method may be used.

With the barrier layer, the range of choices for the material of the conductive layer 542 can be expanded. For example, a material having a low oxidation resistance and high conductivity, such as tungsten or aluminum, can be used for the conductive layer 542. Moreover, for example, a conductor that can be easily deposited or processed can be used.

The insulating layer 550 functions as a first gate insulating layer. The insulating layer 550 is preferably provided in the opening provided in the insulating layer 580 with the oxide 530c and the insulating layer 574 positioned therebetween.

As miniaturization and high integration of transistors progress, a problem such as leakage current may arise because of a thinner gate insulating layer. In that case, the insulating layer 550 may have a stacked-layer structure like the second gate insulating layer. When the insulating layer functioning as the gate insulating layer has a stacked-layer structure of a high-k material and a thermally stable material, a gate potential during operation of the transistor can be reduced while the physical thickness is maintained. Furthermore, the stacked-layer structure can be thermally stable and have a high dielectric constant.

The conductive layer 560 functioning as a first gate electrode includes the conductive layer 560a and the conductive layer 560b over the conductive layer 560a. Like the conductive layer 505a, for the conductive layer 560a, it is preferable to use a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductive layer 560a has a function of inhibiting oxygen diffusion, the range of choices for the material of the conductive layer 560b can be expanded. That is, the conductive layer 560a inhibits oxidation of the conductive layer 560b, thereby preventing the decrease in conductivity of the conductive layer 560b.

As a conductive material having a function of inhibiting diffusion of oxygen, for example, tantalum, tantalum nitride, ruthenium, or ruthenium oxide is preferably used. For the conductive layer 560a, the oxide semiconductor that can be used as the oxide 530 can be used. In that case, when the conductive layer 560b is deposited by a sputtering method, the electric resistance of the oxide semiconductor is lowered so that the conductive layer 560a can become a conductor. This can be referred to as an OC (Oxide Conductor) electrode.

For the conductive layer 560b, it is preferable to use a conductive material containing tungsten, copper, or aluminum as its main component. The conductive layer 560 functions as a wiring and thus a conductor having high conductivity is preferably used. For example, a conductive material containing tungsten, copper, or aluminum as its main component can be used. The conductive layer 560b may have a stacked-layer structure, for example, a stack of any of the above conductive materials and titanium or titanium nitride.

The insulating layer 574 is positioned between the insulating layer 580 and the transistor 510A. For the insulating layer 574, an insulating material having a function of inhibiting diffusion of oxygen and impurities such as water and hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulating layer 574 can inhibit diffusion of impurities such as water and hydrogen contained in the insulating layer 580 into the oxide 530b through the oxide 530c and the insulating layer 550. In addition, oxidation of the conductive layer 560 due to excess oxygen contained in the insulating layer 580 can be inhibited.

The insulating layer 580, the insulating layer 582, and the insulating layer 584 function as interlayer films.

Like the insulating layer 514, the insulating layer 582 preferably functions as a barrier insulating film that inhibits entry of impurities such as water and hydrogen into the transistor 510A from the outside.

The use of an insulating material having a resistivity higher than or equal to $1 \times 10^{10}$ Ωcm and lower than or equal to $1 \times 10^{15}$ Ωcm for the insulating layer 582 can reduce plasma damage caused in deposition, etching, or the like. For example, silicon nitride having a resistivity lower than or equal to $1 \times 10^{14}$ Ωcm, preferably lower than or equal to $1 \times 10^{13}$ Ωcm is used as the insulating layer 582. Note that an insulating material having a resistivity higher than or equal to $1 \times 10^{10}$ Ωcm and lower than or equal to $1 \times 10^{15}$ Ωcm may be used not only for the insulating layer 582 but also for the other insulating layers. For example, silicon nitride having a resistivity lower than or equal to $1 \times 10^{14}$ Ωcm, preferably lower than or equal to $1 \times 10^{13}$ Ωcm may be used for the insulating layer 584, the insulating layer 580, the insulating layer 524, and/or the insulating layer 516.

Like the insulating layer 516, the insulating layer 580 and the insulating layer 584 preferably have a lower dielectric constant than the insulating layer 582. When a material with a low dielectric constant is used for the interlayer films, the parasitic capacitance generated between wirings can be reduced.

The transistor 510A may be electrically connected to another component through a plug or a wiring such as the conductive layer 546 embedded in the insulating layer 580, the insulating layer 582, and the insulating layer 584.

As a material for the conductive layer 546, a conductive material such as a metal material, an alloy material, a metal nitride material, or a metal oxide material can be used as a single layer or stacked layers, as in the conductive layer 505. For example, it is preferable to use a high-melting-point material that has both heat resistance and conductivity, such as tungsten or molybdenum. Alternatively, it is preferable to use a low-resistance conductive material such as aluminum or copper. The use of a low-resistance conductive material can reduce wiring resistance.

For example, when the conductive layer 546 has a stacked-layer structure of tantalum nitride or the like, which is a conductor having a barrier property against hydrogen and oxygen, and tungsten, which has high conductivity, diffusion of impurities from the outside can be inhibited while the conductivity of a wiring is maintained.

With the above structure, a semiconductor device including a transistor that contains an oxide semiconductor and has a high on-state current can be provided. Alternatively, a semiconductor device including a transistor that contains an oxide semiconductor and has a low off-state current can be provided. Alternatively, a semiconductor device that has small variations in electrical characteristics, stable electrical characteristics, and high reliability can be provided.

The conductive layer 505 capable of functioning as a back gate electrode and the conductive layer 503 capable of functioning as a wiring may be omitted as needed. A transistor 510Aa illustrated in FIGS. 45(A) to 45(C) has a structure in which the conductive layer 505 and the conductive layer 503 are removed from the transistor 510A.

Figure 45A:
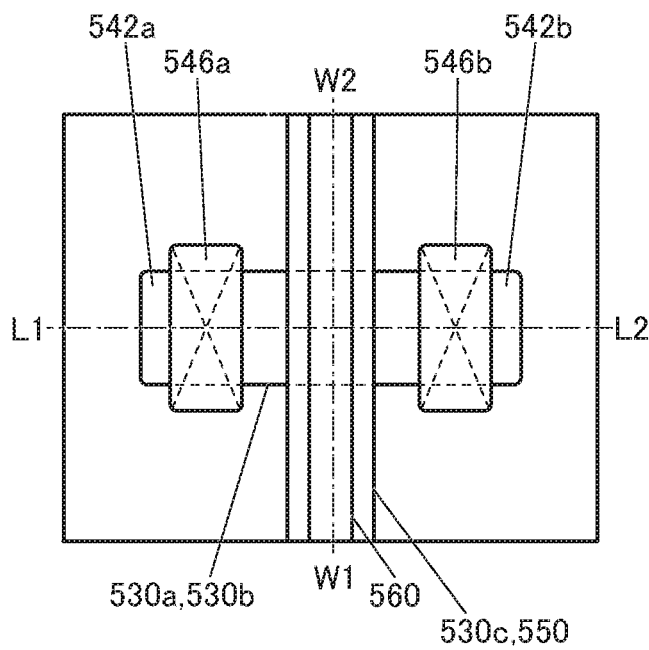
FIGS. 45A to 45C Diagrams illustrating a structure example of a transistor.
Figure 45C:
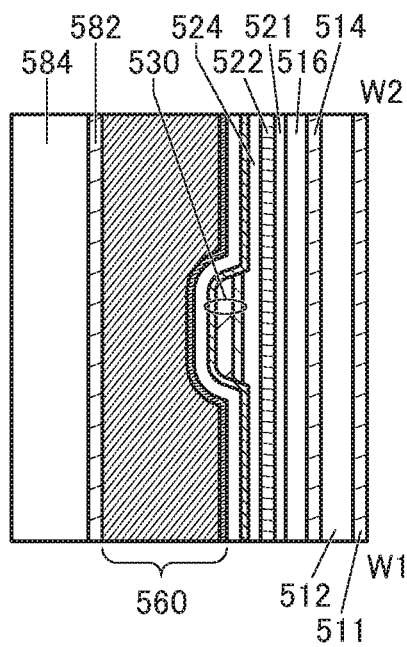
Figure 45B:
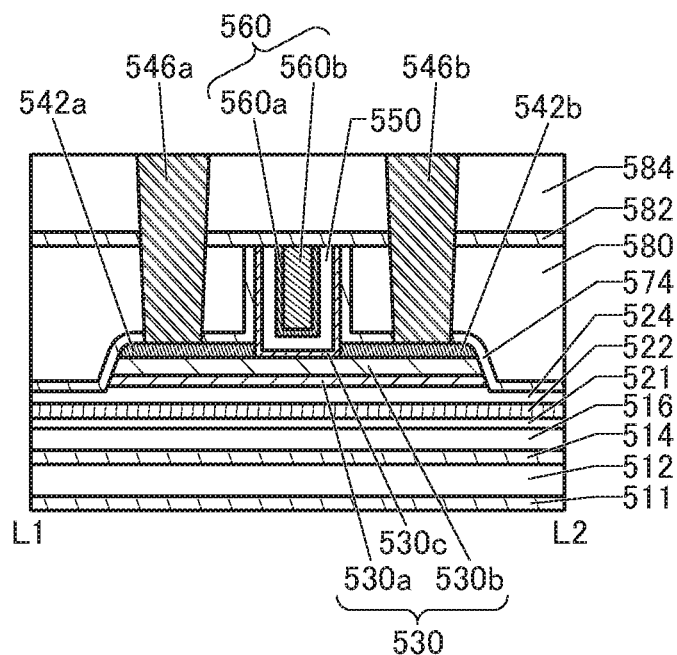

FIG. 45(A) is a top view of the transistor 510Aa. FIG. 45(B) is a cross-sectional view of a portion indicated by a dashed-dotted line L1-L2 in FIG. 45(A). FIG. 45(C) is a cross-sectional view of a portion indicated by a dashed-dotted line W1-W2 in FIG. 45(A). For clarity of the diagram, some components are not illustrated in the top view of FIG. 45(A).

Transistor Structure Example 2

Figure 39A:
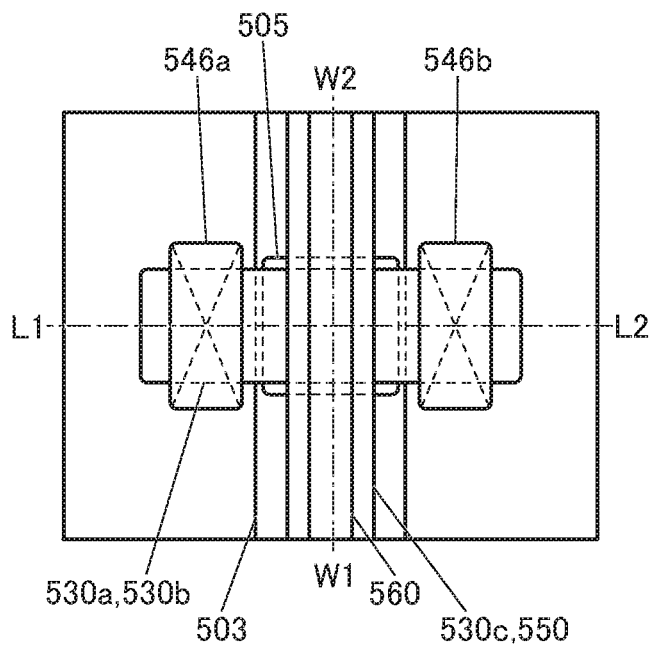
FIGS. 39A to 39C Diagrams illustrating a structural example of a transistor.
Figure 39C:
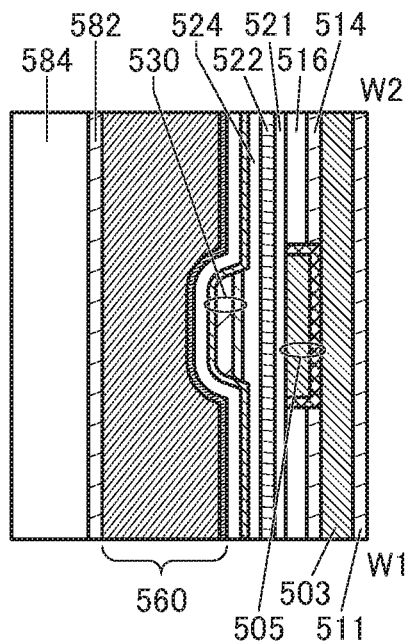
Figure 39B:
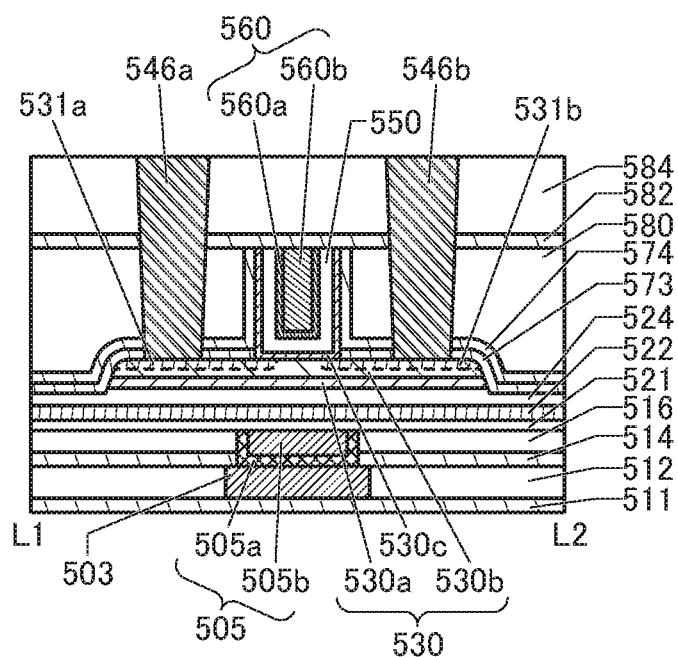

A structure example of a transistor 510B is described with reference to FIGS. 39(A), 39(B), and 39(C). FIG. 39(A) is a top view of the transistor 510B. FIG. 39(B) is a cross-sectional view of a portion indicated by a dashed-dotted line L1-L2 in FIG. 39(A). FIG. 39(C) is a cross-sectional view of a portion indicated by a dashed-dotted line W1-W2 in FIG. 39(A). For clarity of the diagram, some components are not illustrated in the top view of FIG. 39(A).

The transistor 510B is a modification example of the above transistor. Therefore, the point different from the above transistor will be mainly described to avoid repeated description.

In FIGS. 39(A) to 39(C), the conductive layer 542 (the conductive layer 542a and the conductive layer 542b) is not provided, and part of the exposed surface of the oxide 530b includes a region 531a and a region 531b. One of the region 531a and the region 531b functions as a source region, and the other functions as a drain region. Moreover, an insulating layer 573 is included between the oxide 530b and the insulating layer 574.

A region 531 (the region 531a and the region 531b) illustrated in FIG. 39 is a region where the above element is added to the oxide 530b. The region 531 can be formed with the use of a dummy gate, for example.

Specifically, a dummy gate is provided over the oxide 530b, and the above element that reduces the resistance of the oxide 530b is added using the dummy gate as a mask. That is, the element is added to regions of the oxide 530 that are not overlapped by the dummy gate, whereby the region 531 is formed. As a method of adding the element, an ion implantation method by which an ionized source gas is subjected to mass separation and then added, an ion doping method by which an ionized source gas is added without mass separation, a plasma immersion ion implantation method, or the like can be used.

Typical examples of the element that reduces the resistance of the oxide 530 are boron and phosphorus. Moreover, hydrogen, carbon, nitrogen, fluorine, sulfur, chlorine, titanium, a rare gas element, or the like may be used. Typical examples of the rare gas element include helium, neon, argon, krypton, and xenon. The concentration of the element is measured by secondary ion mass spectrometry (SIMS) or the like.

In particular, boron and phosphorus are preferable because an apparatus used in a manufacturing line for amorphous silicon or low-temperature polysilicon can be used. Since the existing facility can be used, capital investment can be reduced.

Next, an insulating film to be the insulating layer 573 and an insulating film to be the insulating layer 574 may be deposited over the oxide 530b and the dummy gate. Stacking the insulating layer 573 and the insulating film to be the insulating layer 574 can provide a region where the region 531, the oxide 530c, and the insulating layer 550 overlap with each other.

Specifically, after an insulating film to be the insulating layer 580 is provided over the insulating film to be the insulating layer 574, the insulating film to be the insulating layer 580 is subjected to CMP (Chemical Mechanical Polishing) treatment, whereby part of the insulating film to be the insulating layer 580 is removed and the dummy gate is exposed. Then, when the dummy gate is removed, part of the insulating layer 573 in contact with the dummy gate is preferably also removed. Thus, the insulating layer 574 and the insulating layer 573 are exposed at the side surface of the opening provided in the insulating layer 580, and the region 531 provided in the oxide 530b is partly exposed at the bottom surface of the opening. Next, an oxide film to be the oxide 530c, an insulating film to be the insulating layer 550, and a conductive film to be the conductive layer 560 are deposited in this order in the opening, and then, the oxide film to be the oxide 530c, the insulating film to be the insulating layer 550, and the conductive film to be the conductive layer 560 are partly removed by CMP treatment or the like until the insulating layer 580 is exposed; thus, the transistor illustrated in FIG. 39 can be formed.

Note that the insulating layer 573 and the insulating layer 574 are not essential components. Design is appropriately set in consideration of required transistor characteristics.

The cost of the transistor illustrated in FIG. 39 can be reduced because an existing apparatus can be used and the conductive layer 542 is not provided.

The conductive layer 505 capable of functioning as a back gate electrode and the conductive layer 503 capable of functioning as a wiring may be omitted as needed. A transistor 510Ba illustrated in FIGS. 46(A) to 46(C) has a structure in which the conductive layer 505 and the conductive layer 503 are removed from the transistor 510B.

Figure 46A:
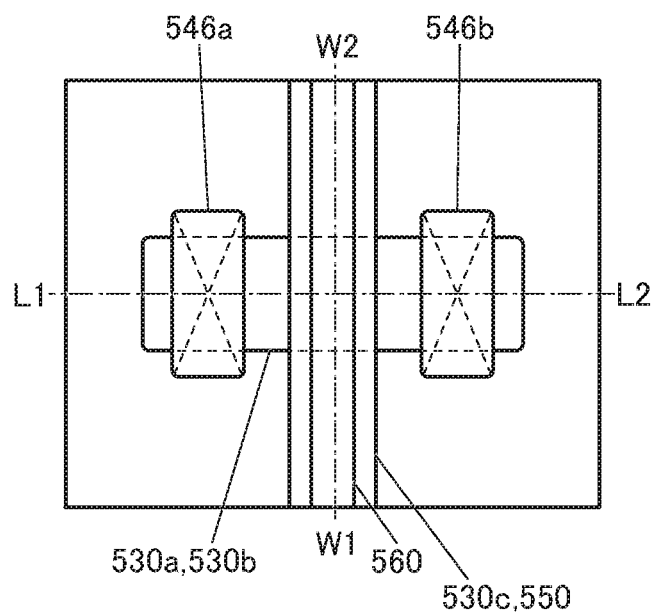
FIGS. 46A to 46C Diagrams illustrating a structure example of a transistor.
Figure 46C:
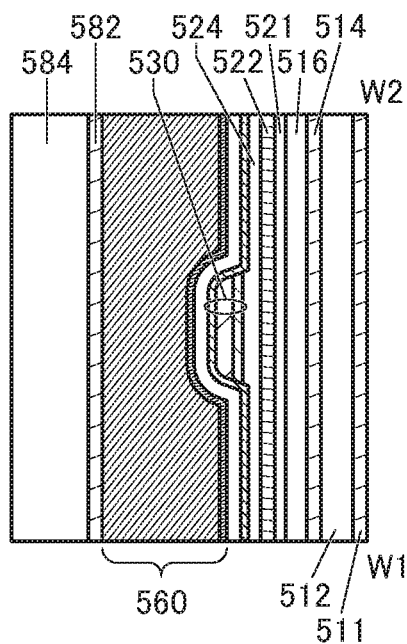
Figure 46B:
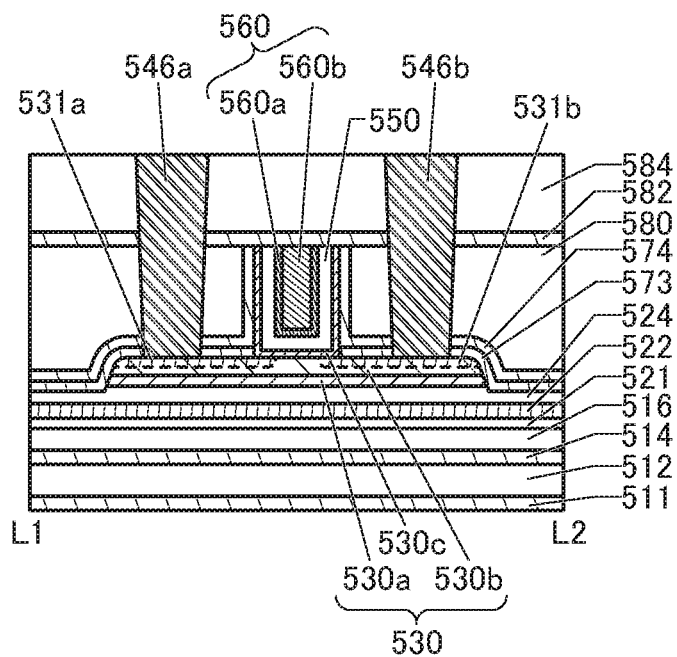

FIG. 46(A) is a top view of the transistor 510Ba. FIG. 46(B) is a cross-sectional view of a portion indicated by a dashed-dotted line L1-L2 in FIG. 46(A). FIG. 46(C) is a cross-sectional view of a portion indicated by a dashed-dotted line W1-W2 in FIG. 46(A). For clarity of the diagram, some components are not illustrated in the top view of FIG. 46(A).

Transistor Structure Example 3

Figure 40A:
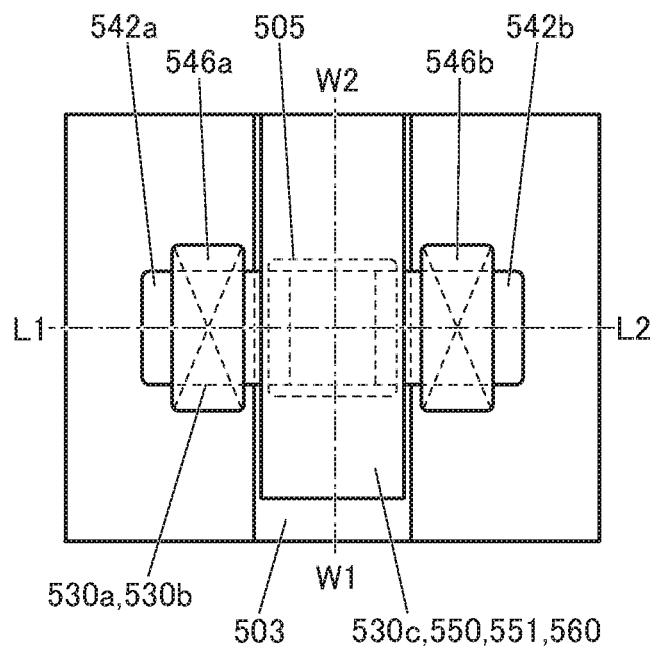
FIGS. 40A to 40C Diagrams illustrating a structural example of a transistor.
Figure 40C:
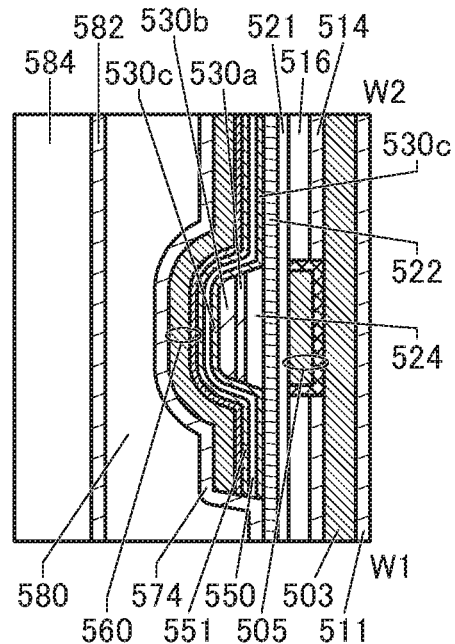
Figure 40B:
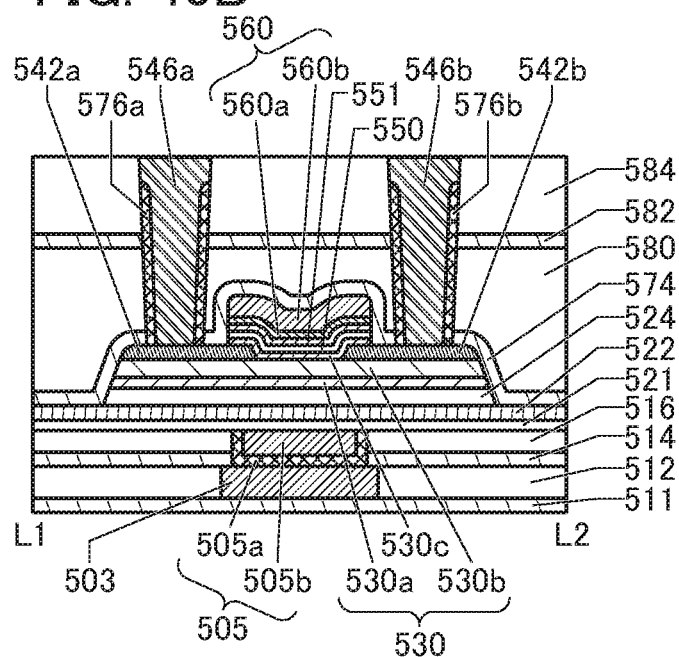

A structure example of a transistor 510C is described with reference to FIGS. 40(A), 40(B), and 40(C). FIG. 40(A) is a top view of the transistor 510C. FIG. 40(B) is a cross-sectional view of a portion indicated by a dashed-dotted line L1-L2 in FIG. 40(A). FIG. 40(C) is a cross-sectional view of a portion indicated by a dashed-dotted line W1-W2 in FIG. 40(A). For clarity of the diagram, some components are not illustrated in the top view of FIG. 40(A).

The transistor 510C is a modification example of the above transistor. Therefore, the point different from the transistor 510A will be mainly described to avoid repeated description.

The transistor 510C includes a region where the conductive layer 542 (the conductive layer 542a and the conductive layer 542b), the oxide 530c, the insulating layer 550, the oxide 551, and the conductive layer 560 overlap with each other. With this structure, a transistor having a high on-state current can be provided. Moreover, a transistor having high controllability can be provided.

The conductive layer 560 functioning as a first gate electrode includes the conductive layer 560a and the conductive layer 560b over the conductive layer 560a. Like the conductive layer 505a, for the conductive layer 560a, it is preferable to use a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductive layer 560a has a function of inhibiting oxygen diffusion, the range of choices for the material of the conductive layer 560b can be expanded. That is, the conductive layer 560a inhibits oxidation of the conductive layer 560b, thereby preventing the decrease in conductivity of the conductive layer 560b.

In addition, to adjust Vth of the transistor, a material used for the conductive layer 560a may be determined in consideration of a work function. For example, the conductive layer 560a may be formed using titanium nitride, and the conductive layer 560b may be formed using tungsten. The conductive layer 560a and the conductive layer 560b are formed by a known deposition method such as a sputtering method, a CVD method, or an AFM method. Note that the deposition temperature in the case where titanium nitride is deposited by a CVD method is preferably higher than or equal to 380° C. and lower than or equal to 500° C., further preferably higher than or equal to 400° C. and lower than or equal to 450° C.

The oxide 551 may be formed using a material similar to those of the other insulators. As the oxide 551, a metal oxide such as an In-M-Zn oxide containing excess oxygen (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) may be used. For example, as the oxide 551, an In—Ga—Zn oxide is deposited by a sputtering method. Specifically, for example, deposition is performed using a target with an atomic ratio of In:Ga:Zn=1:3:4 and a sputtering gas containing oxygen. In the case where the oxide 551 is deposited by a sputtering method, the flow rate ratio of oxygen contained in the sputtering gas is preferably higher than or equal to 70%, further preferably higher than or equal to 80%, still further preferably 100%.

When a gas containing oxygen is used as a sputtering gas, oxygen can be supplied not only to the oxide 551 but also to the insulating layer 550 that is a formation surface of the oxide 551. Furthermore, when the flow rate ratio of oxygen contained in the sputtering gas is increased, the amount of oxygen supplied to the insulating layer 550 can be increased.

Moreover, when the oxide 551 is provided over the insulating layer 550, excess oxygen contained in the insulating layer 550 is unlikely to be diffused into the conductive layer 560. Thus, the reliability of the transistor can be increased. Note that the oxide 551 may be omitted depending on purposes or the like.

The insulating layer 574 is preferably provided to cover the top surface and the side surface of the conductive layer 560, the side surface of the insulating layer 550, and the side surface of the oxide 530c. For the insulating layer 574, an insulating material having a function of inhibiting diffusion of oxygen and impurities such as water and hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulating layer 574 can inhibit oxidation of the conductive layer 560. Moreover, the insulating layer 574 can inhibit diffusion of impurities such as water and hydrogen contained in the insulating layer 580 into the transistor 510C.

The insulating layer 576 (the insulating layer 576a and the insulating layer 576b) having a barrier property may be provided between the conductive layer 546 and the insulating layer 580. Providing the insulating layer 576 can prevent oxygen in the insulating layer 580 from reacting with the conductive layer 546 and oxidizing the conductive layer 546.

Furthermore, with the insulating layer 576 having a barrier property, the range of choices for the material of the conductor used as the plug or the wiring can be expanded. The use of a metal material having an oxygen absorbing property and high conductivity for the conductive layer 546, for example, can provide a semiconductor device with low power consumption.

The conductive layer 505 capable of functioning as a back gate electrode and the conductive layer 503 capable of functioning as a wiring may be omitted as needed. A transistor 510Ca illustrated in FIGS. 47(A) to 47(C) has a structure in which the conductive layer 505 and the conductive layer 503 are removed from the transistor 510C.

Figure 47A:
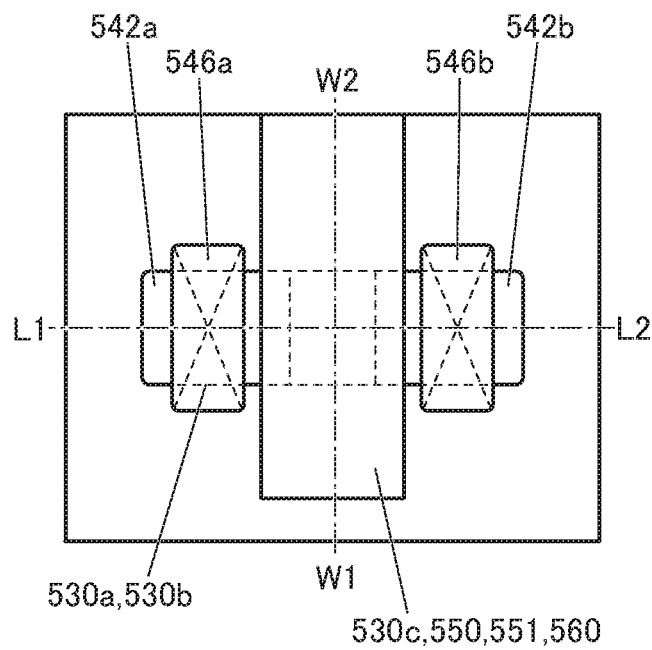
FIGS. 47A to 47C Diagrams illustrating a structure example of a transistor.
Figure 47C:
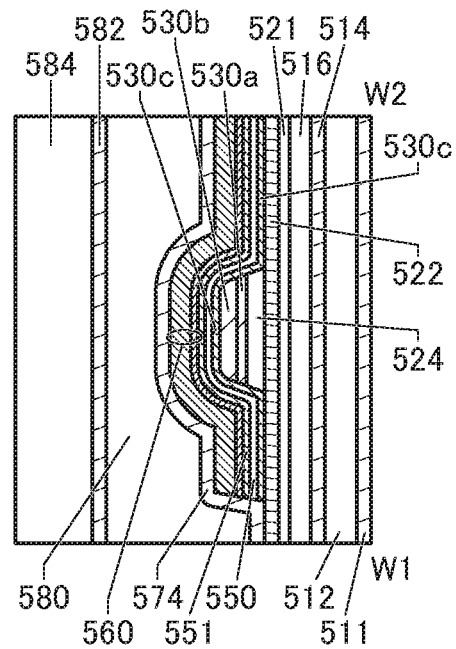
Figure 47B:
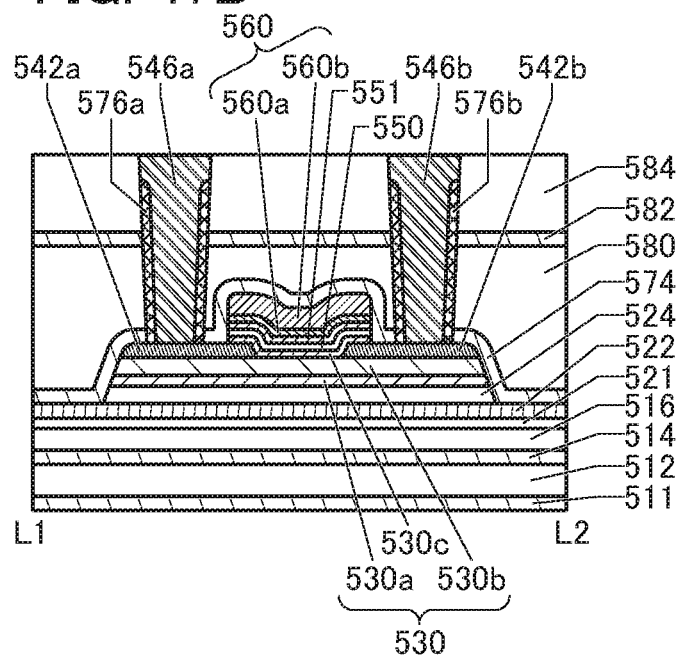

FIG. 47(A) is a top view of the transistor 510Ca. FIG. 47(B) is a cross-sectional view of a portion indicated by a dashed-dotted line L1-L2 in FIG. 47(A). FIG. 47(C) is a cross-sectional view of a portion indicated by a dashed-dotted line W1-W2 in FIG. 47(A). For clarity of the diagram, some components are not illustrated in the top view of FIG. 47(A).

Transistor Structure Example 4

Figure 41A:
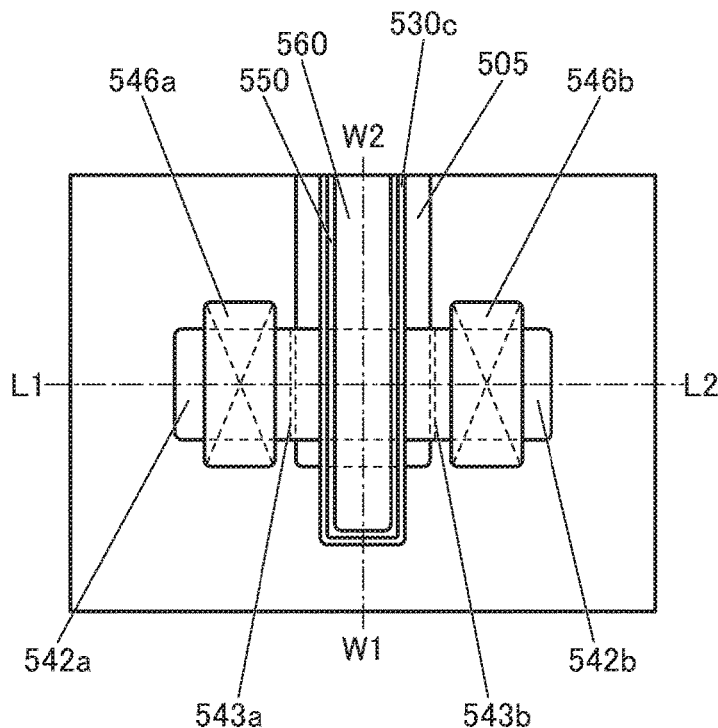
FIGS. 41A to 41C Diagrams illustrating a structural example of a transistor.
Figure 41C:
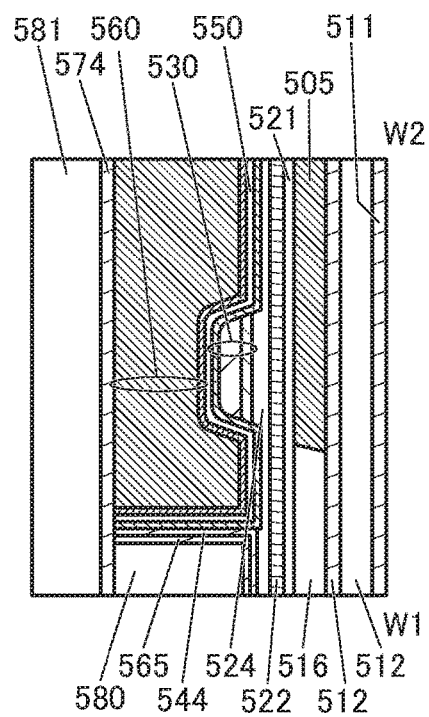
Figure 41B:
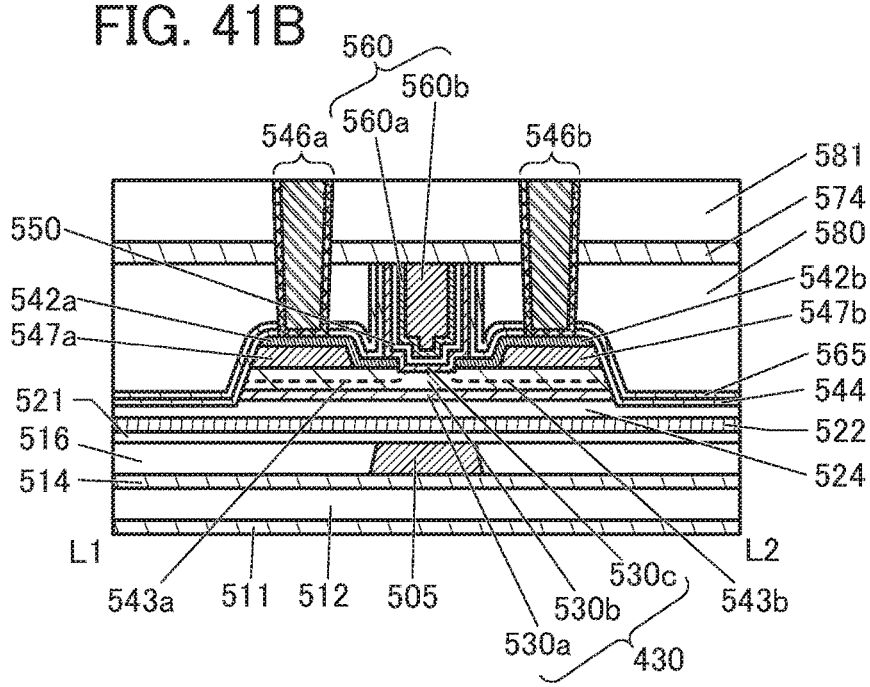

A structure example of a transistor 510D is described with reference to FIGS. 41(A), 41(B), and 41(C). FIG. 41(A) is a top view of the transistor 510D. FIG. 41(B) is a cross-sectional view of a portion indicated by a dashed-dotted line L1-L2 in FIG. 41(A). FIG. 41(C) is a cross-sectional view of a portion indicated by a dashed-dotted line W1-W2 in FIG. 41(A). For clarity of the diagram, some components are not illustrated in the top view of FIG. 41(A).

The transistor 510D is a modification example of the above transistor. Therefore, the point different from the transistor 510A will be mainly described to avoid repeated description.

In the transistor 510D illustrated in FIG. 41, a conductive layer 547a is placed between the conductive layer 542a and the oxide 530b, and a conductive layer 547b is placed between the conductive layer 542b and the oxide 530b. Here, the conductive layer 542a (the conductive layer 542b) extends beyond the top surface and the side surface on the conductive layer 560 side of the conductive layer 547a (the conductive layer 547b), and includes a region in contact with the top surface of the oxide 530b. Here, for the conductive layer 547, a conductor that can be used for the conductive layer 542 is used. It is preferred that the thickness of the conductive layer 547 be at least greater than that of the conductive layer 542.

In the transistor 510D in FIG. 41 having such a structure, the conductive layer 542 can be closer to the conductive layer 560 than that in the transistor 510A is. Alternatively, an end portion of the conductive layer 542a and an end portion of the conductive layer 542b can overlap with the conductive layer 560. Accordingly, an effective channel length of the transistor 510D can be shortened; thus, the transistor 510D can have a high on-state current and improved frequency characteristics.

The conductive layer 547a (the conductive layer 547b) is preferably provided to overlap with the conductive layer 542a (the conductive layer 542b). With such a structure, the conductive layer 547a (the conductive layer 547b) functioning as a stopper can prevent over-etching of the oxide 530b by etching for forming the opening where the conductive layer 546a (the conductive layer 546b) is to be embedded.

In the transistor 510D illustrated in FIG. 41, the insulating layer 565 may be positioned on and in contact with the insulating layer 544. The insulating layer 544 preferably functions as a barrier insulating film that inhibits entry of impurities such as water and hydrogen and excess oxygen into the transistor 510D from the insulating layer 580 side. For the insulating layer 565, an insulating layer that can be used for the insulating layer 544 can be used. In addition, the insulating layer 544 may be formed using a nitride insulating material such as aluminum nitride, aluminum titanium nitride, titanium nitride, silicon nitride, or silicon nitride oxide, for example.

Unlike in the transistor 510A illustrated in FIG. 38, in the transistor 510D illustrated in FIG. 41, the conductive layer 505 may be provided to have a single-layer structure. In this case, an insulating film to be the insulating layer 516 is deposited over the patterned conductive layer 505, and an upper portion of the insulating film is removed by a CMP method or the like until the top surface of the conductive layer 505 is exposed. Preferably, the planarity of the top surface of the conductive layer 505 is made favorable. For example, the average surface roughness (Ra) of the top surface of the conductive layer 505 is less than or equal to 1 nm, preferably less than or equal to 0.5 nm, further preferably less than or equal to 0.3 nm. This allows the improvement in planarity of the insulating layer formed over the conductive layer 505 and the increase in crystallinity of the oxide 530b and the oxide 530c.

The conductive layer 505 may be omitted as necessary. A transistor 510Da illustrated in FIGS. 48(A) to 48(C) has a structure in which the conductive layer 505 and the conductive layer 503 are removed from the transistor 510D.

Figure 48A:
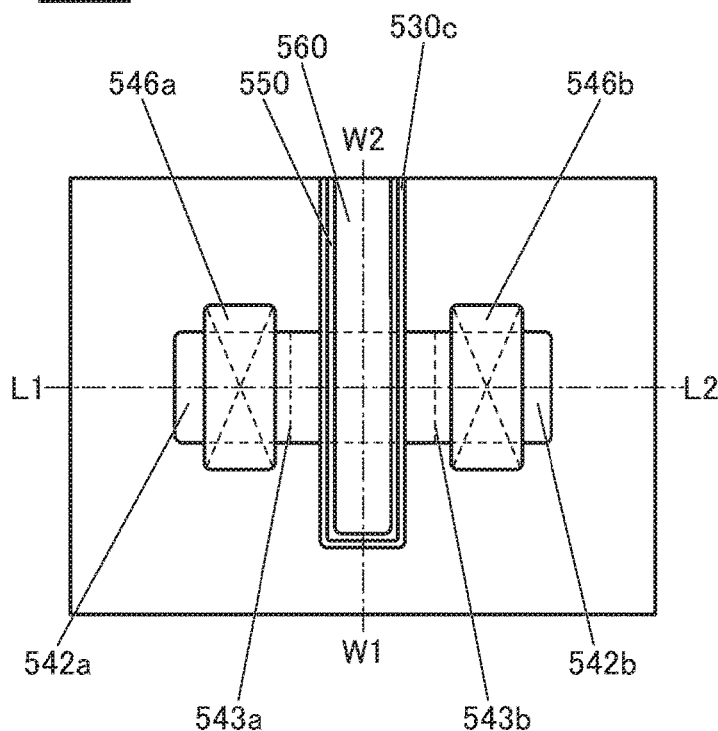
FIGS. 48A to 48C Diagrams illustrating a structure example of a transistor.
Figure 48C:
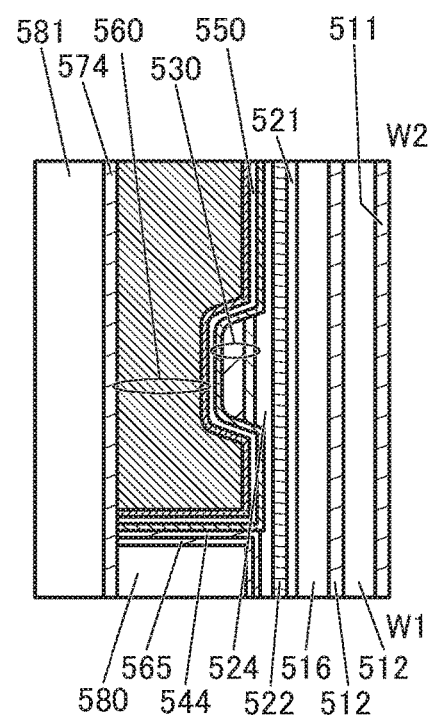
Figure 48B:
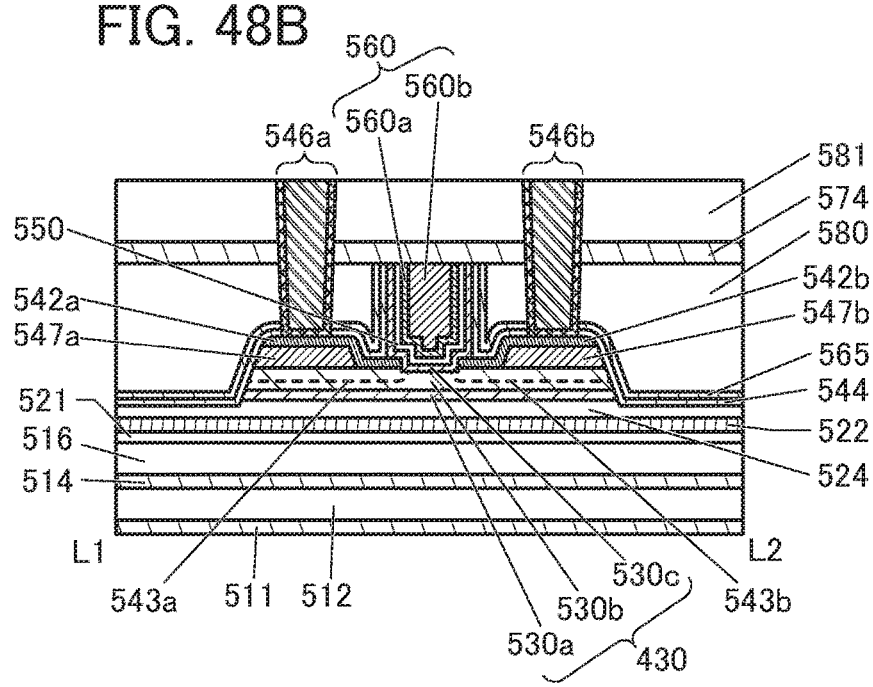

A structure example of a transistor 510 Da is described with reference to FIGS. 48(A), 48(B), and 48(C). FIG. 48(A) is a top view of the transistor 510Da. FIG. 48(B) is a cross-sectional view of a portion indicated by a dashed-dotted line L1-L2 in FIG. 48(A). FIG. 48(C) is a cross-sectional view of a portion indicated by a dashed-dotted line W1-W2 in FIG. 48(A). For clarity of the diagram, some components are not illustrated in the top view of FIG. 48(A).

Transistor Structure Example 5

Figure 42A:
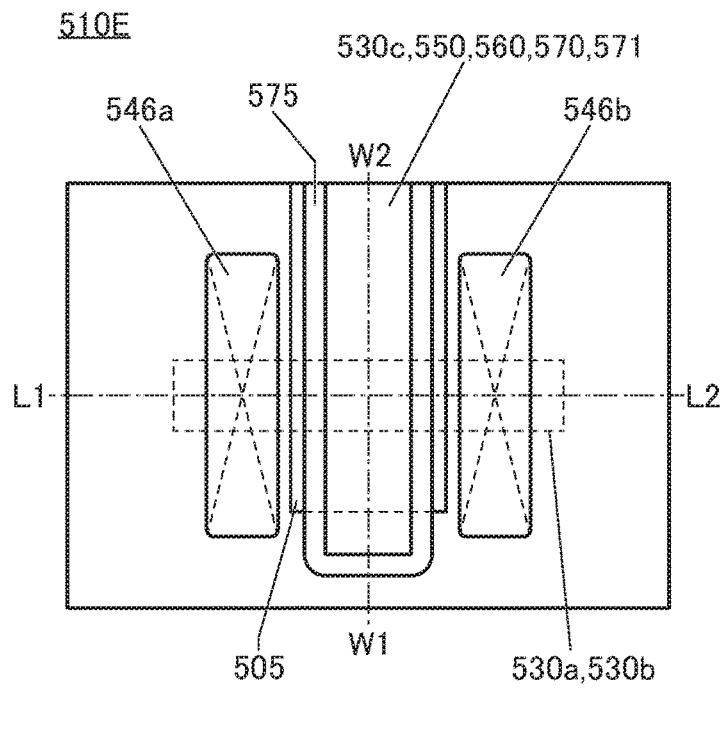
FIGS. 42A to 42C Diagrams illustrating a structural example of a transistor.
Figure 42C:
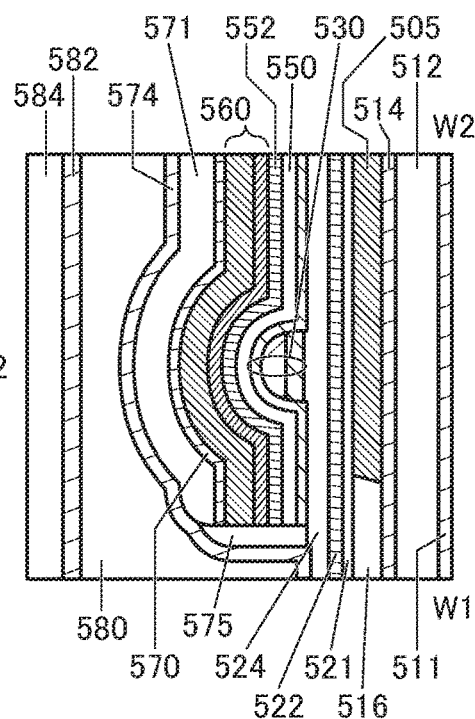
Figure 42B:
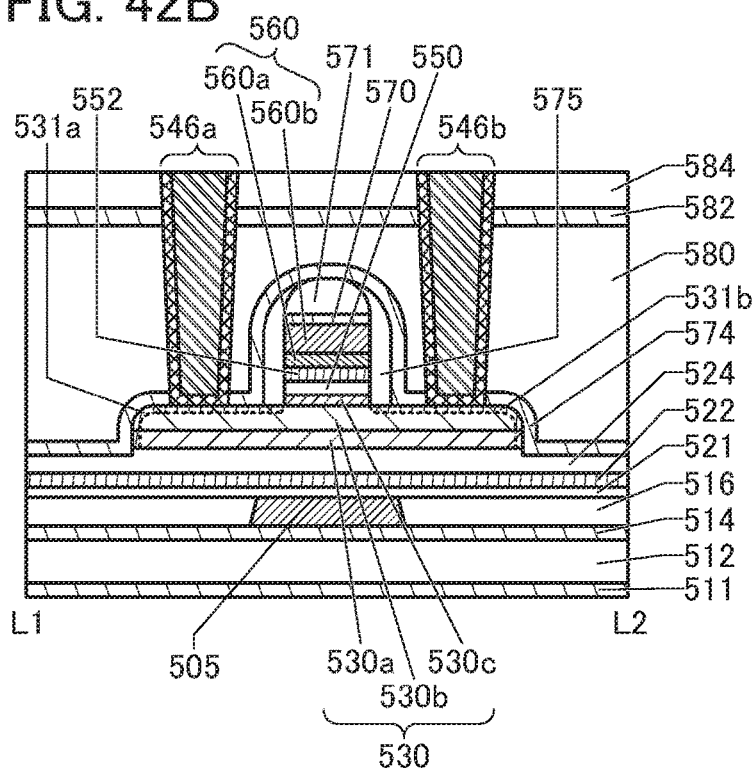

A structure example of a transistor 510E is described with reference to FIGS. 42(A), 42(B), and 42(C). FIG. 42(A) is a top view of the transistor 510E. FIG. 42(B) is a cross-sectional view of a portion indicated by a dashed-dotted line L1-L2 in FIG. 42(A). FIG. 42(C) is a cross-sectional view of a portion indicated by a dashed-dotted line W1-W2 in FIG. 42(A). For clarity of the diagram, some components are not illustrated in the top view of FIG. 42(A).

The transistor 510E is a modification example of the above transistor. Therefore, the point different from the above transistor will be mainly described to avoid repeated description.

In FIGS. 42(A) to 42(C), the conductive layer 503 is not provided and the conductive layer 505 functioning as the second gate also functions as a wiring. The insulating layer 550 is provided over the oxide 530c, and a metal oxide 552 is provided over the insulating layer 550. The conductive layer 560 is provided over the metal oxide 552, and an insulating layer 570 is provided over the conductive layer 560. An insulating layer 571 is provided over the insulating layer 570.

The metal oxide 552 preferably has a function of inhibiting diffusion of oxygen. When the metal oxide 552 that inhibits diffusion of oxygen is provided between the insulating layer 550 and the conductive layer 560, diffusion of the oxygen to the conductive layer 560 is inhibited. That is, a reduction in the amount of oxygen supplied to the oxide 530 can be inhibited. Moreover, oxidization of the conductive layer 560 due to oxygen can be inhibited.

Note that the metal oxide 552 may function as part of the first gate. For the metal oxide 552, the oxide semiconductor that can be used as the oxide 530 can be used, for example. In that case, when the conductive layer 560 is deposited by a sputtering method, the electric resistance of the metal oxide 552 is lowered so that the metal oxide 552 can become a conductive layer. This can be referred to as an OC (Oxide Conductor) electrode.

In addition, the metal oxide 552 functions as part of a gate insulating layer in some cases. Thus, when silicon oxide, silicon oxynitride, or the like is used for the insulating layer 550, a metal oxide that is a high-k material with a high dielectric constant is preferably used for the metal oxide 552. Such a stacked-layer structure can be thermally stable and can have a high dielectric constant. Thus, a gate potential that is applied during operation of the transistor can be reduced while the physical thickness is maintained. In addition, the equivalent oxide thickness (EOT) of the insulating layer functioning as the gate insulating layer can be reduced.

Although the metal oxide 552 in the transistor 510E is shown as a single layer, the metal oxide 552 may have a stacked-layer structure of two or more layers. For example, a metal oxide functioning as part of a gate electrode and a metal oxide functioning as part of the gate insulating layer may be stacked.

With the metal oxide 552 functioning as a gate electrode, the on-state current of the transistor 510E can be increased without a reduction in the influence of the electric field from the conductive layer 560. With the metal oxide 552 functioning as the gate insulating layer, the distance between the conductive layer 560 and the oxide 530 is kept by the physical thicknesses of the insulating layer 550 and the metal oxide 552, so that leakage current between the conductive layer 560 and the oxide 530 can be reduced. Thus, with the stacked-layer structure of the insulating layer 550 and the metal oxide 552, the physical distance between the conductive layer 560 and the oxide 530 and the intensity of electric field applied from the conductive layer 560 to the oxide 530 can be easily adjusted as appropriate.

Specifically, the oxide semiconductor layer that can be used for the oxide 530 can also be used for the metal oxide 552 when the resistance thereof is reduced. Alternatively, a metal oxide containing one kind or two or more kinds selected from hafnium, aluminum, gallium, yttrium, zirconium, tungsten, titanium, tantalum, nickel, germanium, magnesium, and the like can be used.

It is particularly preferable to use an insulating layer containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable since it is less likely to be crystallized by heat treatment in a later step. Note that the metal oxide 552 is not an essential structure. Design is appropriately set in consideration of required transistor characteristics.

For the insulating layer 570, an insulating material having a function of inhibiting the passage of oxygen and impurities such as water and hydrogen is preferably used. For example, aluminum oxide or hafnium oxide is preferably used. Thus, oxidization of the conductive layer 560 due to oxygen from above the insulating layer 570 can be inhibited. Moreover, entry of impurities such as water and hydrogen from above the insulating layer 570 into an oxide 230 through the conductive layer 560 and the insulating layer 550 can be inhibited.

The insulating layer 571 functions as a hard mask. By providing the insulating layer 571, the conductive layer 560 can be processed to have a side surface that is substantially vertical; specifically, an angle formed by the side surface of the conductive layer 560 and a surface of the substrate can be greater than or equal to 75° and less than or equal to 100°, preferably greater than or equal to 80° and less than or equal to 95°.

An insulating material having a function of inhibiting the passage of oxygen and impurities such as water and hydrogen may be used for the insulating layer 571 so that the insulating layer 571 also functions as a barrier layer. In that case, the insulating layer 570 does not have to be provided.

Parts of the insulating layer 570, the conductive layer 560, the metal oxide 552, the insulating layer 550, and the oxide 530c are selected and removed using the insulating layer 571 as a hard mask, whereby their side surfaces can be substantially aligned with each other and a surface of the oxide 530b can be partly exposed.

The transistor 510E includes a region 531a and a region 531b on part of the exposed surface of the oxide 530b. One of the region 531a and the region 531b functions as a source region, and the other functions as a drain region.

The region 531a and the region 531b can be formed by addition of an impurity element such as phosphorus or boron to the exposed surface of the oxide 530b by an ion implantation method, an ion doping method, a plasma immersion ion implantation method, or plasma treatment, for example. In this embodiment and the like, an "impurity element" refers to an element other than main constituent elements.

Alternatively, the region 531a and the region 531b can be formed in such manner that, after part of the surface of the oxide 530b is exposed, a metal film is formed and then heat treatment is performed so that the element contained in the metal film is diffused into the oxide 530b.

The electrical resistivity of regions of the oxide 530b to which the impurity element is added decreases. For that reason, the region 531a and the region 531b are sometimes referred to as "impurity regions" or "low-resistance regions".

The region 531a and the region 531b can be formed in a self-aligned manner by using the insulating layer 571 and/or the conductive layer 560 as a mask. Accordingly, the conductive layer 560 does not overlap with the region 531a and/or the region 531b, so that the parasitic capacitance can be reduced. Moreover, an offset region is not formed between a channel formation region and the source/drain region (the region 531a or the region 531b). The formation of the region 531a and the region 531b in a self-aligned manner achieves an increase in on-state current, a reduction in threshold voltage, and an improvement in operating frequency, for example.

Note that an offset region may be provided between the channel formation region and the source/drain region in order to further reduce the off-state current. The offset region is a region where the electrical resistivity is high and a region where the above-described addition of the impurity element is not performed. The offset region can be formed by the above-described addition of the impurity element after the formation of an insulating layer 575. In this case, the insulating layer 575 serves as a mask like the insulating layer 571 or the like. Thus, the impurity element is not added to a region of the oxide 530b overlapped by the insulating layer 575, so that the electrical resistivity of the region can be kept high.

The transistor 510E includes the insulating layer 575 on the side surfaces of the insulating layer 570, the conductive layer 560, the metal oxide 552, the insulating layer 550, and the oxide 530c. The insulating layer 575 is preferably an insulating layer having a low dielectric constant. For example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like is preferably used. In particular, silicon oxide, silicon oxynitride, silicon nitride oxide, or porous silicon oxide is preferably used for the insulating layer 575, in which case an excess-oxygen region can be easily formed in the insulating layer 575 in a later step. Silicon oxide and silicon oxynitride are preferable because of their thermal stability. The insulating layer 575 preferably has a function of diffusing oxygen.

The transistor 510E also includes the insulating layer 574 over the insulating layer 575 and the oxide 530. The insulating layer 574 is preferably deposited by a sputtering method. When a sputtering method is used, an insulating layer containing few impurities such as water and hydrogen can be deposited. For example, aluminum oxide is preferably used for the insulating layer 574.

Note that an oxide film obtained by a sputtering method may extract hydrogen from the structure body over which the oxide film is deposited. Thus, the hydrogen concentration in the oxide 230 and the insulating layer 575 can be reduced when the insulating layer 574 absorbs hydrogen and water from the oxide 230 and the insulating layer 575.

The conductive layer 505 may be omitted as necessary. A transistor 510Ea illustrated in FIGS. 49(A) to 49(C) has a structure in which the conductive layer 505 and the conductive layer 503 are removed from the transistor 510E.

FIG. 49(A) is a top view of the transistor 510Ea. FIG. 49(B) is a cross-sectional view of a portion indicated by a dashed-dotted line L1-L2 in FIG. 49(A). FIG. 49(C) is a cross-sectional view of a portion indicated by a dashed-dotted line W1-W2 in FIG. 49(A). Note that for clarification of the drawing, some components are not illustrated in the top view of FIG. 49(A).

Transistor Structure Example 6

Figure 43A:
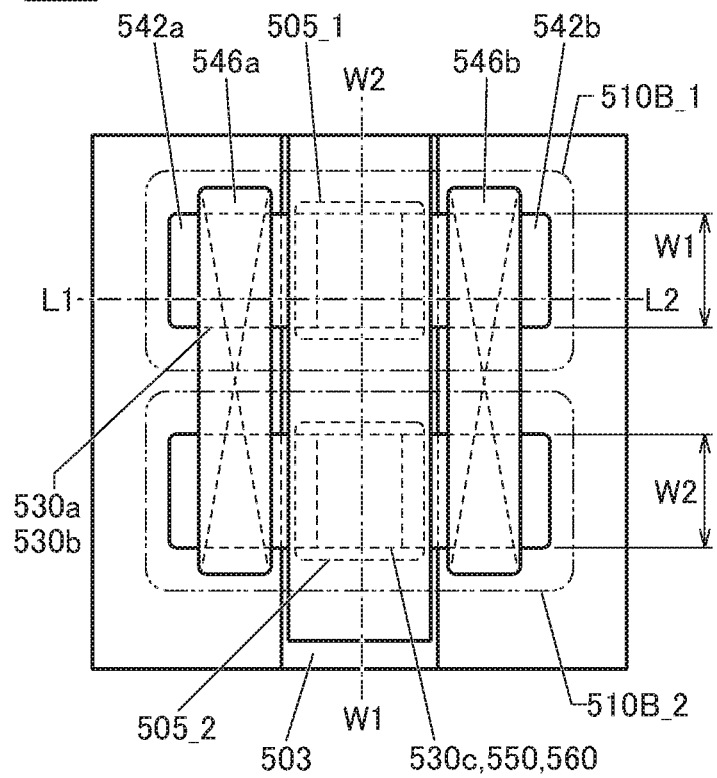
FIGS. 43A to 43C Diagrams illustrating a structural example of transistors.
Figure 43C:
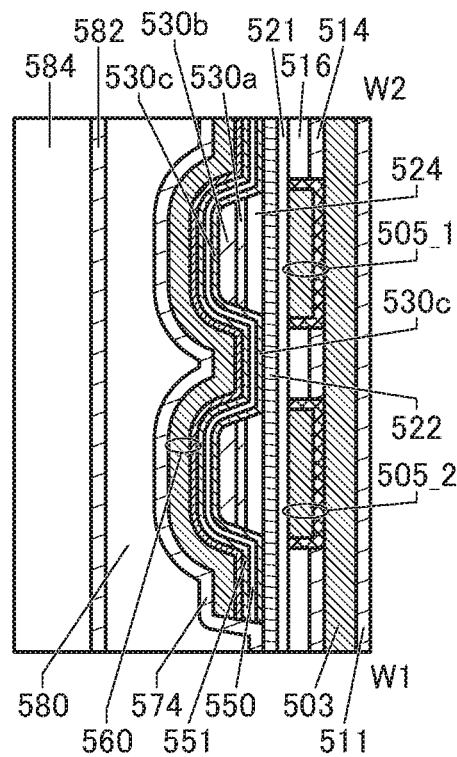
Figure 43B:
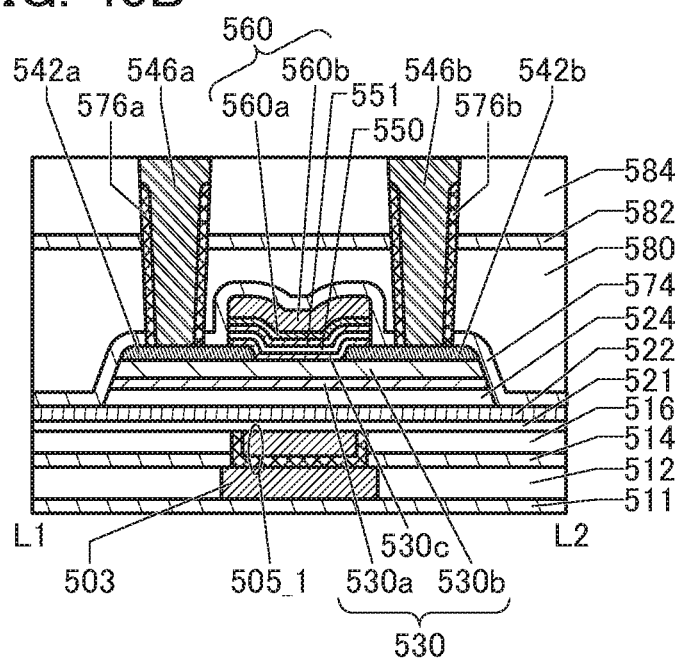

A structure example of a transistor 510F is described with reference to FIGS. 43(A), 43(B), and 43(C). FIG. 43(A) is a top view of the transistor 510F. FIG. 43(B) is a cross-sectional view of a portion indicated by a dashed-dotted line L1-L2 in FIG. 43(A). FIG. 43(C) is a cross-sectional view of a portion indicated by a dashed-dotted line W1-W2 in FIG. 43(A). For clarity of the diagram, some components are not illustrated in the top view of FIG. 43(A).

The transistor 510F is a modification example of the above transistor. Therefore, the point different from the above transistor will be mainly described to avoid repeated description.

The transistor 510F has a structure in which a transistor 510C_1 and a transistor 510C_2 are connected in parallel. Specifically, one of a source and a drain of the transistor 510C_1 is electrically connected to one of a source and a drain of the transistor 510C_2 through one of the conductive layer 546a and the conductive layer 546b. In addition, the other of the source and the drain of the transistor 510C_1 is electrically connected to the other of the source and the drain of the transistor 510C_2 through the other of the conductive layer 546a and the conductive layer 546b. In addition, the conductive layer 560 is used as gate electrodes of the transistor 510C_1 and the transistor 510C_2.

The transistor 510C_1 and the transistor 510C_2 each have the same structure as the transistor 510C. Thus, the transistor 510F is a transistor in which two transistors 510C are connected in parallel. Note that the number of transistors connected in parallel is not limited to two and may be three or more. For example, in the case where the transistor 510F is used as a transistor forming a memory cell, the number of transistors connected in parallel can be determined in accordance with the cell size. In addition, the structure of the transistors connected in parallel is not limited to the transistor 510C.

Moreover, a conductive layer 505_1 included in the transistor 510C_1 functions as a back gate electrode. A conductive layer 505_2 included in the transistor 510C_2 functions as a back gate electrode. The conductive layer 505_1 and the conductive layer 505_2 can be formed using a material and a method that are similar to those of the conductive layer 505.

When a channel width is increased to increase on-state current, an increase in S value (subthreshold swing value), a normally-on change, or the like tends to occur. This tendency is noticeable in a transistor with a short channel length, in particular. Note that an S value is an indicator of the electrical characteristics of a transistor and preferably as low as possible. Dividing a channel width into a plurality of widths can increase the on-state current without increasing the S value. In addition, the on-state current can be increased without a normally-on change.

Moreover, an increase in channel width reduces the effect of the S-channel structure in a transistor with the S-channel structure in which an effective channel width is greater than an apparent channel width due to a channel formed on a side surface of a semiconductor layer. Dividing a channel width into a plurality of widths can increase the substantial channel width while keeping the effect of the S-channel structure.

Note that when a channel width is divided into a plurality of widths, the divided channel widths are preferably the same or substantially the same as each other. In the transistor 510F, the channel width of the transistor 510C_1 and the channel width of the transistor 510C_2 are preferably the same or substantially the same as each other. When the channel width of the transistor 510C_1 is W1 and the channel width of the transistor 510C_2 is W2, W1 is preferably greater than or equal to 0.8 times and less than or equal to 1.2 times, further preferably greater than or equal to 0.9 times and less than or equal to 1.1 times, still further preferably greater than or equal to 0.95 times and less than or equal to 1.05 times.

The conductive layer 505 capable of functioning as a back gate electrode and the conductive layer 503 capable of functioning as a wiring may be omitted as needed. A transistor 510Fa illustrated in FIGS. 50(A) to 50(C) has a structure in which the conductive layer 505 and the conductive layer 503 are removed from the transistor 510F.

Figure 50A:
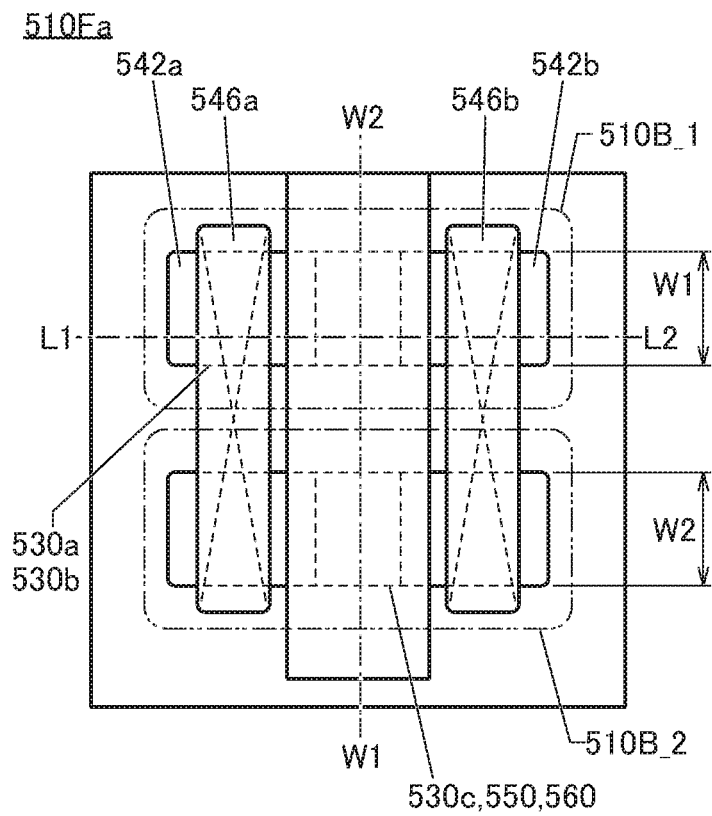
FIGS. 50A to 50C Diagrams illustrating a structure example of a transistor.
Figure 50C:
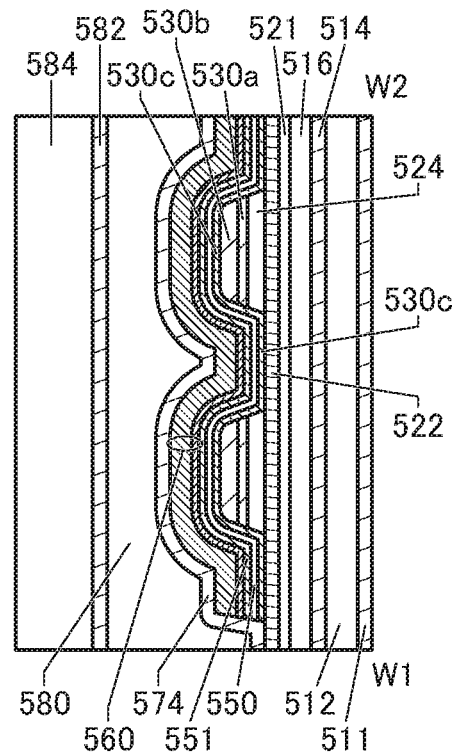
Figure 50B:
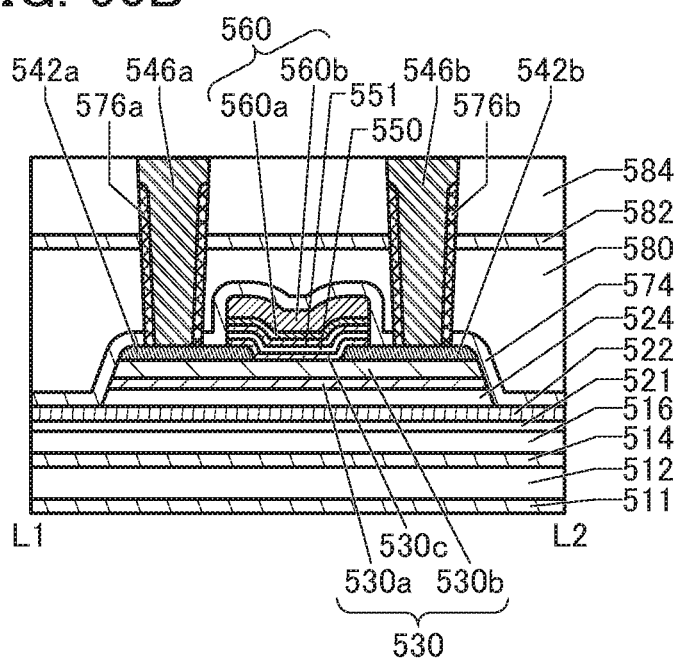

FIG. 50(A) is a top view of the transistor 510Fa. FIG. 50(B) is a cross-sectional view of a portion indicated by a dashed-dotted line L1-L2 in FIG. 50(A). FIG. 50(C) is a cross-sectional view of a portion indicated by a dashed-dotted line W1-W2 in FIG. 50(A). For clarity of the diagram, some components are not illustrated in the top view of FIG. 50(A).

Transistor Structure Example 7

Figure 44A:
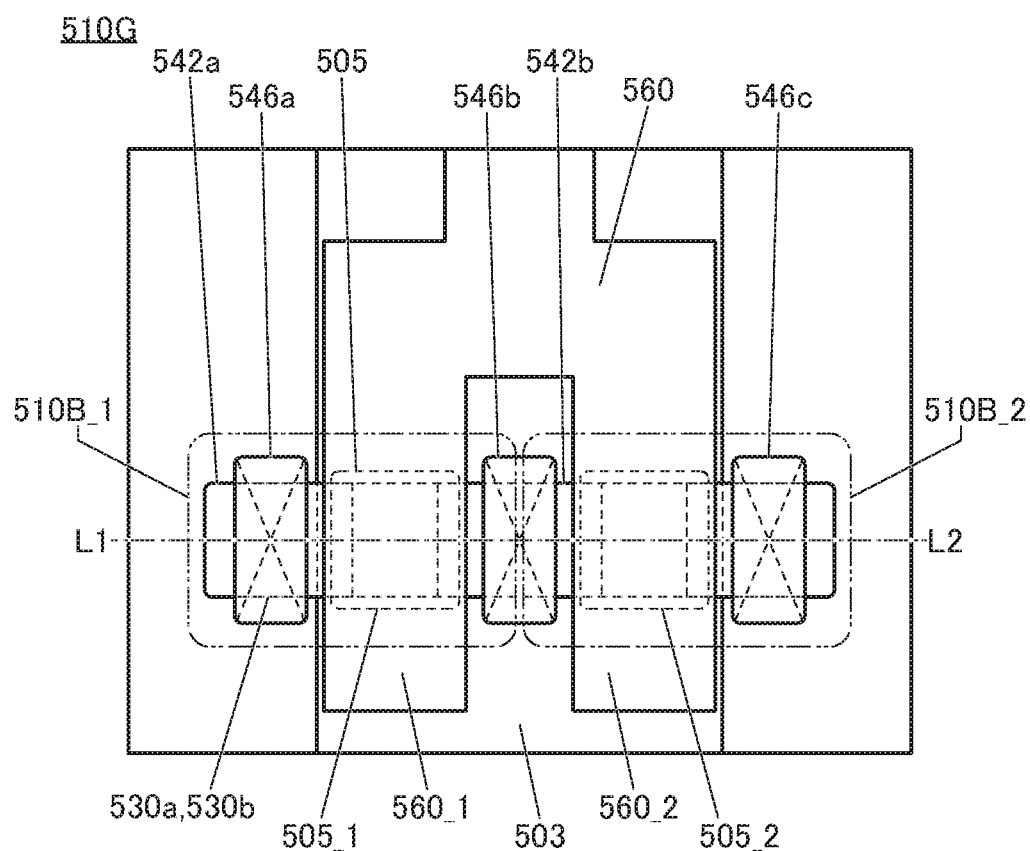
FIGS. 44A and 44B Diagrams illustrating a structural example of a transistor.
Figure 44B:
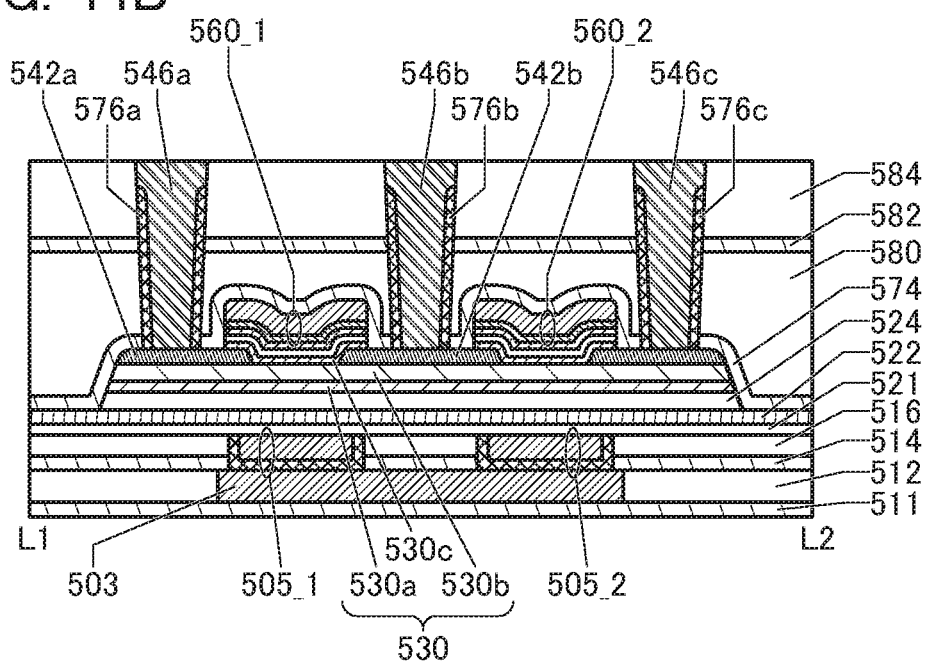

A structure example of a transistor 510G is described with reference to FIGS. 44(A), 44(B), and 44(C). FIG. 44(A) is a top view of the transistor 510G. FIG. 44(B) is a cross-sectional view of a portion indicated by a dashed-dotted line L1-L2 in FIG. 44(A). FIG. 44(C) is a cross-sectional view of a portion indicated by a dashed-dotted line W1-W2 in FIG. 44(A). For clarity of the diagram, some components are not illustrated in the top view of FIG. 44(A).

The transistor 510G is a modification example of the above transistor 510F. Therefore, the point different from the transistor 510F will be mainly described to avoid repeated description.

The transistor 510G has a structure different from that of a transistor E and connects the transistor 510C_1 and the transistor 510C_2 in parallel. Specifically, the conductive layer 505_1 and the conductive layer 505_2 are electrically connected to each other. In addition, one of the source and the drain of the transistor 510C_1 is electrically connected to one of a source and a drain of the transistor 510C_2. In FIG. 44, one of the source and the drain of the transistor 510C_1 and one of a source and a drain of the transistor 510C_2 are shared and electrically connected to the conductive layer 546b. In addition, the transistor 510C_1 includes a conductive layer 560_1 functioning as a gate electrode, and the transistor 510C_2 includes the conductive layer 560_2 functioning as a gate electrode. The conductive layer 560_1 and the conductive layer 560_2 are electrically connected to each other.

The conductive layer 560_1 and the conductive layer 560_2 can be formed using a material and a method that are similar to those of the conductive layer 560. Note that FIG. 44 shows an example in which one part of the conductive layer 560 is used as the conductive layer 560_1, and another part of the conductive layer 560 is used as the conductive layer 560_2.

In addition, the other of the source and the drain of the transistor 510C_1 is electrically connected to the conductive layer 546a, and the other of the source and the drain of the transistor 510C_2 is electrically connected to the conductive layer 546c. The conductive layer 546c can be formed using a material and a method similar to those of the conductive layer 546a and the conductive layer 546b. In addition, an insulating layer 576c can be formed using a material and a method similar to those of the insulating layer 576a and the insulating layer 576b.

In the transistor 510G, the conductive layer 546b is electrically connected to one of a source and a drain of the transistor 510G, and the conductive layer 546a and the conductive layer 546b are electrically connected to the other of the source and the drain of the transistor 510G.

The transistor 510G also has the same action and effect as the transistor 510F.

The conductive layer 505 capable of functioning as a back gate electrode and the conductive layer 503 capable of functioning as a wiring may be omitted as needed. A transistor 510Ga illustrated in FIGS. 51(A) to 51(C) has a structure in which the conductive layer 505 and the conductive layer 503 are removed from the transistor 510G.

Figure 51A:
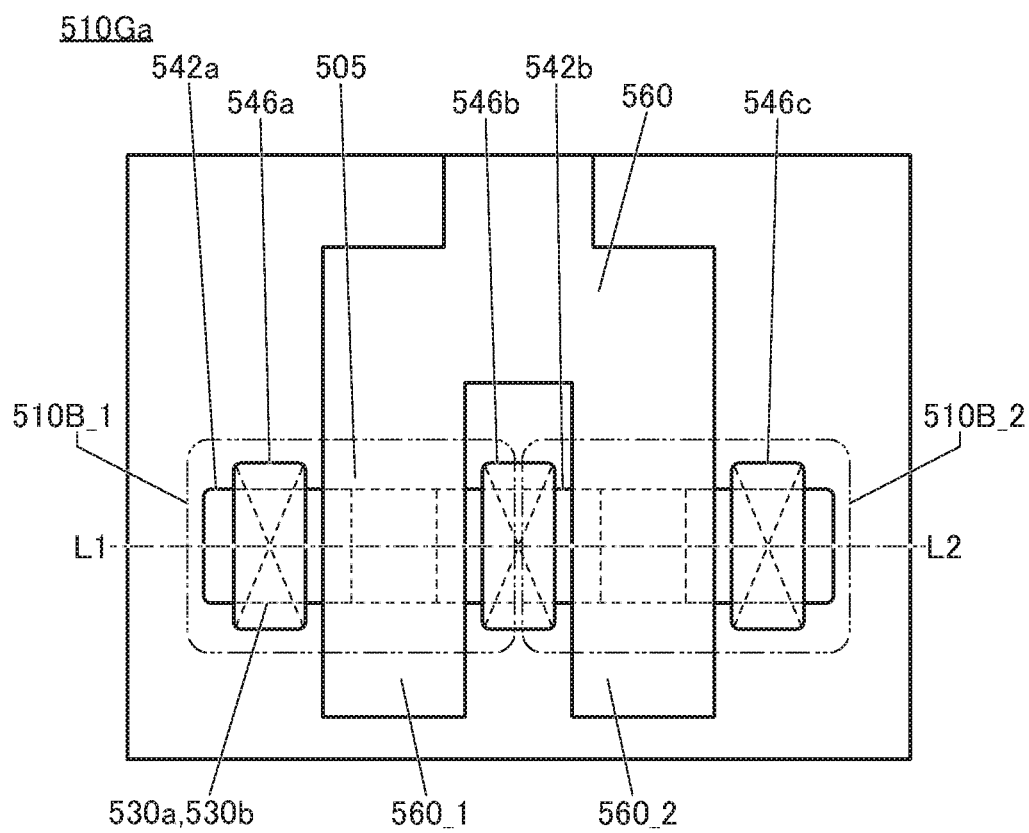
FIGS. 51A and 51B Diagrams illustrating a structure example of a transistor.
Figure 51B:
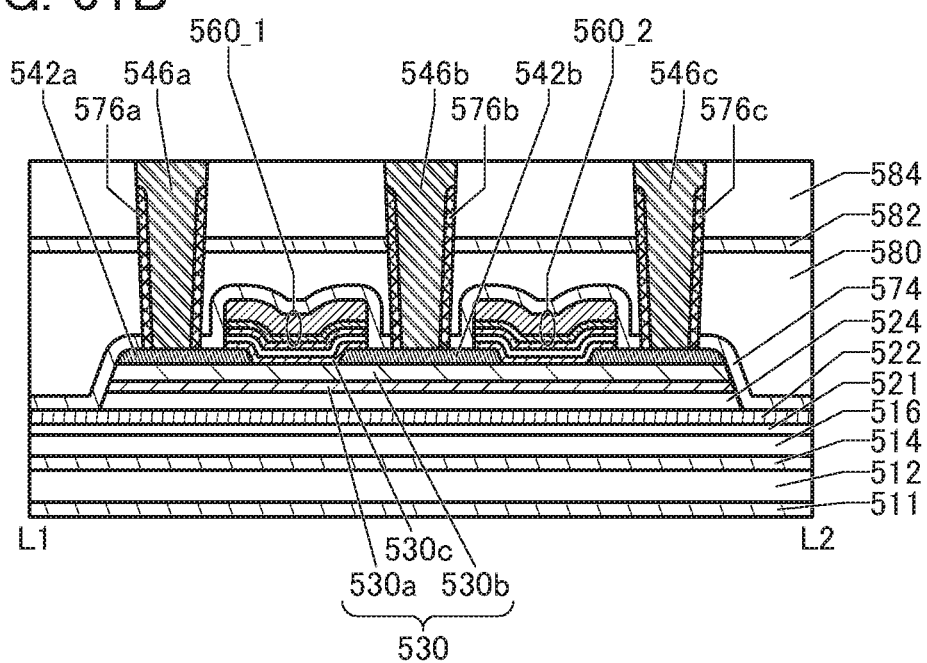

FIG. 51(A) is a top view of the transistor 510Ga. FIG. 51(B) is a cross-sectional view of a portion indicated by a dashed-dotted line L1-L2 in FIG. 51(A). FIG. 51(C) is a cross-sectional view of a portion indicated by a dashed-dotted line W1-W2 in FIG. 51(A). For clarity of the diagram, some components are not illustrated in the top view of FIG. 51(A).

This embodiment can be implemented in combination with the structures described in the other embodiments and the like, as appropriate.

Embodiment 9

This embodiment shows examples of an image of products in which the memory device described in the above embodiments can be used and electronic components and electronic devices in which the memory device described in the above embodiment and the like are incorporated.

<Product Image>

Figure 52:
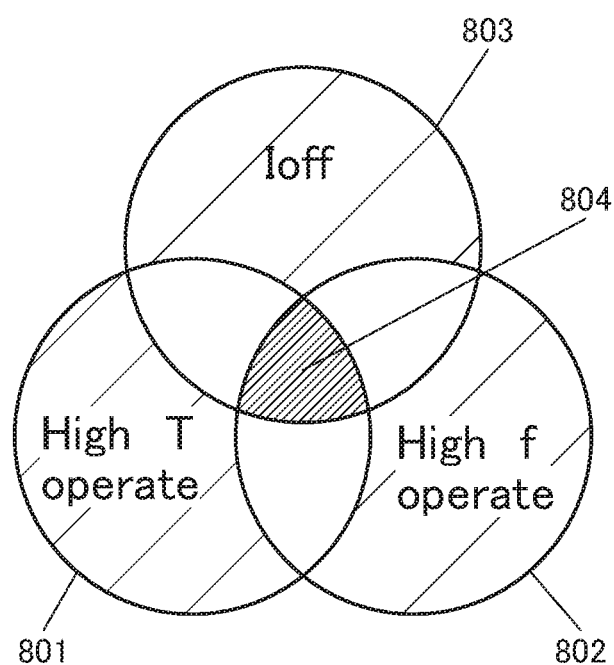
FIG. 52 A diagram illustrating a product image.

First, FIG. 52 illustrates a product image applicable to the memory device according to one embodiment of the present invention. A region 801 illustrated in FIG. 52 represents high temperature characteristics (High T operate), a region 802 represents high frequency characteristics (High f operate), a region 803 represents low off characteristics (Ioff), and a region 804 represents a region where the region 801, the region 802, and the region 803 overlap one another.

Note that when the region 801 is intended to be satisfied, it can be roughly satisfied by using a carbide or a nitride such as silicon carbide or gallium nitride for a channel formation region of a transistor. When intended to be satisfied, the region 802 can be roughly satisfied by using a silicide such as single crystal silicon or crystalline silicon for a channel formation region of a transistor. In addition, when intended to be satisfied, the region 803 can be roughly satisfied by using an oxide semiconductor or a metal oxide for a channel formation region of a transistor.

The memory device according to one embodiment of the present invention can be favorably used for a product in the range represented by the region 804, for example.

A conventional product has difficulty in satisfying all of the region 801, the region 802, and the region 803. However, a transistor included in the memory device according to one embodiment of the present invention includes a crystalline OS in a channel formation region. In the case where the crystalline OS is included in the channel formation region, a memory device and an electronic device satisfying high temperature characteristics, high frequency characteristics, and low off characteristics can be provided.

Note that examples of a product in the range represented by the region 804 are an electronic device including a low-power consumption and high-performance CPU, an in-car electronic device required to have high reliability in a high-temperature environment, and the like. Next, examples of electronic components and electronic devices in which the memory device according to one embodiment of the present invention or the like is incorporated are described.

<Electronic Components>

First, examples of electronic components in which the memory device 100 is incorporated will be described with reference to FIGS. 53(A) and 53(B).

Figure 53A:
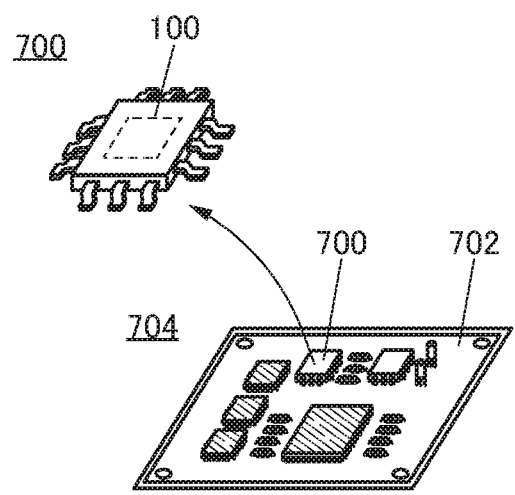
FIGS. 53A and 53B Diagrams illustrating examples of electronic components.

FIG. 53(A) is a perspective view of an electronic component 700 and a substrate on which the electronic component 700 is mounted (a mounting board 704). The electronic component 700 illustrated in FIG. 53(A) is an IC chip and includes a lead and a circuit portion. The electronic component 700 is mounted on a printed circuit board 702, for example. A plurality of such IC chips are combined and electrically connected to each other on the printed circuit board 702, whereby the mounting board 704 is completed.

The memory device 100 described in the above embodiment is provided as the circuit portion of the electronic component 700. Although a QFP (Quad Flat Package) is used as a package of the electronic component 700 in FIG. 53(A), the embodiment of the package is not limited thereto.

Figure 53B:
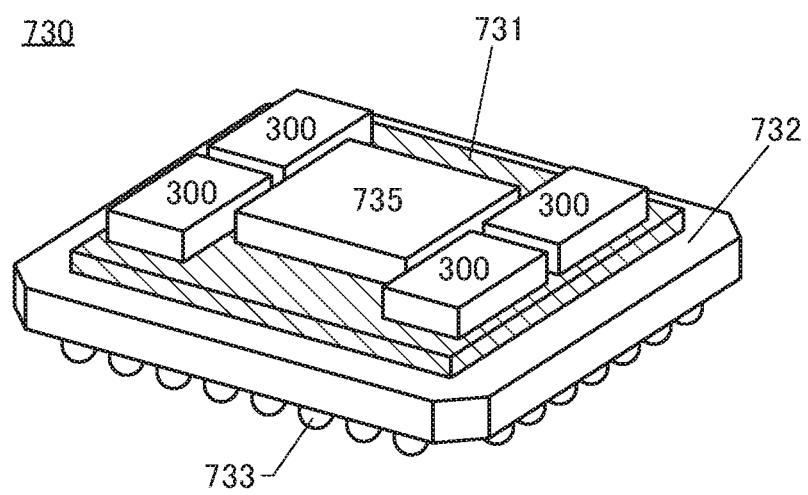

FIG. 53(B) is a perspective view of an electronic component 730. The electronic component 730 is an example of a SiP (System in package) or an MCM (Multi Chip Module). In the electronic component 730, an interposer 731 is provided on a package substrate 732 (a printed circuit board), and a semiconductor device 735 and a plurality of memory devices 100 are provided on the interposer 731.

The electronic component 730 using the memory devices 100 as high bandwidth memory (HBM) is shown as an example. An integrated circuit (a semiconductor device) such as a CPU (Central Processing Unit), a GPU (Graphics Processing Unit), or an FPGA (Field Programmable Gate Array) can be used as the semiconductor device 735.

As the package substrate 732, a ceramic substrate, a plastic substrate, a glass epoxy substrate, or the like can be used. As the interposer 731, a silicon interposer, a resin interposer, or the like can be used.

The interposer 731 includes a plurality of wirings and has a function of electrically connecting a plurality of integrated circuits with different terminal pitches. The plurality of wirings are provided in a single layer or multiple layers. Moreover, the interposer 731 has a function of electrically connecting an integrated circuit provided on the interposer 731 to an electrode provided on the package substrate 732. Accordingly, the interposer is referred to as a "redistribution substrate" or an "intermediate substrate" in some cases. A through electrode may be provided in the interposer 731 and used for electrically connecting an integrated circuit and the package substrate 732. For a silicon interposer, a TSV (Through Silicon Via) can also be used as the through electrode.

A silicon interposer is preferably used as the interposer 731. A silicon interposer can be manufactured at lower cost than an integrated circuit because it is not necessary to provide an active element. Meanwhile, since wirings of a silicon interposer can be formed through a semiconductor process, formation of minute wirings, which is difficult for a resin interposer, is easy.

In order to achieve a wide memory bandwidth, many wirings need to be connected to HBM. Therefore, formation of minute and high-density wirings is required for an interposer on which HBM is mounted. For this reason, a silicon interposer is preferably used as the interposer on which HBM is mounted.

In a SiP, an MCM, or the like using a silicon interposer, the decrease in reliability due to a difference in expansion coefficient between an integrated circuit and the interposer does not easily occur. Furthermore, the surface of a silicon interposer has high planarity, so that a poor connection between the silicon interposer and an integrated circuit provided on the silicon interposer does not easily occur. It is particularly preferable to use a silicon interposer for a 2.5D package (2.5D mounting) in which a plurality of integrated circuits are arranged side by side on an interposer.

A heat sink (a radiator plate) may be provided to overlap with the electronic component 730. In the case of providing a heat sink, the heights of integrated circuits provided on the interposer 731 are preferably equal to each other. For example, in the electronic component 730 described in this embodiment, the heights of the memory devices 100 and the semiconductor device 735 are preferably equal to each other.

To mount the electronic component 730 on another substrate, an electrode 733 may be provided on the bottom portion of the package substrate 732. FIG. 53(B) illustrates an example in which the electrode 733 is formed of a solder ball. Solder balls are provided in a matrix on the bottom portion of the package substrate 732, whereby BGA (Ball Grid Array) mounting can be achieved. Alternatively, the electrode 733 may be formed of a conductive pin. When conductive pins are provided in a matrix on the bottom portion of the package substrate 732, PGA (Pin Grid Array) mounting can be achieved.

The electronic component 730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

<Electronic Devices>

Figure 54:
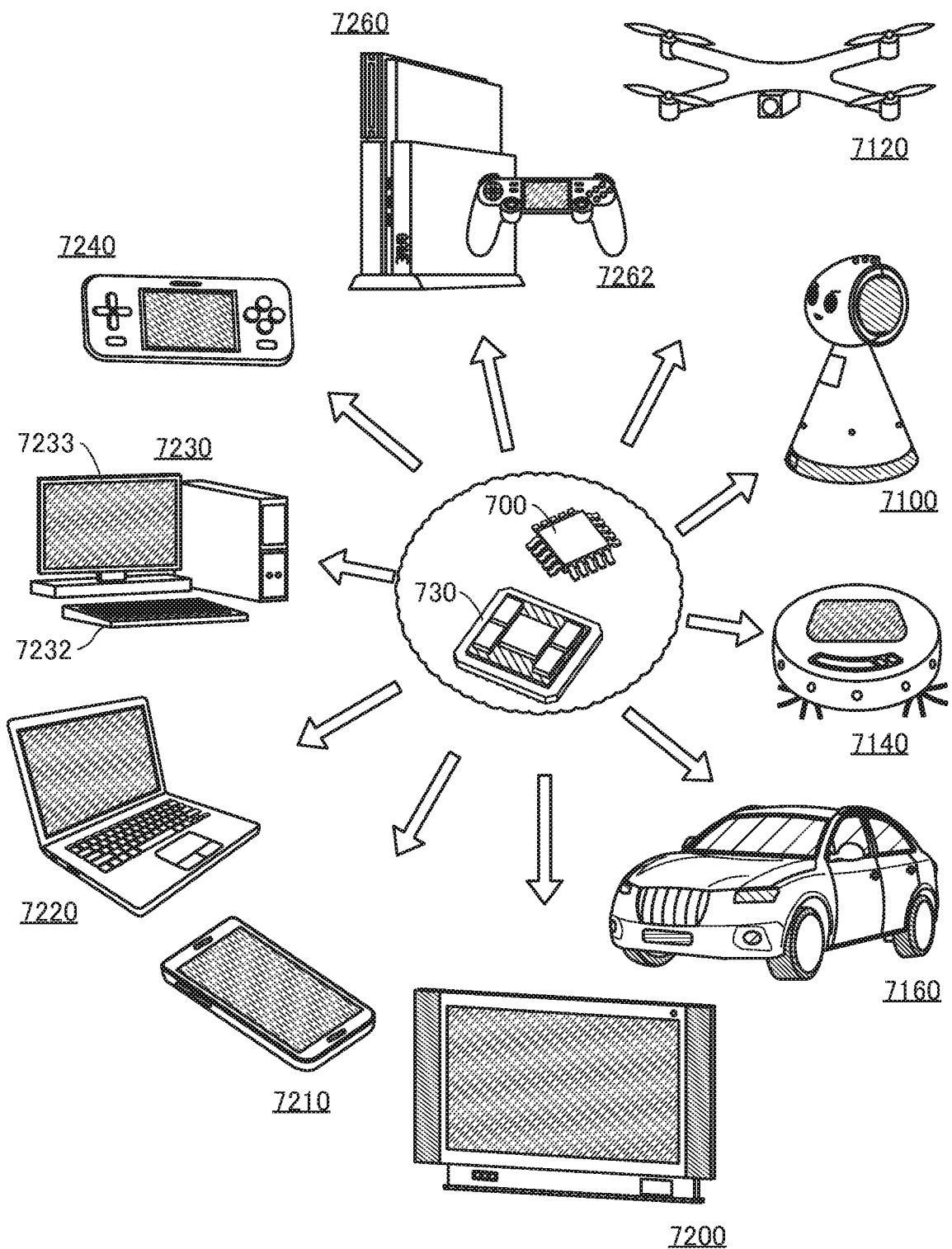
FIG. 54 Diagrams illustrating examples of electronic devices.

Next, examples of electronic devices including the above electronic component will be described with reference to FIG. 54.

A robot 7100 includes an illuminance sensor, a microphone, a camera, a speaker, a display, various kinds of sensors (e.g., an infrared ray sensor, an ultrasonic wave sensor, an acceleration sensor, a piezoelectric sensor, an optical sensor, and a gyro sensor), a moving mechanism, and the like. The electronic component 730 includes a processor or the like and has a function of controlling these peripheral devices. For example, the electronic component 700 has a function of storing data obtained by the sensors.

The microphone has a function of detecting acoustic signals of a speaking voice of a user, an environmental sound, and the like. The speaker has a function of outputting audio signals such as a voice and a warning beep. The robot 7100 can analyze an audio signal input via the microphone and can output a necessary audio signal from the speaker. The robot 7100 can communicate with the user with the use of the microphone and the speaker.

The camera has a function of taking images of the surroundings of the robot 7100. Furthermore, the robot 7100 has a function of moving with the use of the moving mechanism. The robot 7100 can take images of the surroundings with the use of the camera, and can analyze the images to sense whether there is an obstacle in the way of the movement.

A flying object 7120 includes propellers, a camera, a battery, and the like and has a function of flying autonomously. The electronic component 730 has a function of controlling these peripheral devices.

For example, image data taken by the camera is stored in the electronic component 700. The electronic component 730 can analyze the image data to sense whether there is an obstacle in the way of the movement. Moreover, the electronic component 730 can estimate the remaining battery level from a change in the power storage capacity of the battery.

A cleaning robot 7140 includes a display provided on the top surface, a plurality of cameras provided on the side surface, a brush, an operation button, various kinds of sensors, and the like. Although not illustrated, a cleaning robot 7300 is provided with a tire, an inlet, and the like. The cleaning robot 7300 can run autonomously, detect dust, and vacuum the dust through the inlet provided on the bottom surface.

For example, the electronic component 730 can judge whether there is an obstacle such as a wall, furniture, or a step by analyzing an image taken by the cameras. In the case where an object that is likely to be caught in the brush, such as a wire, is detected by image analysis, the rotation of the brush can be stopped.

An automobile 7160 includes an engine, tires, a brake, a steering gear, a camera, and the like. For example, the electronic component 730 performs control for optimizing the running state of the automobile 7160 on the basis of navigation information, the speed, the state of the engine, the gearshift state, the use frequency of the brake, and other data. For example, image data taken by the camera is stored in the electronic component 700.

The electronic component 700 and/or the electronic component 730 can be incorporated in a TV device 7200 (a television receiver), a smartphone 7210, a PC 7220 (a personal computer), 7230, a game console 7240, a game console 7260, and the like.

For example, the electronic component 730 incorporated in the TV device 7200 can function as an image processing engine. The electronic component 730 performs, for example, image processing such as noise removal and resolution up-conversion.

The smartphone 7210 is an example of a portable information terminal. The smartphone 7210 includes a microphone, a camera, a speaker, various kinds of sensors, and a display portion. These peripheral devices are controlled by the electronic component 730.

The PC 7220 and the PC 7230 are examples of a notebook PC and a desktop PC. To the PC 7230, a keyboard 7232 and a monitor device 7233 can be connected with or without a wire. The game console 7240 is an example of a portable game console. The game console 7260 is an example of a stationary game console. To the game console 7260, a controller 7262 is connected with or without a wire. The electronic component 700 and/or the electronic component 730 can be incorporated in the controller 7262.

This embodiment can be implemented in an appropriate combination with the structures described in the other embodiments and the like.

REFERENCE NUMERALS

100: memory device, 111: input/output circuit 112: control circuit, 113: C receiver, 114: setting resister, 115: LVDS circuit, 117: decoder, 118: register, 119: register, 127: sense amplifier, 210: memory block array, 211: memory block, 212: word line driver, 213: local sense amplifier driver, 214: local sense amplifier array, 215: global sense amplifier, 216: selector, 230: oxide, 231: switch, 232: switch, 233: switch, 234: switch,

The invention claimed is:

1. A memory device comprising:
a first cell array;
a second cell array;

a first bit line pair; and a second bit line pair, wherein the first cell array and the second cell array comprise a region where they overlap with each other, wherein the first cell array comprises:

Aa (Aa is an integer greater than or equal to 1) first memory cell(s);

Ba (Ba is an integer greater than or equal to 1) first memory cell(s);

Ca (Ca is an integer greater than or equal to 1) first memory cell(s);

Da (Da is an integer greater than or equal to 1) first memory cell(s);

Ea (Ea is an integer greater than or equal to 1) first memory cell(s); and

Fa (Fa is an integer greater than or equal to 1) first memory cell(s), wherein the second cell array comprises:

Ab (Ab is an integer greater than or equal to 1) second memory cell(s);

Bb (Bb is an integer greater than or equal to 1) second memory cell(s);

Cb (Cb is an integer greater than or equal to 1) second memory cell(s);

Db (Db is an integer greater than or equal to 1) second memory cell(s);

Eb (Eb is an integer greater than or equal to 1) second memory cell(s); and

Fb (Fb is an integer greater than or equal to 1) second memory cell(s), wherein one of the first bit line pair is electrically connected to the Aa first memory cell(s), the Ca first memory cell(s), and the Cb second memory cell(s), wherein the other of the first bit line pair is electrically connected to the Ba first memory cell(s), the Ab second memory cell(s), and the Bb second memory cell(s), wherein one of the second bit line pair is electrically connected to the Da first memory cell(s), the Fa first memory cell(s), and the Fb second memory cell(s), wherein the other of the second bit line pair is electrically connected to the Ea first memory cell(s), the Db second memory cell(s), and the Eb second memory cell(s), wherein part of the Da first memory cell(s) are adjacent to the Ba first memory cell(s), wherein another part of the Da first memory cell(s) are adjacent to the Ca first memory cell(s), wherein part of the Db second memory cell(s) are adjacent to the Bb first memory cell(s), and wherein another part of the Db second memory cell(s) are adjacent to the Cb first memory cell(s).

2. The memory device according to claim 1, further comprising a plurality of first bit line pairs and a plurality of second bit line pairs.

3. The memory device according to claim 1, wherein the first memory cell comprises a first transistor and a first capacitor, and wherein the second memory cell comprises a second transistor and a second capacitor.

4. The memory device according to claim 3, wherein the first transistor and the second transistor each comprise an oxide semiconductor in a semiconductor layer.

5. The memory device according to claim 1, wherein the Ca is greater than or equal to 0.8 times and less than or equal to 1.2 times the Ba.

6. The memory device according to claim 1, wherein the Ca is equal to the Ba.

7. The memory device according to claim 1, wherein the Ab is greater than or equal to 0.8 times and less than or equal to 1.2 times the Aa.

8. The memory device according to claim 1, wherein the Ba is greater than or equal to 0.8 times and less than or equal to 1.2 times the Ca.

9. A memory device comprising:

a first cell array;

a second cell array;

first to fourth BLf bit lines;

first to fourth BLs bit lines;

first to fourth BLBf bit lines; and first to fourth BLBs bit lines, wherein the first cell array and the second cell array comprise a region where they overlap with each other, wherein the first cell array comprises:

Aa (Aa is an integer greater than or equal to 1) first memory cell(s);

Ba (Ba is an integer greater than or equal to 1) first memory cell(s);

Ca (Ca is an integer greater than or equal to 1) first memory cell(s);

Da (Da is an integer greater than or equal to 1) first memory cell(s);

Ea (Ea is an integer greater than or equal to 1) first memory cell(s);

Fa (Fa is an integer greater than or equal to 1) first memory cell(s);

Ga (Ga is an integer greater than or equal to 1) first memory cell(s);

Ha (Ha is an integer greater than or equal to 1) first memory cell(s);

Ia (Ia is an integer greater than or equal to 1) first memory cell(s);

Ja (Ja is an integer greater than or equal to 1) first memory cell(s);

Ka (Ka is an integer greater than or equal to 1) first memory cell(s); and

La (La is an integer greater than or equal to 1) first memory cell(s), wherein the second cell array comprises:

Ab (Ab is an integer greater than or equal to 1) second memory cell(s);

Bb (Bb is an integer greater than or equal to 1) second memory cell(s);

Cb (Cb is an integer greater than or equal to 1) second memory cell(s);

Db (Db is an integer greater than or equal to 1) second memory cell(s);

Eb (Eb is an integer greater than or equal to 1) second memory cell(s);

Fb (Fb is an integer greater than or equal to 1) second memory cell(s);

Gb (Gb is an integer greater than or equal to 1) second memory cell(s);

Hb (Hb is an integer greater than or equal to 1) second memory cell(s);

Ib (Ib is an integer greater than or equal to 1) second memory cell(s);

Jb (Jb is an integer greater than or equal to 1) second memory cell(s);

Kb (Kb is an integer greater than or equal to 1) second memory cell(s); and

Lb (Lb is an integer greater than or equal to 1) second memory cell(s), wherein the first BLf bit line is electrically connected to the Ba first memory cell(s) and the Bb second memory cell(s), wherein the first BLs bit line is electrically connected to the Ab second memory cell(s), wherein the first BLBf bit line is electrically connected to the Ca first memory cell(s) and the Cb second memory cell(s), wherein the first BLBs bit line is electrically connected to the Aa first memory cell(s), wherein the second BLf bit line is electrically connected to the Fa first memory cell(s) and the Fb second memory cell(s), wherein the second BLs bit line is electrically connected to the Db second memory cell(s), wherein the second BLBf bit line is electrically connected to the Ea first memory cell(s) and the Eb second memory cell(s), wherein the second BLBs bit line is electrically connected to the Da first memory cell(s), wherein the third BLf bit line is electrically connected to the Ia first memory cell(s) and the Ib second memory cell(s), wherein the third BLs bit line is electrically connected to the Gb second memory cell(s), wherein the third BLBf bit line is electrically connected to the Ha first memory cell(s) and the Hb second memory cell(s), wherein the third BLBs bit line is electrically connected to the Ga first memory cell(s), wherein the fourth BLf bit line is electrically connected to the Ka first memory cell(s) and the Kb second memory cell(s), wherein the fourth BLs bit line is electrically connected to the Jb second memory cell(s), wherein the fourth BLBf bit line is electrically connected to the La first memory cell(s) and the Lb second memory cell(s), wherein the fourth BLBs bit line is electrically connected to the Ja first memory cell(s), wherein the Ba first memory cell(s) and the Ia first memory cell(s) are adjacent to part of the Da first memory cell(s), wherein the Ca first memory cell(s) and the Ha first memory cell(s) are adjacent to another part of the Da first memory cell(s), wherein part of the Ja first memory cell(s) are adjacent to the Ia first memory cell(s), wherein another part of the Ja first memory cell(s) are adjacent to the Ha first memory cell(s), wherein the Bb second memory cell(s) and the Ib second memory cell(s) are adjacent to part of the Db second memory cell(s), wherein the Cb second memory cell(s) and the Hb second memory cell(s) are adjacent to another part of the Db second memory cell(s), wherein part of the Jb second memory cell(s) are adjacent to the Ib second memory cell(s), and wherein another part of the Jb second memory cell(s) are adjacent to the Hb second memory cell(s).

10. The memory device according to claim 9,
wherein the first memory cell comprises a first transistor and a first capacitor, and
wherein the second memory cell comprises a second transistor and a second capacitor.

11. The memory device according to claim 10,
wherein the first transistor and the second transistor each comprise an oxide semiconductor in a semiconductor layer.

12. The memory device according to claim 9, further comprising a first sense amplifier and first to fourth switches,
wherein the first BLf bit line is electrically connected to the first sense amplifier through the first switch,
wherein the first BLs bit line is electrically connected to the first sense amplifier through the second switch,
wherein the first BLBf bit line is electrically connected to the first sense amplifier through the third switch, and
wherein the first BLBs bit line is electrically connected to the first sense amplifier through the fourth switch.

13. The memory device according to claim 9, further comprising a second sense amplifier and fifth to eighth switches,
wherein the second BLf bit line is electrically connected to the second sense amplifier through the fifth switch,
wherein the second BLs bit line is electrically connected to the second sense amplifier through the sixth switch,
wherein the second BLBf bit line is electrically connected to the second sense amplifier through the seventh switch, and
wherein the second BLBs bit line is electrically connected to the second sense amplifier through the eighth switch.

14. The memory device according to claim 9, further comprising a third sense amplifier and ninth to twelfth switches,
wherein the third BLf bit line is electrically connected to the third sense amplifier through the ninth switch,
wherein the third BLs bit line is electrically connected to the third sense amplifier through the tenth switch,
wherein the third BLBf bit line is electrically connected to the third sense amplifier through the eleventh switch, and
wherein the third BLBs bit line is electrically connected to the third sense amplifier through the twelfth switch.

15. The memory device according to claim 9, further comprising a fourth sense amplifier and thirteenth to sixteenth switches,
wherein the fourth BLf bit line is electrically connected to the fourth sense amplifier through the thirteenth switch,
wherein the fourth BLs bit line is electrically connected to the fourth sense amplifier through the fourteenth switch,
wherein the fourth BLBf bit line is electrically connected to the fourth sense amplifier through the fifteenth switch, and
wherein the fourth BLBs bit line is electrically connected to the fourth sense amplifier through the sixteenth switch.

16. The memory device according to claim 9,
wherein the Ca is greater than or equal to 0.8 times and less than or equal to 1.2 times the Ba.

17. The memory device according to claim 9,
wherein the Ca is equal in number to the Ba.

18. The memory device according to claim 9,
wherein the Ab is greater than or equal to 0.8 times and less than or equal to 1.2 times the Aa.

19. The memory device according to claim 9,
wherein a sum of the Ba and the Ca is greater than or equal to 0.8 times and less than or equal to 1.2 times the Aa.

20. The memory device according to claim 9,
wherein a sum of the Ba and the Ca is equal in number to the Aa.

21. The memory device according to claim 9, wherein the Ia is greater than or equal to 0.8 times and less than or equal to 1.2 times the Ba.

22. The memory device according to claim 9, wherein the Ia is equal in number to the Ba.

* * * * *